(12) United States Patent
Suzuki et al.

(10) Patent No.: US 8,717,842 B2
(45) Date of Patent: May 6, 2014

(54) MULTI-PORT MEMORY BASED ON DRAM CORE

(75) Inventors: Takaaki Suzuki, Kawasaki (JP); Shinnosuke Kamata, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/601,406

(22) Filed: Aug. 31, 2012

(65) Prior Publication Data

US 2013/0201751 A1  Aug. 8, 2013

Related U.S. Application Data

(60) Division of application No. 13/031,080, filed on Feb. 18, 2011, now Pat. No. 8,547,776, which is a division of application No. 11/512,319, filed on Aug. 30, 2006, now Pat. No. 7,911,825, which is a division of application No. 10/284,092, filed on Oct. 31, 2002, now Pat. No. 7,120,761, which is a continuation-in-part of application No. 09/968,516, filed on Oct. 2, 2001, now abandoned.

(30) Foreign Application Priority Data

| Dec. 20, 2000 | (JP) | ................................ 2000-387891 |
| Dec. 27, 2000 | (JP) | ................................ 2000-398893 |
| Dec. 27, 2000 | (JP) | ................................ 2000-399052 |
| Feb. 9, 2001 | (JP) | ................................ 2001-034361 |
| Feb. 14, 2001 | (JP) | ................................ 2001-037547 |
| Mar. 14, 2002 | (JP) | ................................ 2002-070514 |

(51) Int. Cl.
*G11C 8/00* (2006.01)

(52) U.S. Cl.
USPC ................. 365/230.05; 365/149; 365/189.04; 365/189.07

(58) Field of Classification Search
USPC .................. 365/149, 189.04, 189.07, 230.05
See application file for complete search history.

(56) References Cited

U.S. PATENT DOCUMENTS

| 4,636,982 A | 1/1987 | Takemae et al. |
| 4,796,232 A | 1/1989 | House |
| 4,967,398 A | 10/1990 | Jamoua et al. |
| 5,001,671 A | 3/1991 | Koo et al. |
| 5,036,491 A | 7/1991 | Yamaguchi |

(Continued)

FOREIGN PATENT DOCUMENTS

| EP | 496 391 A2 | 7/1992 |
| EP | 0 520 425 A2 | 12/1992 |

(Continued)

OTHER PUBLICATIONS

Partial English-language Translation of Office Action from the Japanese Patent Office dated Aug. 3, 2010 for Japanese Patent Application No. 2000-387891.

(Continued)

*Primary Examiner* — Harry W Byrne
*Assistant Examiner* — Lance Reidlinger
(74) *Attorney, Agent, or Firm* — Arent Fox LLP

(57) ABSTRACT

A semiconductor memory device includes a plurality of N external ports, each of which receives commands, and an internal circuit which performs at least N access operations during a minimum interval of the commands that are input into one of the external ports.

13 Claims, 147 Drawing Sheets

(56) References Cited

U.S. PATENT DOCUMENTS

| | | |
|---|---|---|
| 5,276,842 A | 1/1994 | Sugita |
| 5,497,353 A | 3/1996 | Sato et al. |
| 5,587,957 A | 12/1996 | Kowalczyk et al. |
| 5,602,781 A | 2/1997 | Isobe |
| 5,617,367 A | 4/1997 | Holland et al. |
| 5,659,711 A | 8/1997 | Sugita |
| 5,737,569 A | 4/1998 | Nadir et al. |
| 5,768,211 A | 6/1998 | Jones et al. |
| 5,781,480 A | 7/1998 | Nogle et al. |
| 5,946,262 A | 8/1999 | Randolph et al. |
| 6,078,527 A | 6/2000 | Roth et al. |
| 6,134,168 A | 10/2000 | Harrington et al. |
| 6,167,487 A | 12/2000 | Camacho et al. |
| 6,233,659 B1 | 5/2001 | Cohen et al. |
| 6,411,128 B2 | 6/2002 | Maeda |
| 6,421,291 B1 | 7/2002 | Watanabe et al. |
| 6,427,197 B1 | 7/2002 | Sato et al. |
| 6,430,103 B2 | 8/2002 | Nakayama et al. |
| 6,438,054 B1 | 8/2002 | Kanazashi |
| 6,473,357 B1 | 10/2002 | Fan et al. |
| 6,636,449 B2 | 10/2003 | Matsuzaki |
| 6,877,071 B2 | 4/2005 | Sherman |
| 2002/0010831 A1 | 1/2002 | DeMone et al. |
| 2002/0078269 A1 | 6/2002 | Agarwala et al. |

FOREIGN PATENT DOCUMENTS

| | | | |
|---|---|---|---|
| EP | 520425 A2 | * | 12/1992 |
| JP | 62-221747 A | | 9/1987 |
| JP | 64-55794 A | | 3/1989 |
| JP | 3-105788 A | | 5/1991 |
| JP | 3-175713 A | | 7/1991 |
| JP | 4-49595 A | | 2/1992 |
| JP | 04-324187 | | 11/1992 |
| JP | 4-326138 A | | 11/1992 |
| JP | 7-175713 A | | 7/1995 |
| JP | 7-262083 A | | 10/1995 |
| JP | 8-16455 A | | 1/1996 |
| JP | 10-208479 A | | 8/1998 |
| JP | 2000-30460 A | | 1/2000 |
| JP | 2000-163969 A | | 6/2000 |
| JP | 2000-268573 A | | 9/2000 |
| WO | WO 00/19437 A2 | | 4/2000 |

OTHER PUBLICATIONS

Partial English-language Translation of Office Action from the Japanese Patent Office dated Jul. 20, 2010 for Japanese Patent Application No. 2000-398893.

* cited by examiner

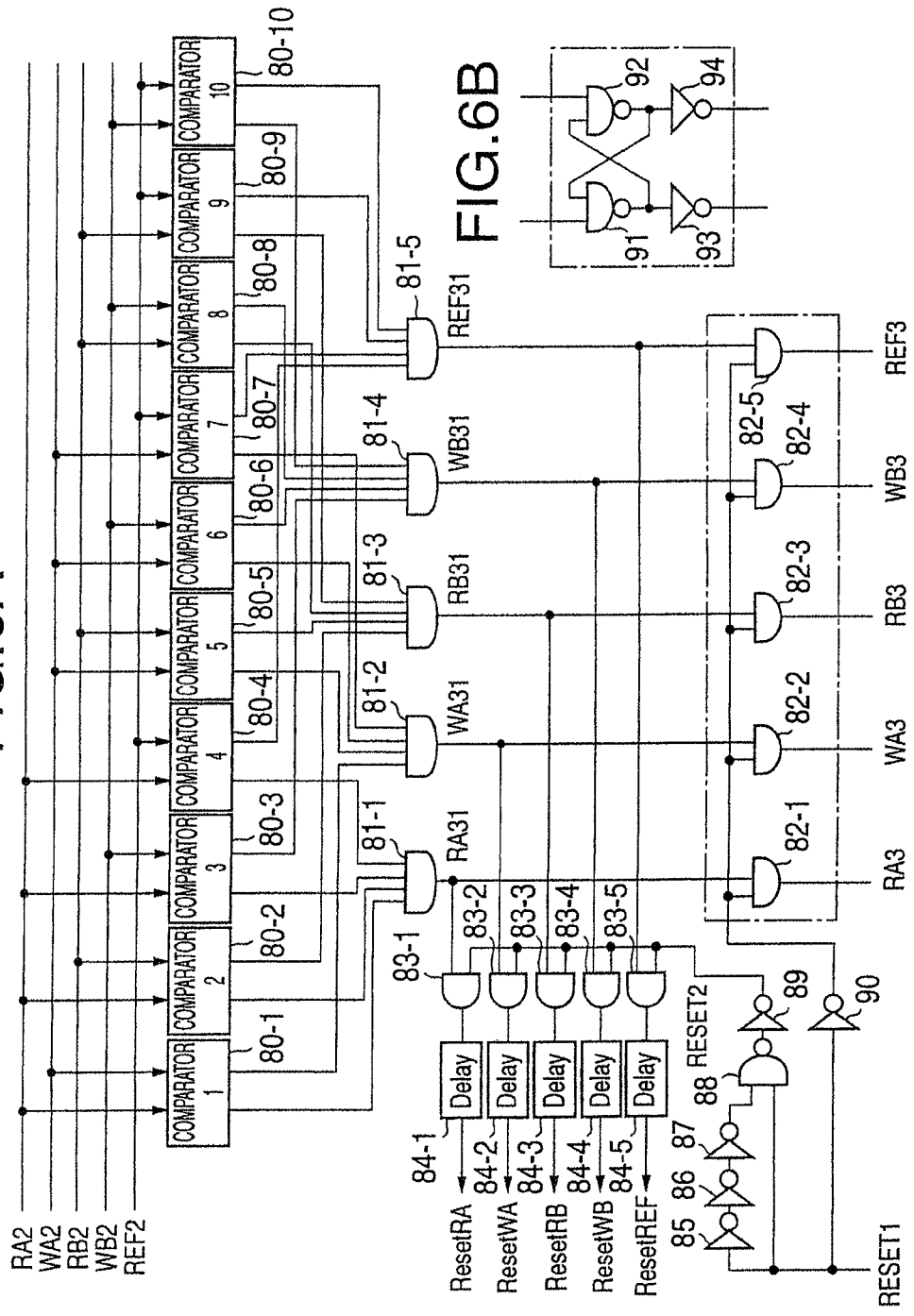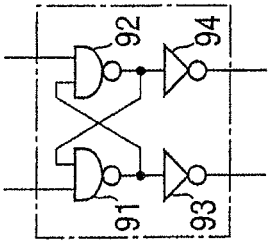

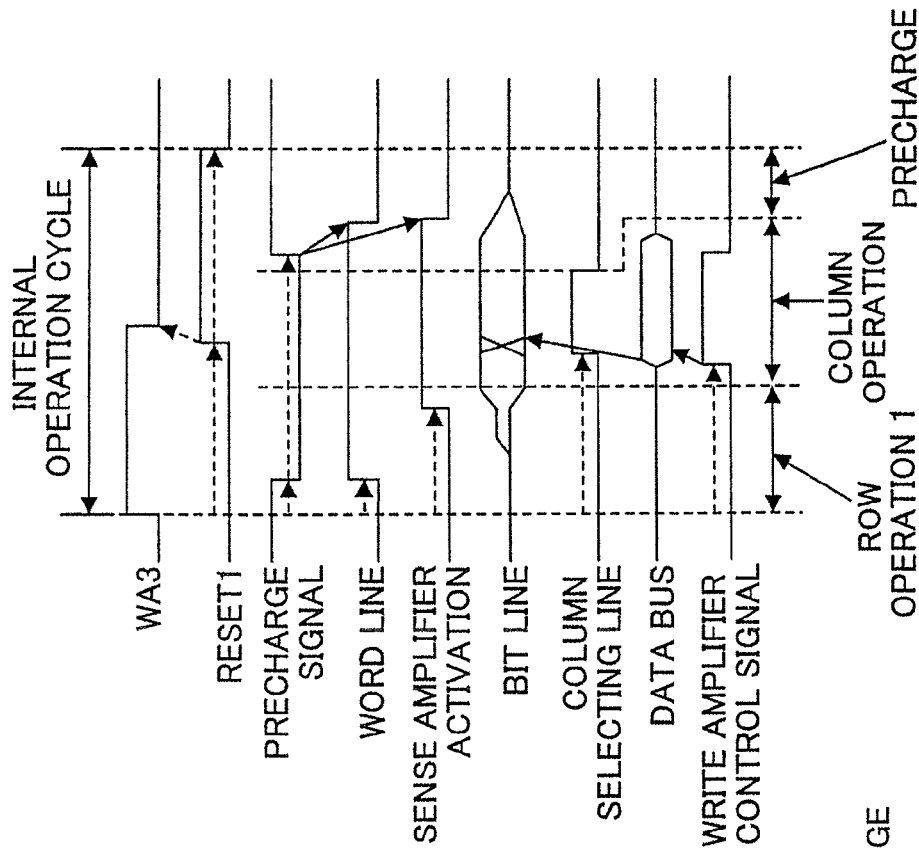
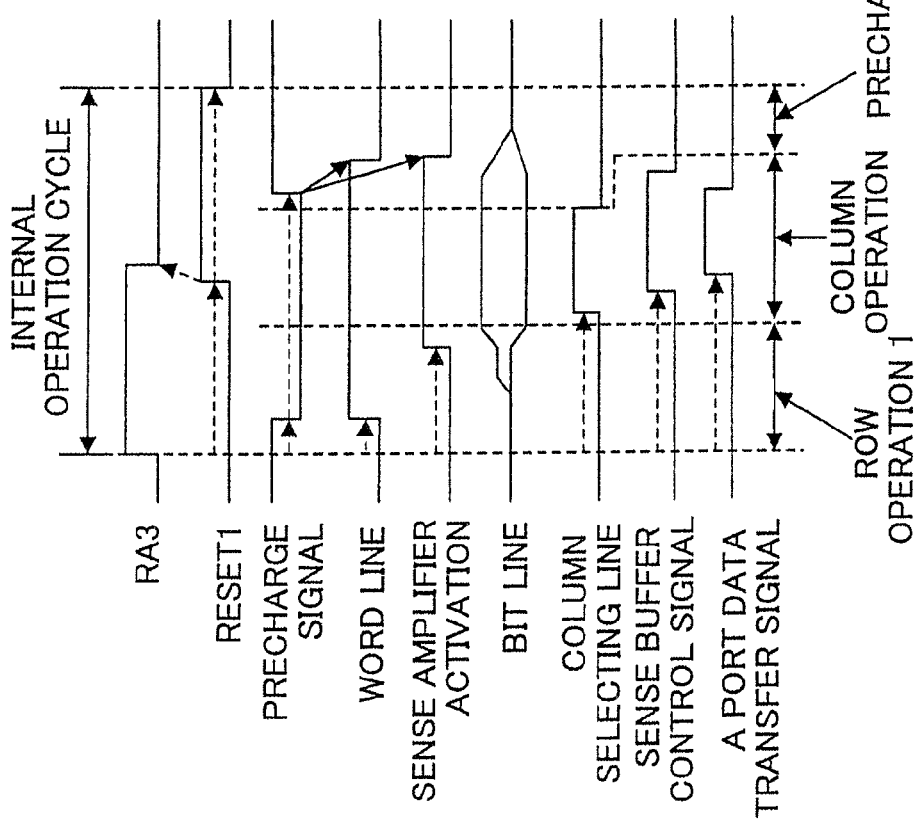

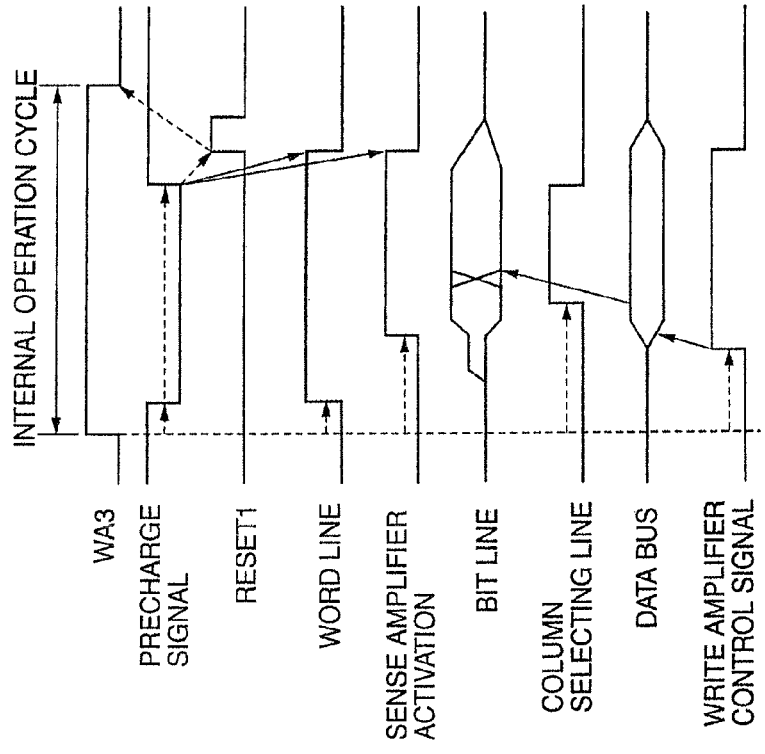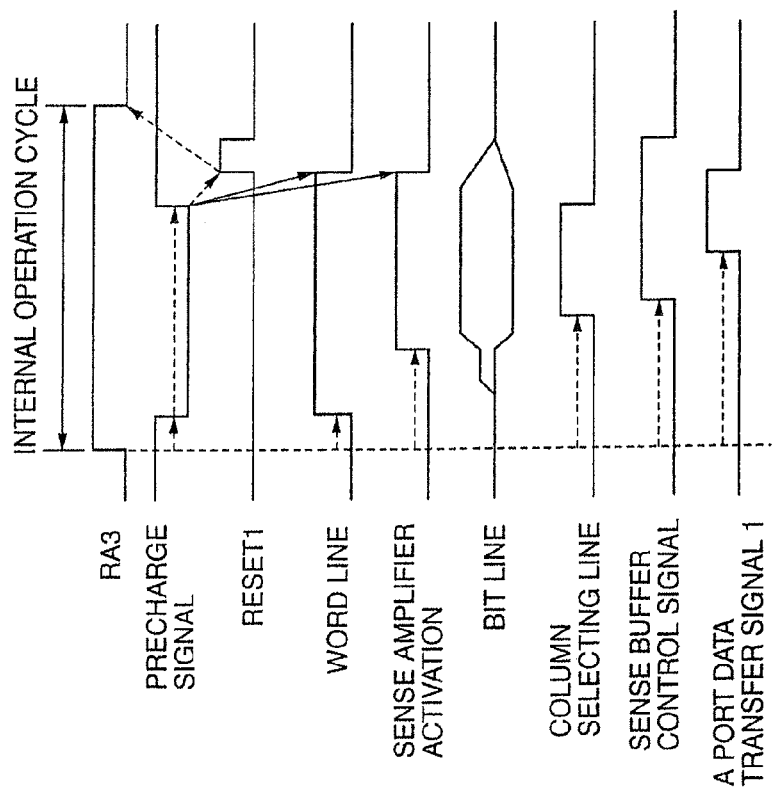

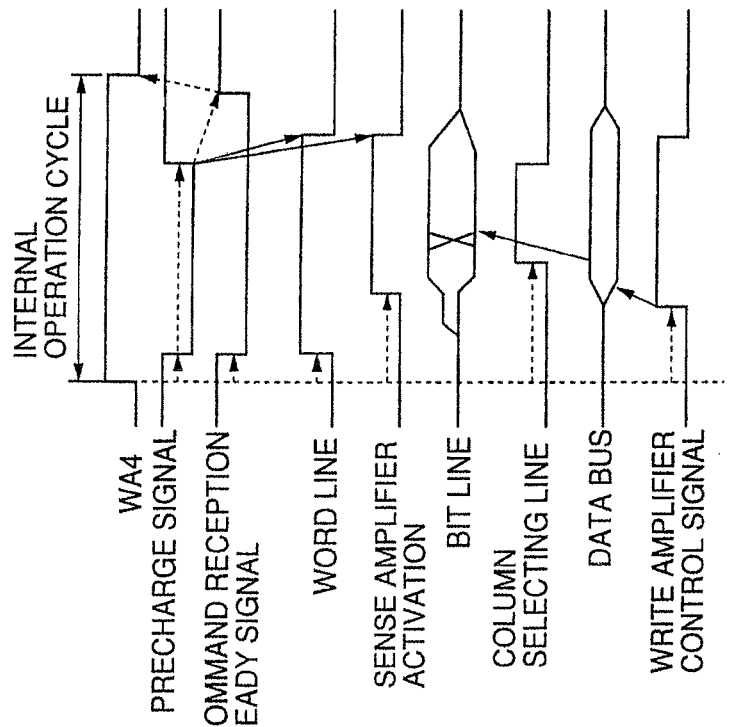
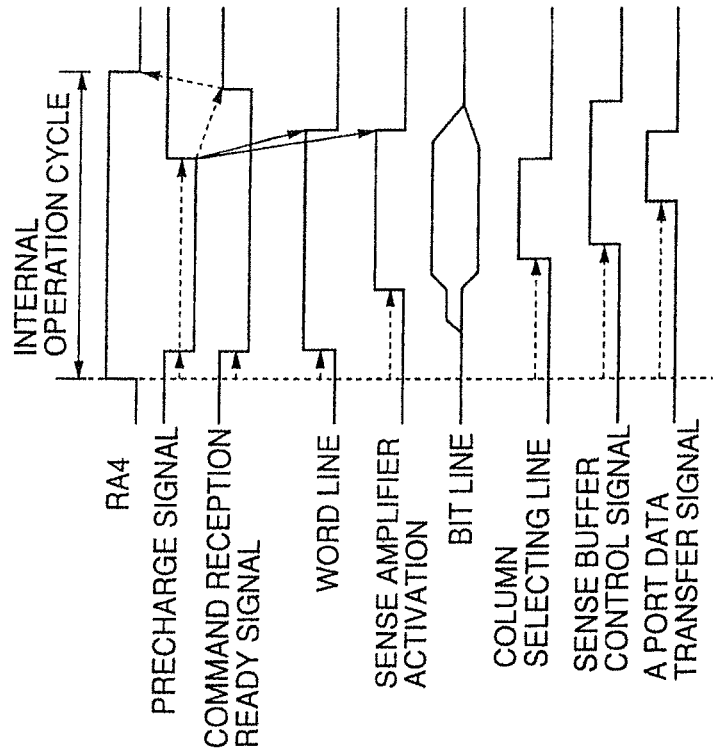

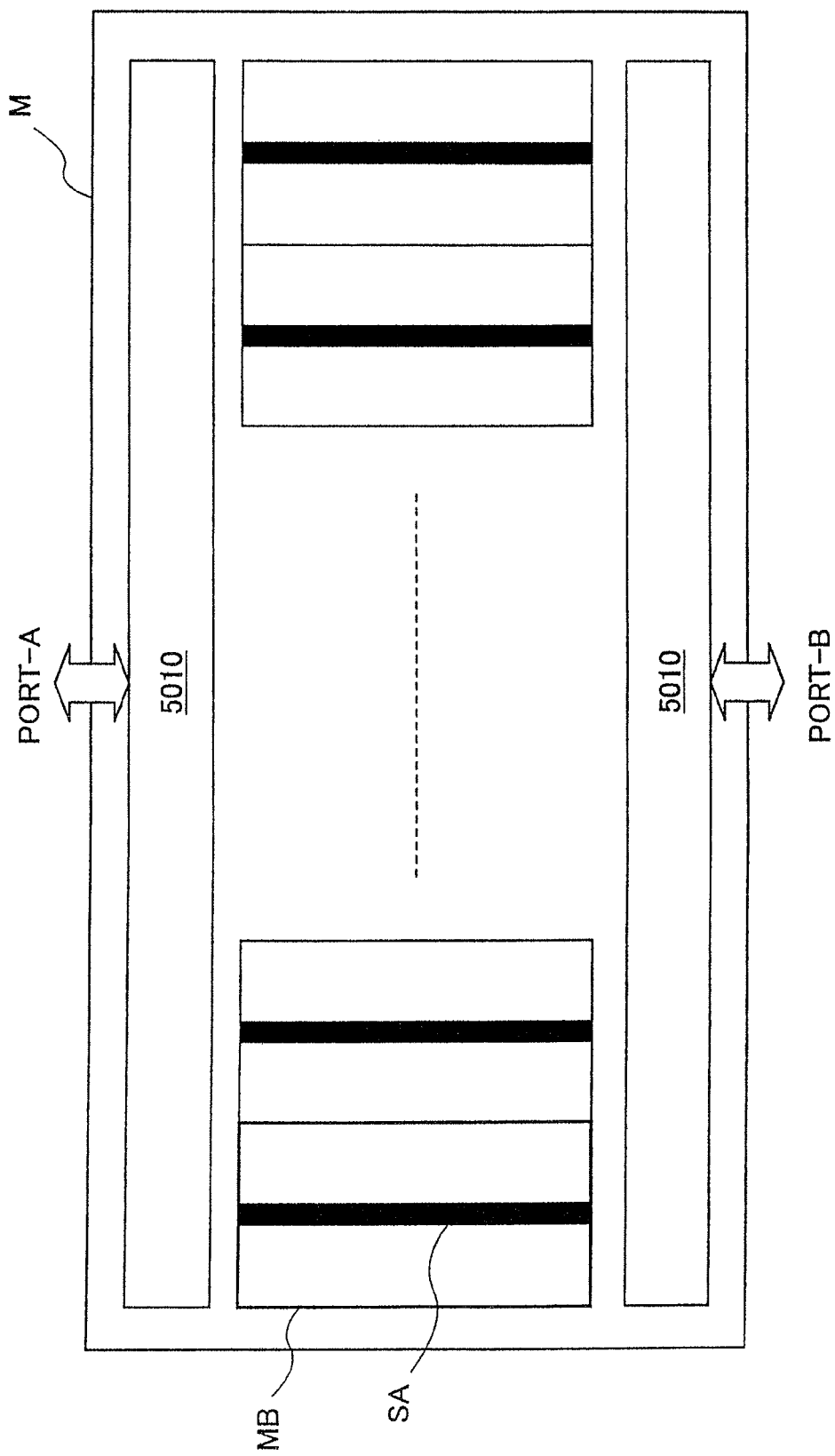

MULTI-PORT MEMORY BASED ON DRAM CORE

CROSS-REFERENCED TO RELATED APPLICATIONS

This Divisional Application is a Divisional Application of U.S. application Ser. No. 13/031,080, which is a Divisional Application of U.S. application Ser. No. 11/512,319, filed Aug. 30, 2006, which is a Divisional Application of U.S. application Ser. No. 10/284,092, filed Oct. 31, 2002, now U.S. Pat. No. 7,120,761, issued Oct. 10, 2006, which is a Continuation-In-Part Application of 09/968,516, filed Oct. 2, 2001, now abandoned, which claims priority of Japanese Application Nos.: 2000-387891, filed Dec. 20, 2000; 2000-399052, filed Dec. 27, 2000; 2000-398893, filed Dec. 27, 2000; 2001-034361, filed Feb. 9, 2001; 2001-037547, filed Feb. 14, 2001; and 2002-070514, filed Mar. 14, 2002. The disclosures of the prior applications are hereby incorporated herein in their entirety by reference.

BACKGROUND OF THE INVENTION

1. Field of the Invention

The present invention generally relates to semiconductor memory devices, and particularly relates to a semiconductor memory device equipped with a plurality of ports.

2. Description of the Related Art

Multi-port memories, which are semiconductor memory devices equipped with a plurality of ports, can be classified into various types. When the term "multi-port memory" is used hereinafter, it refers to a memory that is provided with a plurality of ports, and that allows access to be independently made from any one of the ports to a common memory array. Such a memory may have an A port and a B port, and allows a read/write operation to be conducted with respect to the common memory array independently from a CPU linked to the A port and from a CPU linked to the B port.

A multi-port memory is equipped with an arbitration circuit called an arbiter. The arbiter determines priority of access requests received from the plurality of ports, and a control circuit of a memory array attends to access operations one after another according to the determined priority. For example, the earlier the arrival of an access request to a port, the higher priority the access is given.

In such a case, since the memory array is accessed from the plurality of ports at random, it is necessary to reset the memory array immediately after a read or write access operation is carried out, thereby making sure to be prepared for next access. That is, if a word line is kept in the selected state in response to an access from a given port, and column addresses are successively shifted to read successive data as in a column access operation generally used in DRAMs, access from another port will be kept waiting during this operation. Accordingly, it is necessary to reset the memory array immediately after each read or write operation.

Conventionally, an SRAM has typically been used as a memory array of a multi-port memory. This is because an SRAM allows high-speed random accessing, and, also, non-destructive read operation is possible.

In a multi-port memory having two ports, for example, one SRAM memory cell is provided with two sets of word lines and bit line pairs. One of the ports performs a read/write operation by using one set of a word line and a bit line pair, and the other one of the ports performs a read/write operation by using the other set of a word line and a bit line pair. In this manner, read/write operations can be independently carried out from the two different ports. However, since it is impossible to perform two write operations simultaneously when the two ports attempt to write data in the same cell at the same time, one of the ports is given priority to perform the write operation, and the other one of the ports is given a BUSY signal. This is called a BUSY state.

As a system develops to have improved performance, the amount of data treated by the system also increases. As a result, a multi-port memory needs a large capacity. The SRAM-type multi-port memories, however, have a drawback in that the size of a memory cell is large.

In order to obviate this, it is conceivable to adopt a DRAM array in a multi-port memory. In order to attain a significantly higher circuit density than multi-port SRAMs, one DRAM memory cell used for a multi-port memory needs to be connected to only one word line and one bit line in the same manner as a typical DRAM cell. If memory blocks are implemented by using DRAM cells in such a manner, one of the ports cannot access a given block if another one of the ports is carrying out a read or write operation with respect to this block. This is because only a destructive read operation is possible in a DRAM cell. That is, when information is read, another word line in the same block cannot be selected until this information is amplified and restored in the cell and a word line and a bit line are precharged.

For this reason, if a given port accesses a memory block that is being accessed by another port, a BUSY state will be detected. A BUSY state occurs in an SRAM-type multi-port memory only when a plurality of ports simultaneously issues write requests to the same memory cell. On the other hand, a BUSY state occurs in a DRAM-type multi-port memory when a plurality of ports simultaneously issues any types of access requests to the same memory cell. Therefore, the probability of BUSY occurrence in the DRAM-type memory is significantly greater than the probability of BUSY occurrence of the SRAM-type memory. Further, once in a BUSY state, the DRAM-type multi-port memory suffers problems that desired operations cannot be performed, or that processing becomes slow due to a waiting time.

Moreover, unlike an SRAM-type multi-port memory, a DRAM-type multi-port memory needs a refresh operation to be periodically performed for the purpose of maintaining stored information, so that some measure has to be taken to insure proper refresh timing.

Accordingly, the present invention is aimed at providing a DRAM-type multi-port memory that obviates problems particularly associated with DRAMs.

SUMMARY OF THE INVENTION

It is a general object of the present invention to provide a semiconductor memory device (multi-port memory) that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a multi-port memory particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides a semiconductor memory device, including a plurality of N external ports, each of which receives commands, and an internal circuit which performs at least N access operations during a minimum interval of the commands that are input into one of the external ports.

Further, an arbitration circuit is provided that determines an order of command execution at which an internal circuit executes a plurality of commands input into N respective external ports.

In the invention described above, when commands are entered into N ports, all the N commands corresponding to the N ports are executed one after another within a minimum command cycle of any given port. Because of this, an access operation relating to any given port appears to the exterior of the device to be performed within the minimum command cycle. In this case, a BUSY signal can occur only when the same address is accessed from a plurality of ports. It is thus possible to attain a BUSY occurrence probability that is as low as a BUSY occurrence probability of an SRAM-type multi-port memory.

In the semiconductor memory device of the present invention, furthermore, the internal circuit includes a cell array comprised of dynamic-type memory cells and a refresh circuit that defines timings at which the memory cells are refreshed. In a first mode, the memory cells are refreshed in response to a refresh command input to at least one of the N external ports, and, in a second mode, the memory cells are refreshed at the timing that is specified by the refresh circuit.

The invention as described above is provided with the first operation mode in which a refresh operation is performed in response to an instruction from an external port and with the second operation mode in which a refresh operation is performed in response to the internal refresh circuit. Because of this configuration, one of the external ports is allowed to operate as a port for refresh management so as to receive refresh commands at constant internals, or the internal refresh circuit performs refresh operations if this port for refresh management is in a deactivated state. This makes it possible to manage refresh operations in a flexible manner according to system configurations.

BRIEF DESCRIPTION OF THE DRAWINGS

FIGS. 6A and 6B are circuit diagrams showing a configuration of the arbiter;

FIGS. 20A and 20B are timing charts showing operations of the DRAM core;

FIGS. 59A and 59B are drawings showing operations of a DRAM core;

FIGS. 100A and 100E are drawings showing operations of a DRAM core;

FIG. 111 shows a first embodiment of a multi-port memory according to the present invention (fifth aspect);

FIG. 121 shows operations performed when the cycles of the clock signals CLKA and CLKB are the same, and the phase of the clock signal CLKA is ahead of the phase of the clock signal CLKB by more than half a cycle;

FIG. 122 shows operations in the case where the row address signals RA almost simultaneously supplied to the input/output ports PORT-A and PORT-B differ from each other;

FIG. 123 shows a second embodiment of the multi-port memory and the method of controlling the multi-port memory according to the present invention (fifth aspect);

FIG. 124 shows a third embodiment of the multi-port memory and the method of controlling the multi-port memory according to the present invention (fifth aspect);

FIG. 125 shows details of an arbitration control circuit;

FIG. 126 shows operations of the arbitration control circuit performed when row address signals supplied to the input/output ports PORT-A and PORT-B match each other;

FIG. 127 shows the way a read operation is performed when the input/output ports PORT-A and PORT-B receive active commands ACT and the same row address signals RA;

FIG. 128 shows the way a read operation is performed when active commands ACT and mutually different row address signals RA are supplied to the input/output ports PORT-A and PORT-B;

FIG. 129 shows the way a write operation is performed when the input/output ports PORT-A and PORT-B receive active commands ACT and the same row address signals RA;

Figure 130:
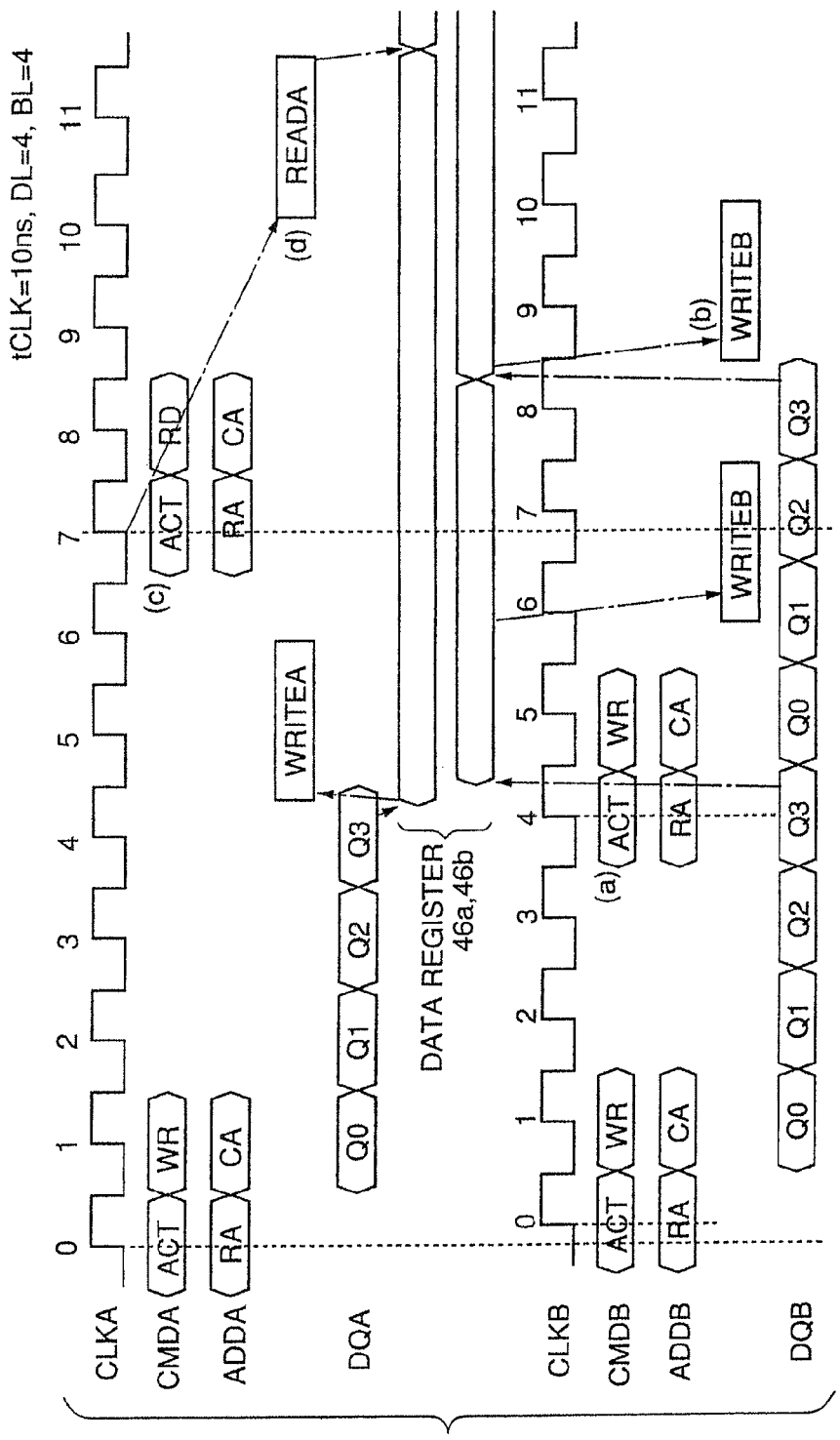
Figure 131:
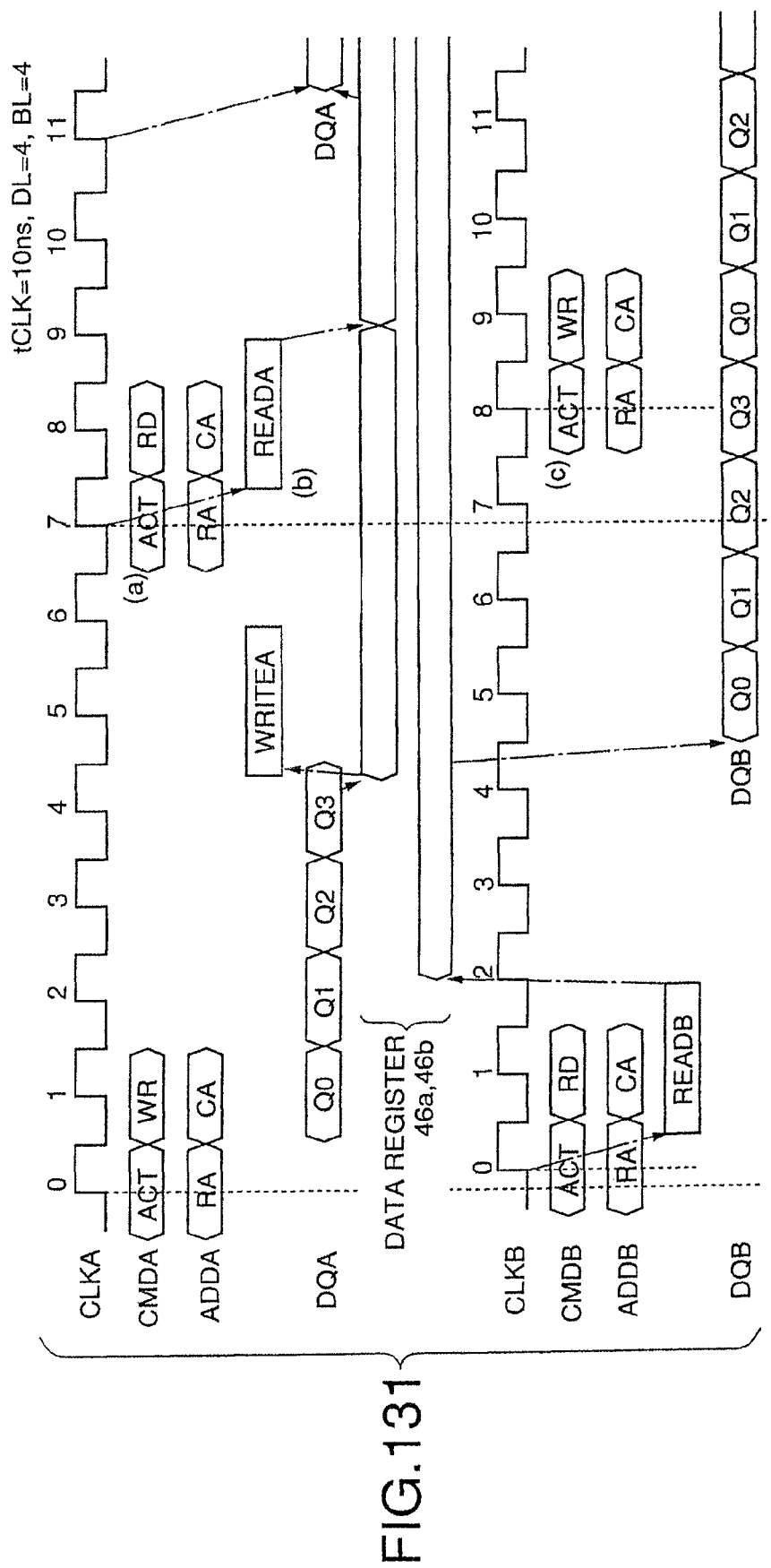
Figure 132:
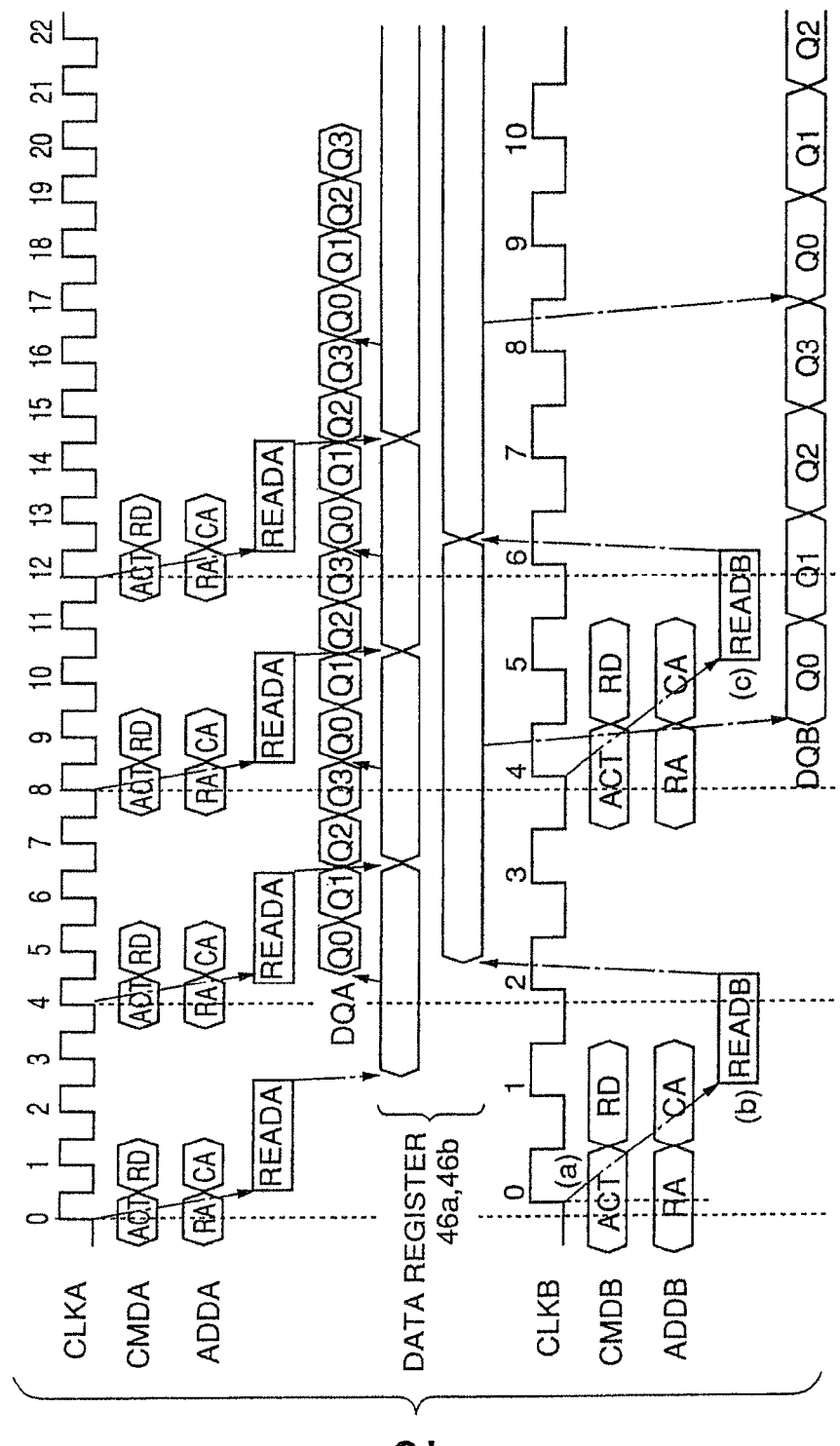
Figure 133:
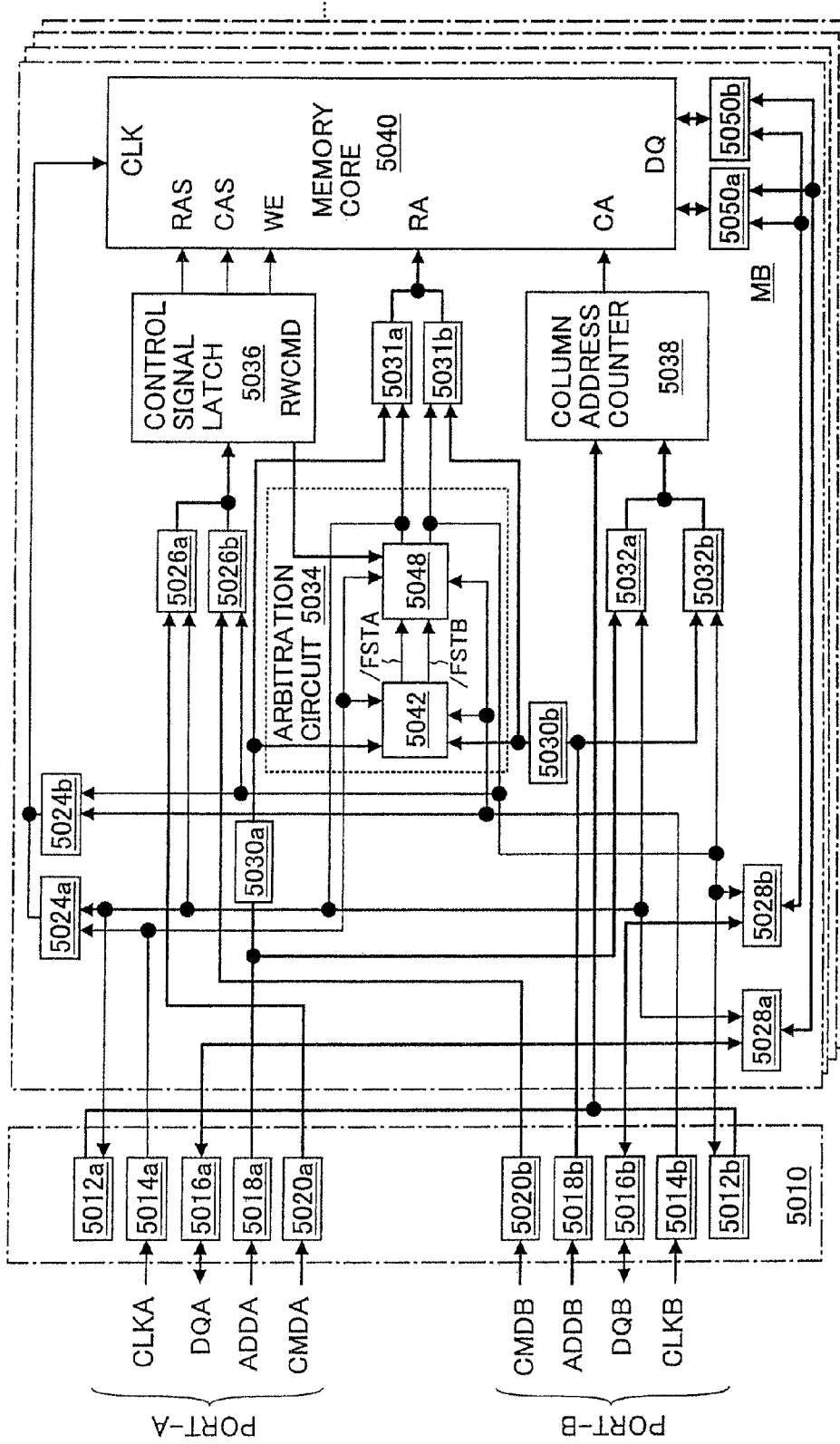
Figure 134:
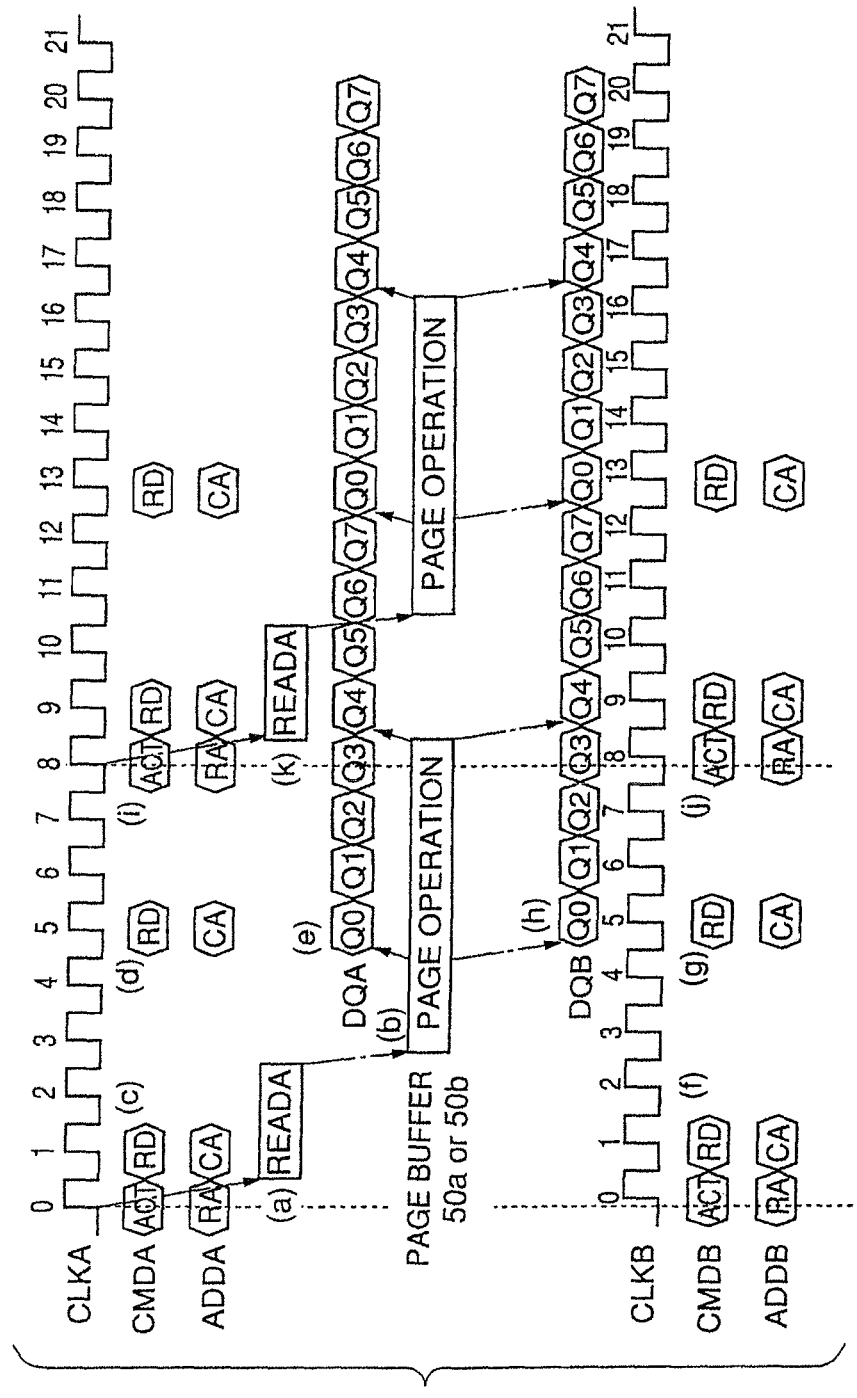
Figure 135:
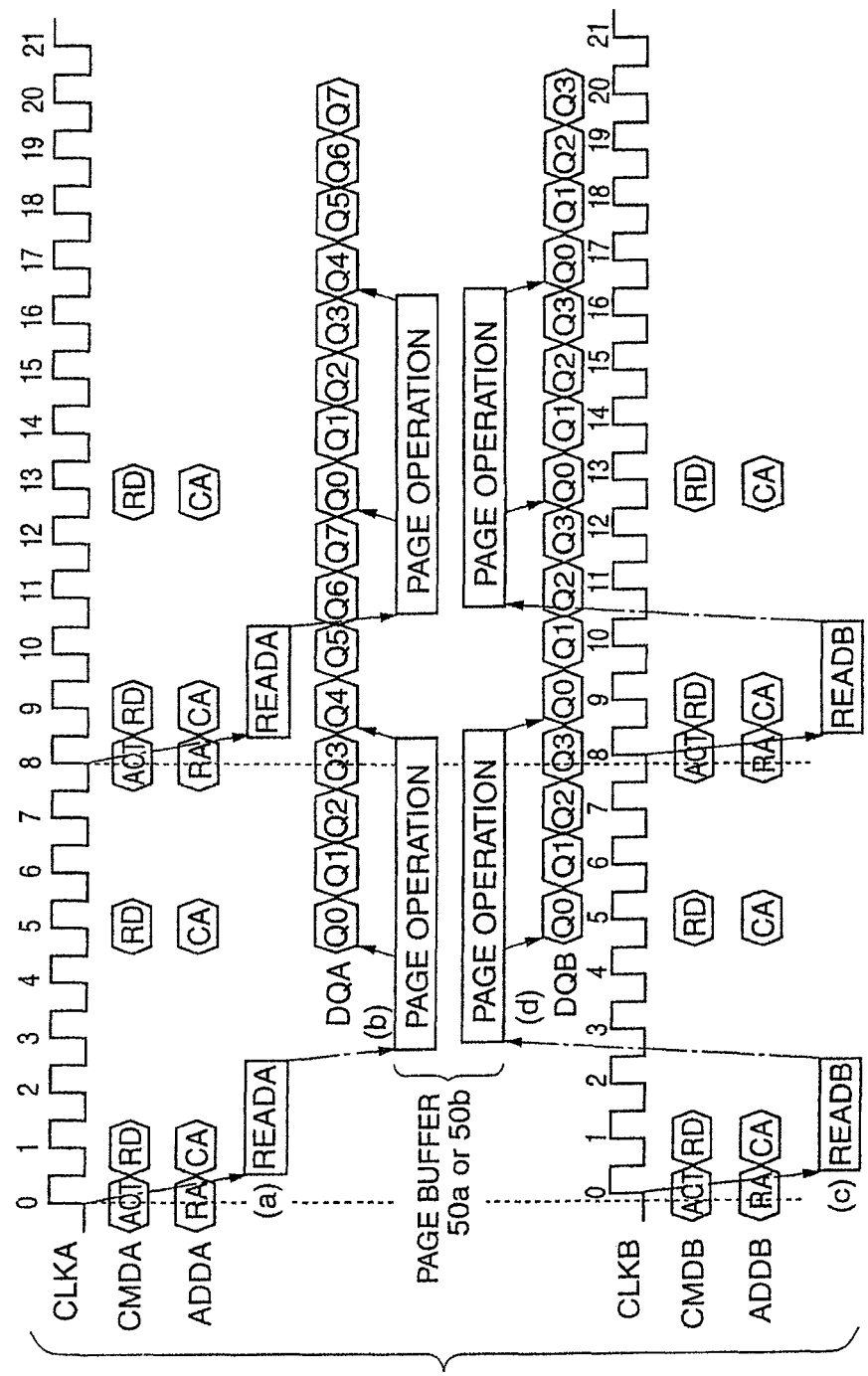
Figure 136:
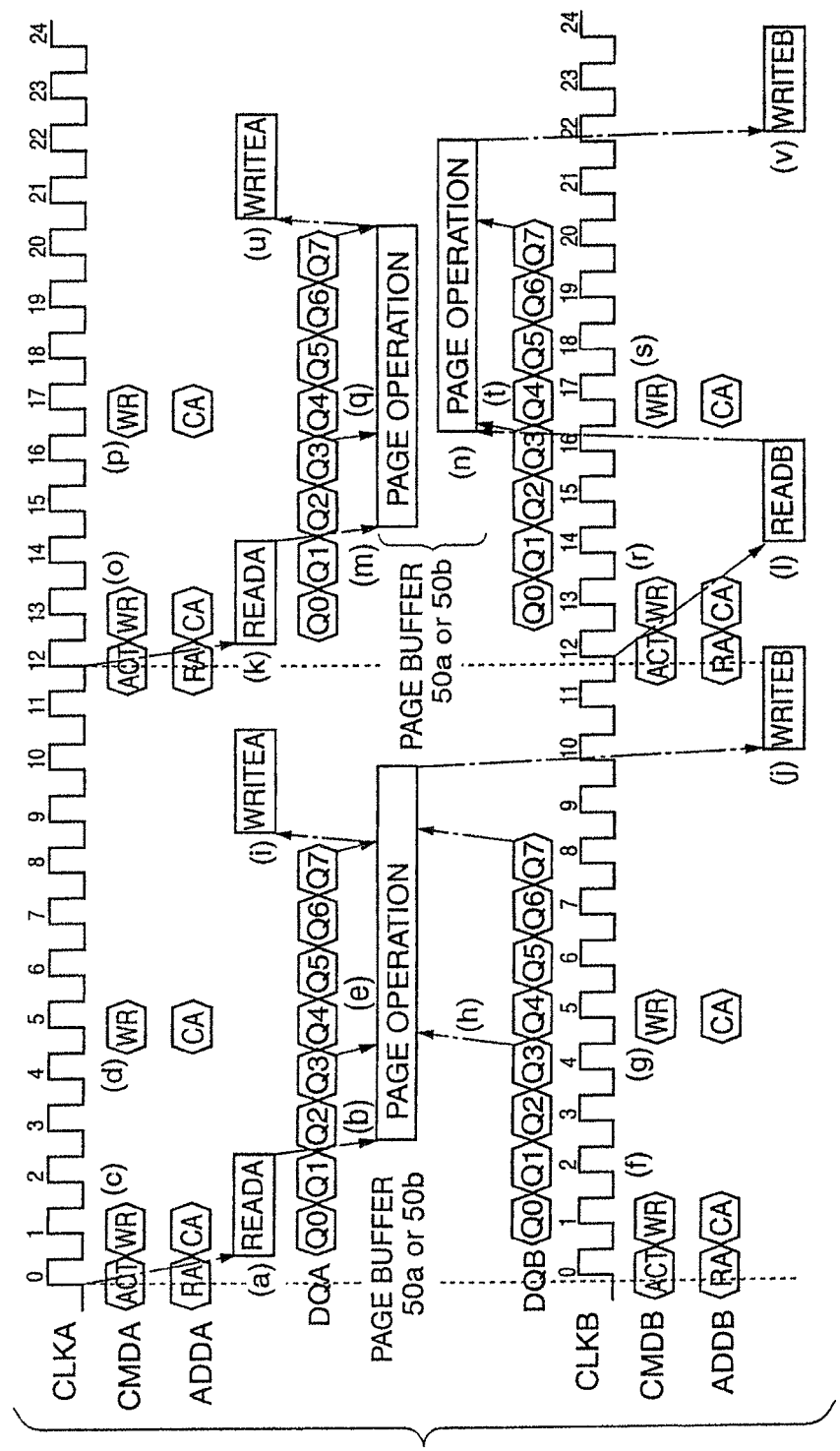
Figure 137:
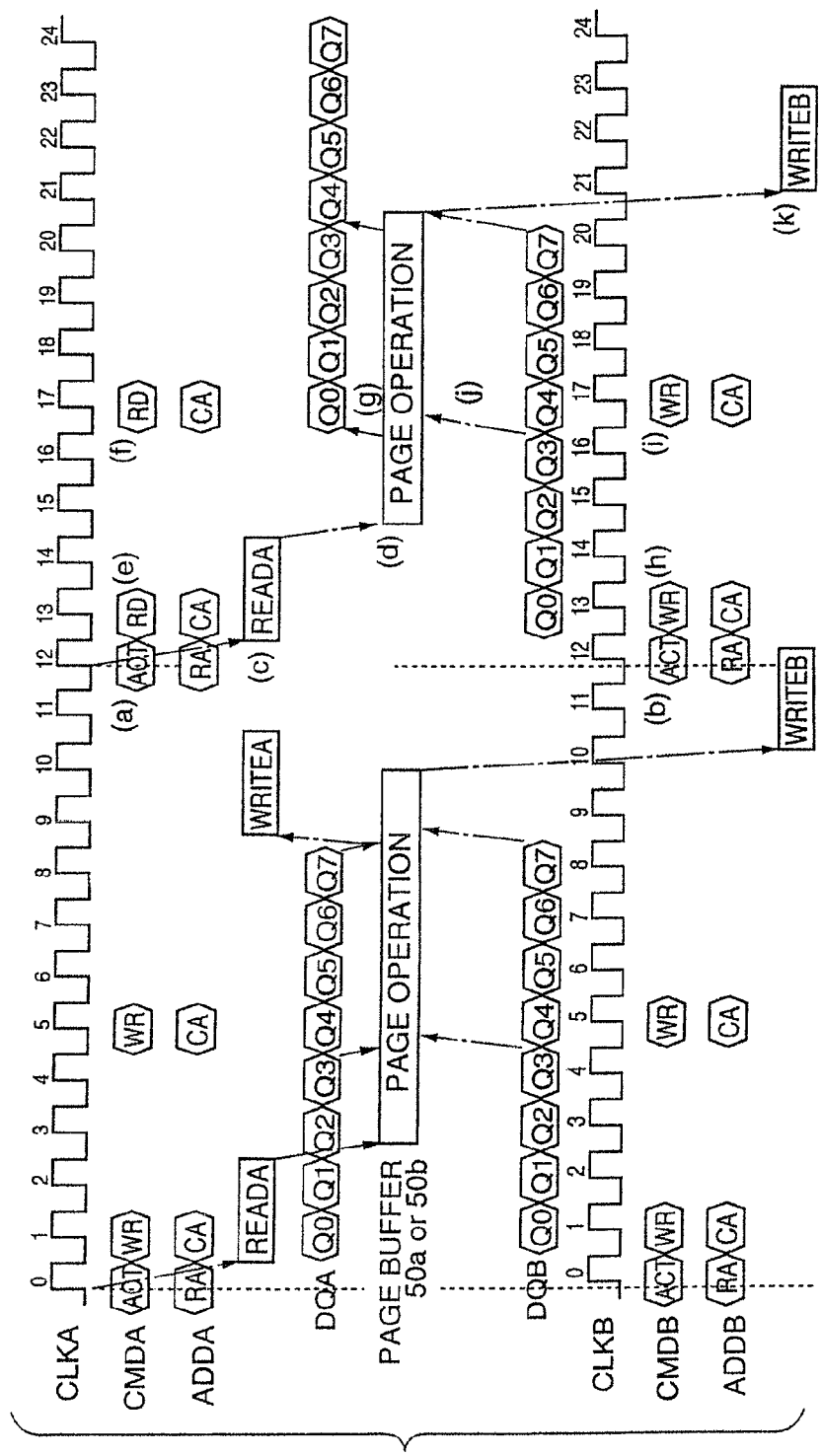
Figure 138:
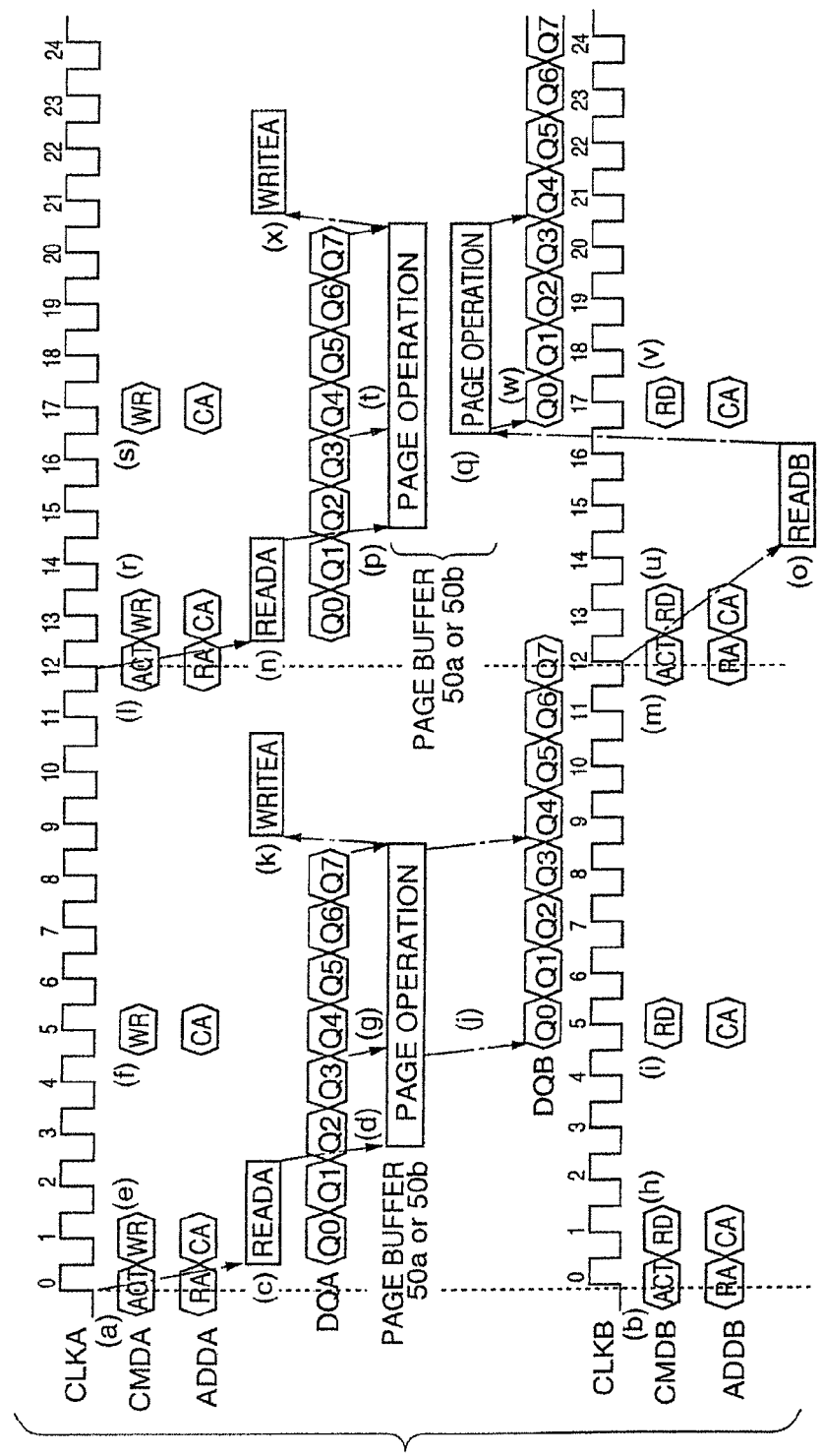
Figure 139:
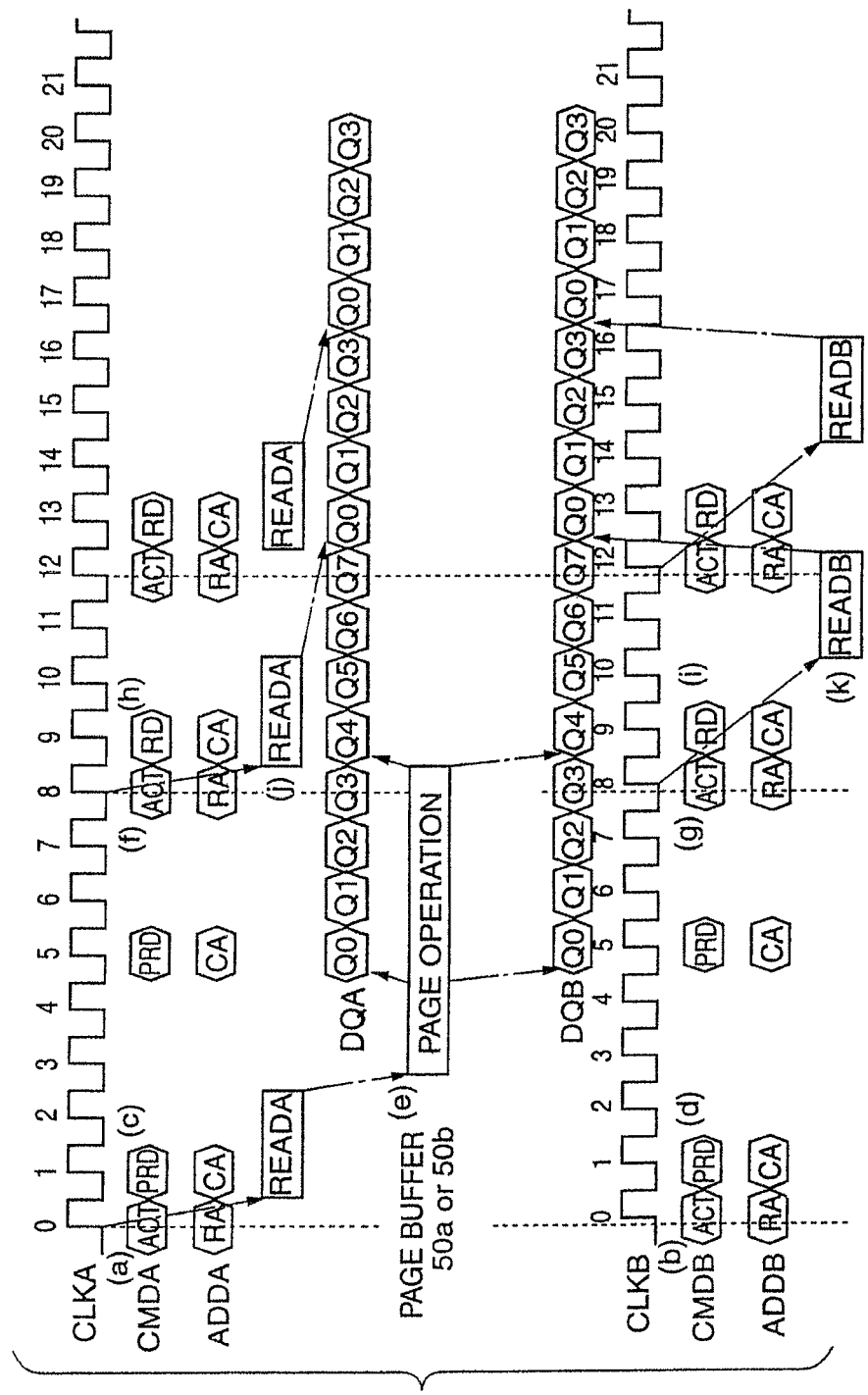
Figure 140:
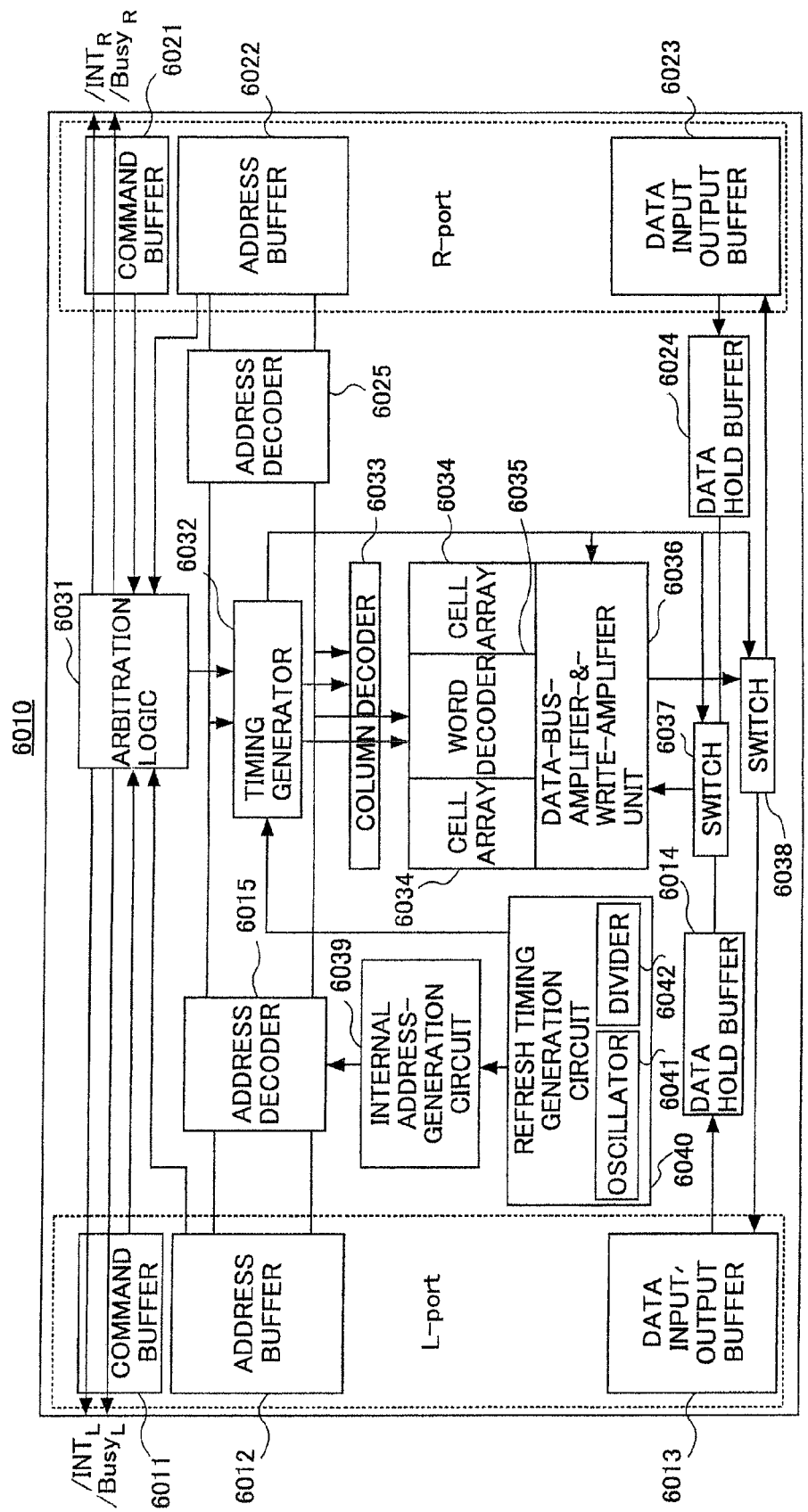
Figure 141:
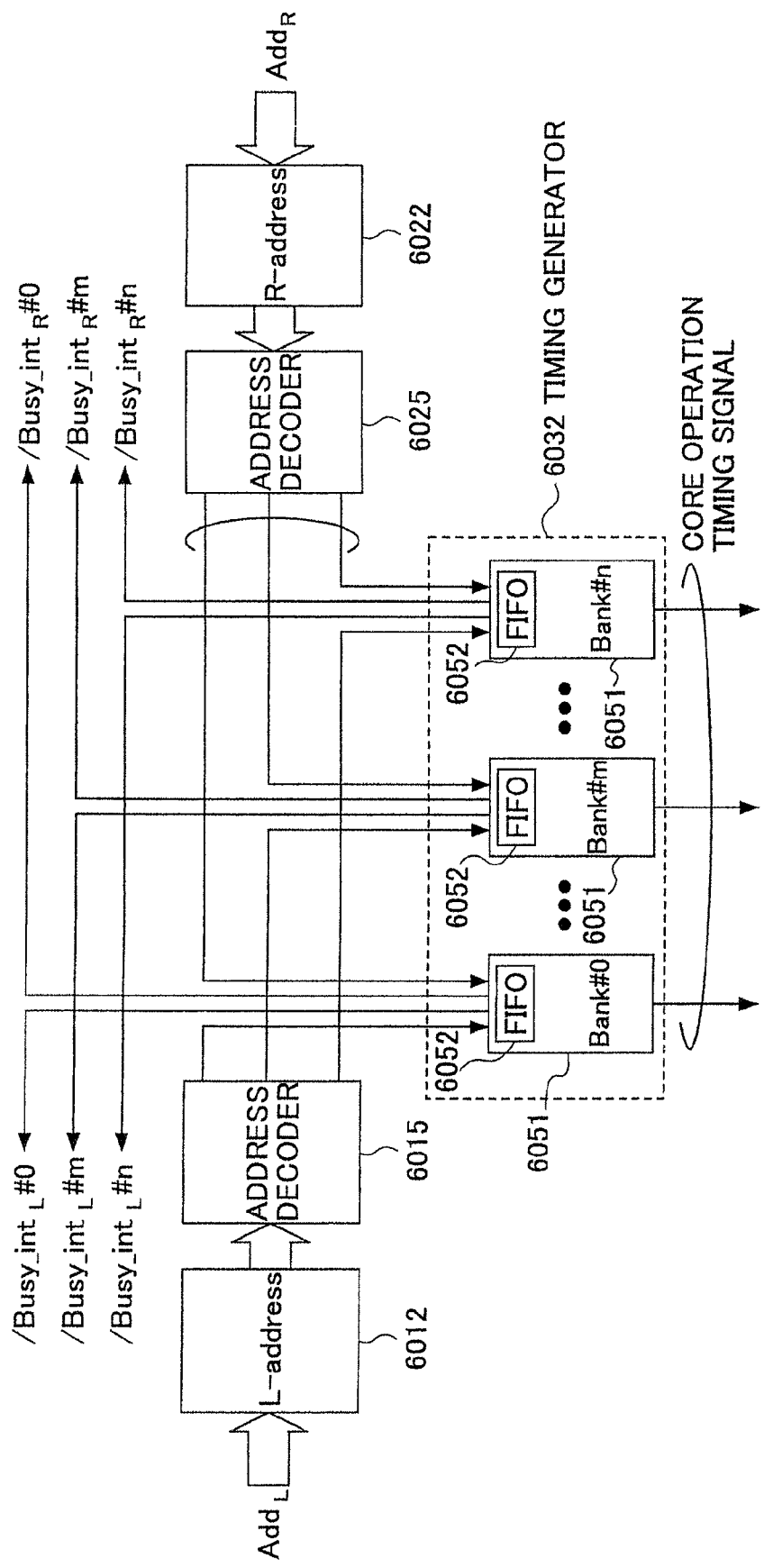
Figure 142:
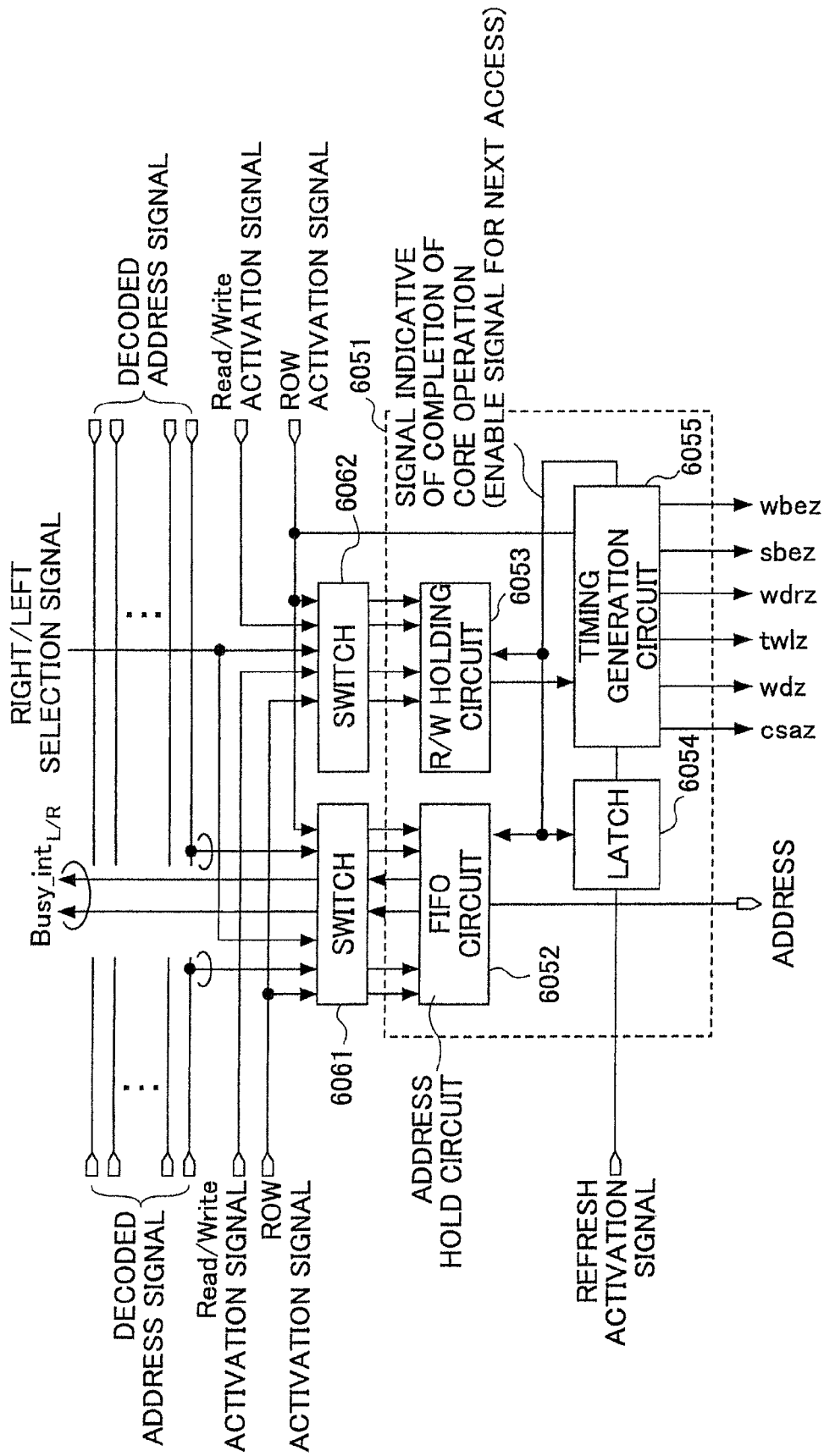
Figure 143:
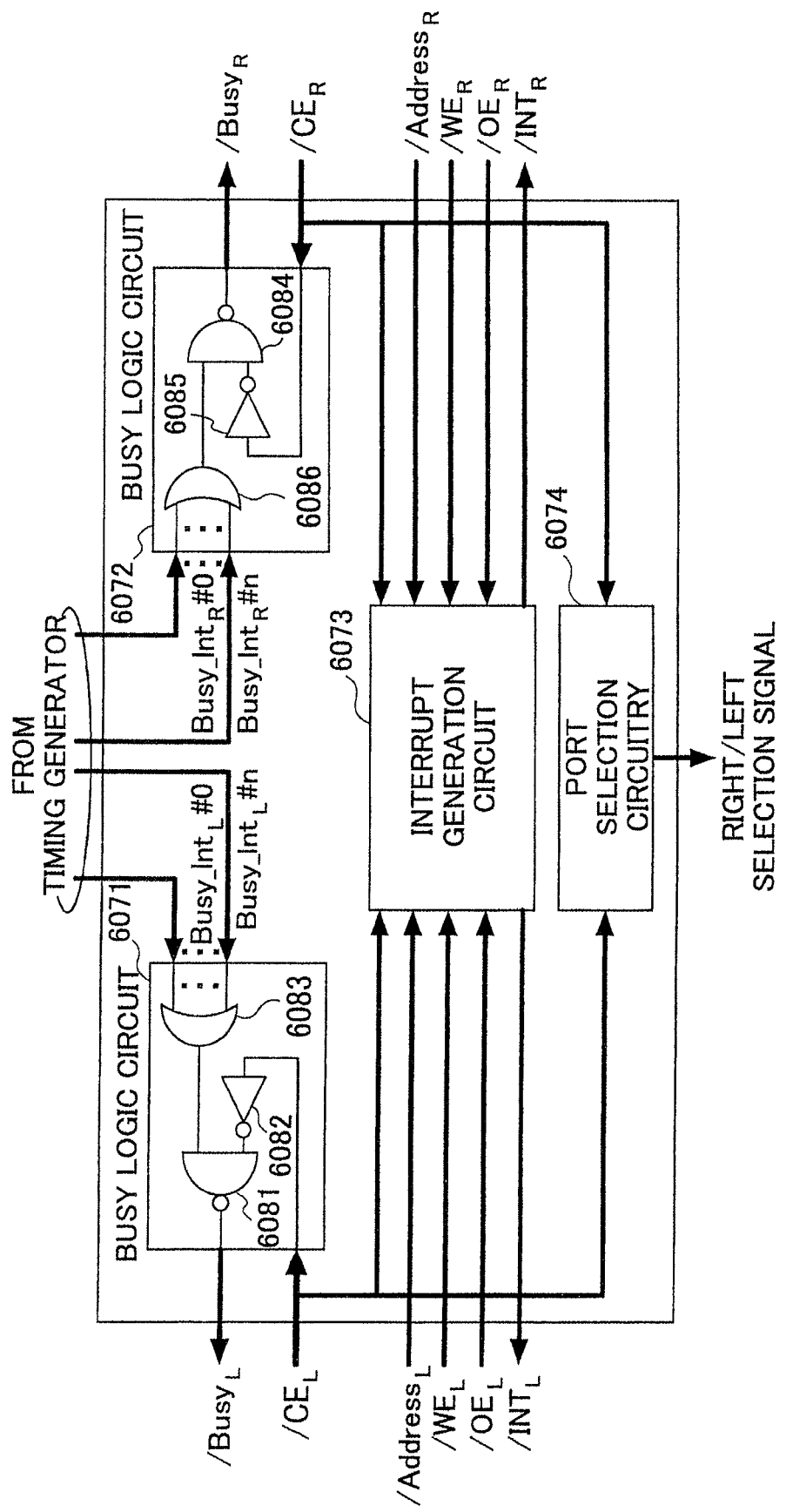
Figure 144:
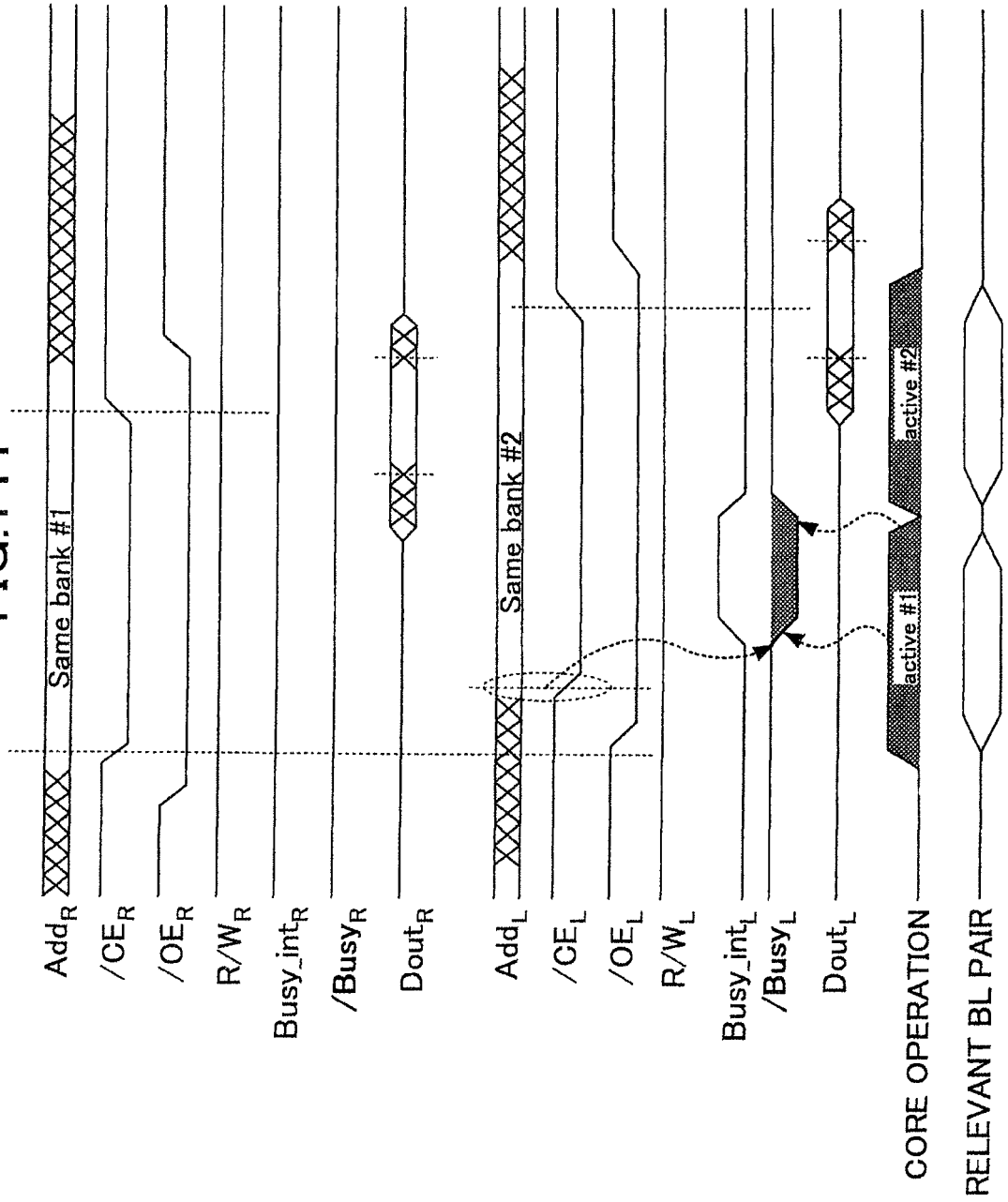
Figure 145:
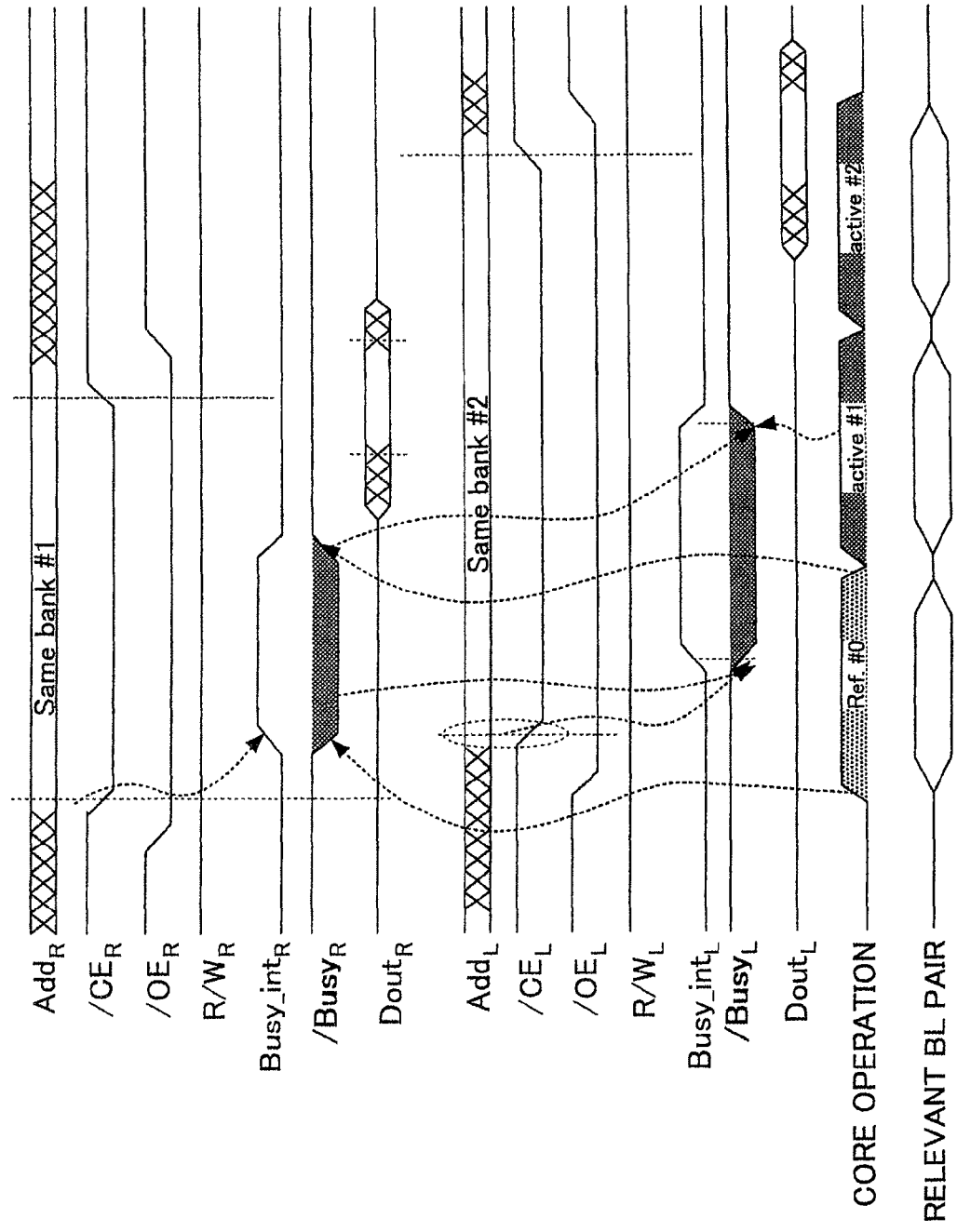
Figure 146:
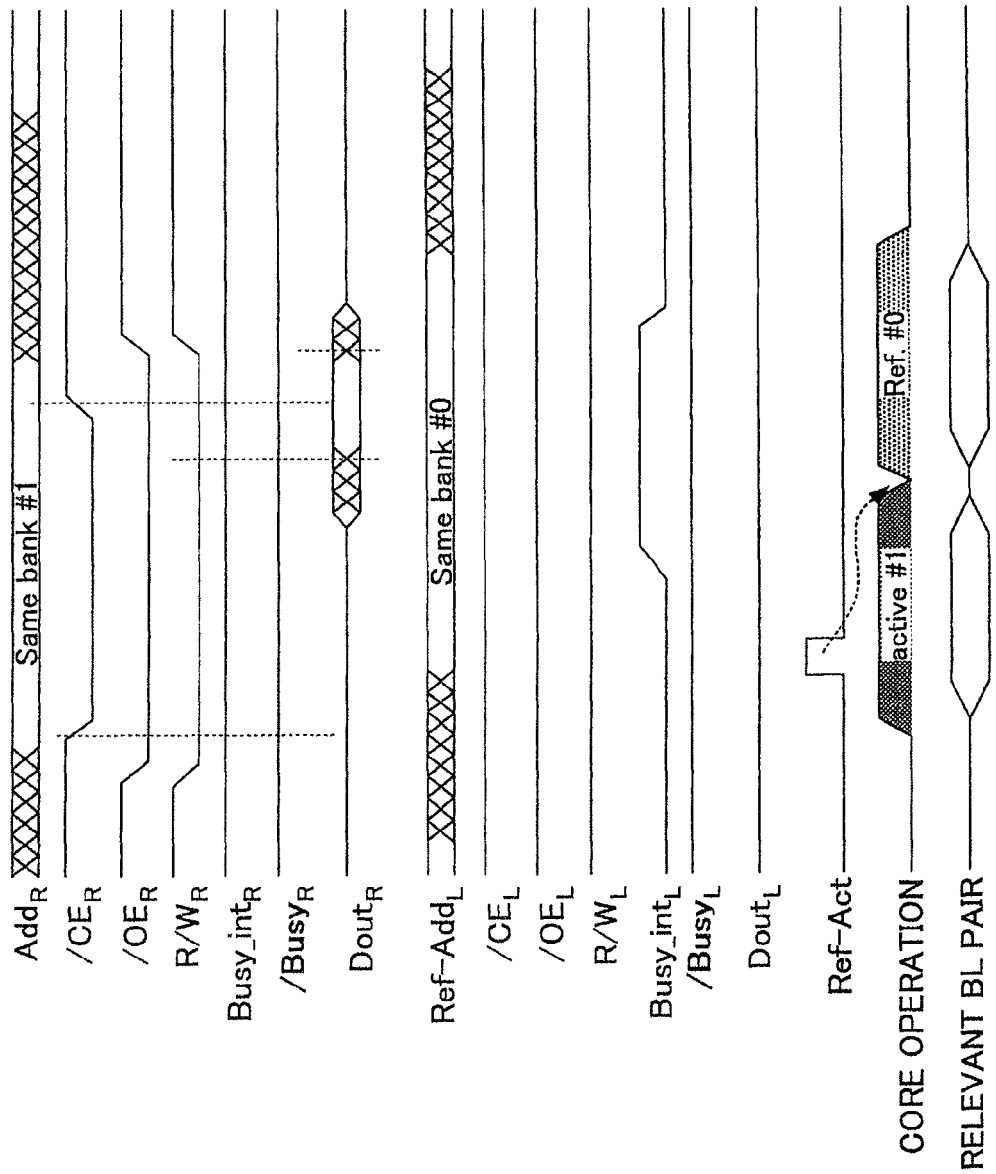

FIG. 130 shows a case in which a write operation and a read operation are successively performed with respect to the input/output port PORT-A and a write operation directed to the same row address signals RA as those of the write operation of the input/output port PORT-A and a write operation directed to the same row address signals RA as those of the read operation of the input/output port PORT-A are consecutively performed with respect to the input/output port PORT-B;

FIG. 131 shows a case in which a write operation and a read operation are successively performed with respect to the input/output port PORT-A, and a read operation directed to the same row address signals RA as those of the write operation of the input/output port PORT-A and a write operation directed to the same row address signals RA as those of the read operation of the input/output port PORT-A are consecutively performed with respect to the input/output port PORT-B;

FIG. 132 shows operations performed when the row address signals RA supplied to the input/output ports PORT-A and PORT-B match each other in the case of the clock signals CLKA and CLKB having different clock cycles;

FIG. 133 shows a fourth embodiment of the multi-port memory and the method of controlling the multi-port memory according to the present invention (fifth aspect);

FIG. 134 shows the way a read operation is performed when the input/output ports PORT-A and PORT-B receive active commands ACT and the same row address signals RA;

FIG. 135 shows the way a read operation is performed when active commands ACT and different row address signals RA are supplied to the input/output ports PORT-A and PORT-B;

FIG. 136 shows a case in which active commands ACT and the same row address signals RA are supplied to the input/output ports PORT-A and PORT-B, and write operations are performed, followed by active commands ACT and different row address signals RA being supplied, resulting in write operations being performed;

FIG. 137 shows a case in which active commands ACT and the same row address signals RA are supplied to the input/output ports PORT-A and PORT-B, and write operations are performed, followed by active commands ACT and the same row address signals RA being supplied, resulting in a read operation being performed in the input/output port PORT-A and a write operation being performed in the input/output port PORT-B;

FIG. 138 shows a case in which active commands ACT and the same row address signals RA are supplied to the input/output ports PORT-A and PORT-B, and a write operation and a read operation are performed, followed by active commands ACT and different row address signals RA being supplied, resulting in a write operation and a read operation being performed;

FIG. 139 shows operations of the multi-port memory according to a fifth embodiment of the multi-port memory and the method of controlling the multi-port memory of the present invention (fifth aspect);

FIG. 140 is a drawing showing an example of the configuration of a dual-port semiconductor memory device according to the present invention;

FIG. 141 is a block diagram showing the configuration of a timing generator in relation to the generation of Busy signals;

FIG. 142 is a block diagram showing the detailed configuration of a timing generator unit;

FIG. 143 is a block diagram showing the configuration of an arbitration logic in relation to Busy signal generation;

FIG. 144 is a timing chart showing core operations performed without intervals between an address #1 and an address #2;

FIG. 145 is a timing chart showing an operation when accesses are made to the same bank from the left port and the right port, and a refresh operation is also to be performed concurrently on the same bank;

FIG. 146 is a timing chart showing an operation when a refresh operation is requested during a core operation; and FIGS. 147A through 147D are illustrative drawings showing various bank configurations.

DESCRIPTION OF THE PREFERRED EMBODIMENTS

In the following, embodiments of the present invention will be described with reference to the accompanying drawings.

[First Aspect of the Invention]

The principle of the present invention (first aspect) will be described first.

Figure 1:
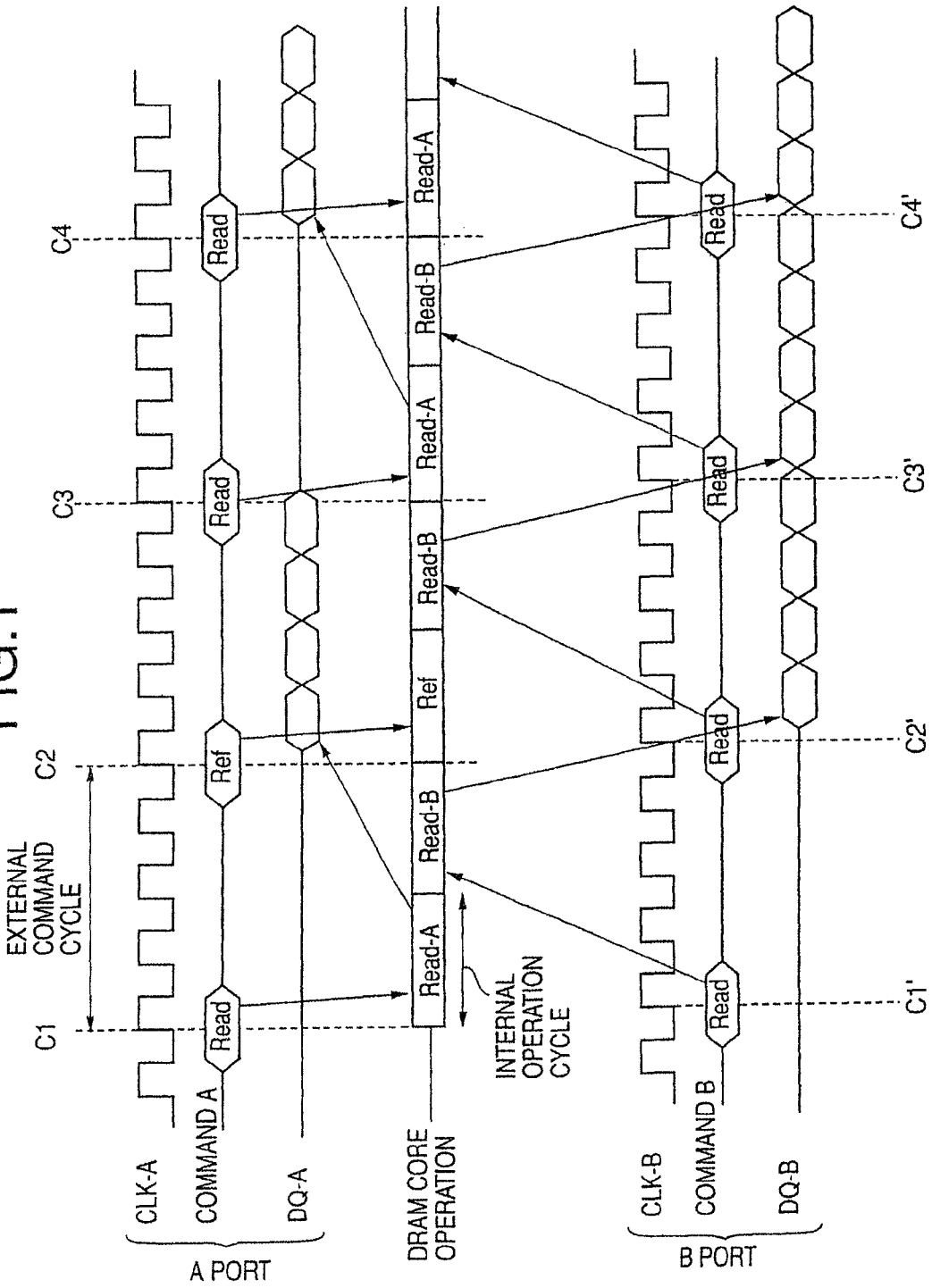
FIG. 1 is a drawing for explaining the principle of the present invention (first aspect)

FIG. 1 is a drawing for explaining the principle of the present invention (first aspect). Although FIG. 1 shows a drawing for explaining the principle in the case of two ports, the same operation is attainable even if two or more ports (N ports) are provided.

A time span equivalent to two cycles of internal-circuit (DRAM-core) operation is defined as one cycle of an external command cycle. That is, core operation cycles are double the rate of the external command cycles. Commands entered at an A port and a B port are processed by the internal memory at the double rate in such an order that the earlier an arrival of commands, the earlier the processing of the commands. Output data is then passed to each port. Namely, a series of operations including selection of a word line, amplification of data, selection of a column line, a read or write operation, and a precharge operation are performed in one core operation cycle, thereby completing an access operation with respect to the relevant memory block.

For example, at timing C1 of an, external command cycle relevant to the A port of FIG. 1, a Read command is entered at the A port. Further, at timing C1' of an external command cycle relevant to the B port, a Read command is entered at the B port. Since timing of the Read command of the A port is slightly earlier, this Read command is performed ahead of the Read command entered at the B port. Here, one external command cycle corresponds to four clock cycles. As shown in FIG. 1, each Read command is executed and completed in two clock cycles that correspond to one core operation cycle. Accordingly, in response to the Read commands entered at the A port and the B port at the intervals of four clock cycles that are equivalent to one external command cycle, read operations can be performed without generating a BUSY state even if the read access from the A port and the read access from the B port are directed to the same block. This is achieved by carrying out and completing each access in two clock cycles.

In this manner, even if the same memory block is simultaneously accessed by a plurality of ports, a BUSY state is not generated because the internal memory can attend to consecutive and continuous processing at double the speed.

Moreover, when a refresh command is given from an exterior of the device (e.g., at the A port) as shown in FIG. 1, a refresh operation can be performed inside the device without affecting access from another port (i.e., the B port in this example). In this case, one of the plurality of ports (i.e., the A port in the example of FIG. 1) may be selected as a port that attends to refresh management, and a refresh command may always be entered from this port.

Moreover, data output can take a form of a burst type that reads data from a plurality of column addresses in parallel, and that outputs data by converting the parallel data into serial data at the time of outputting. This increases a data transfer rate, and makes it possible to continuously output data in response to continuous Read commands.

Figure 2:
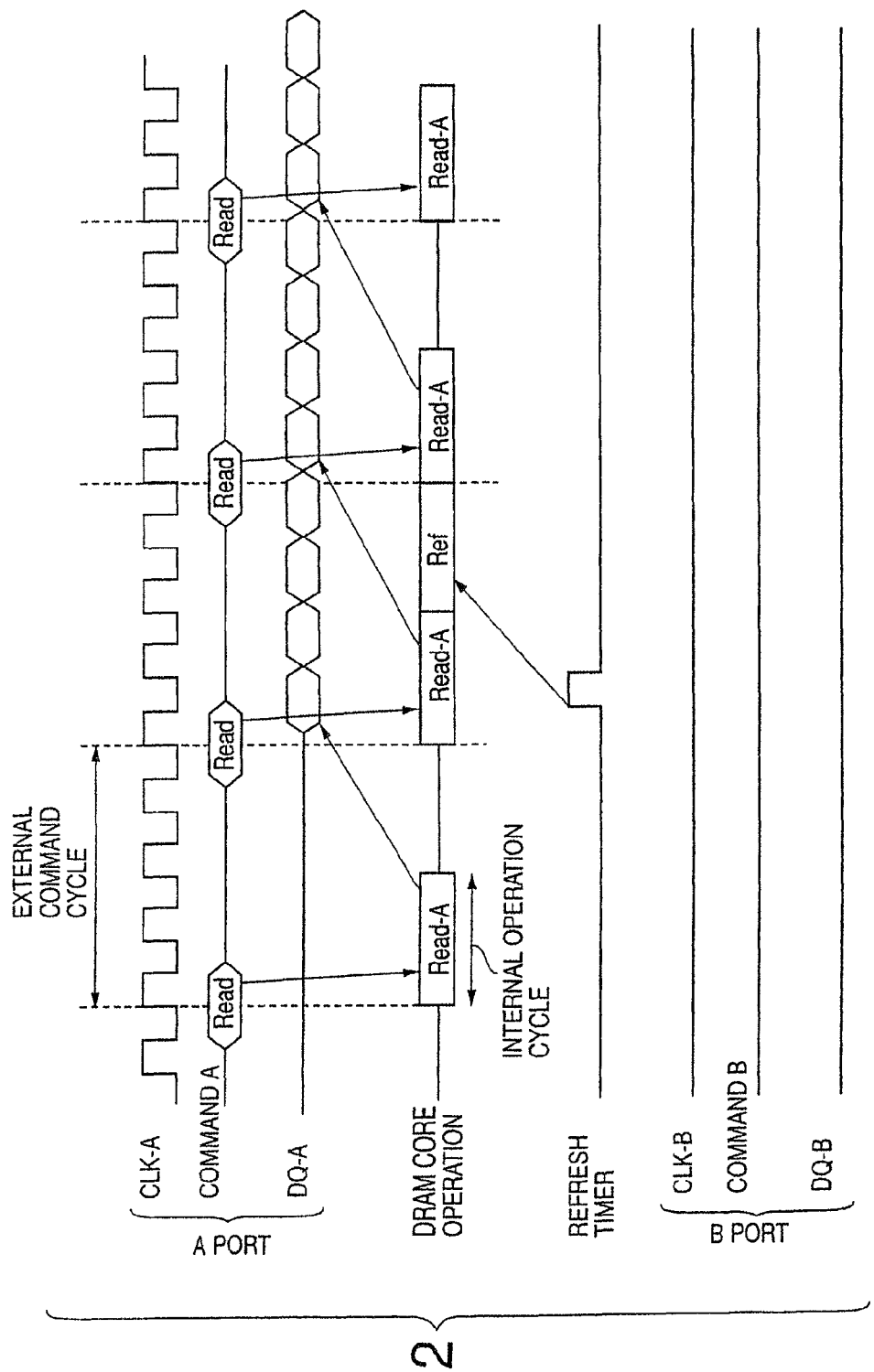
FIG. 2 is a drawing showing a refresh operation performed when only one of the ports is being used.

FIG. 2 is a drawing showing a refresh operation performed when only one of the ports is being used.

As shown in FIG. 2, when two ports, e.g., the A port and the B port, are provided, there is no need to let both ports operate. Provision of a refresh timer inside the device makes it possible to internally generate a refresh command. As shown in FIG. 2, for example, a refresh command can be internally generated when one of the ports (e.g., the B port) is not operating, thereby carrying out a refresh operation without affecting access made at the A port.

Consideration is now given to an example in which a controller A controls the A port, and a controller B controls the B port while attending to refresh management. In such a case, if there exists a function of internal refresh as described above, the B port can be stopped completely while only the A port is used. This achieves a reduction in power consumption by following changes of system operations.

Figure 3A:
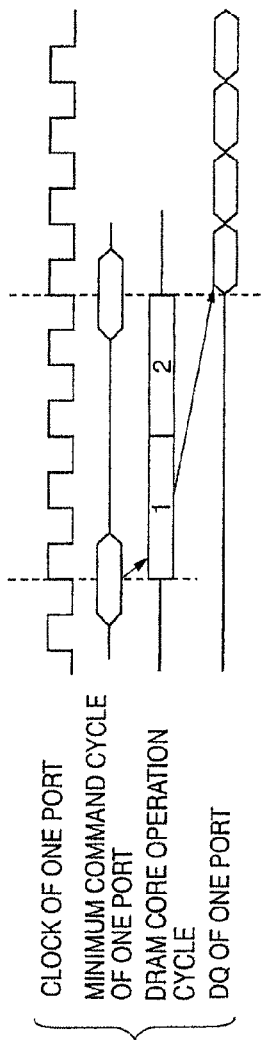
FIGS. 3A through 3C are drawings for explaining the principle of the present invention in the case of two ports, three ports, and N ports.
Figure 3B:
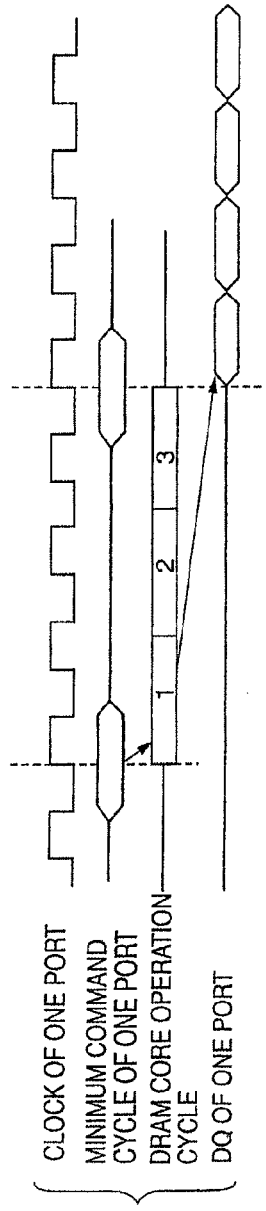
Figure 3C:
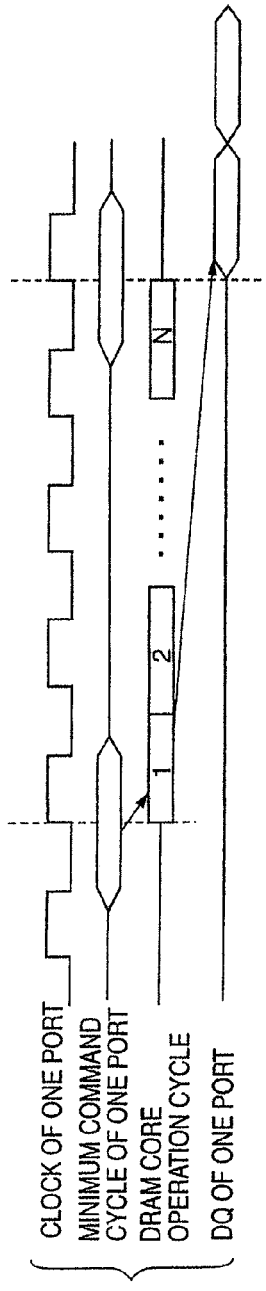

FIGS. 3A through 3C are drawings for explaining the principle of the present invention in the case of two ports, three ports, and N ports.

As described above, the present invention is also applicable to the multi-port memory of three or more ports. FIG. 3A shows operations of one port in the case where two ports are provided as shown in FIG. 1 and FIG. 2. FIG. 3B shows operations of one port in the case of three ports, and FIG. 3C shows the case of an N-port memory. As shown in FIG. 3C, the length of an internal operation cycle may properly be set to 1/N as long as the external command cycle in the case of the N-port memory.

In the following, a semiconductor memory device according to an embodiment of the present invention will be described.

Figure 4:
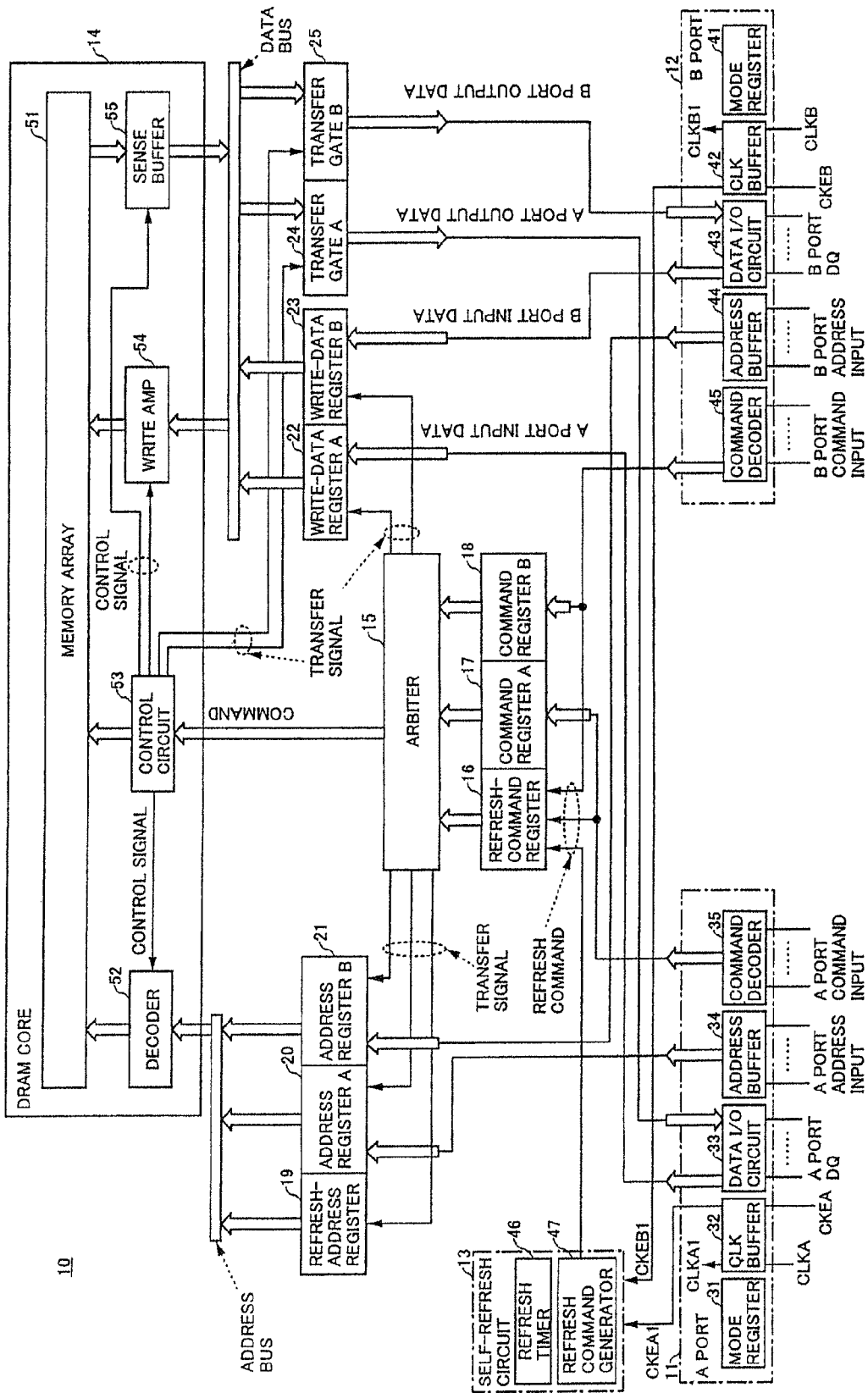
FIG. 4 is a block diagram showing a first embodiment of the multi-port memory according to the present invention (first aspect)

FIG. 4 is a block diagram showing a first embodiment of the multi-port memory according to the present invention. In this example, a configuration is such that two ports, i.e., an A port and a B port, are provided.

A multi-port memory 10 of FIG. 4 includes an A port 11, a B port 12, a self-refresh circuit 13, a DRAM core 14, an arbiter 15, a refresh-command register 16, a command register A 17, a command register B 18, a refresh-address register 19, an address register A 20, an address register B 21, a write-data register A 22, a write-data register B 23, a transfer gate A 24, and a transfer gate B 25.

The A port 11 includes a mode register 31, a CLK buffer 32, a data I/O circuit 33, an address buffer 34, and a command decoder 35. Further, the B port 12 includes a mode register 41, a CLK buffer 42, a data I/O circuit 43, an address buffer 44, and a command decoder 45. At the A port 11 and the B port 12, access to/from an external bus is established independently in synchronization with respective clock signals CLKA and CLKB. The mode registers 31 and 41 can store therein mode settings such as a data latency and a burst length with respect to respective ports. In this embodiment, both the A port 11 and the B port 12 are provided with the respective mode register, so that each port can make mode settings. However, a mode register may be arranged only in one of the ports, for example, such that settings for both ports may be made by making settings to this one port.

The self-refresh circuit 13 includes a refresh timer 46 and a refresh command generator 47. The self-refresh circuit 13 generates a refresh command inside the device, and receives signals CKEA1 and CKEB1 from the A port 11 and the B port 12, respectively. Signals CKEA1 and CKEB1 are signals obtained by buffering external signals CKEA and CKEB by the CLK buffers 32 and 42, respectively. The external signals CKEA and CKEB are used to suspend the clock buffers of respective ports and to deactivate the respective ports. If one of the A port 11 and the B port 12 is brought into a deactivated state, the self-refresh circuit 13 starts an operation thereof. Where a setting has been made in the mode registers 31 and 41 as to which one of the ports is responsible for refresh management, the self refresh circuit 13 may be activated when the port responsible for refresh management becomes inactive.

Further, the DRAM core 14 includes a memory array 51, a decoder 52, a control circuit 53, a WriteAmp 54, and a sense buffer 55. The memory array 51 stores therein data that was written and to be read, and includes DRAM memory cells, cell gate transistors, word lines, bit lines, sense amplifiers, column lines, column gates, etc. The decoder 52 decodes an address to be accessed. The control circuit 53 controls operations of the DRAM core 14. The WriteAmp 54 amplifies data to be written in the memory array 51. The sense buffer 55 amplifies data that is read from the memory array 51.

Inputs to the A port 11 are transferred to the address register A 20, the refresh-command register 16, the command register A 17, and the write-data register A 22. Further, inputs to the B port 12 are supplied to the address register B 21, the refresh-command register 16, the command register B 18, and the write-data register B 23. The arbiter (arbitration circuit) 15 determines an order in which commands were entered, in order to determine which command is given priority for processing between the A port 11 and the B port 12. In the order that is determined, the arbiter 15 transfers commands, addresses, and data (in the case of write operation) to the DRAM core 14 from the respective registers. The DRAM core 14 operates based on the received data. In the case of a Read command, data read from the DRAM core 14 is transmitted to the port where the corresponding command was input, and is then converted from parallel data to serial data, followed by being output in synchronization with the clock of this port.

Figure 5:
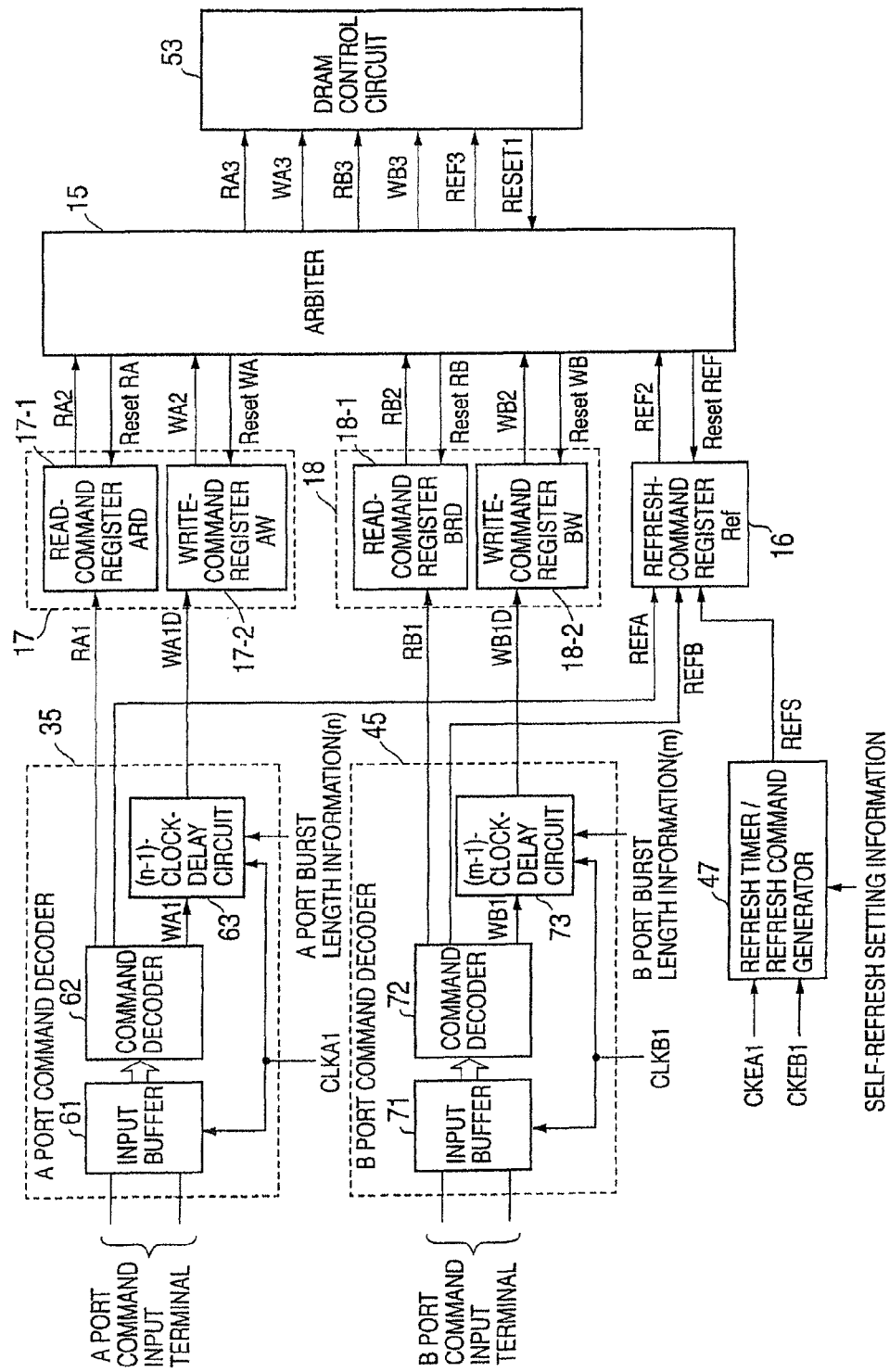
FIG. 5 is a block diagram of circuitry relevant to the command input to an arbiter.

FIG. 5 is a block diagram of circuitry relevant to the command input to the arbiter 15.

The command decoder 35 includes an input buffer 61, a command decoder 62, and an (n−1)-clock-delay circuit 63. Moreover, the command decoder 45 includes an input buffer 71, a command decoder 72, and an (n−1)-clock-delay circuit 73. The command register A 17 includes a read-command register 17-1 and a write-command register 17-2. Moreover, the command register B 18 includes a read-command register 18-1 and a write-command register 18-2.

In the case of a Read command, a command input to the input buffer 61 or 71 is transmitted to the read-command register 17-1 or 18-1 through the command decoder 62 or 72, respectively, without any timing manipulation. In the case of a Write command, an entered command is delayed (n−1) clocks by the (n−1)-clock-delay circuit 63 or 73, and is then transferred to the write-command register 17-2 or 18-2 at timing when the n-th data (i.e., last data) of a series of burst data to be written is input.

In the case of a refresh command, a refresh command supplied from the A port 11, the B port 12, or the refresh-command generator 47 is transferred to the refresh-command register 16. Since the occurrence of refresh commands is not so frequent, there is no need to provide a plurality of refresh-command registers. Further, self-refresh setting information that is input to the refresh-command generator 47 is supplied from the mode registers 31 and 41, and indicates which one of the ports is responsible for refresh management.

The arbiter 15 detects an order in which the commands were transferred to the respective command registers, and transmits the commands one after another to the DRAM control circuit 53 in this order.

When receiving a command (or when coming close to an end of command execution), the DRAM control circuit 53 generates a RESET1 signal, letting the arbiter 15 be prepared for a next command. In the particular configuration of this embodiment, the DRAM control circuit 53 receives the next command when the RESET1 signal is terminated.

Upon reception of the RESET1 signal, the arbiter 15 supplies one of reset signals ResetRA, ResetWA, and ResetRB, ResetWB and ResetREF to a corresponding one of the command register A 17, the command register B 18, and the refresh command registers 16. Through this operation, the command register storing therein a command that has been transferred to the DRAM core 14 is reset, and the following command is prepared in this command register.

FIGS. 6A and 6B are circuit diagrams showing a configuration of the arbiter 15.

As shown in FIG. 6A, the arbiter 15 includes comparators 80-1 through 80-10, AND circuits 81-1 through 81-5, AND circuits 82-1 through 82-5, AND circuits 83-1 through 83-5, the delay circuits 84-1 through 84-5, inverters 85 through 87, a NAND circuit 88, and inverters 89 and 90. The comparators 80-1 through 80-10 each have the same circuit configuration, and, as shown in FIG. 6B, includes NAND circuits 91 and 92, and inverters 93 and 94.

A read-command signal RA2 and a write-command signal WA2 from the command register A 17, a read-command signal RB2 and a write-command signal WB2 from the command register B 18, and a refresh command REF2 from the refresh-command register 16 are supplied to the arbiter 15. With respect to all of the ten combinations obtained by choosing two of the five command signals, the 10 comparators 80-1 through 80-10 determines which one is earlier than the other in terms of the timing of command arrivals.

Each comparator compares the timings of two commands, and sets to HIGH one of the outputs that corresponds to the input that has received HIGH ahead of the other input. For example, each of the comparator 80-1 through 80-4 determines which one is the earlier of the read-command signal RA2 from the A port 11 or a corresponding one of the four other commands. If the read-command signal RA2 is earlier than any of the four other commands, a read-command signal RA31 output from the AND circuit 81-1 is set to HIGH. When the RESET1 signal is LOW, this read-command signal RA31 is supplied to the DRAM core 14 from the arbiter 15 as a read-command signal RA3.

When the DRAM core 14 receives the command, the DRAM core 14 generates the RESET1 signal that is HIGH. This RESET1 signal is converted into a pulse signal by the inverter 85 through 87, the NAND circuit 88, and the inverter 89, and is supplied to the AND circuit 83-1 through 83-5. When the Read command signal RA31 is HIGH, for example, a signal (ResetRA) that resets the command register having the received command therein is generated through the delay circuit 84-1.

Figure 7:
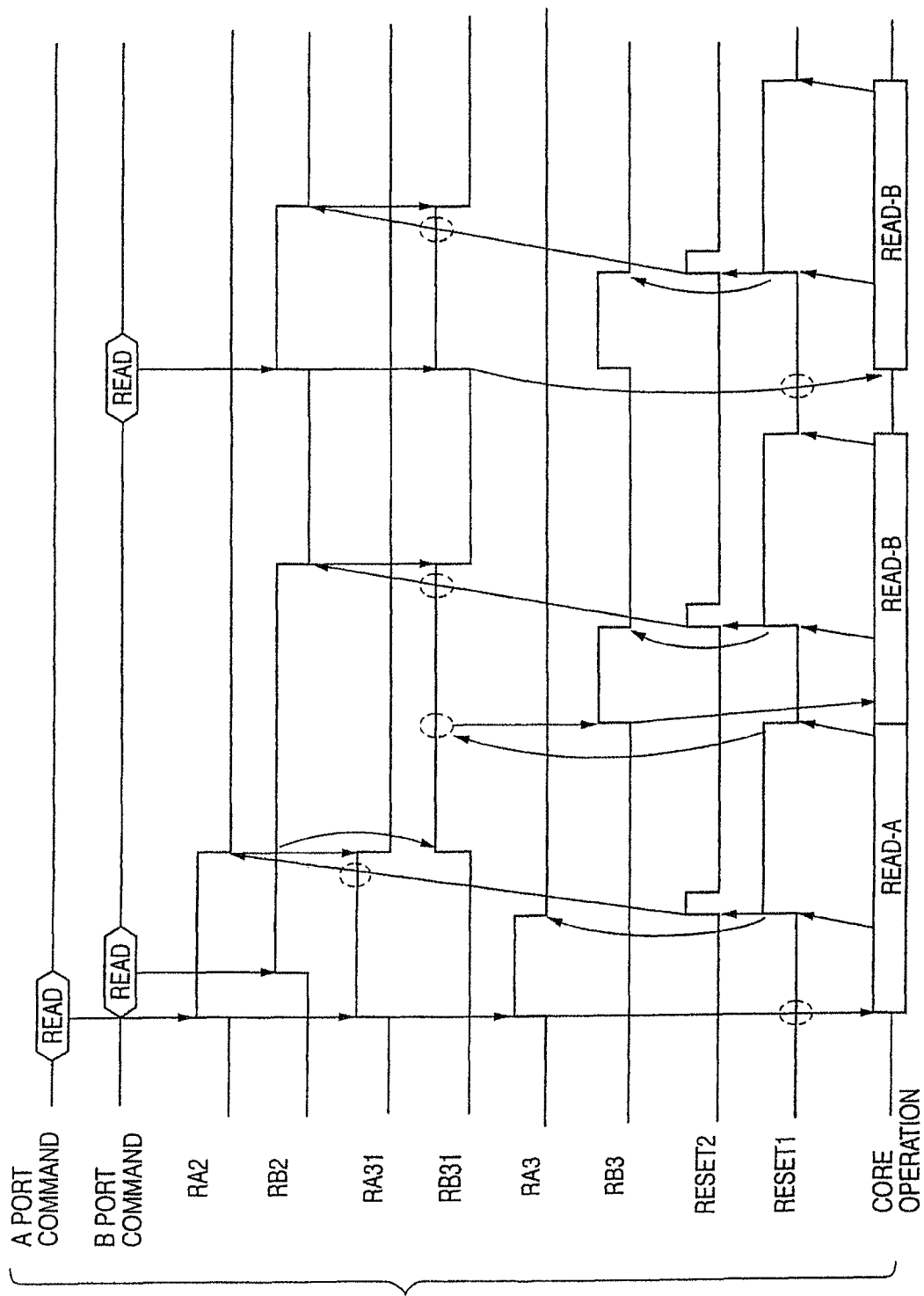
FIG. 7 is a timing chart that shows operation of the arbiter.

FIG. 7 is a timing chart that shows operation of the arbiter 15.

Signals having names listed in FIG. 7 are shown in respective positions of FIG. 6A. FIG. 7 shows operations of the arbiter 15 when Read commands are supplied to the A port 11 and the B port 12. As shown in FIG. 7, a Read command RA2 corresponding to the A port 11 is selected as having priority, thereby generating RA31, so that the core circuit performs a read operation READ-A. In response to the reset signal RESET1 generated by this, the read-command signal RA2 is reset. In response, a Read command RB2 corresponding to the B port 12 is chosen, thereby generating RB31. When the reset signal RESET1 becomes LOW, the Read command RB3 is supplied to the core circuit, thereby carrying out a read operation READ-B.

Figure 8:
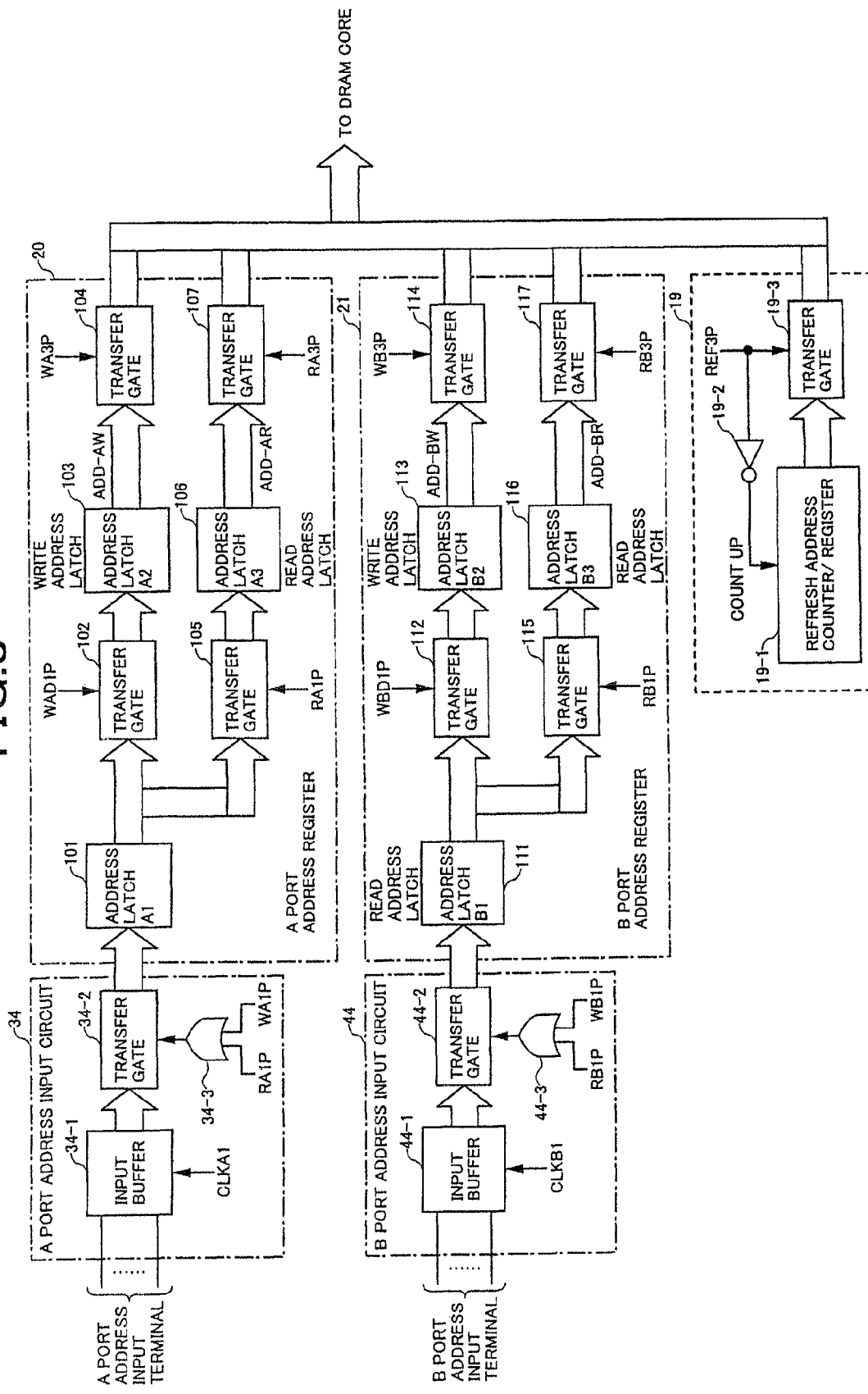
FIG. 8 is a block diagram of circuitry relevant to address input to a DRAM core.

FIG. 8 is a block diagram of circuitry relevant to address input to the DRAM core 14.

The address buffer 34 of the A port 11 includes an input buffer 34-1, a transfer gate 34-2, and an OR circuit 34-3. A pulse signal that has pulses corresponding to rising edges of the read-command signal RA1 output form the command decoder 62 shown in FIG. 5 is supplied as RA1P to one of the inputs of the OR circuit 34-3. Further, a pulse signal that has pulses corresponding to rising edges of the write-command signal WA1 output form the command decoder 62 shown in FIG. 5 is supplied as WA1P to the other one of the inputs of the OR circuit 34-3. Hereinafter, a signal having the letter "P" at the end of its signal name represents a signal that has pulses made from rising edges of a signal of a corresponding signal name.

The address buffer 44 of the B port 12 includes an input buffer 44-1, a transfer gate 44-2, and an OR circuit 44-3.

The address register A 20 includes an address latch 101, a transfer gate 102, an address latch 103, a transfer gate 104, a transfer gate 105, an address latch 106, and a transfer gate 107. Further, the address register B 21 includes an address latch 111, a transfer gate 112, an address latch 113, a transfer gate 114, a transfer gate 115, an address latch 116, and a transfer gate 117.

The refresh address register 19 includes a refresh-address-counter/register 19-1, an inverter 19-2, and a transfer gate 19-3. A refresh address is generated and held by the refresh-address-counter/register 19-1.

Through operations of the above-described circuit configuration, when a Read command or a Write command is input from the outside of the device, an address entered together with the command is transmitted to the address latch 101 or 111. In the case of a Read command, the address is transferred to the address latch 106 or 116 without any timing manipulation. In the case of a Write command, the address is transferred to the address latch 103 or 113 at the timing at which the last data of a series of write data is acquired.

As shown in the circuit configuration of FIG. 8, an address signal is transmitted from an address latch to the DRAM core 14 in response to pulse signals RA3P, WA3P, RB3P, WB3P, and REF3P corresponding to the respective command signals RA3, WA3, RB3, WB3, and REF3, which are transmitted from the arbiter 15 to the DRAM core 14.

Figure 9:
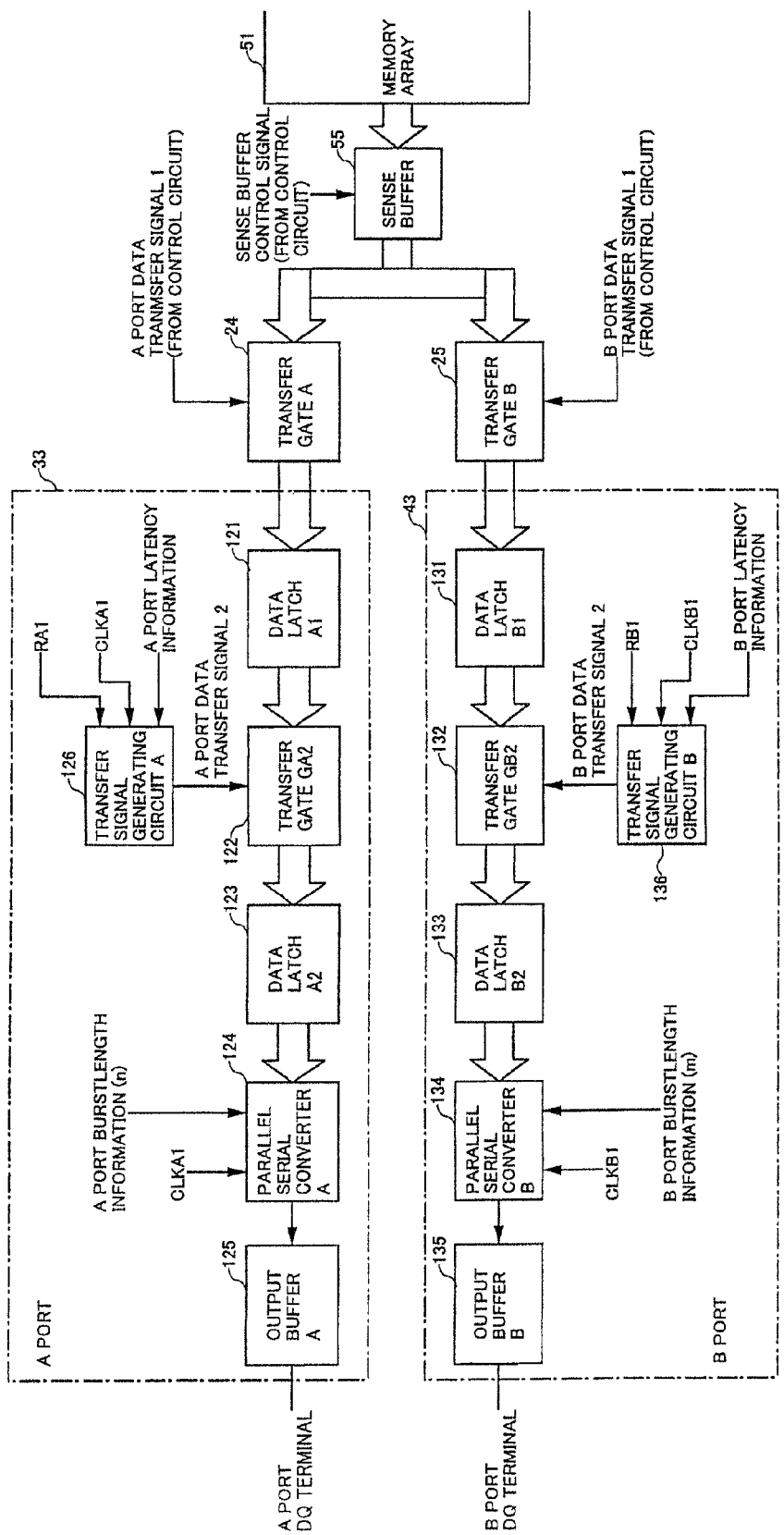
FIG. 9 is a block diagram of circuitry relevant to data output.

FIG. 9 is a block diagram of circuitry relevant to data output.

A portion relevant to the data output of the data I/O circuit 33 includes a data latch 121, a transfer gate 122, a data latch 123, a parallel serial converter 124, an output buffer 125, and a transfer signal generating circuit 126. Moreover, the portion relevant to the data output of the data I/O circuit 43 includes a data latch 131, a transfer gate 132, a data latch 133, a parallel serial converter 134, an output buffer 135, and a transfer signal generating circuit 136.

Data read from the memory array 51 is amplified by the sense buffer 55, and is supplied to the data I/O circuit 33 or the data I/O circuit 43 through the transfer gate A 24 or the transfer gate B 25, respectively. If the executed command relates to data reading from the A port 11, the transfer gate A24 opens, whereas if the executed command relates to data reading from the B port 12, the transfer gate B25 will open. The data supplied in this manner is latched and held by the data latch 121 or 131.

The transfer gate 122 or 132 opens a predetermined latency after reception of a Read command at a corresponding port in response to the transfer signal supplied from the transfer signal generating circuit 126 or 136. The data of the data latch 121 or 131 is thus transmitted to the data latch 123 or 133, respectively. Thereafter, the data is converted from parallel data to serial data by the parallel serial converter 124 or 134. The data is then transmitted to the output buffer 125 or 135, and is output therefrom.

Figure 10:
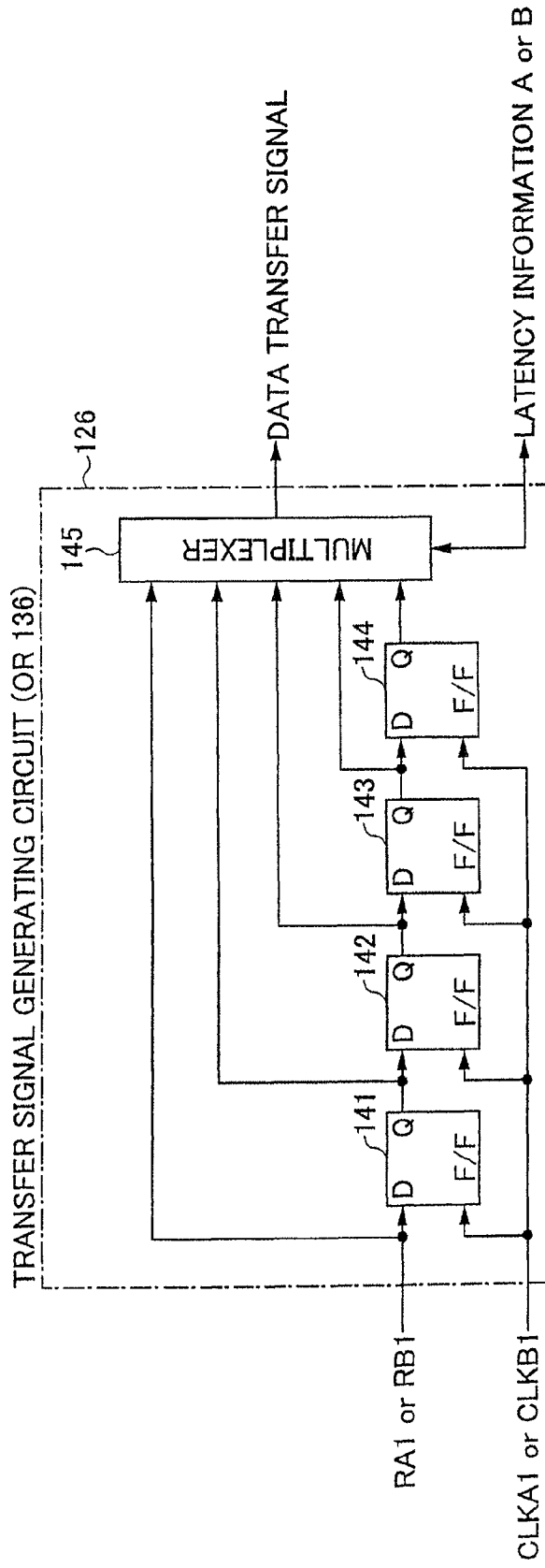
FIG. 10 is a circuit diagram showing a configuration of a transfer signal generating circuit.

FIG. 10 is a circuit diagram showing a configuration of the transfer signal generating circuit 126 or 136.

The transfer signal generating circuit 126 or 136 includes flip-flops 141 through 144 and a multiplexer 145. The read-command signal RA1 or RB1 is supplied to the flip-flop 141, and continues to propagate from one flip-flop to next in synchronization with the clock signal CLKA1 or CLKB1. The latency information A and B is supplied to the multiplexer 145. This latency information specifies a length of latency by the number of clock cycles, for example. Based on the latency information, the multiplexer 145 selects a Q output of a corresponding flip-flop, and outputs it as a data transfer signal.

Figure 11:
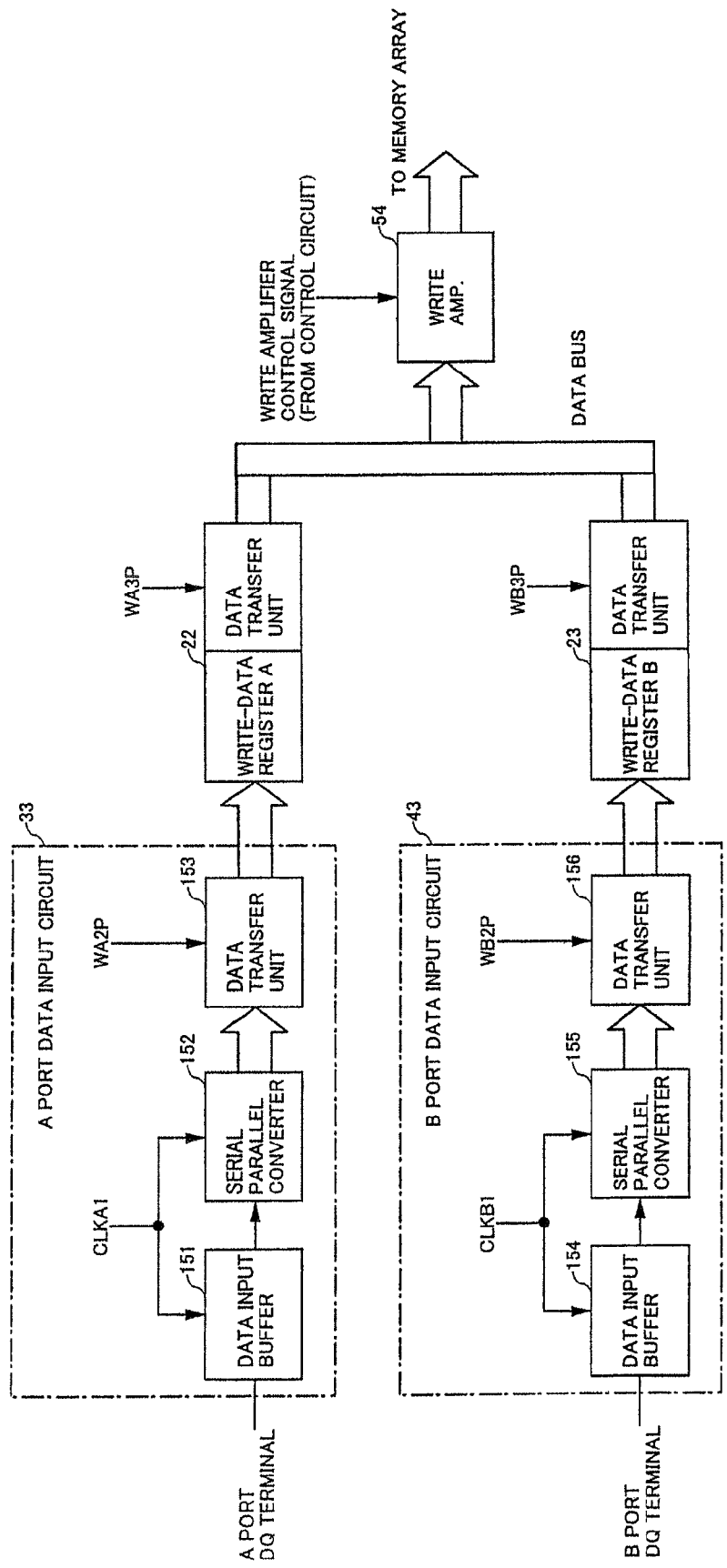
FIG. 11 is a block diagram of circuitry relevant to data input.

FIG. 11 is a block diagram of circuitry relevant to data input.

The portion relevant to the data input of the data I/O circuit 33 includes a data input buffer 151, a serial parallel converter 152, and a data transfer unit 153. The portion relevant to the data input of the data I/O circuit 43 includes a data input buffer 154, a serial parallel converter 155, and a data transfer unit 156.

Data that is serially input to the data input buffer 151 or 154 is converted into parallel data by the serial parallel converter 152 or 155, respectively. When the last data is input, the parallel data is transmitted to the write-data register A 22 or the write-data register B 23. When the Write command is transmitted to the DRAM core 14 from the arbiter 15, the data of the write-data register A 22 or the write-data register B 23 is transferred to the DRAM core 14, responding to a signal WA3P or WB3P which shows the timing corresponding to the transmission of the Write command to the DRAM core 14.

Figure 12:
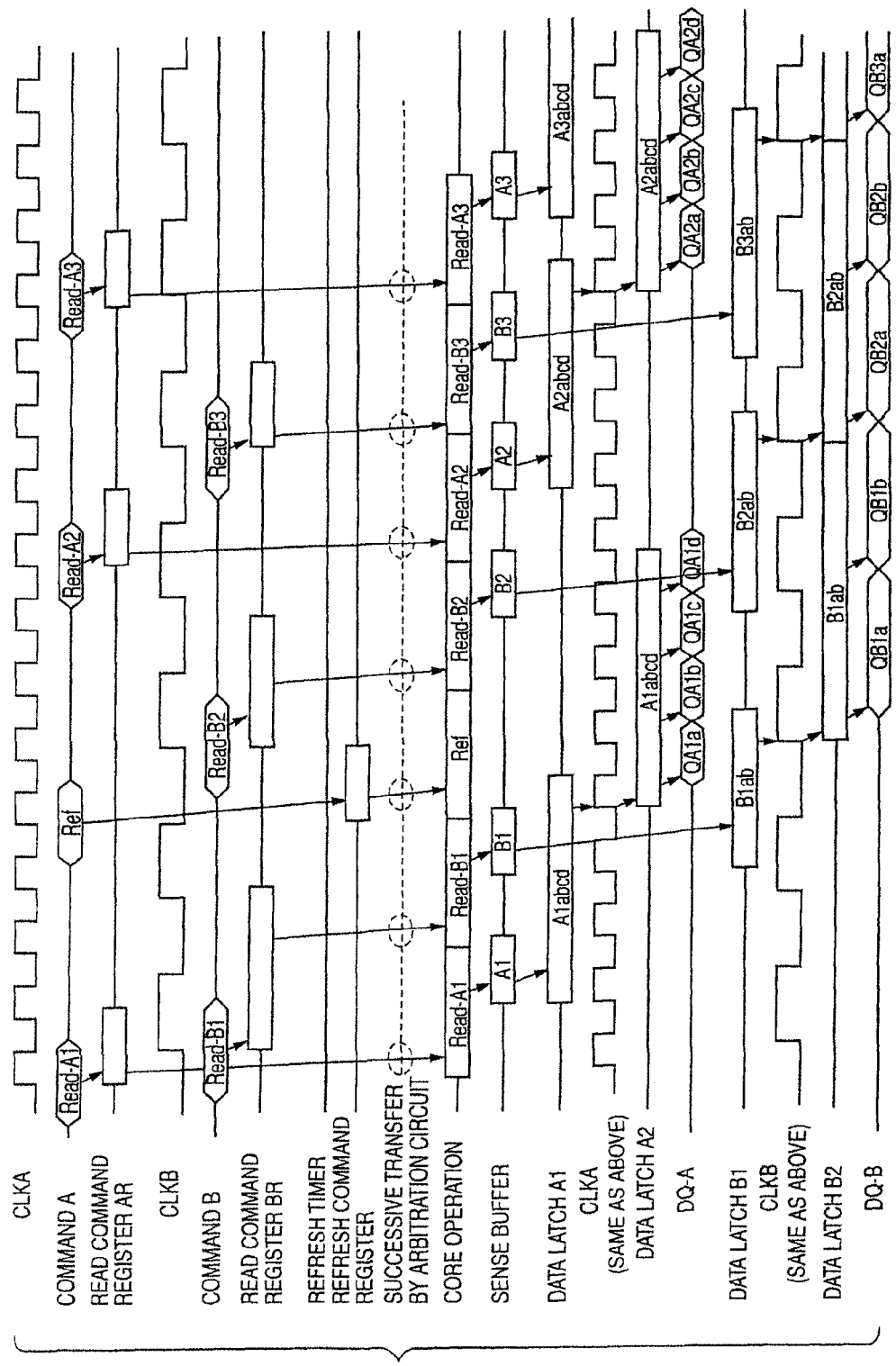
FIG. 12 is a timing chart showing operations performed when Read commands are continuously entered.

FIG. 12 is a timing chart showing operations performed when Read commands are continuously entered.

The A port 11 and the B port 12 operate in synchronization with the clocks CLKA and CLKB, respectively, which have different frequencies. In this example, the A port 11 operates with a maximum clock frequency, and the B port 12 operates with a slower clock frequency.

The A ports 11 has the following settings: read-command cycle=4 (CLKA), data latency=4, and burst length=4. The B ports 12 has the settings as read-command cycle=2 (CLKB), data latency=2, and burst length=2. A data latency and a burst length are set in the mode register of each port.

Commands received by the ports are stored in respective command registers. A refresh command is stored in the refresh command register. The arbiter monitors these command registers, and transmits commands to the DRAM core in an order in which the commands are received. A next command is transmitted when processing of the preceding command is completed.

Data read from the DRAM core are transmitted to the data latches (see FIG. 9) of the respective ports from the sense buffer. Thereafter, the data is converted from parallel to serial, and is output as burst outputs in synchronization with the external clock.

Although the refresh command is input once from the A port, operations of the B port are not affected, as shown in FIG. 12.

Figure 13:
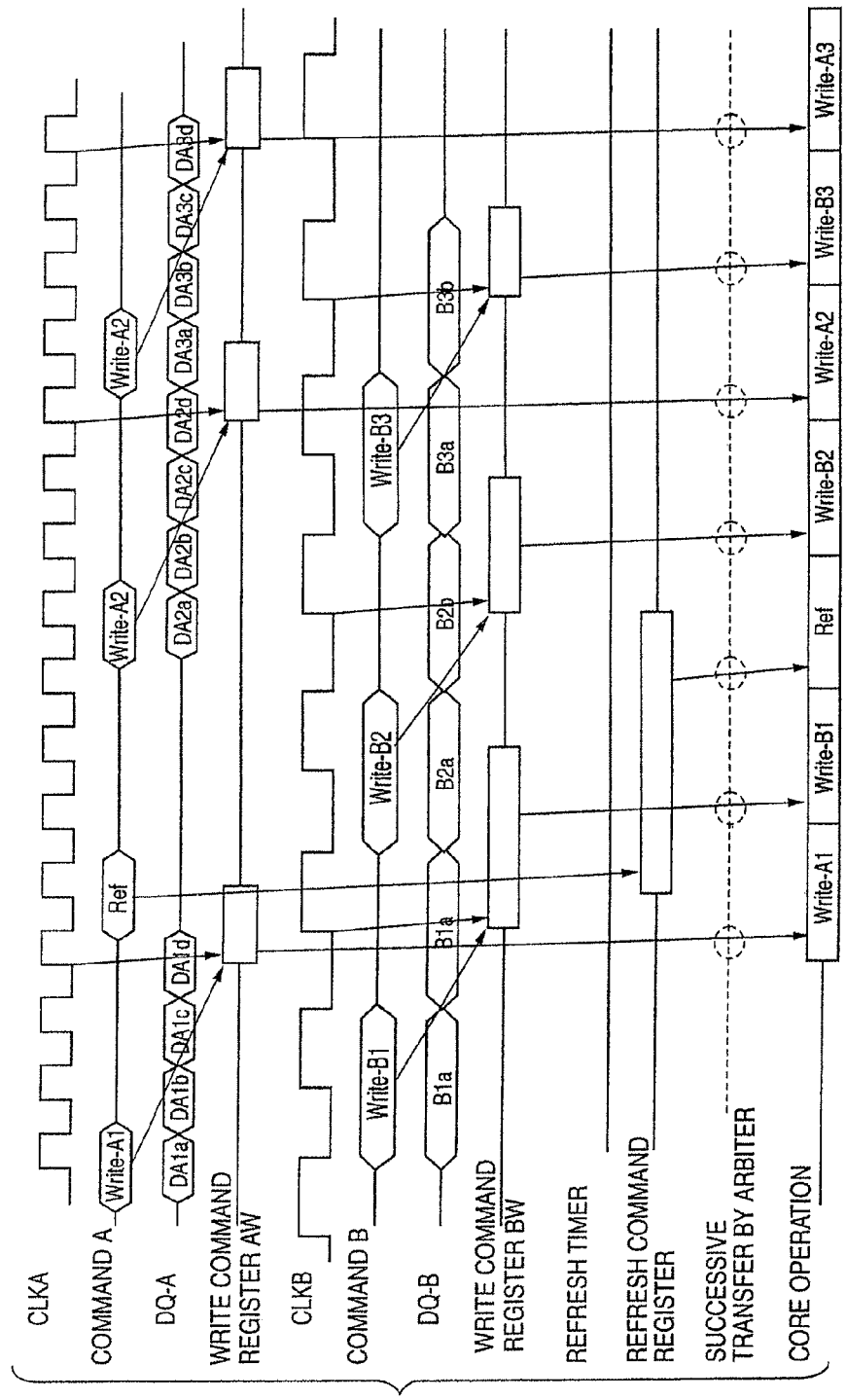
FIG. 13 is a timing chart showing operations performed when Write commands are input continuously.

FIG. 13 is a timing chart showing operations performed when Write commands are input continuously.

Data input from the exterior of the device at the time of write operation takes a form of burst inputs. Timing at which the Write command is stored in the write-command register is the timing at which the last data of burst inputs is input.

As shown in FIG. 13, the refresh command supplied from the A port does not affect operations of the B port.

Figure 14:
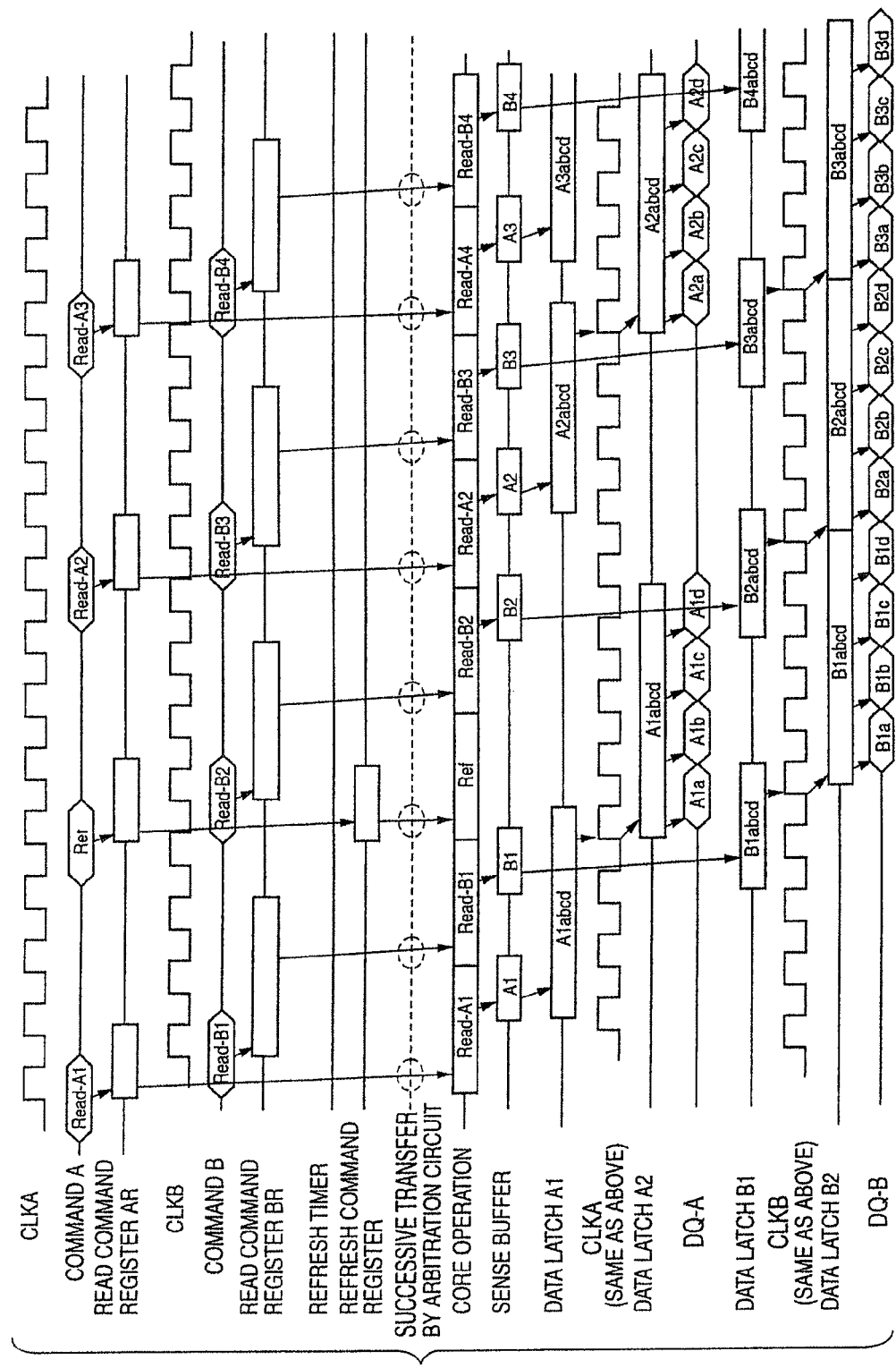
FIG. 14 is a timing chart showing a case in which both an A port and a B port operate at a maximum clock frequency.

FIG. 14 is a timing chart showing the case in which both the A port and the B port operate at the maximum clock frequency.

As shown in FIG. 14, there may be a phase difference between the clock signals of these ports. Both ports have the following settings: read-command cycle=4, data latency=4, and burst length=4. As can be seen in the figure, there is no problem concerning the operations even when both ports are operated at the maximum clock frequency, and Read commands are input continuously.

Figure 15:
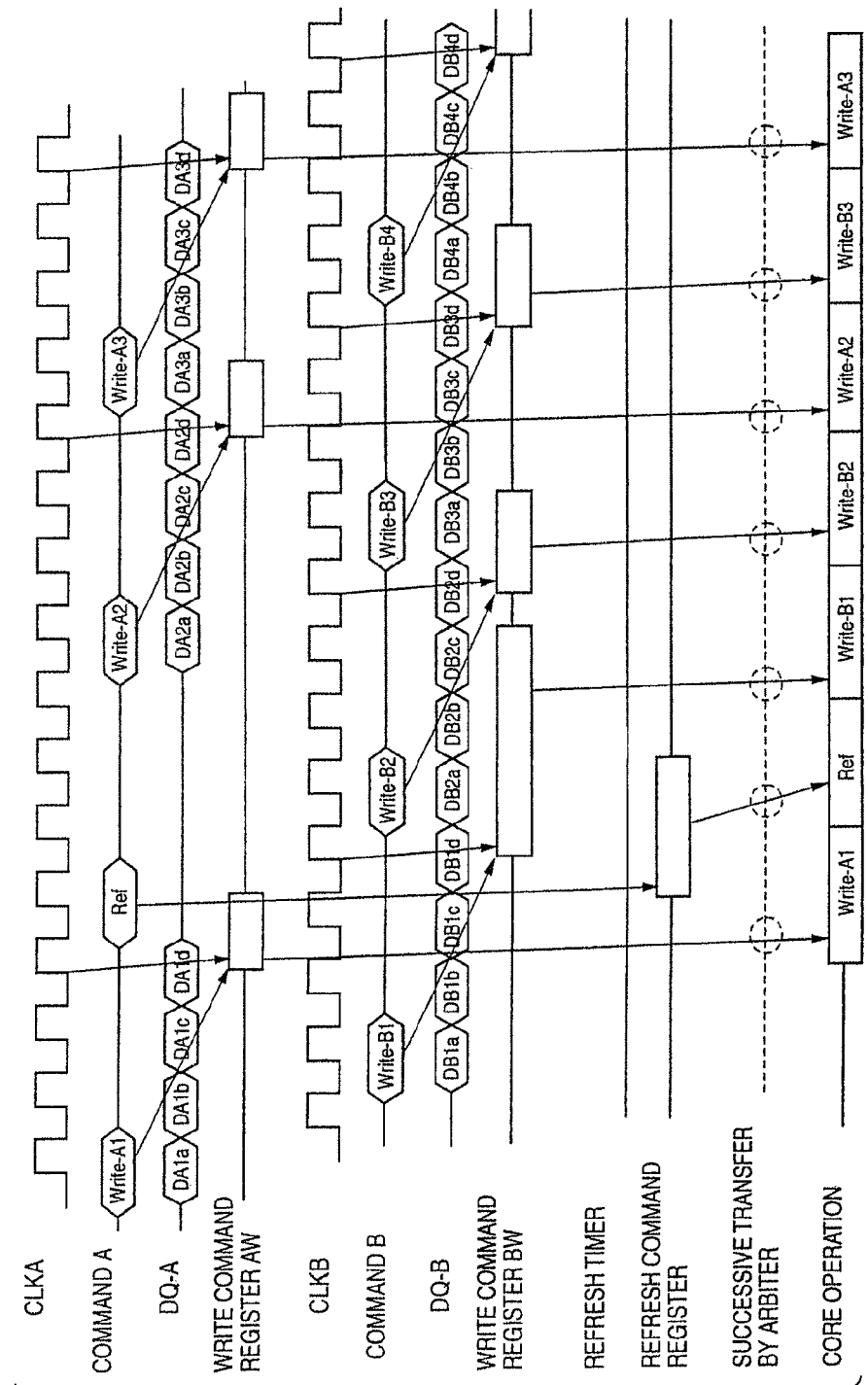
FIG. 15 is a timing chart showing the case in which both the A port and the B port operate at the maximum clock frequency.

FIG. 15 is a timing chart showing the case in which both the A port and the B port operate at the maximum clock frequency. In FIG. 15, both ports receive continuously Write commands.

As shown in FIG. 15, a phase difference may exist between the clock signals of these ports. Both ports have the settings as a write-command cycle=4, data latency=4, and burst length=4. As can be seen in the figure, operations properly proceed even when both ports are operated at the maximum clock frequency, and Write commands are input continuously.

Figure 16:
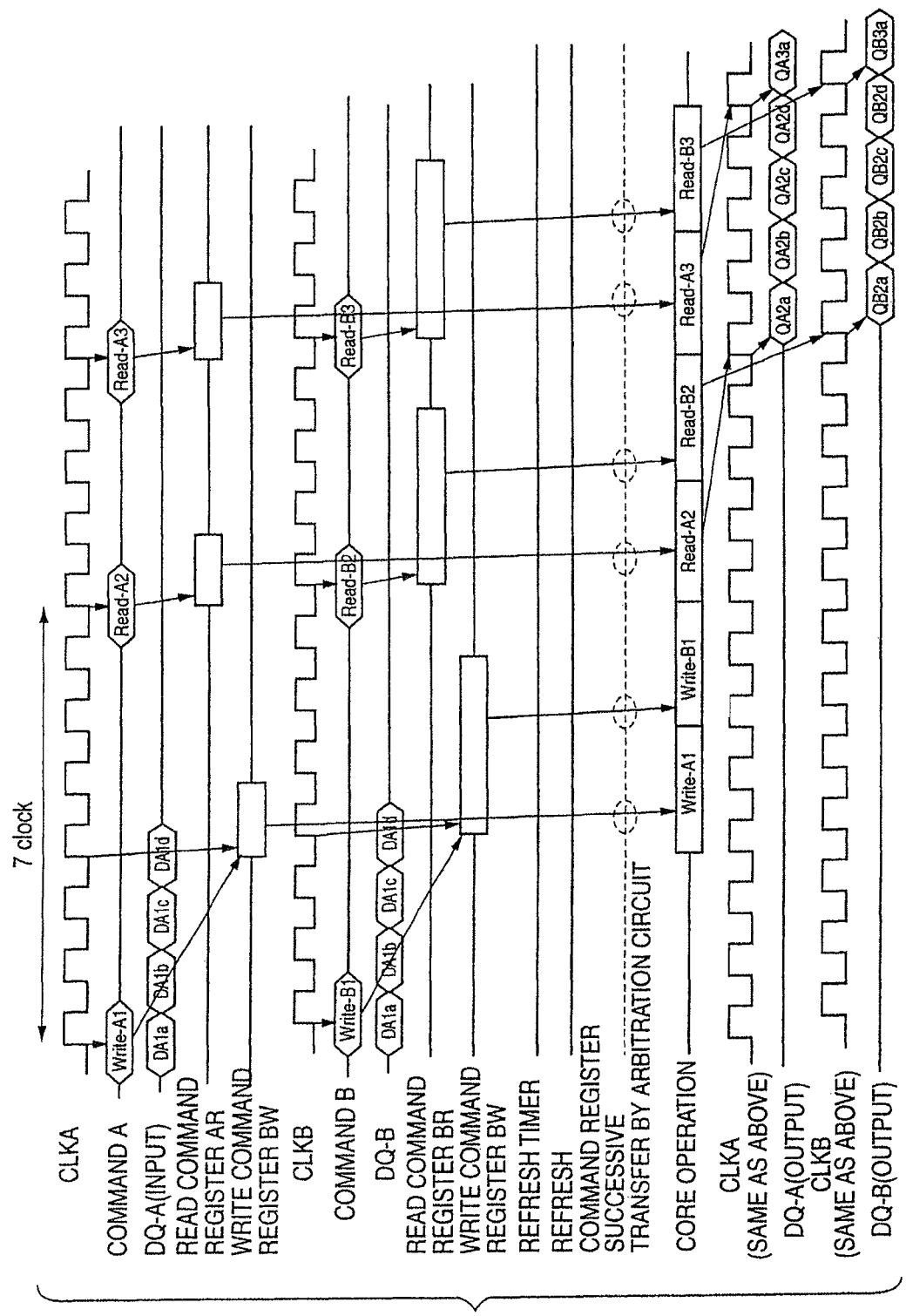
FIG. 16 is a timing chart showing operations in a case in which commands change from a Read command to a Write command.

FIG. 16 is a timing chart showing operations in the case in which commands change from a Read command to a Write command.

As shown in FIG. 16, a command transition "Write→Read" needs to have an extra command internal in comparison with the command interval of "Write→Write" or "Read→Read". This is because a Write command is transmitted for processing thereof at the timing when the last data of a burst input is entered. In contrast, the timing at which a Read command is transferred for processing thereof is defined as the timing at which the Read command is entered, so that there is a need to provide an extra command interval when successive commands are "Write→Read". Such a need can be attributable to the fact that input data taking a form of a burst input is converted into parallel data. If only one piece of data is input instead of entering four pieces of data as a burst input, there is no need to provide an extra command interval even when two successive commands are "Write→Read".

In such a configuration as only one piece of data is input for one Write command, operations can be properly performed for the "Write→Read" command succession even if the same command interval as in the case of "Write→Write" or "Read→Read" is used.

Figure 17:
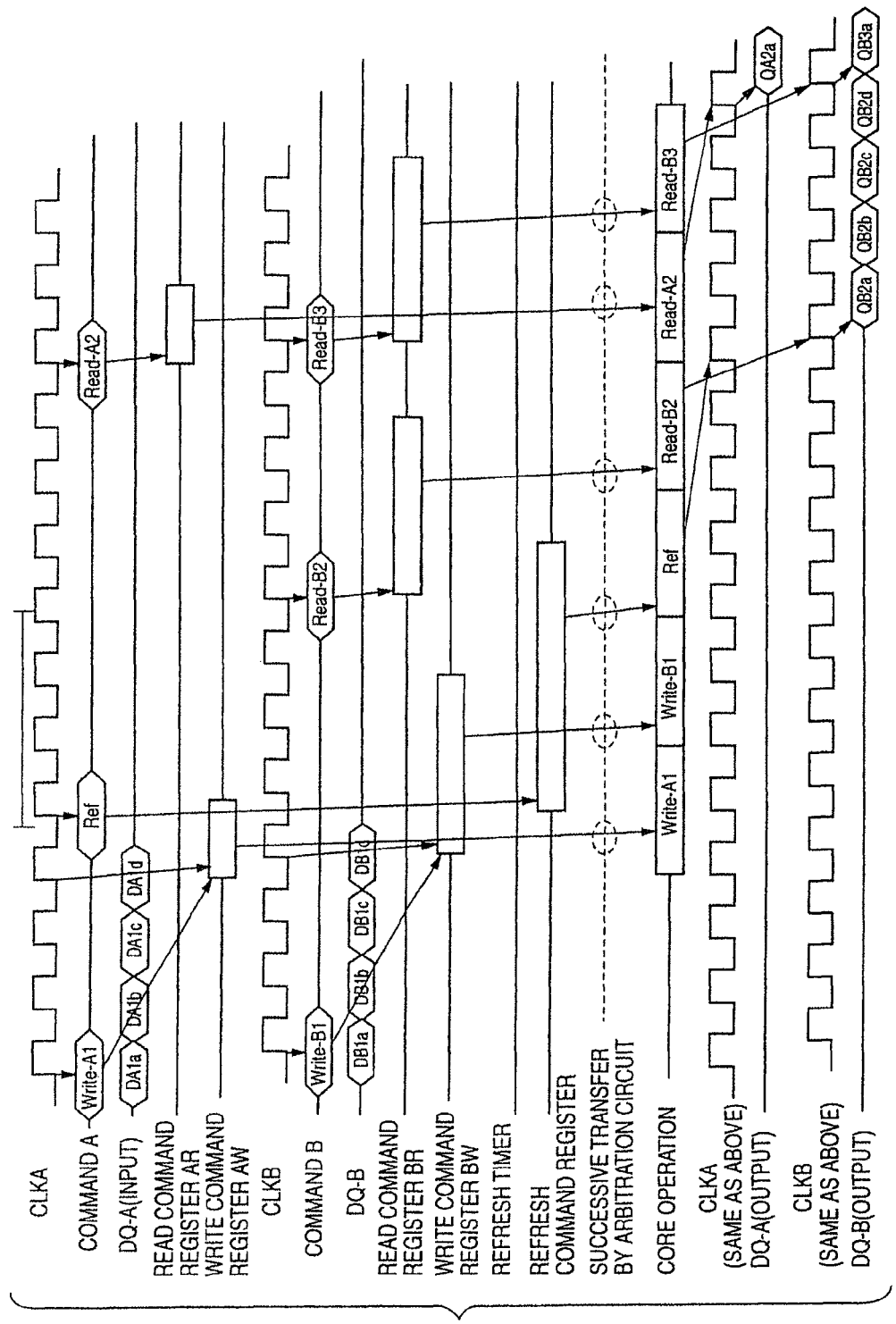
FIG. 17 is a drawing showing the timing at which a refresh command is input when commands change from "Read" to "Write"

FIG. 17 is a drawing showing the timing at which a refresh command is input when commands change from "Read" to "Write".

At the top of the drawing, timing at which a refresh command should be entered is shown. A refresh command can properly be entered at any timing during the period as is illustrated. For example, even if a refresh command is input at the timing shown in FIG. 17, a refresh operation starts only when the execution of a preceding Write command is completed, until which time the refresh command is kept in a standby state. Because of this, a refresh command may properly be entered at any timing as long as it falls within the period that corresponds to this standby state.

Figure 18:
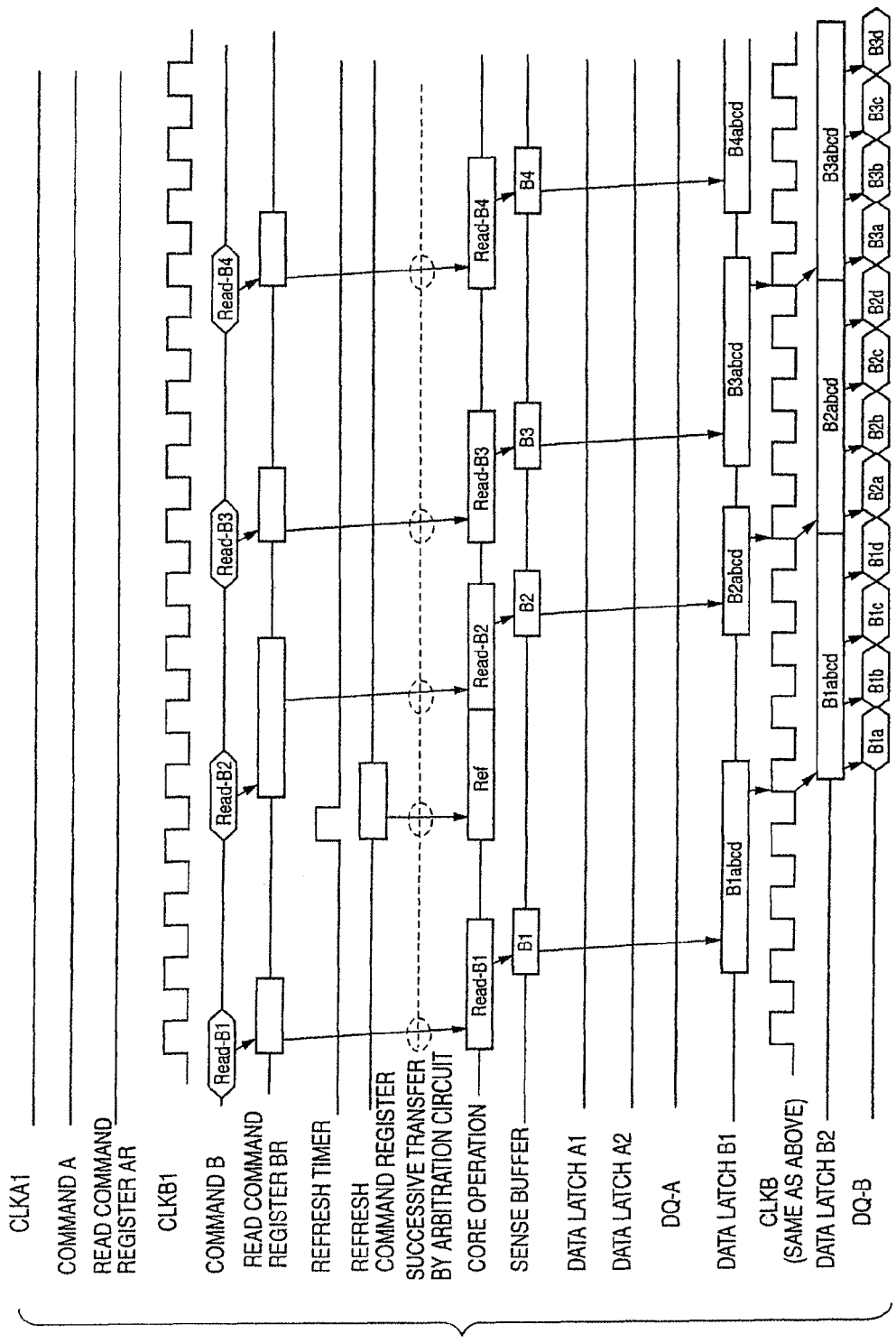
FIG. 18 is a timing chart showing operations performed when one of the ports is deactivated.

FIG. 18 is a timing chart showing operations performed when one of the ports is deactivated.

As shown in FIG. 18, when one of the ports (i.e., the A port 11 in FIG. 18) is deactivated, a refresh command is internally generated based on the refresh timer, thereby executing a refresh operation.

Figure 19:
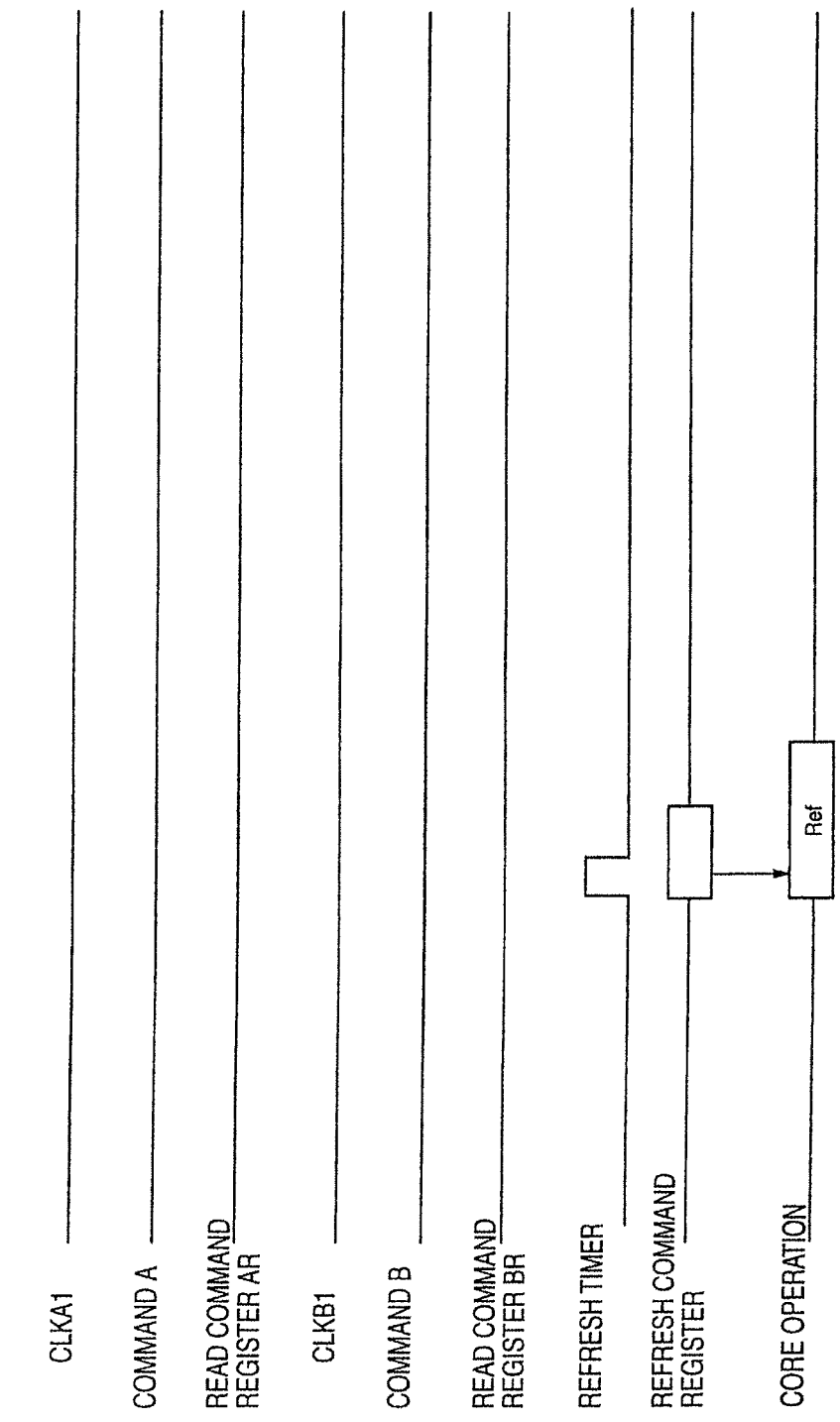
FIG. 19 is a timing chart showing operations performed when both ports are deactivated.

FIG. 19 is a timing chart showing operations performed when both ports are deactivated.

As shown in FIG. 19, when both ports are deactivated, a refresh command is internally generated based on the refresh timer, thereby executing a refresh operation.

FIGS. 20A and 20B are timing charts showing operations of the DRAM core.

FIG. 20A shows the case of a read operation, and FIG. 20B shows the case of a write operation. At the operation timing as shown in FIGS. 20A and 20B, an entered command is ensued by successive operations of word line selection, data amplification, a write back, and a precharge before the entire operation is completed.

Figure 21:
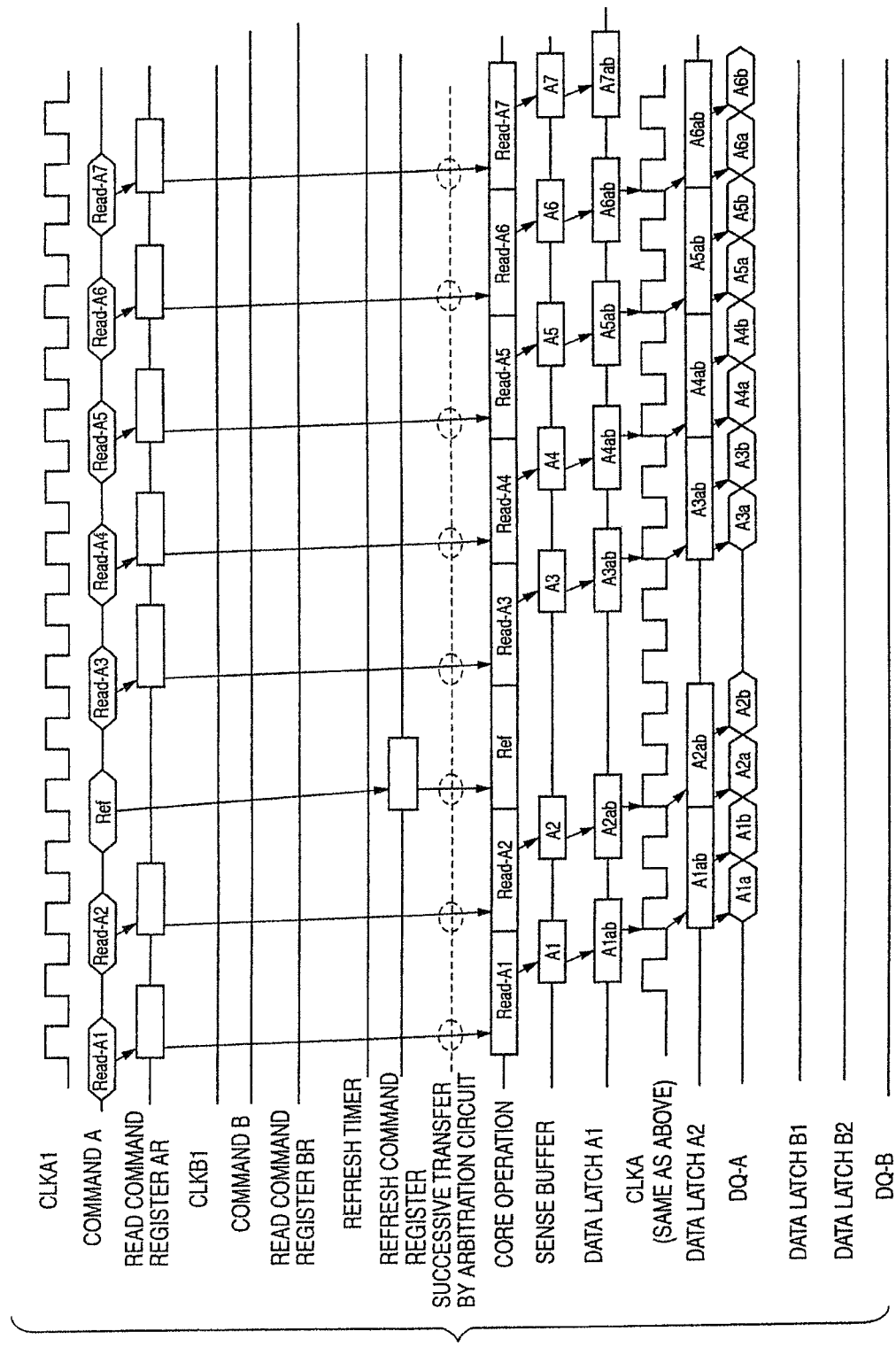
FIG. 21 is a timing chart showing double-rate operations performed when only one port is operated.

FIG. 21 is a timing chart showing double-rate operations performed when only one port is operated.

By stopping one of the two ports, the intervals of command inputs to the operating port can be shortened by half. When this happens, the fastest cycle of external commands and the fastest cycle of internal actions are identical to each other. In the example of FIG. 21, the command intervals are shortened without changing the clock frequency. In this case, since the burst length also becomes shorter, a data transfer rate is the same as when both ports are used.

Figure 22:
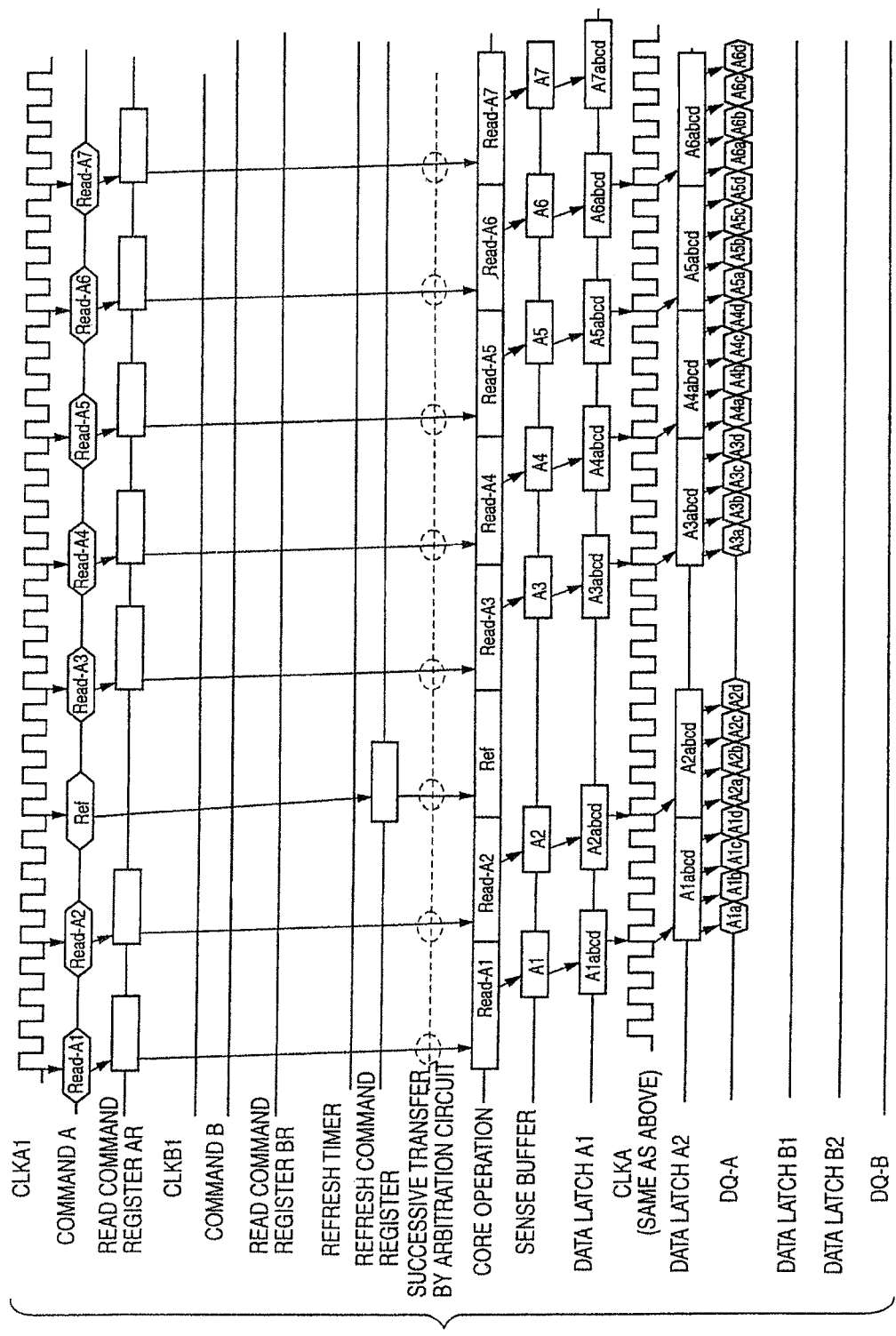
FIG. 22 is a timing chart showing a double-rate operation when a data transfer rate is doubled by making a clock frequency twice as high.

FIG. 22 is a timing chart showing a double-rate operation when a data transfer rate is doubled by making the clock frequency twice as high.

In FIG. 22, when one of the two ports is stopped, the clock signal input to the operating port is set to a frequency that is twice as high. In connection with this, the time intervals of command inputs become half as long. In this case, since the burst length is the same as the case where both ports are used, the data transfer rate is twice as fast as when both ports are used.

In addition, since the external-clock signal is input only to the I/O circuit unit, it is easy to actually implement the double-rate operation if this circuit unit is so designed as to cope with high-speed operations.

Figure 23:
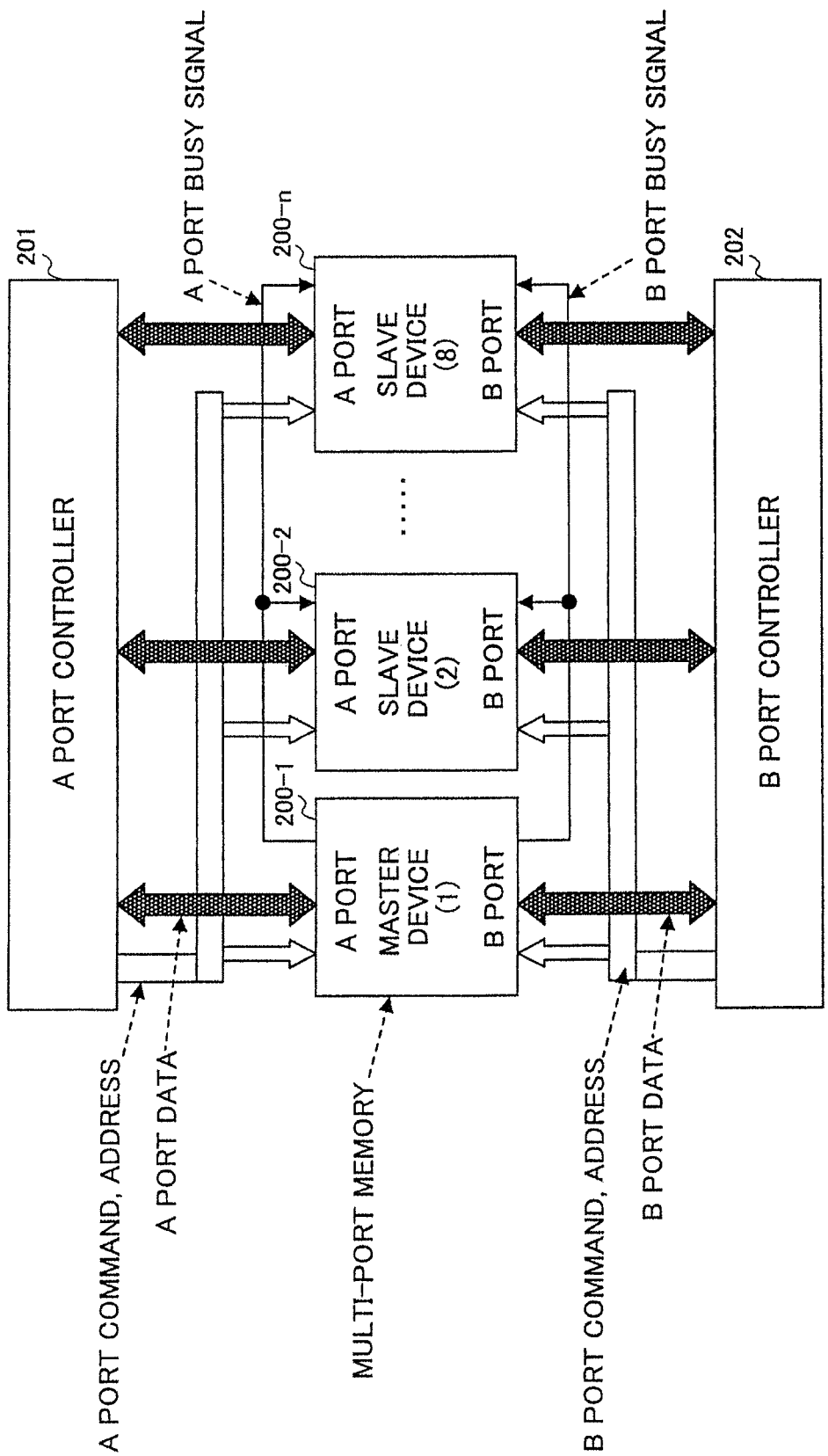
FIG. 23 is a drawing for explaining a second embodiment of the present invention (first aspect)

FIG. 23 is a drawing for explaining a second embodiment of the present invention.

In general, memory is extended according to usage thereof. The same applies in the case of a multi-port memory, and there may be a case in which a plurality of multi-port memories is provided for the purpose of expanding memory space.

A multi-port memory includes an arbiter, and detects which one of the commands are earlier in entering the respective ports, followed by executing commands in the detected order. Even when commands are input at almost the same timing to the respective ports, an order is determined for successive execution of the commands. In an example shown in FIG. 23, a plurality of multi-port memories 200-1 through 200-n are provided, and the same commands are supplied to the multi-port memories 200-1 through 200-n from an A port controller 201 and a B port controller 202. The relative timing of command arrival at each multi-port memory may slightly differ because of different lengths of signal lines and/or the influence of power supply noise even if the commands are supplied to the A port and the B port simultaneously. In this case, the arbiter of each multi-port memory may execute commands in an order different from memory to memory.

Different orders of command execution between memory devices may not present a problem if the command to the A port and the command to the B port are directed to different addresses. When commands are for the same address, however, a problem arises.

For example, retrieved data would be different between when the data is read after write access to the same memory cell and when the data is read before write access to the same memory cell. Moreover, the data of the B port stays in memory when the data of the B port is written after the data of the A port is written, whereas the data of the A port will remain in the memory if operations are performed in the reverse order.

There is a serious problem regarding the reliability of data if an order of command execution differs from memory to memory in the manner as described above.

Accordingly, when a plurality of multi-port memories is used, there is a need to keep consistency between memories regarding decisions made by the arbiters. To this end, the second embodiment of the present invention assigns one of the multi-port memories as a master device 200-1, and uses the remaining devices as slave devices 200-2 through 200-n. The slave devices conform to a decision made by the arbiter of the master device.

Figure 24:
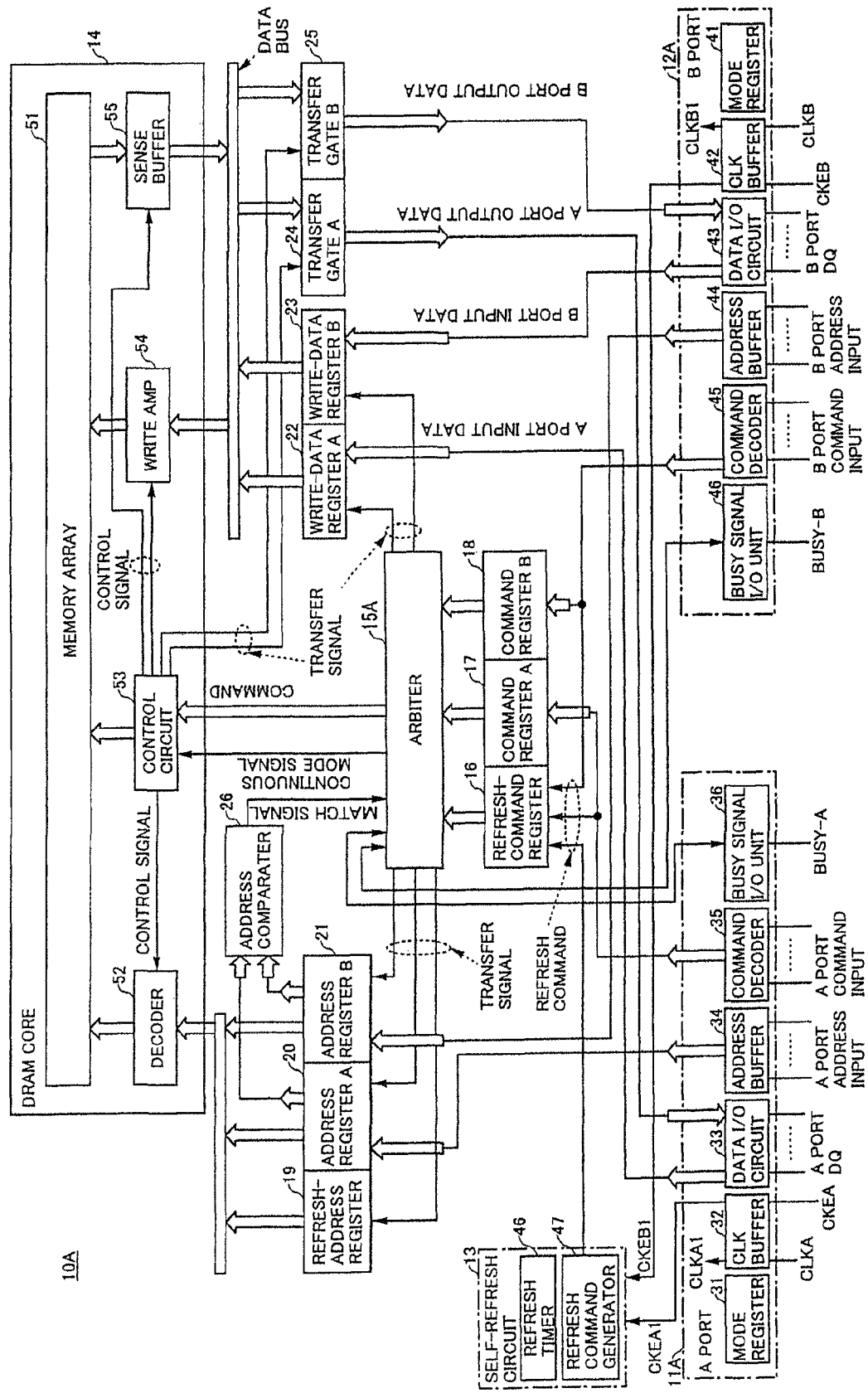
FIG. 24 is a block diagram showing the second embodiment of the multi-port memory according to the present invention (first aspect)

FIG. 24 is a block diagram showing the second embodiment of the multi-port memory according to the present invention. A configuration of this example is provided with two ports, i.e., an A port and a B port.

Differences from the first embodiment shown in FIG. 4 includes the fact that an A port 11A and a B port 12A are provided with BUSY signal I/O units 36 and 46, respectively, and the fact that an address comparator 26 is provided to compare an address of the A port with an address of the B port. If the address comparator 26 detects an address match and thus generates a match signal, an arbiter 15A will switch operation modes of a DRAM core so as to initiate a continuation mode.

Figures 25A, 25B:
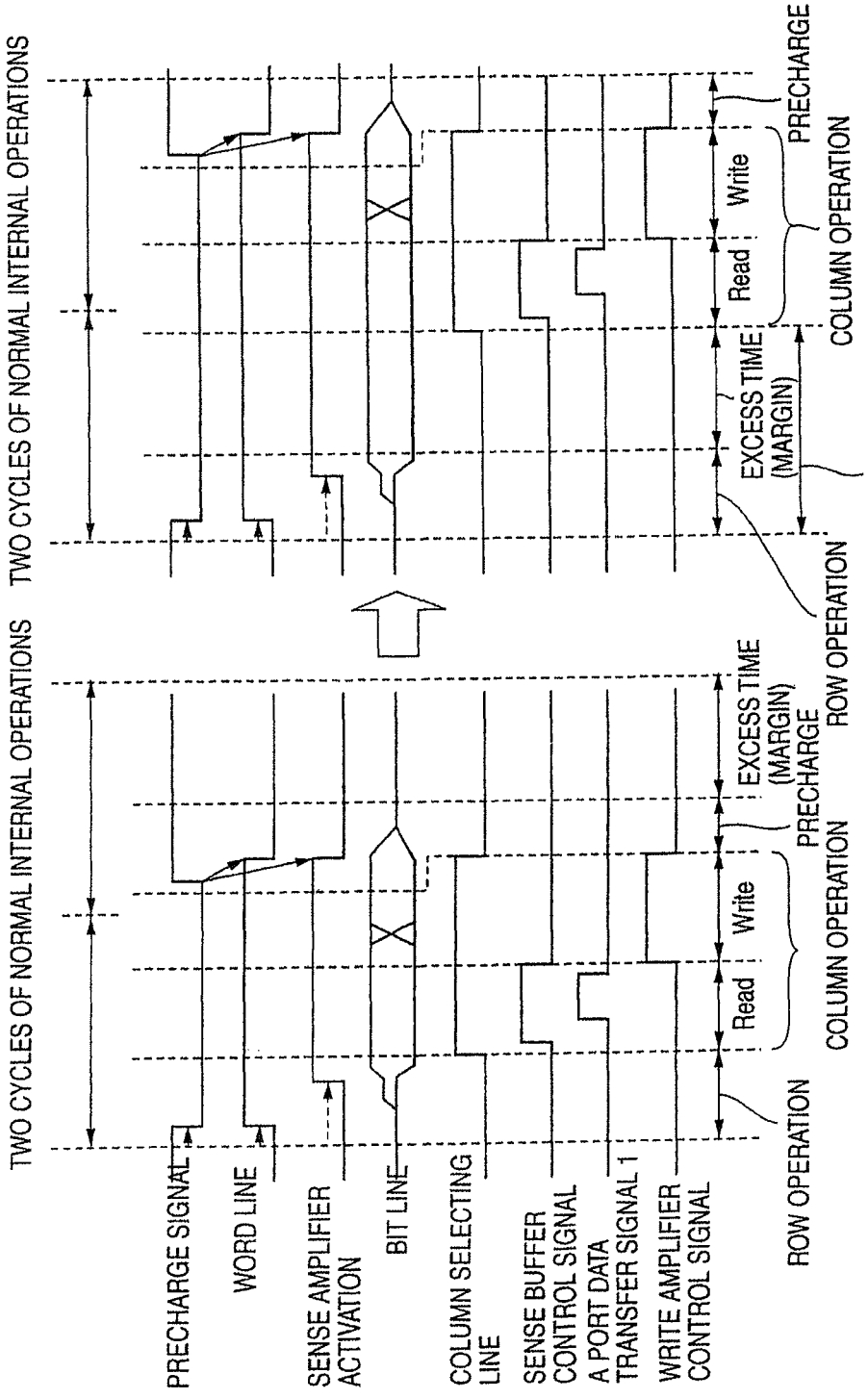
FIGS. 25A and 25B are timing charts for explaining a continuation mode.

FIGS. 25A and 25B are timing charts for explaining the continuation mode.

As shown in the drawing (FIG. 20) showing operations of the first embodiment, a DRAM core operation is divided into a ROW operation and a COLUMN operation. In the present invention, a ROW operation, a COLUMN operation, and a precharge operation are performed as a series of continuous executions, which defines a single internal operation cycle.

The continuation mode in the second embodiment is the same as a column access operation of an ordinary DRAM, and executes a command repeatedly with respect to the same cell. That is, this mode performs a precharge after carrying out executions of COLUMN operations multiple times after a ROW operation. When Write commands with respect to the same cell address are supplied consecutively, the later command is performed without carrying out the former command. This is because even if these Write commands are carried out consecutively, data that is written by the former command will be overwritten by the data of the latter command.

As shown in FIG. 25A, a continuation mode allows operations to be shortened compared with 2 cycles of ordinary internal operations, thereby providing an extra time. The margin obtained by this extra time is allocated to a point between a ROW operation and a COLUMN operation (this margin will hereinafter be called a Wait period). During this Wait period, processing for making orders of command execution consistent between the master and the slaves is carried out.

In the following, a procedure of making operations consistent between the master and the slaves by use of a BUSY signal will be explained.

A BUSY signal is used in order to insure the same order of command execution between the master and the slaves. BUSY signal I/O units 36 and 46 serve as a BUSY output circuit that outputs a BUSY signal in the master device 200-1, and serve as a BUSY input circuit that receives a BUSY signal in the slave devices 200-2 through 200-n. Information indicative of either a master device identification or a slave device identification is stored in the mode register 31 or 41.

The memory device receives a command from one of the ports, and starts the operation shown in FIGS. 20A and 20B.

When a command is input from the other port to access the same address within the period of a ROW operation, the address comparator 26 generates a match signal. Upon reception of this match signal, the arbiter 15A supplies a continuation-mode signal to the control circuit 53 of the DRAM core 14. In response to a continuation mode signal, the DRAM core 14 shifts to a continuation mode as shown in FIG. 25B.

During the Wait period, the master device 200-1 generates a BUSY-A signal or a BUSY-B signal based on the decision made by arbiter 15A. In this example, a BUSY signal is generated with respect to the port that is identified by the arbiter 15A as having received a command earlier.

Similarly, during the Wait period, the slave device detects the BUSY signal generated by the master device, and changes the decision made by its own arbiter 15A so as to conform to the master if it differs from the indication of the BUSY signal. A COLUMN operation is then performed according to a command order as modified.

Figure 26:
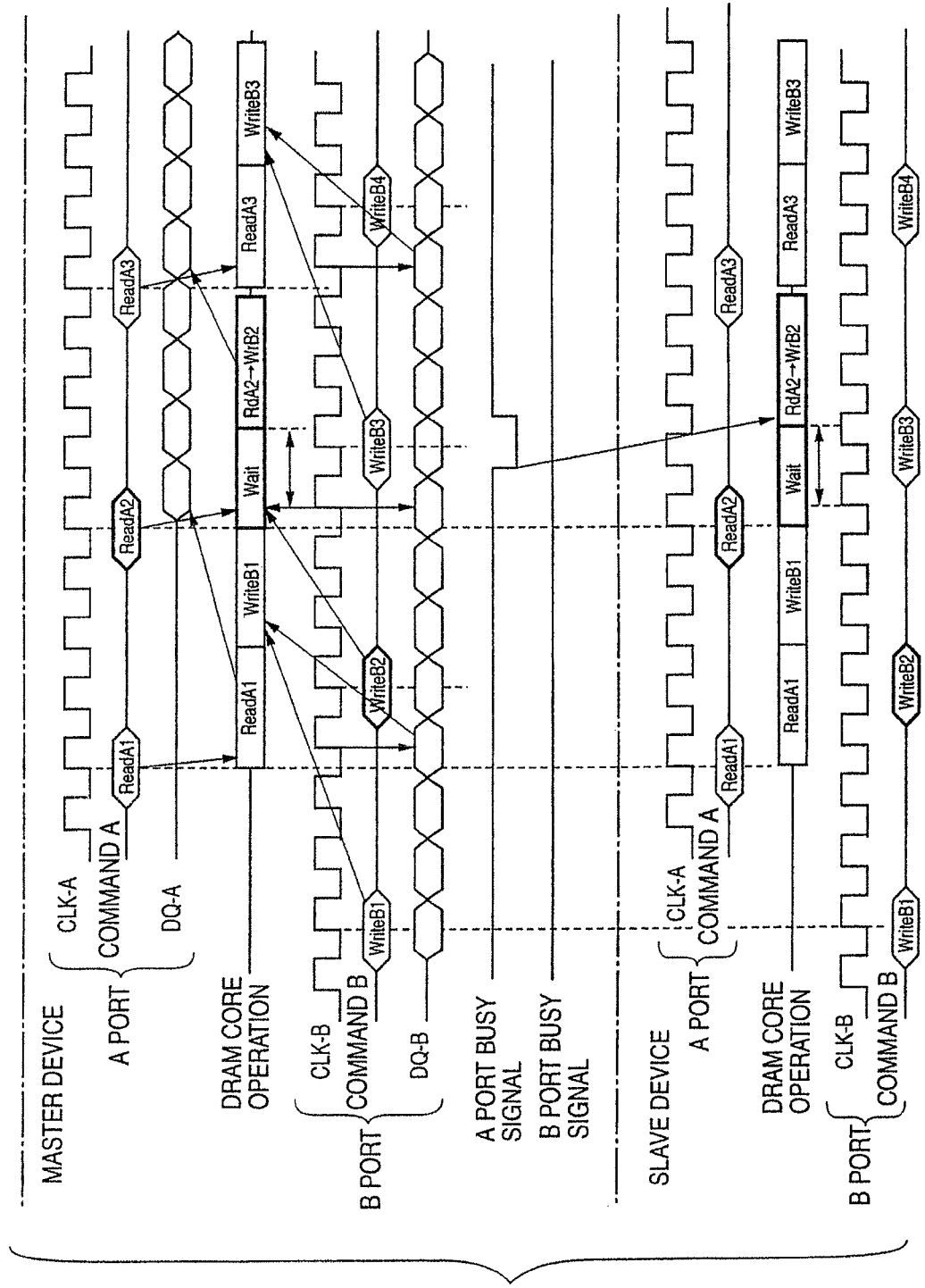
FIG. 26 is a timing chart showing an operation performed when a BUSY signal is generated with respect to a Read command of the A port and a Write command of the B port.

FIG. 26 is a timing chart showing an operation performed when a BUSY signal is generated with respect to a Read command of the A port and a Write command of the B port.

In this embodiment, the BUSY signal assumes a logic level "L" to indicate selection. Moreover, a BUSY signal is preferably transmitted and received asynchronously. This is because there is a need to promptly exchange the BUSY signal within a limited Wait period.

In the example of FIG. 26, since ReadA2 of the A port is earlier than WriteB2 of the B port, the master generates a BUSY signal indicative of the A port during the Wait period. The slaves receive this BUSY signal, and leans that ReadA2 of the A port is earlier than WriteB2 of the B port. Then, the master and the slaves execute column operations in the continuation mode in the order of ReadA2 first and WriteB2 second.

Figure 27:
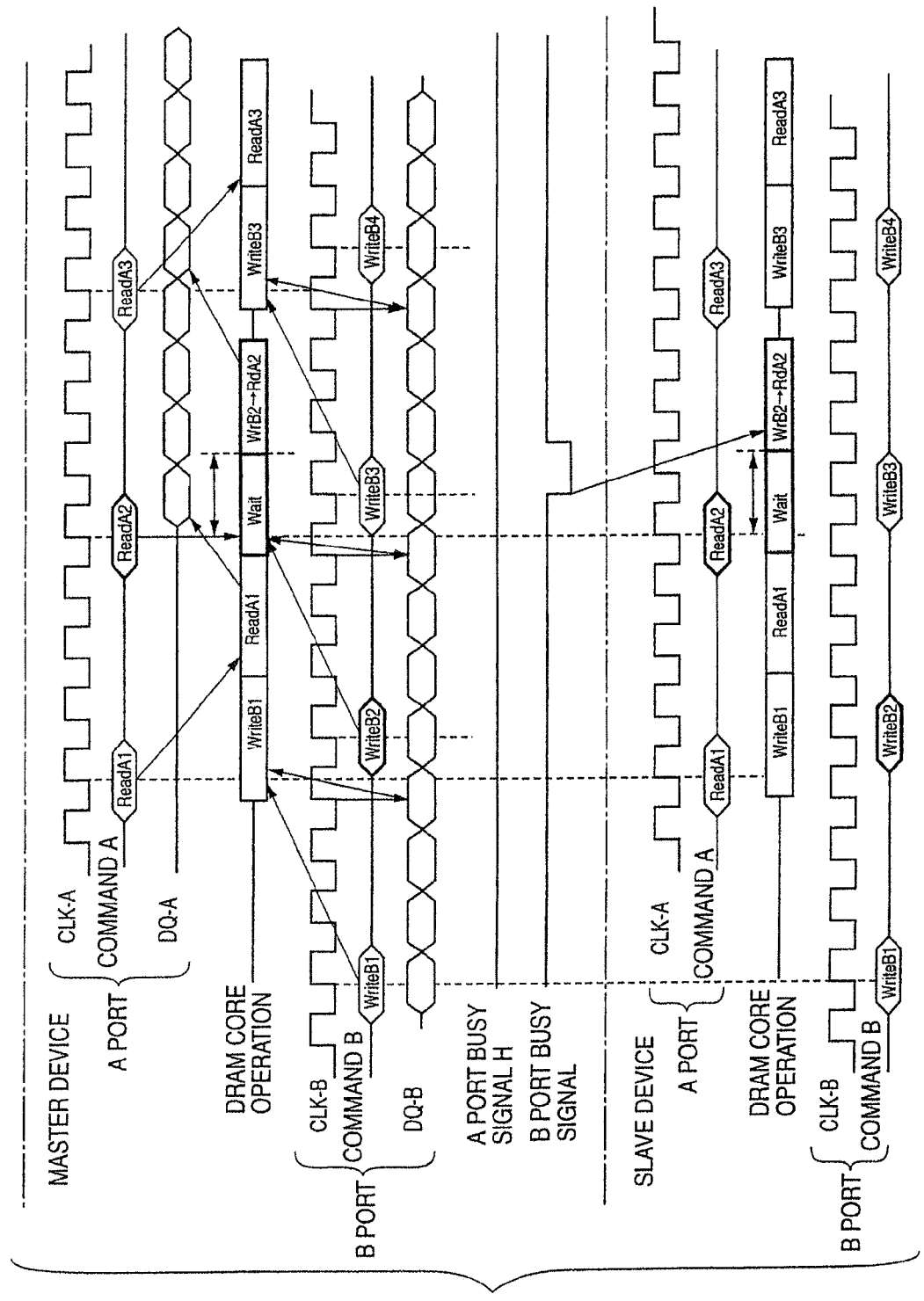
FIG. 27 is a timing chart showing an operation performed when a BUSY signal is generated with respect to a Read command of the A port and a Write command of the B port.

FIG. 27 is a timing chart showing an operation performed when a BUSY signal is generated with respect to a Read command of the A port and a Write command of the B port. While FIG. 26 illustrated the case where the Read command of the A port was earlier, FIG. 27 shows a case in which a Write command of the B port is earlier.

Figure 28:
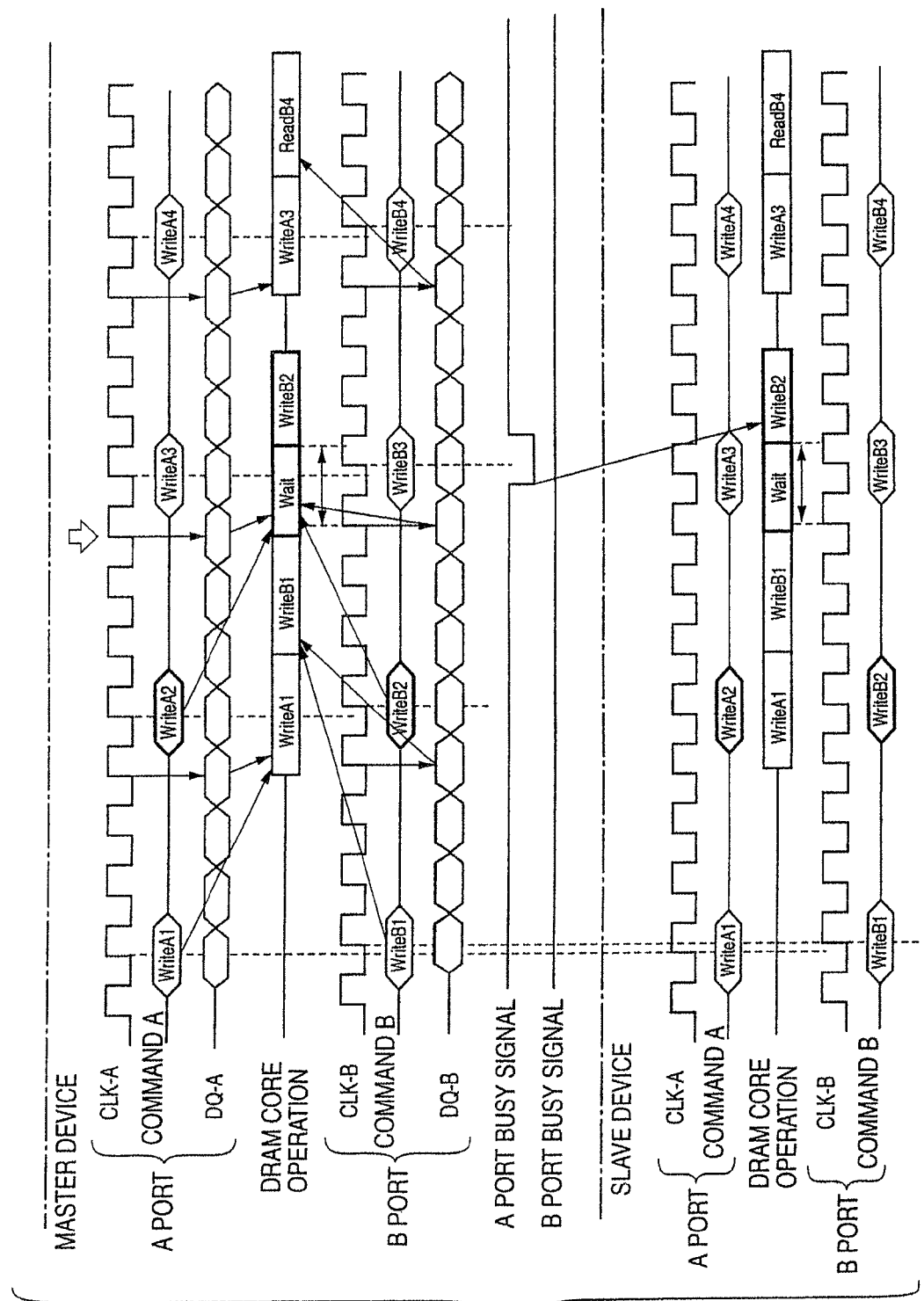
FIG. 28 is a timing chart showing an operation performed when a BUSY signal is generated in respect of a Write command of the A port and a Write command of the B port.

FIG. 28 is a timing chart showing an operation performed when a BUSY signal is generated in respect of a Write command of the A port and a Write command of the B port.

An example of operation shown in FIG. 28 concerns the case in which the Write command of the A port is earlier than the Write command of the B port. That is, since WriteA2 of the A port is earlier than WriteB2 of the B port, a BUSY signal indicative of the A port is generated, and is supplied to the slaves. In this case, since data that would be written by executing the Write command of the A port will be immediately rewritten, only the Write command WriteB2 of the B port is executed as it is entered later.

Figure 29:
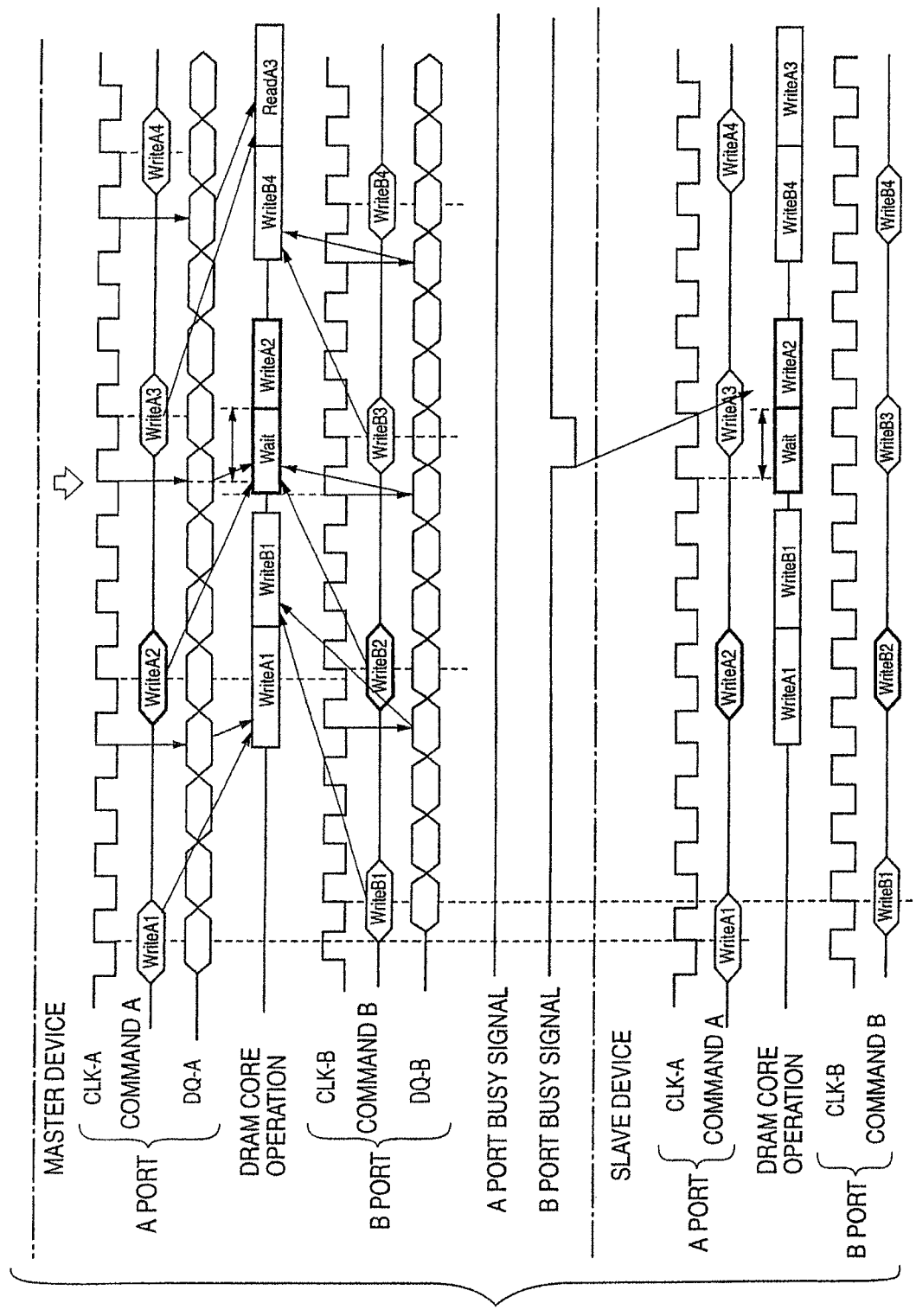
FIG. 29 is a timing chart showing an operation performed when a BUSY signal occurs with respect to a Write command of the A port and a Write command of the B port.

FIG. 29 is a timing chart showing an operation performed when a BUSY signal occurs with respect to a Write command of the A port and a Write command of the B port.

The example of operation shown in FIG. 29 concerns the case in which the Write command of the B port is earlier than the Write command of the A port. In this case, since data that would be written by executing the Write command of the B port will be immediately replaced, only the Write command WriteA2 of the A port is executed. In this example, the clock frequency of the A port is set slightly lower than the clock frequency of the B port. Although the command input is earlier for the A port when the commands WriteA2 and WriteB2 are compared, it is the B port that is earlier in receiving the last data input. Because of this, the Write command of the B port is determined to be earlier than the Write command of the A port.

The description provided above has not made any reference to a case regarding a combination of a Read command of the A port and a Read command of the B port. Since the reliability of data is not affected regardless of relative timings, there is no need to generate a BUSY signal in this case.

Figure 30:
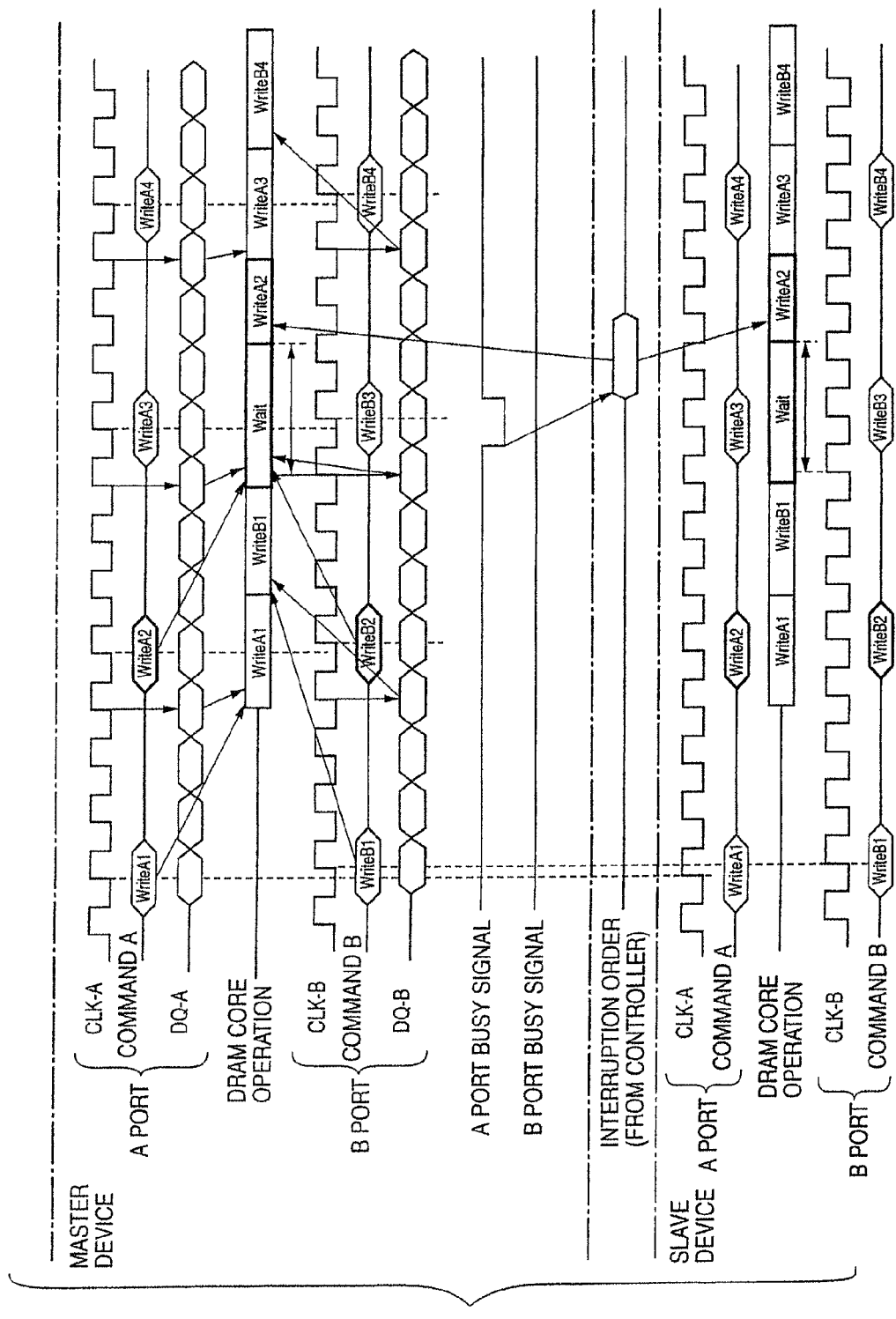
FIG. 30 is a timing chart showing an operation in a configuration that can handle an interruption issued by a controller.

FIG. 30 is a timing chart showing an operation in a configuration that can handle an interruption issued by the controller.

"Interruption" is an instruction that orders a change of the decision made by the arbiter of the master device when a BUSY state is initiated. Method of causing interruption include:
 a) inputting as a command;
 b) providing a dedicated terminal pin;
 c) using a special address combination; and
 d) using a BUSY signal.

The method d) supplies a BUSY signal by the controller with respect to the port that is different from a port for which a BUSY signal is generated, and arranges for the master memory and the slave memories to detect it.

In the example of FIG. 30, an interruption is generated when a BUSY signal occurs with respect to a Write command of the A port and a Write command of the B port. As described in connection with FIG. 28 and FIG. 29, only one of the Write command of the A port and the Write command of the B port will be executed when a BUSY signal is brought about by a Write-&-Write combination. As a result, data that is entered earlier will be lost.

In FIG. 30, WriteA2 of the A port is earlier than WriteB2 of the B port, so that a BUSY signal directed to the A port is generated. Having received the BUSY signal generated by the master, the controller generates an interruption command in order to prevent the write data of the A port from being erased.

The master and the slaves receive the interruption command from the controller, and change the decisions made by the arbiters, followed by carrying out Write operations according to the interruption command after the end of the Wait period. Namely, the arbiters modify their decisions to indicate that the command WriteA2 of the A port is later than the command of the B port, and perform a write operation relating to WriteA2. This can prevent the write data of the A port from being eliminated. In the case of the Write→Write combination, performing a write operation only once is all that is necessary, so that it is possible to allocate a longer Wait period compared with the continuation mode of the Read→Write combination or the Write→Read combination. It is thus possible to make use of this time period to carry out the interruption command in response to the BUSY signal.

In the following, a description will be given with regard to the configuration of the address comparator, a BUSY I/O system, and an interruption system for attaining the operation described above.

Figure 31:
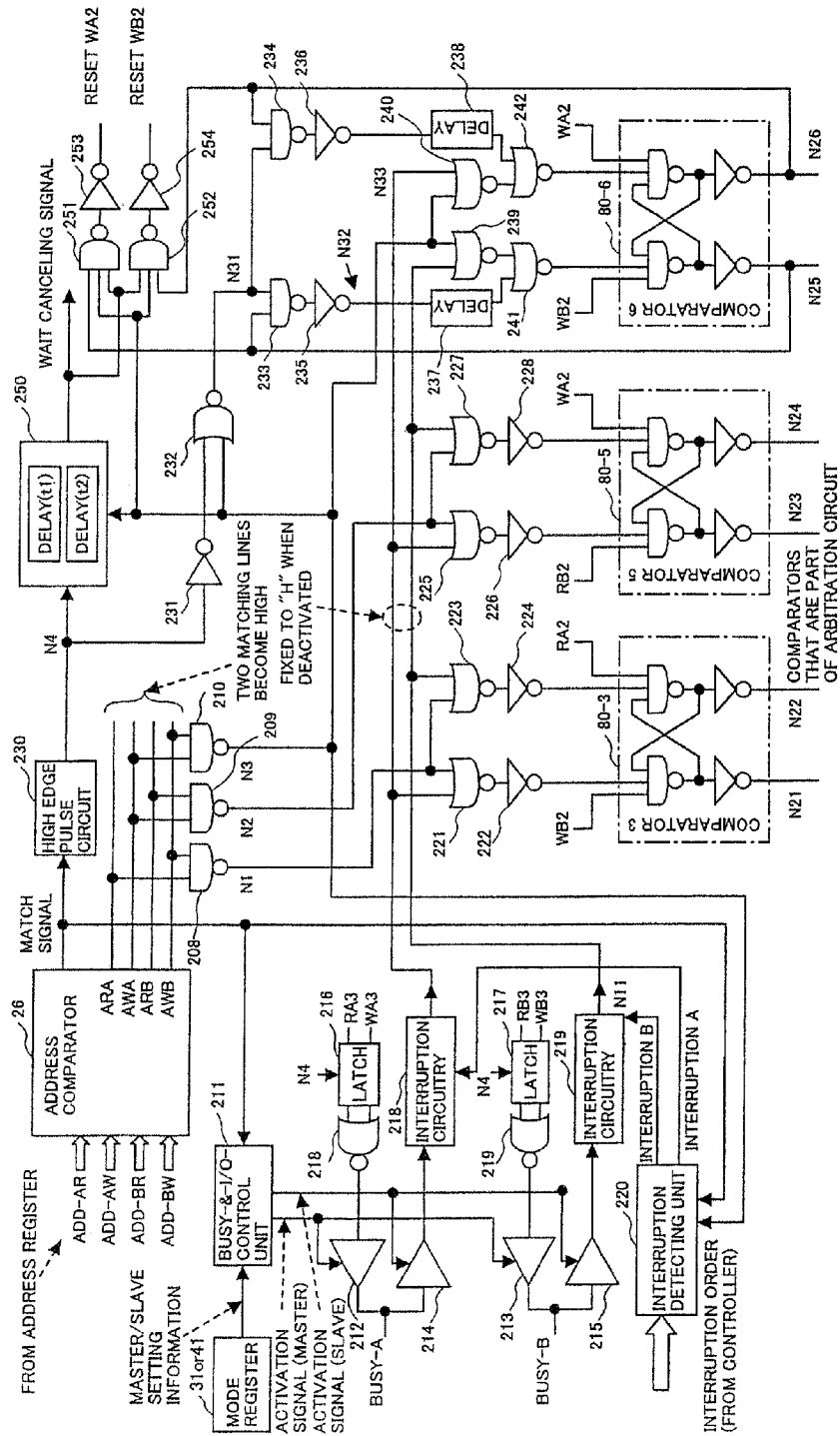
FIG. 31 is a drawing showing the configuration of a address comparator, a BUSY I/O system, and an interruption system of the multi-port memory according to the second embodiment of the present invention (first aspect)

FIG. 31 is a drawing showing the configuration of the address comparator, a BUSY I/O system, and an interruption system of the multi-port memory according to the second embodiment of the present invention.

The address comparator 26 compares addresses stored in address registers, and outputs a match signal when there is a match between the address of the A port 11 and the address of the B port 12. Moreover, in order to indicate which two addresses are matching addresses, signals ARA, AWA, ARB, and AWB are generated. For example, AWA and AWB are set to "H" when the address of the Write command of the A port and the address of the Write command of the B port show a match. NAND circuits 208 through 210 each obtain a logic NAND of these signals, so that one of N1, N2, and N3 becomes "L".

The BUSY signal I/O units 36 and 46 and an interruption circuitry are provided on the left-hand side of FIG. 31 (under the address comparator 26). Based on the settings of the mode register 31 or 41, a BUSY-&-I/O-hardware-control unit 211 generates an activation signal (master) in response to detection of the match signal in the case of the master device, and generates an activation signal (slave) in the case of a slave device. The activation signal (master) activates BUSY output circuits 212 and 213, and the activation signal (slave) activates BUSY input circuits 214 and 215.

In the arbiter, a command chosen as being first in the command order is output to one of the outputs RA3, WA3, RB3, and WB3 (i.e., one of the outputs is "H"). In the case of the master device, RA3 through WB3 are latched by latches 216 and 217 in response to a signal N4, which is comprised of a pulse corresponding to a rising edge of the match signal. A BUSY-A signal or BUSY-B signal is output based on the latched data.

In the case of a slave device, if the BUSY-A signal that is "L" is received, a signal N10 output from the interruption circuitry 218 is set to "L". If the BUSY-B signal that is "L" is received, a signal N11 that is output from an interruption circuitry 219 is set to "L". The signals N10 and N11 are "H" when they are in a deactivated state, and become "L" when a BUSY signal or an interruption is detected.

An interruption detecting unit 220 detects the interruption command supplied from the controller, and outputs interruption signals A or B. The interruption signals are given priority over an incoming BUSY signal, and are transmitted as signals N10 and N11.

Three comparators 80-3, 80-5, and 80-6 shown at the bottom of FIG. 31 are part of the comparator circuitry of the arbiter 15A (see FIG. 6A and FIG. 24). These comparators make comparisons with respect to command combinations that require BUSY determination.

Figure 32:
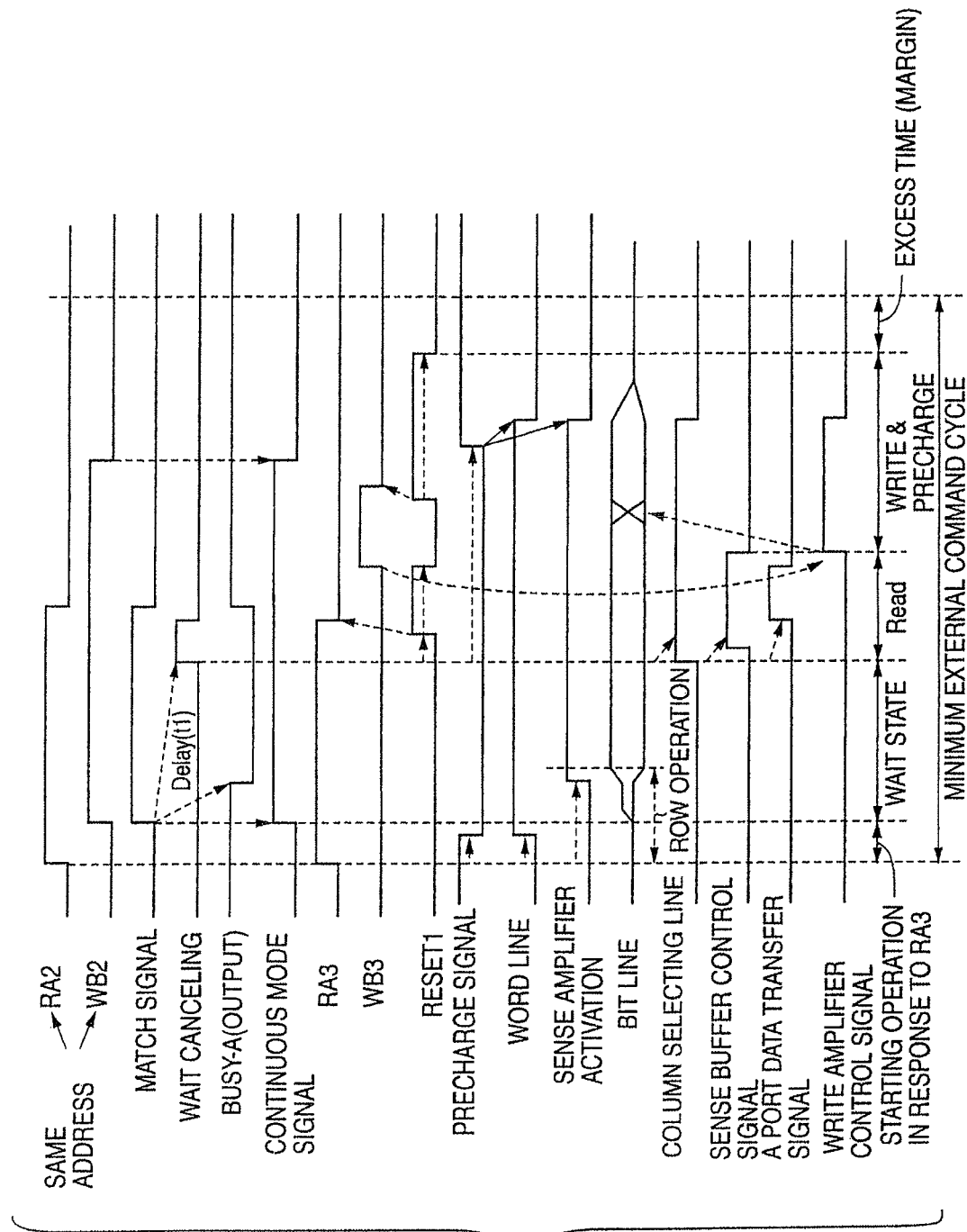
FIG. 32 is a timing chart showing an operation of a master device.
Figure 33:
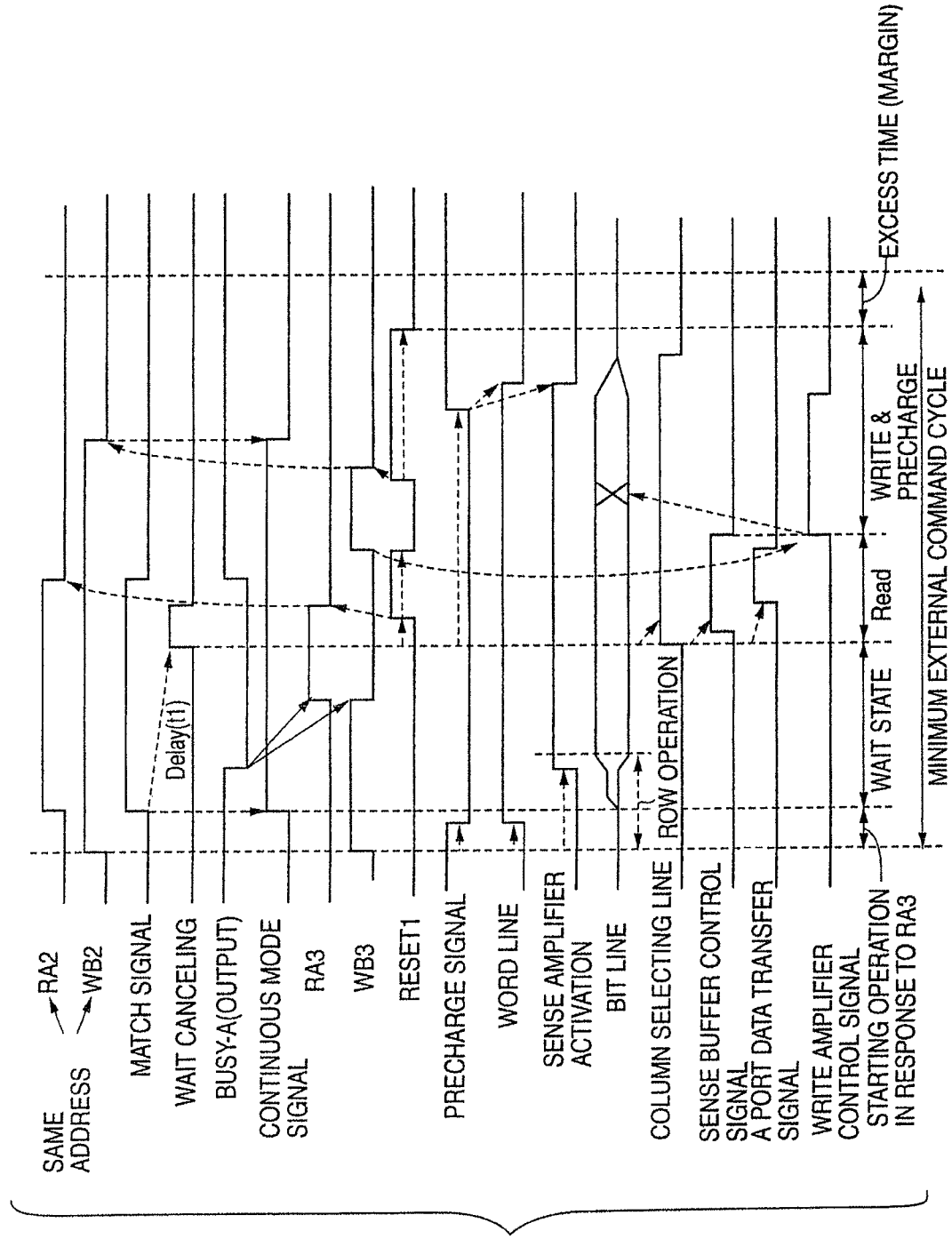
FIG. 33 is a timing chart showing an operation of a slave device.

FIG. 32 is a timing chart showing an operation of the master device. FIG. 33 is a timing chart showing an operation of a slave device.

These timing charts illustrate a case in which the address of a Read command of the A port and the address of a Write command of the B port match each other. The master of FIG. 32 decides that the A port is earlier, and the slave of FIG. 33 decides that the B port is earlier. In this case, the comparator 80-3 of the master outputs N21 being "L" and N22 being "H". Further, the comparator 80-3 of the slave outputs N21 being "H" and N22 being "L". The master generates a BUSY-A signal, and the slave changes N10 to "L" upon receiving the BUSY-A signal. Since N1 is "L" at this point of time, the LOW signal of N10 is supplied to the comparator 80-3 of the slave through a NOR circuit 221 and an inverter 222. In response, the outputs of the comparator 80-3 of the slave change to N21 being "L" and N22 being "H". In this manner, a decision by the arbiter is changed.

Consideration is now given to a case in which the address of a Write command of the A port and the address of a Read command of the B port match each other as opposed to the case that was described above. In this case, the outputs of the comparator 80-5 of the slave are changed, thereby modifying the decision made by the arbiter in the slave.

The comparator 80-6 that compares WA2 with WB2 has a different peripheral circuitry configuration than the comparators 80-3 and 80-5. This is because when the generation of a BUSY signal is in response to a Write-&-Write combination, only one of the command of the A port and the command of the B port is going to stay.

Figure 34:
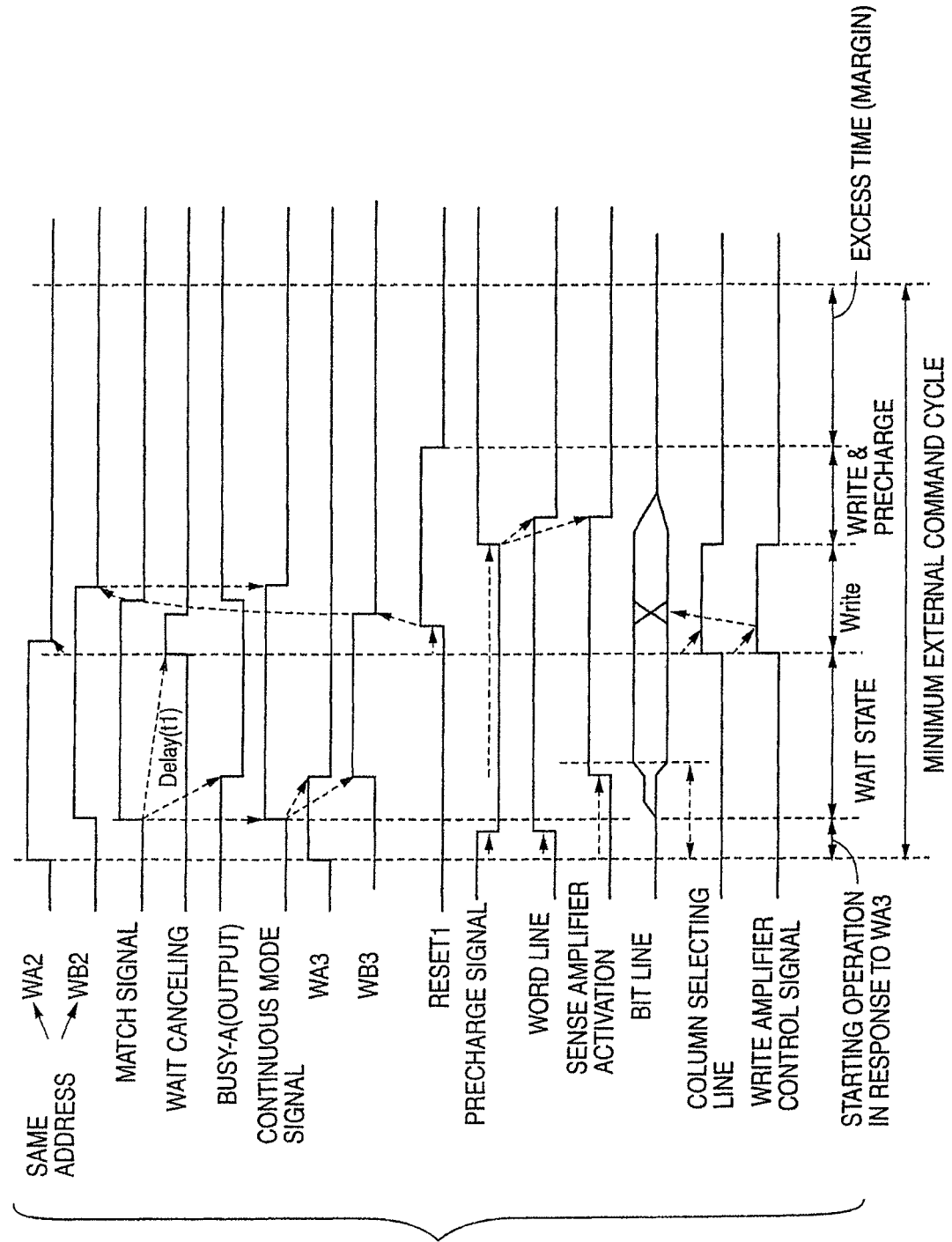
FIG. 34 is a timing chart showing an operation of a master device performed when the write addresses of the two ports are identical.
Figure 35:
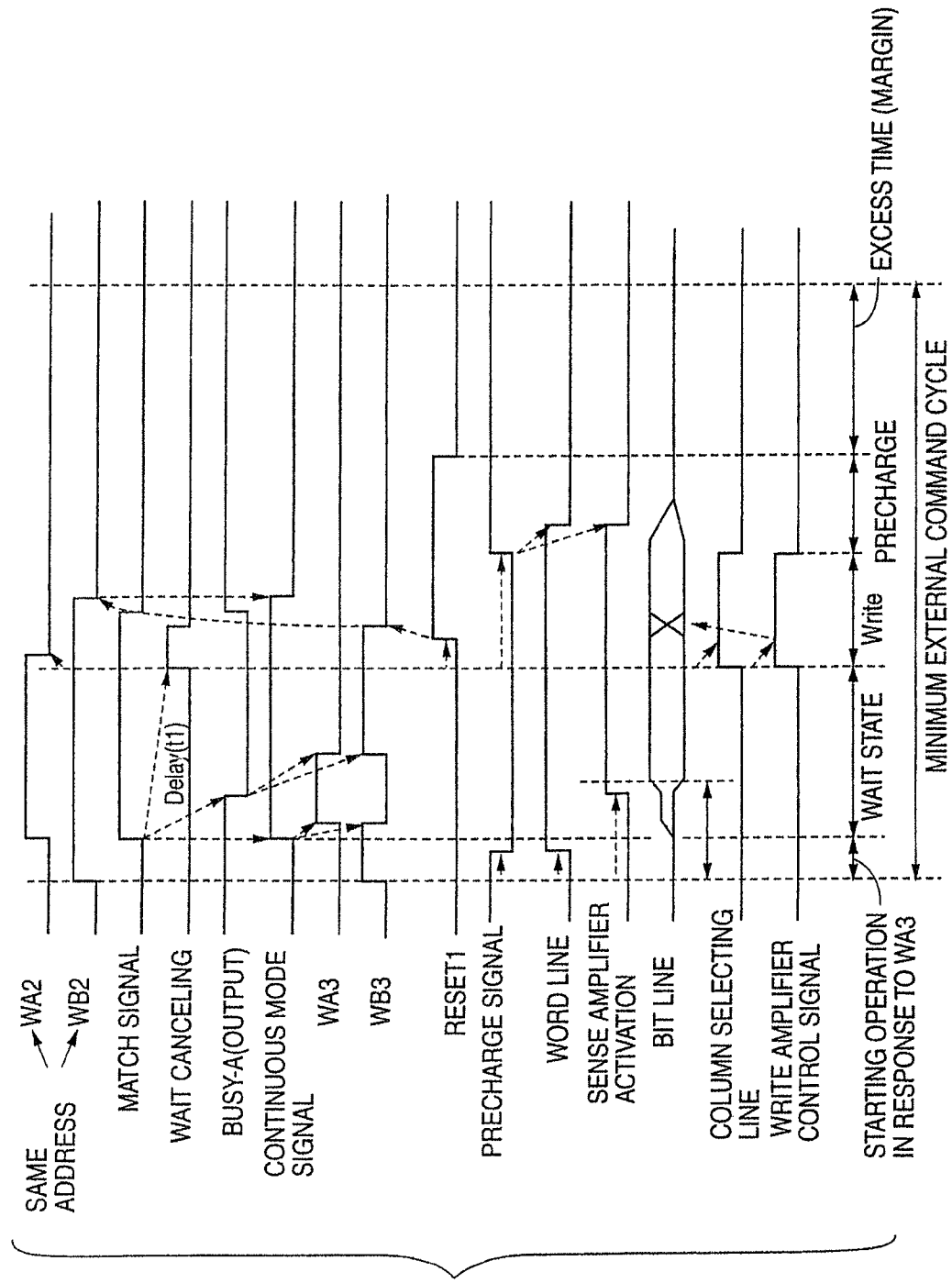
FIG. 35 is a timing chart showing an operation of a slave device performed when the write addresses of the two ports are identical.

FIG. 34 is a timing chart showing an operation of a master device performed when the write addresses of the two ports are identical. FIG. 35 is a timing chart showing an operation of a slave device performed when the write addresses of the two ports are identical.

Consideration is now given to a case in which the master decides that the A port is earlier as shown in FIG. 34, and the slave ascertains that the B port is earlier as shown in FIG. 35. At the instant at which the address comparator 26 has just generated a match signal, the outputs of the comparator 80-6 of the master are N25 being "L" and N26 being "H", and the outputs of the comparator 80-6 of the slave are N25 being "H" and N26 being "L". The master latches RA3, WA3, RB3, and WB3 in this state, and outputs a BUSY-A signal.

When a BUSY signal occurs in a Write-Write combination as in this case, it is necessary to erase a Write command that has been entered earlier. An inverter 231, a NOR circuit 232, NAND circuits 233 and 234, and inverters 235 and 236 are provided for this purpose. In response to the match signal, a HIGH edge pulse circuit 230 generates a "H" pulse of the signal N4. The signal N4 is combined with the signal N3 through a certain logic operation, generating a "H" pulse in the signal N31. In this example, N26 is "H" for the master, so that N33 generates a "H" pulse, resulting in N25 being changed to "H" and N26 being changed to "L". Here, delay circuits 237 and 238 serve to provide an extra time that can be utilized to generate the BUSY signal before the changes occur, and to prevent the already changed status from being changed again as the changed status is fed back to the NAND circuits 233 and 234. In the slave, N25 is changed to "L" and N26 is changed to "H".

As previously described, the master generates a BUSY-A signal, and the slave that receives this signal has N10 thereof changed to "L". Since N3 is "L" at this particular instant, since it is "L", the comparator 80-6 of the slave is reversed again, resulting in the N25 being changed to "H" and N26 being changed to "L".

The delay circuit 250 receives the signal N4, and delays this signal by a predetermined time length, thereby creating a Wait period. Here, Delay (t1) is chosen when N1 or N2 is selected, whereas Delay (t2) is chosen when N3 is selected.

NAND circuits 251 and 252 and inverters 253 and 254 are provided for the purpose of purging the skipped Write command from the command register when the Wait period comes to an end. For example, if N25 is "L" and N26 is "H" at the end of the Wait period, the Write command of the A port will be executed. Accordingly, ResetWB2 is generated in order to eliminate the Write command of the B port from the register. Since it is necessary to change decisions through BUSY reception or interruption during the Wait period, commands in the command registers are left intact for the duration of this period.

Figure 36:
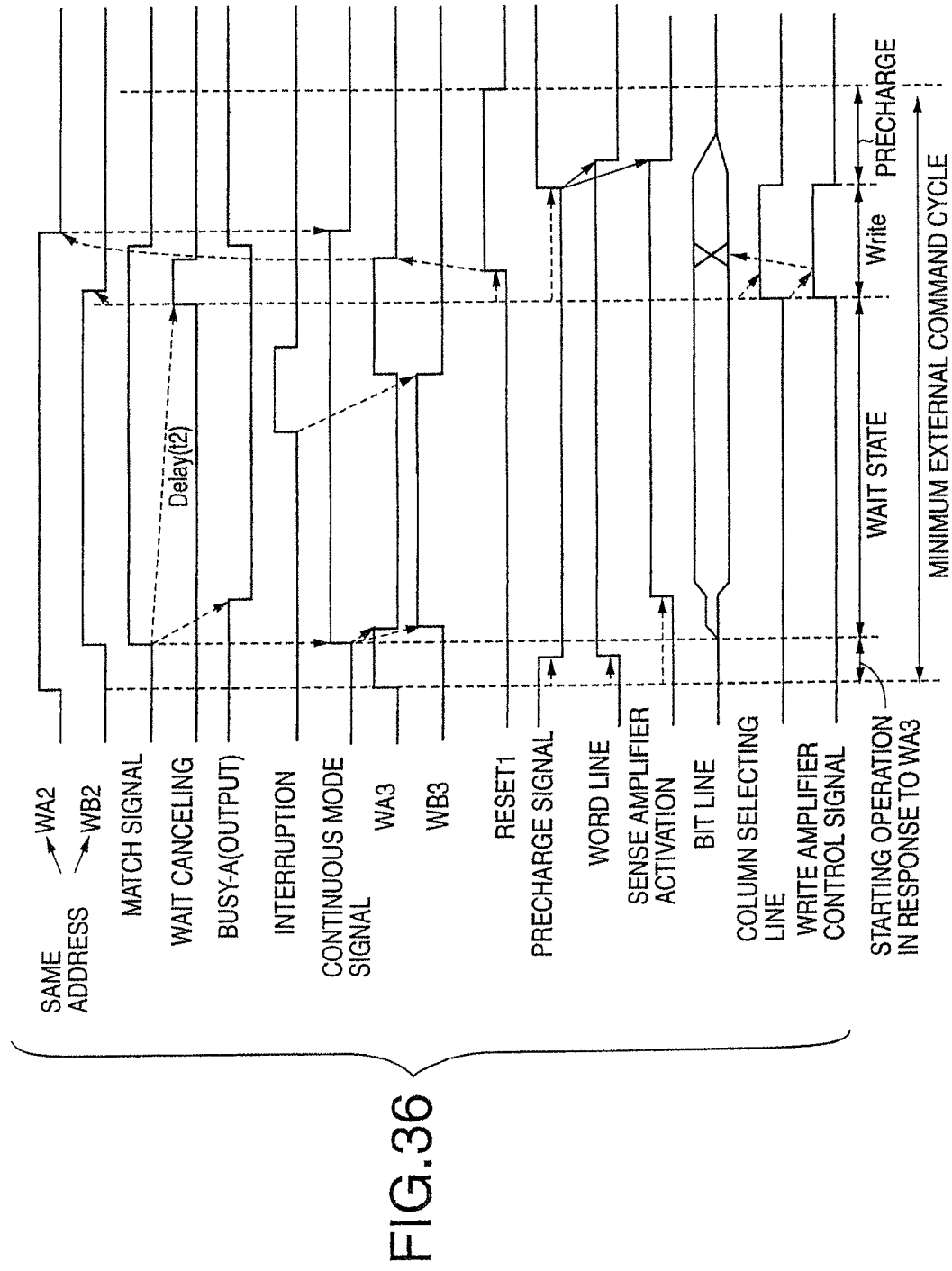
FIG. 36 is a timing chart showing an operation of the master device in the case where the write addresses of the two ports match each other to cause the controller to issue an interruption command.
Figure 37:
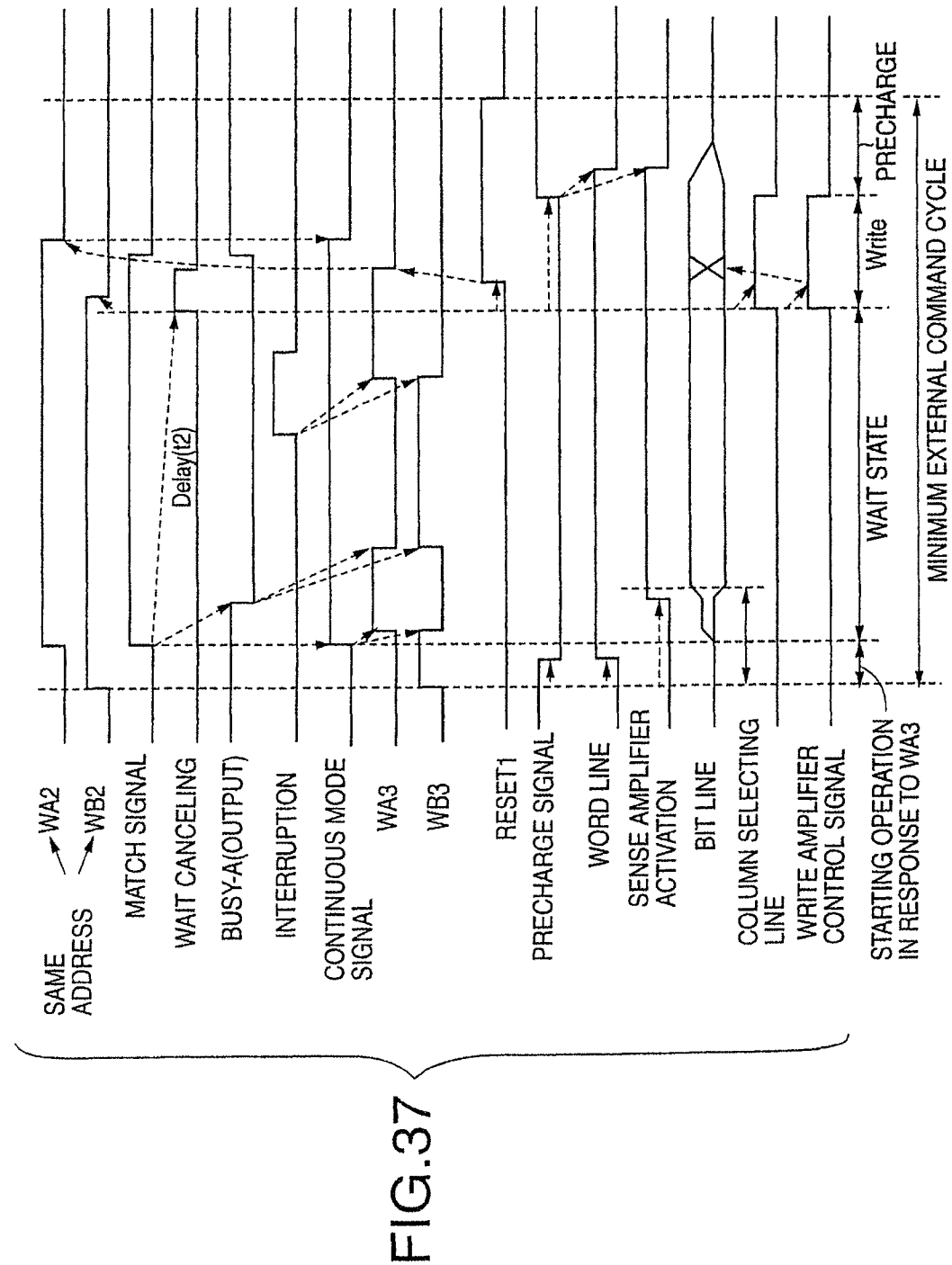
FIG. 37 is a timing chart showing an operation of the slave device in the case where the write addresses of the two ports match each other to cause the controller to issue an interruption command.

FIG. 36 is a timing chart showing an operation of the master device in the case where the write addresses of the two ports match each other to cause the controller to issue an interruption command. FIG. 37 is a timing chart showing an operation of the slave device in the case where the write addresses of the two ports match each other to cause the controller to issue an interruption command.

As shown in FIG. 36, the command selection status in the master device is reversed by interruption. Moreover, as shown in FIG. 37, the command selection status in the slave device is reversed by the BUSY signal, and is then further reversed by the interruption. Here, operations of reversing the status by interruption are the same as those of reversing status by a BUSY signal, and a detailed description thereof will be omitted.

In the operation of the second embodiment described above, a command cycle extending from a given command to the next following command is designed not to change even after a BUSY signal or interruption is generated.

In FIG. 26, for example, although BUSY occurs in response to ReadA2, the command interval of ReadA2→ReadA3 is the same as the command interval of ReadA1→ReadA2. It is required that BUSY and interruption be handled during the Wait period. For this reason, a longer Wait period becomes necessary when exchanging of the BUSY signal or interruption signal takes a long time because of a long system bus, a large number of slave devices, a slow response of the controller, etc.

In order to obviate this problem, the Wait period may be extended while delaying the next command input following the BUSY or interruption. Namely, the command interval of ReadA2→ReadA3 may be extended so as to be longer than the command interval of ReadA1→ReadA2 in FIG. 26 while lengthening Wait period.

In order to delay a command input, the delaying of command input may be specified in a design sheet, and the controller may be designed to operate according to the data sheet. Extension of the Wait period is achieved by lengthening the delay time of the delay circuit 250 shown in FIG. 31. If the Wait period needs to be adjusted according to usage, two or more delay lines may be provided in the delay circuit 250 so as to make is possible to change the setting of a delay length through the setting of a mode register.

When the Wait period is extended in this manner, a long Wait period can be provided in other cases in addition to the case in which the BUSY signal is generated in response to a Write-Write command combination. In consideration of this, the controller may issue an interruption command even when a BUSY signal occurs in response to a Read-Write or Write-Read command combination.

In the present invention described above, when commands are entered into N ports, all the N commands corresponding to the N ports are executed one after another within a minimum command cycle of any given port. Because of this, an access operation relating to any given port appears to the exterior of the device to be performed within the minimum command cycle. In this case, a BUSY signal can occur only when the same address is accessed from a plurality of ports. It is thus possible to attain a BUSY occurrence probability that is as low as a BUSY occurrence probability of an SRAM-type multi-port memory.

In the semiconductor memory device of the present invention, furthermore, the internal circuit includes a cell array comprised of dynamic-type memory cells and a refresh circuit that defines timings at which the memory cells are refreshed. In a first mode, the memory cells are refreshed in response to a refresh command input to at least one of the N external ports, and, in a second mode, the memory cells are refreshed at the timing that is specified by the refresh circuit.

Namely, the present invention as described above is provided with the first operation mode in which a refresh operation is performed in response to an instruction from an external port and with the second operation mode in which a refresh operation is performed in response to the internal refresh circuit. Because of this configuration, one of the external ports is allowed to operate as a port for refresh management so as to receive refresh commands at constant internals, or the internal refresh circuit performs refresh operations if this port for refresh management is in a deactivated state. This makes it possible to manage refresh operations in a flexible manner according to system configurations.

[Second Aspect of the Invention]

In the following a second aspect of the present invention will be described.

There are several kinds of multi-port memories. Hereinafter, it refers to a memory having a plurality of ports, and allows accesses from the respective ports to be made independently of each other to a common memory array. For example, a multi-port memory of a two-port type is equipped with an A port and a B port, and allows read/write accesses to the common memory to be independently made from a CPU-A linked to the A port and from a CPU-B connected to the B port.

As a multi-port memory of this kind, a memory having an SRAM memory array is known, in which word lines and bit line pairs are provided in duplicate sets, and each memory cell is connected to 2 sets of word lines and bit line pairs. However, this multi-port memory has a problem of low circuit density in that the duplicate sets of word lines and bit line pairs need to be provided.

To obviate this, it is conceivable to use the same mechanism as shared memories used by a computer having a multiprocessor configuration. A shared memory has a plurality of ports provided for a common memory. Typically, an SRAM is used as a memory, and the plurality of ports are implemented as discrete ICs. When accesses are made simultaneously from the plurality of ports, operations responsive to the plurality of ports cannot be performed simultaneously because the memory array is of shared use. The easiest way to prevent such a problem is to generate a busy signal to a port to prevent an access thereto when access is being made from another port. This, however, gives rise to a problem of limiting usage of the memory. In consideration of this, an arbitration circuit called arbiter is provided for a common memory, and determines priority of access requests received by the plurality of ports. A control circuit of the memory array is configured to carry out operations responsive to access requests in an order of priority. For example, access requests are attended in an order of arrival, i.e., in an order in which the access requests are supplied to respective ports.

In such a case, the memory array ends up being accessed at random from the plurality of ports. Because of this, a column access operation that successively accesses consecutive column addresses at the same row address is not provided whereas such a column access operation is typically available in DRAMs. That is, a cell is selected, accessed for read/write operation, and reset, all of which are performed in response to a single access.

When a shared memory is to be implemented, in general, an SRAM is conventionally used as a memory array. This is because an SRAM is capable of high-speed random access operations, and, also, it is easy to use an SRAM because there is no need for refresh operation. Moreover, a multi-port memory of a single chip is conventionally provided with duplicate sets of word lines and bit line pairs, and a multi-port memory of a single chip based on a memory array having an ordinary SRAM configuration has not yet been used in practice.

In summary, multi-port memories and shared memories are implemented by using SRAMs, and DRAMs are not used that require refresh operations.

The amount of data to be processed increases as systems offer increasingly high performance, and multi-port memories are also required to have a large capacity. It is conceivable to implement a multi-port memory by using a dynamic-type-memory-cell (DRAM) array that has a higher circuit density than the SRAMs, thereby providing a multi-port memory having a large storage capacity at a low cost. Refresh operation of the memory cells, however, poses a problem.

In conventional DRAms, a refresh command needs to be provided at constant intervals from an exterior of the device between read/write commands. To this end, a controller device in a DRAM-based system is provided with a timer and/or a control circuit for refresh management. Such a circuit, however, is not provided in systems that use SRAM-based multi-port memories. Even in a case where memories are implemented based on DRAMs, such memories need to be usable in the same manner in these systems as are the conventional multi-port memories. Namely, a multi-port memory that has a memory array thereof comprised of DRAMs needs to take care of refresh operations by itself.

The present invention is aimed at providing a multi-port memory that has a memory array thereof comprised of a DRAM core, and can be used without any regard to refresh operations, thereby providing a multi-port memory at a low cost that has a large capacity and is easy to use.

Figure 38:
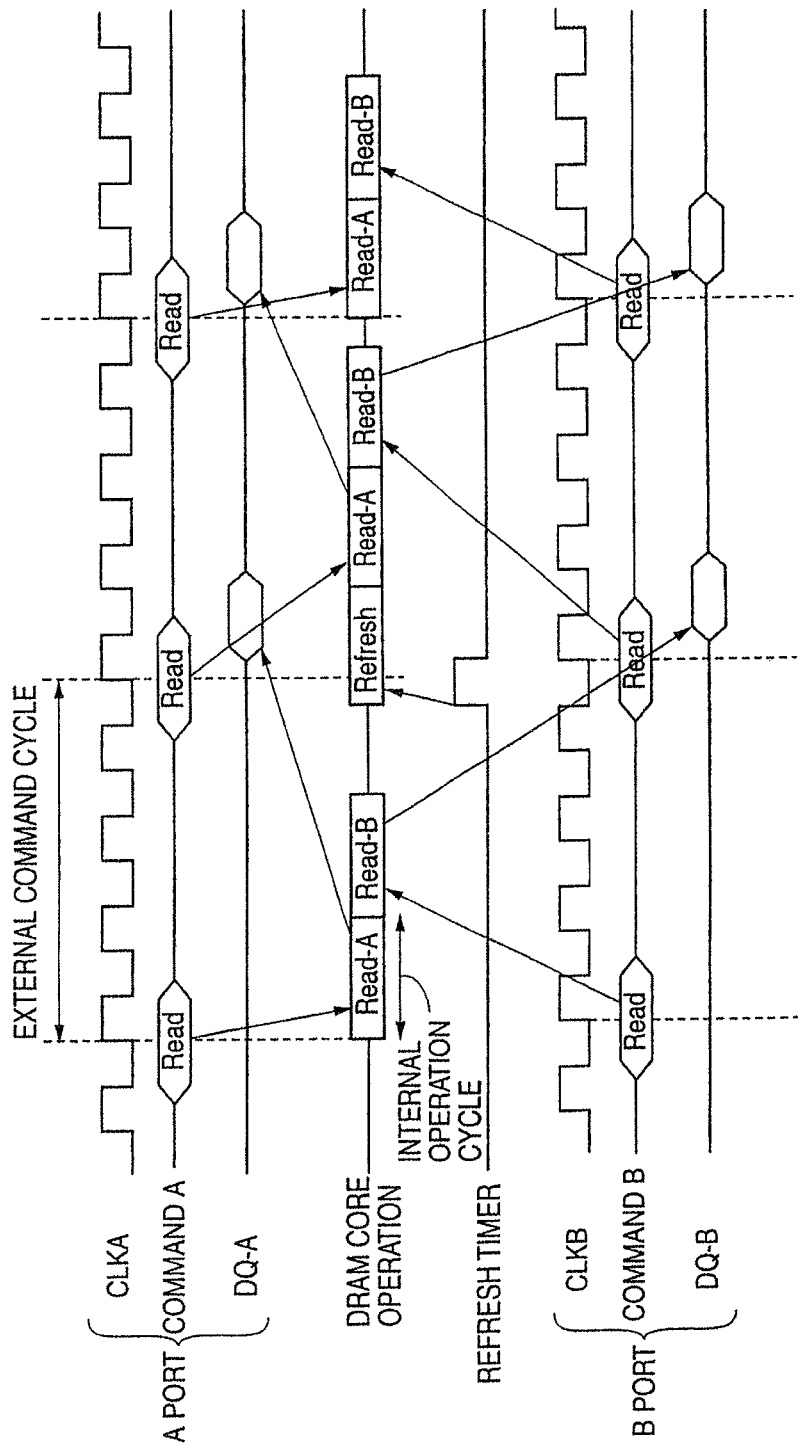
FIG. 38 is a drawing for explaining the principle of the invention (second aspect), showing a case in which read operations are performed with respect to two ports.

FIG. 38 is a drawing for explaining the principle of the invention, and shows a case in which read operations are performed with respect to two ports.

Commands that are supplied to the two external ports, an A port and a B port, are provided at minimum intervals during which three internal operation cycles can be performed. That is, an external command cycle is set to a length longer than a duration that is required for three internal operation cycles. Clocks CLKA and CLKB are input to the A port and the B port, respectively, and exchanges of addresses and data between an exterior of the device and the external ports are conducted in synchronization with the clock signals. Addresses (not shown) are entered concurrently with commands. When read commands are entered into the A port and the B port at the minimum external command cycles, an arbitration circuit controls core operations by giving priority to an input of a first arrival. Three internal operations can be performed during one external command cycle as described above, and two read operations are carried out on the memory array during this external command cycle, followed by outputting the read data to the A port and the B port. Both the A port and the B port hold the retrieved data, and outputs the retrieved data at the start of the next following external command cycle, i.e., in synchronization with the fourth clock from the inputting of the read command. That is, the data latency in this case is 4.

A refresh timer is provided as internal circuitry, and generates a refresh command on its own. Since three internal operations can be performed during one external command cycle as described above, a command A, a command B, and a refresh command can be executed during a single external command cycle when a refresh command is generated. The read data is output at the start of the next following external command cycle. In this manner, the multi-port memory can be accessed from the exterior of the device without any regard to a refresh operation.

In the example of FIG. 38, one item of read data is output in response to one read command. That is, a burst length is 1. After the outputting of read data is completed in one clock cycle, therefore, the external ports will not output any data during the three remaining clock cycles of the external command cycle, which results in inefficient data transfer. This problem can be obviated by elongating the burst length.

Figure 39:
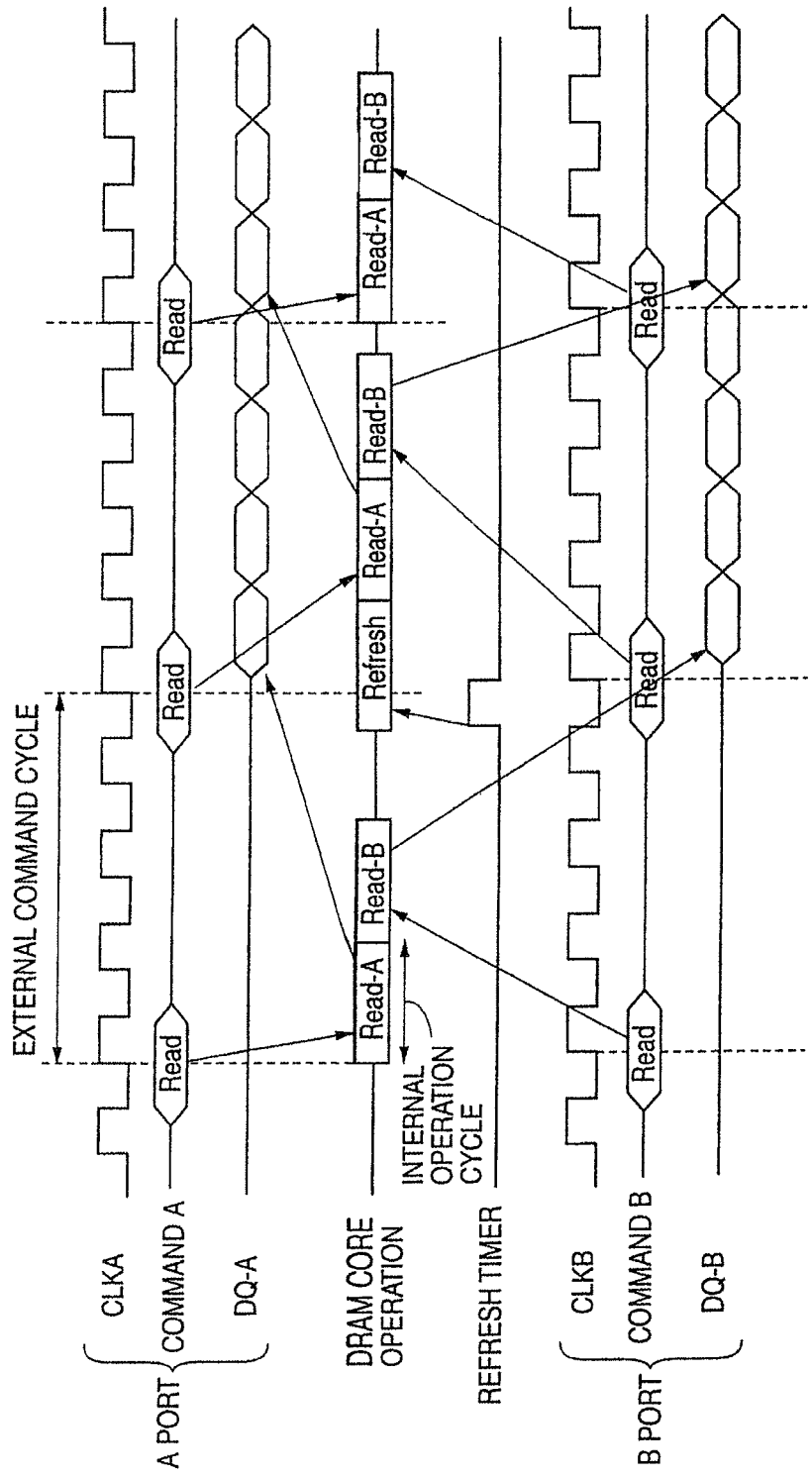
FIG. 39 is a drawing for explaining the principle of the present invention (second aspect), showing an example in which the burst length is 4.

FIG. 39 is a drawing for explaining the principle of the present invention, and shows an example in which the burst length is 4. In this example, like the previous case, the external command cycles of the two external ports are set to a length that can accommodate three internal operation cycles. Further, one external command cycle corresponds to four clock cycles. Data are output four times from an external port during a single external command cycle in synchronization with the clock. Therefore, if the burst length is set according to the number of clock cycles of one external command cycle, gapless read operations are achieved in both of the two ports, thereby significantly boosting the data transfer rate. In this case, it is required that data items as many as the burst length be input/output internally to/from the memory array in response to a single access. For example, if the number of data input/output pins of an external port is 4, and the burst length is 4, it is necessary to ensure that 16-bit data be output/input from/to the memory array by a single access operation.

It should be noted that the A port and the B port do not have to operate in synchronization, and respective external command cycles can be set independently of each other to any timings as long as the minimum cycle is set equal to a duration necessary for three internal operation cycles.

Moreover, the number of external ports can also be any number. If the number of external ports is set to n, the external command cycle of each port is set to such a minimum cycle as n+1 internal operation cycles can be conducted. If this requirement is satisfied, it is possible to perform all the operations requested from the respective ports during an external command cycle even when a refresh operation is carried out, thereby allowing the multi-port memory to be used without any regard to refresh operations.

Figure 40:
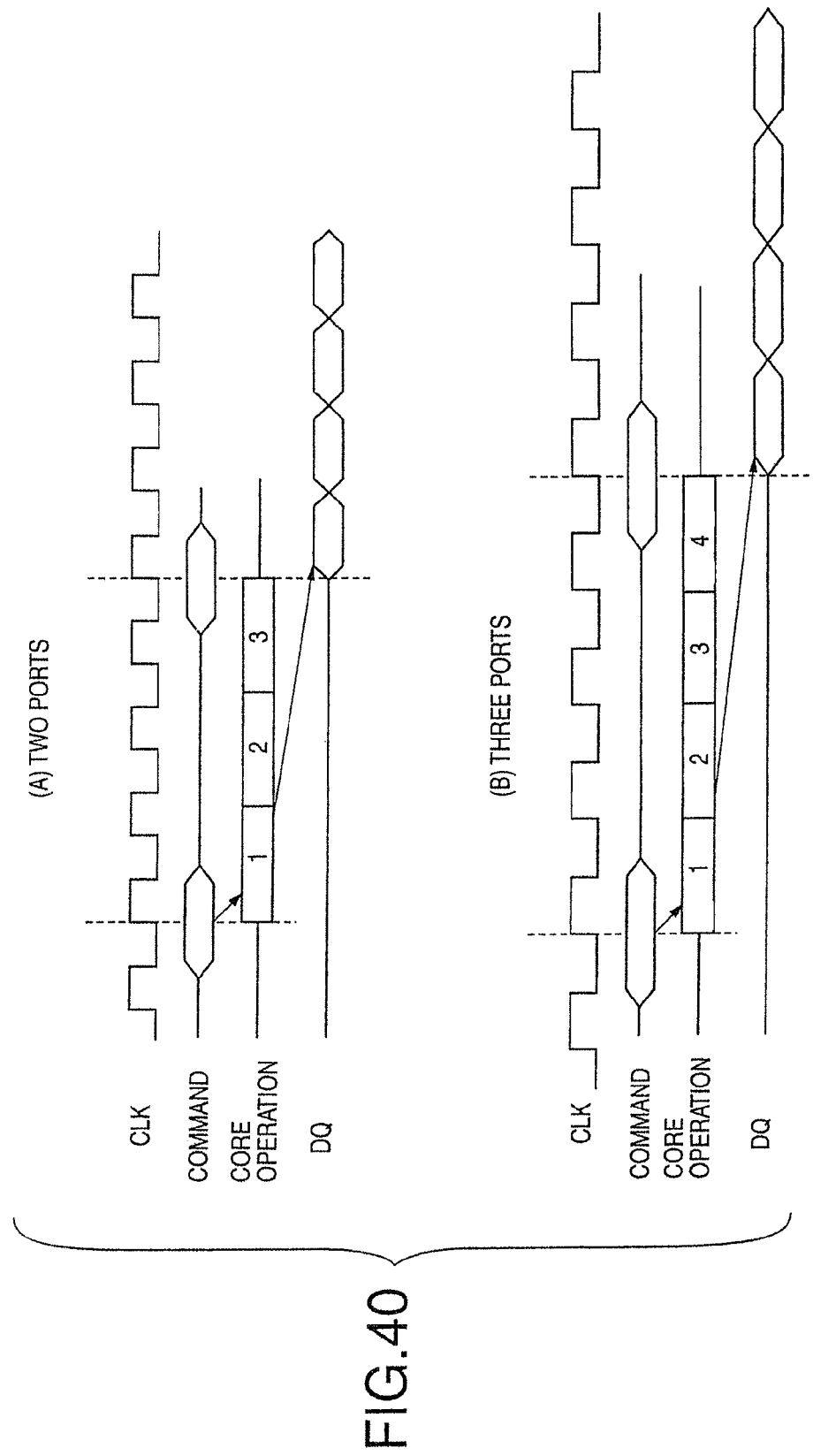
FIG. 40 is a drawing showing the relationship between a minimum external command cycle and internal operation cycles in the case of 2 and 3 ports.
Figure 41:
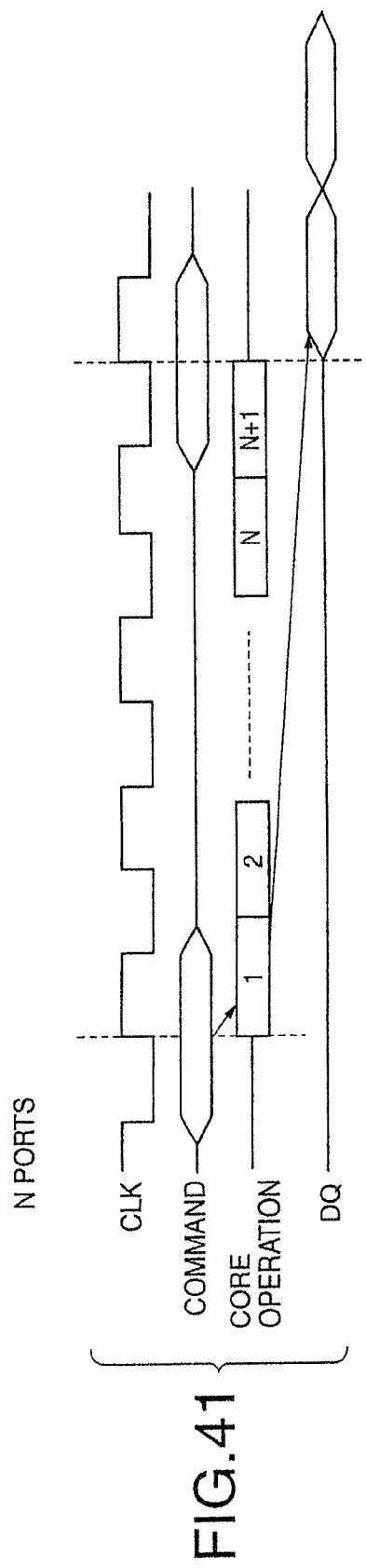
FIG. 41 is a drawing showing the relationship between a minimum external command cycle and internal operation cycles in the case of n ports.

FIG. 40 and FIG. 41 are drawings showing the relationship between a minimum external command cycle and internal operation cycles in the case of 2, 3, and n ports.

As shown in the figures, if the number of ports is 2, the minimum external command cycle has a length that accommodates 3 internal operations, and if the number of ports is 3, the minimum external command cycle is a time period in which 4 internal operations are possible. Further, if the number of ports is n, the minimum external command cycle is equal to a time length in which n+1 internal operations can be carried out.

Figure 42:
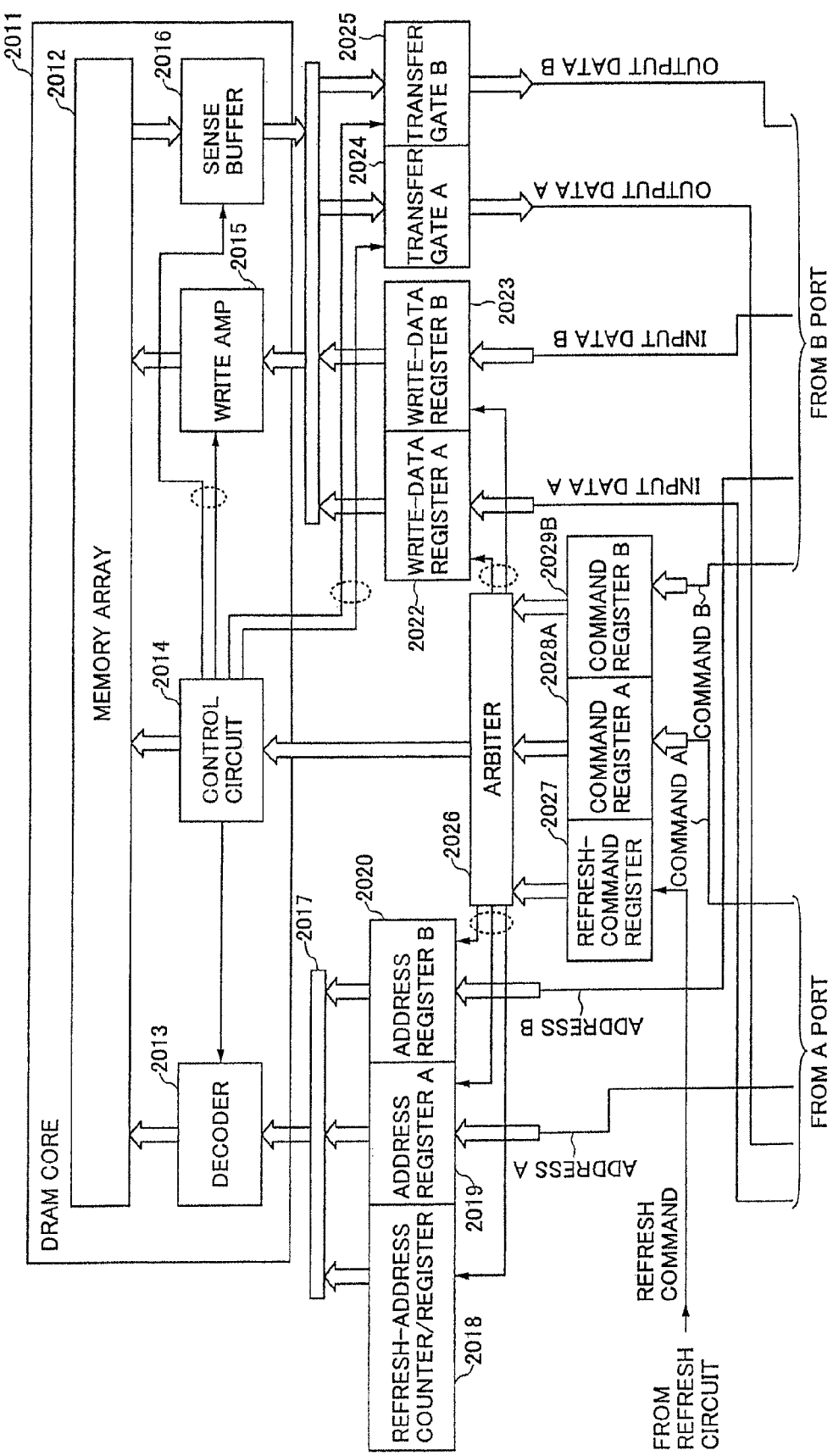
FIG. 42 is a drawing showing a configuration of a multi-port memory according to an embodiment of the present invention (second aspect)
Figure 43A:
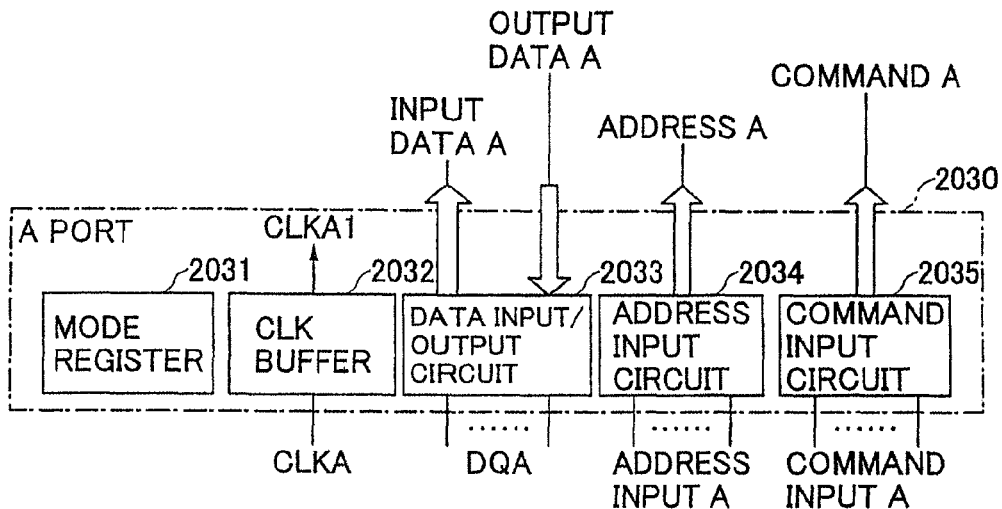
FIGS. 43A through 43C are drawings showing the configuration of the multi-port memory according to the embodiment of the present invention (second aspect)
Figure 43B:
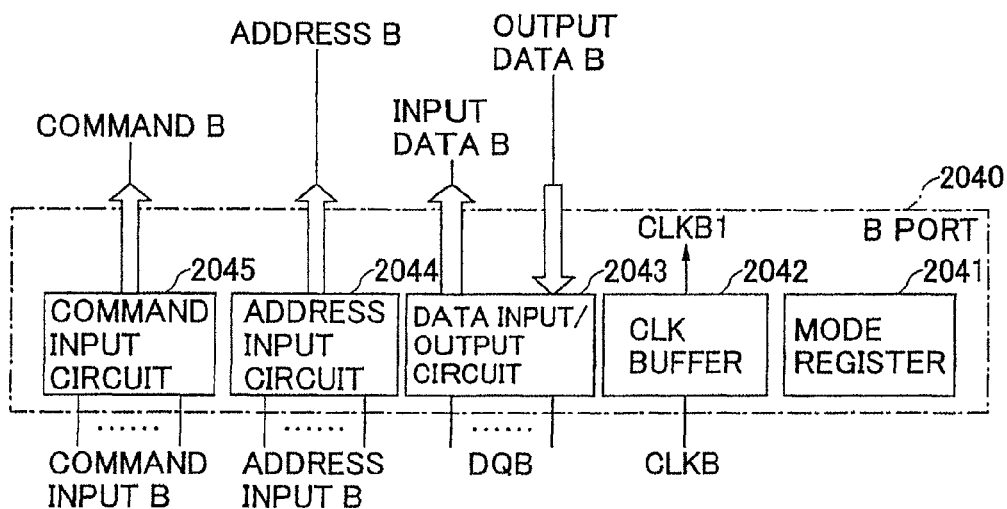
Figure 43C:
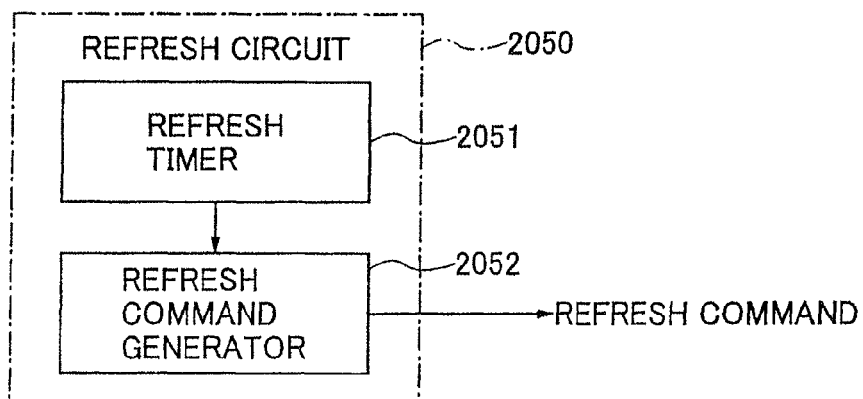

FIG. 42 and FIGS. 43A through 43C are drawings showing a configuration of the multi-port memory according to an embodiment of the present invention. FIG. 42 shows a DRAM core and its relevant circuitry, and FIG. 43A shows the A port, and FIG. 43B shows the B port. Further, FIG. 43C shows a refresh circuit. Circuits shown in FIGS. 43A through 43C are connected to respective portions of FIG. 42.

As shown in the figures, the multi-port memory of this embodiment includes a DRAM core 2011, an arbiter 2026 for the controlling purpose of determining an operation order and insuring that operations are performed in the determined order, sets of registers that temporarily store commands, addresses, and data, two external ports comprised of an A port 2030 and a B port 2040, and a refresh circuit 2050.

The A port 2030 and the B port 2040 include mode registers 2031 and 2041, the CLK buffers 2032 and 2042, data I/O circuits 2033 and 2043, address input circuits 2034 and 2044, and command input units 2035 and 2045, respectively, which operate based on respective separate clock frequencies supplied from the exterior of the device. A data latency and a burst length are stored in the mode registers 2031 and 2041, so that, they can be set separately. The data I/O circuits 2033 and 2043 are equipped with a mechanism to perform the parallel-to-serial conversion and serial-to-parallel conversion of input/output data according to the burst length.

The refresh circuit 2050 includes a refresh timer 2051 and a refresh command generator 2052. The refresh timer 2051 generates a refresh start signal at predetermined intervals, and the refresh command generator 2052 generates a refresh command in response.

Commands, addresses, and write data supplied to the A port and the B port are stored in the registers, respectively. A refresh command is also stored in the refresh command register 2027, and a refresh address is stored in a refresh-address counter/register 2018.

The arbiter 2026 determines an order of command execution based on the order of command arrivals, and transfers commands to the control circuit 2014 of the DRAM core 2011 in the determined order. Further, the arbiter 2026 transmits a transfer signal to a corresponding address register and a corresponding data register (in the case of write operation). In the DRAM core 2011, the control circuit 2014 responds to the supplied command, and controls a decoder 2013, a write amplifier (WriteAmmp) 2015, and a sense buffer 2016 accordingly, thereby performing an access operation with respect to the memory array 2012. In the case of a write operation, the decoder 2013 decodes an address to be accessed for the write operation so as to activate a word line and a column signal line in the memory array 2012, resulting in the write data stored in the Write data registers A 2022 and B 2023 being written in the memory array 2015 through the WriteAmp 2015. In the case of a read operation, the memory array 2012 is accessed in a similar manner, resulting in the read data being transferred from the sense buffer 2016 to the data output circuits of respective ports through transfer gates A 2024 and B 2025. Transfer timings of the transfer gates are controlled according to operation cycles of the DRAM core 2011, and are determined by the control circuit 2014. Output data are output from the data output circuit of each port in synchronization with the corresponding external clock.

In the following, details that are relevant to each of command processing, address processing, and data processing will be described.

Figure 44:
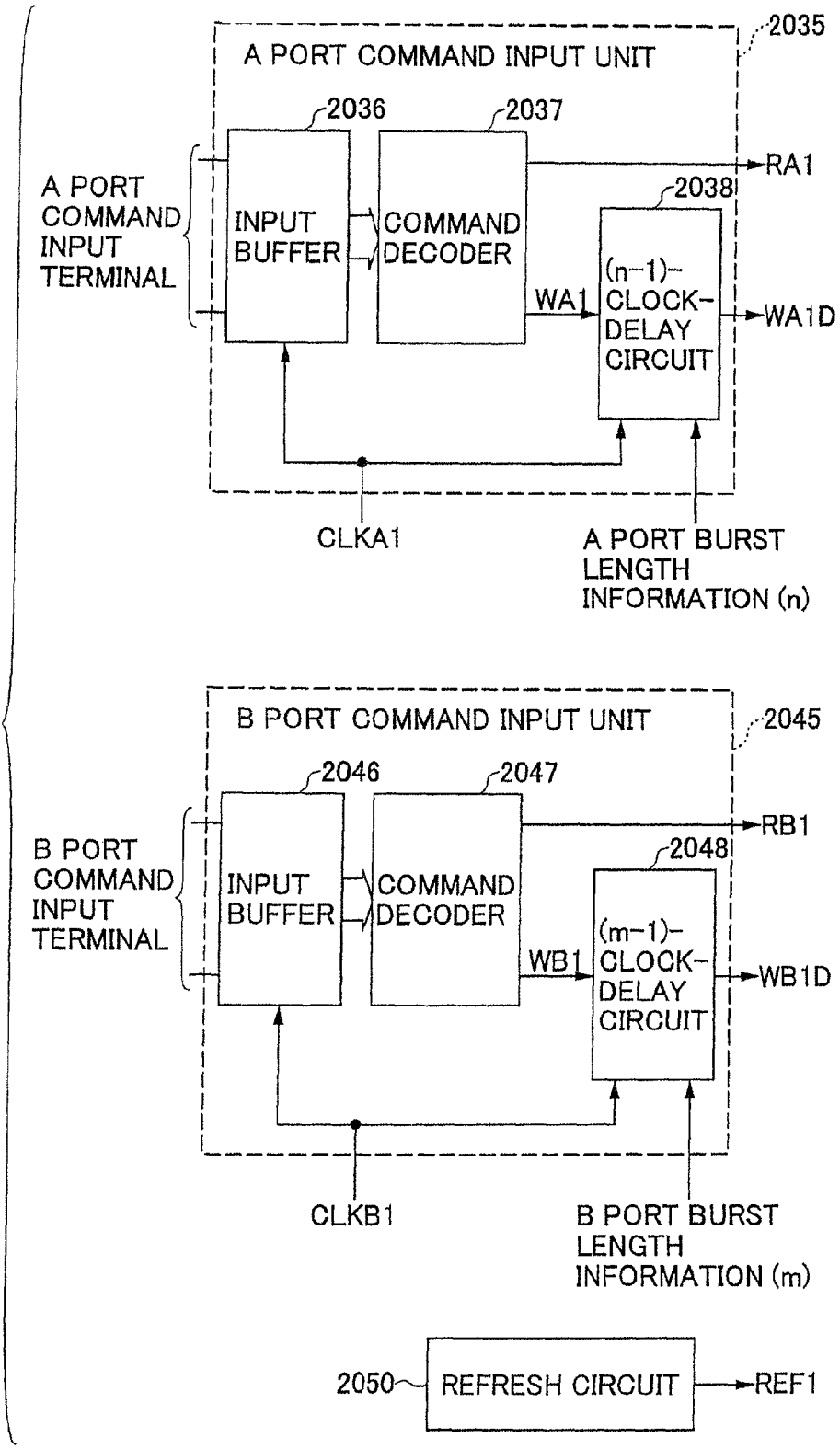
FIG. 44 is a drawing showing a configuration of units relevant to command processing according to a first embodiment.
Figure 45:
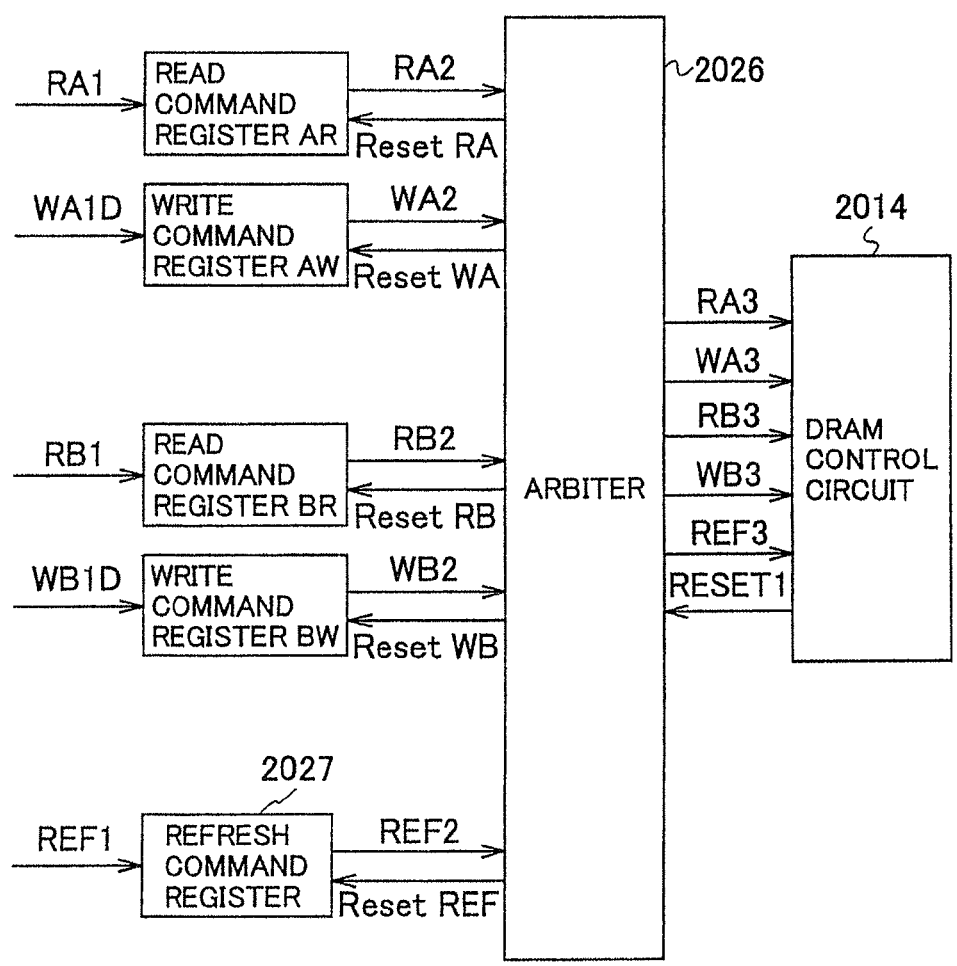
FIG. 45 is a drawing showing a configuration of units relevant to command processing according to the first embodiment

FIG. 44 and FIG. 45 are drawings showing a configuration of units relevant to command processing according to a first embodiment. The same elements as those of FIG. 42 and FIGS. 43A-43C are referred to by the same reference numerals. The same applies in the case of other drawings.

As shown in FIG. 44, the command input unit 2035 of the A port includes an input buffer 2036, a command decoder 2037, and an (n–1)-clock delay 2038, and the command input unit 2045 of the B port includes an input buffer 2046, a decoder 2047, and an (m–1)-clock delay 2048. Here, n and m are burst lengths. Moreover, as shown in FIG. 45, the command register A 2028 includes a Read command register AR and a Write command register AW, and the command register B 2029 includes a Read command register BR and a Write command register BW.

The input buffers 2036 and 2046 acquire supplied Read commands in synchronization with the respective clocks CLKA1 and CLKB1, and the command decoders 2037 and 2047 attend to decoding processes. The command decoders 2037 and 2047 generate RA1 and RB1, respectively, in the case of a read command, and generate WA1 and WB1, respectively, in the case of a write command. The signals RA1 and RB1 are transmitted to the Read command registers AR and BR, respectively, without any timing manipulation, whereas the signals WA1 and WB1 are delayed by the (n–1)-clock delay 2038 and the (m–1)-clock delay 2048 until the last data item of burst data is input, followed by being transmitted to the Write command registers AW and BW, respectively. Moreover, a refresh command REF1 generated by the refresh circuit 2050 is transmitted to the refresh command register 2027.

The arbiter 2026 detects an order in which commands are transferred to these five command registers AR, AW, BR, BW, and 2027, and sends these commands one after another in the detected order to the DRAM control circuit 2014. The DRAM control circuit 2014 executes the received commands, and generates a signal RESET1 to request the arbiter 2026 to send a next command when the command execution finishes or comes close to an end. In response to the RESET1 signal, the arbiter resets the command register in which the executed command is stored, and transmits the following command to the DRAM control circuit 2014.

Figure 46:
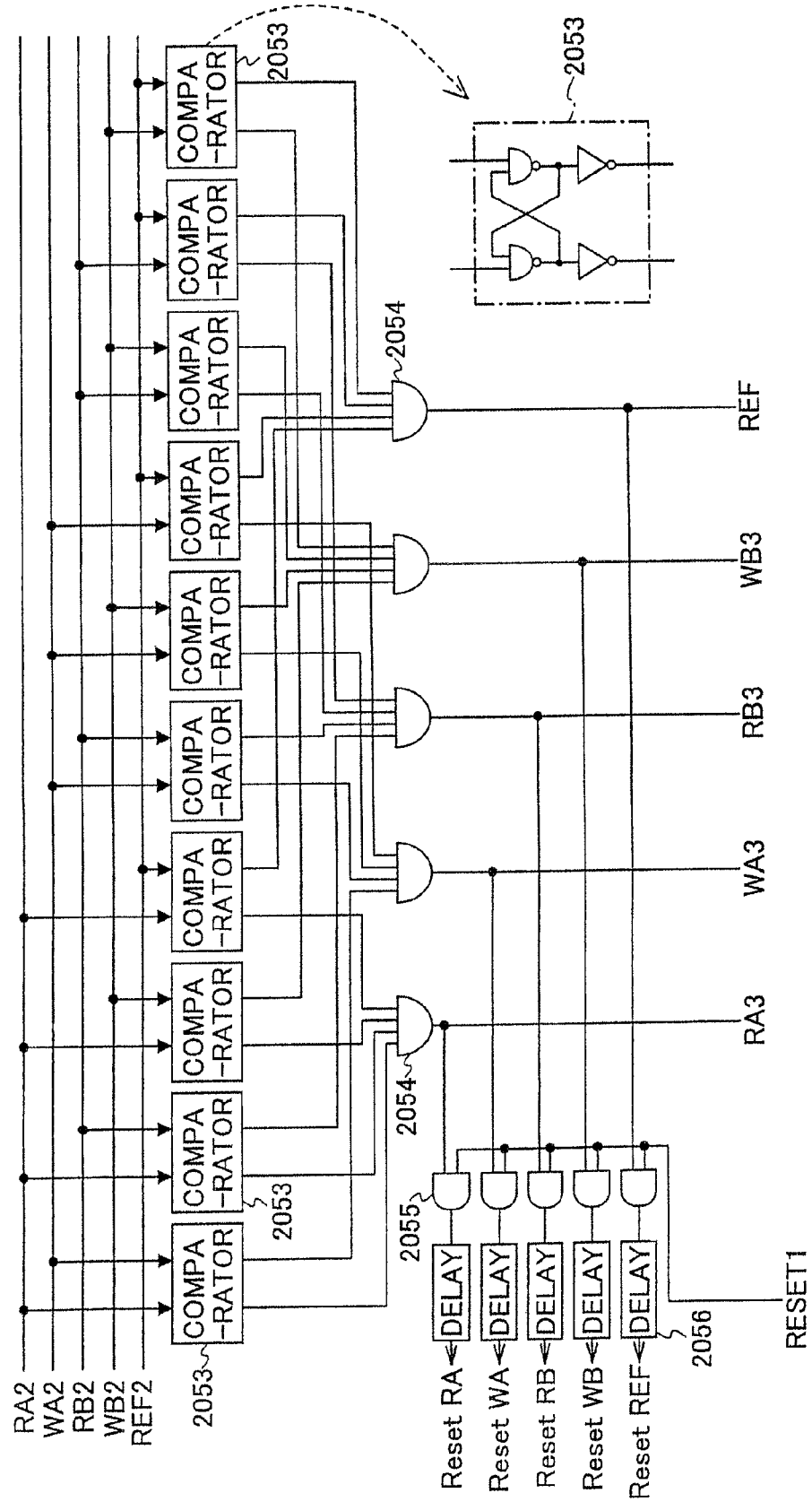
FIG. 46 is an embodiment of an arbiter.

FIG. 46 is an embodiment of the arbiter 2026. An order in which commands arrive in the five command registers of FIG. 45 is detected by comparators 2053 as shown in the figure. Each comparator 2053 compares the timings of two command registers, and changes an output thereof to "H" on the side where "H" is input first. An AND gate 2054 determines whether a given command is input ahead of all the four other commands by checking whether all the relevant outputs of the related comparators 2053 are 'H'. Signals RA3, WA3, RB3, WB3, and REF corresponding to respective commands become "H" if a corresponding command is the earliest, and the address of a corresponding command and the like are transmitted to the DRAM core 2011. When the command is executed by the DRAM core 2011, the signal RESET1 is generated from the DRAM core 2011, and a signal (ResetRA, ResetWA, or the like) for resetting the command register of the executed command is generated. When the command register of the executed command is reset, the output of the comparator 2053 that receives this executed command changes, and the command next in the order will be transmitted to the DRAM core 2011. In this manner, commands are executed in the order of command inputs.

Figure 47:
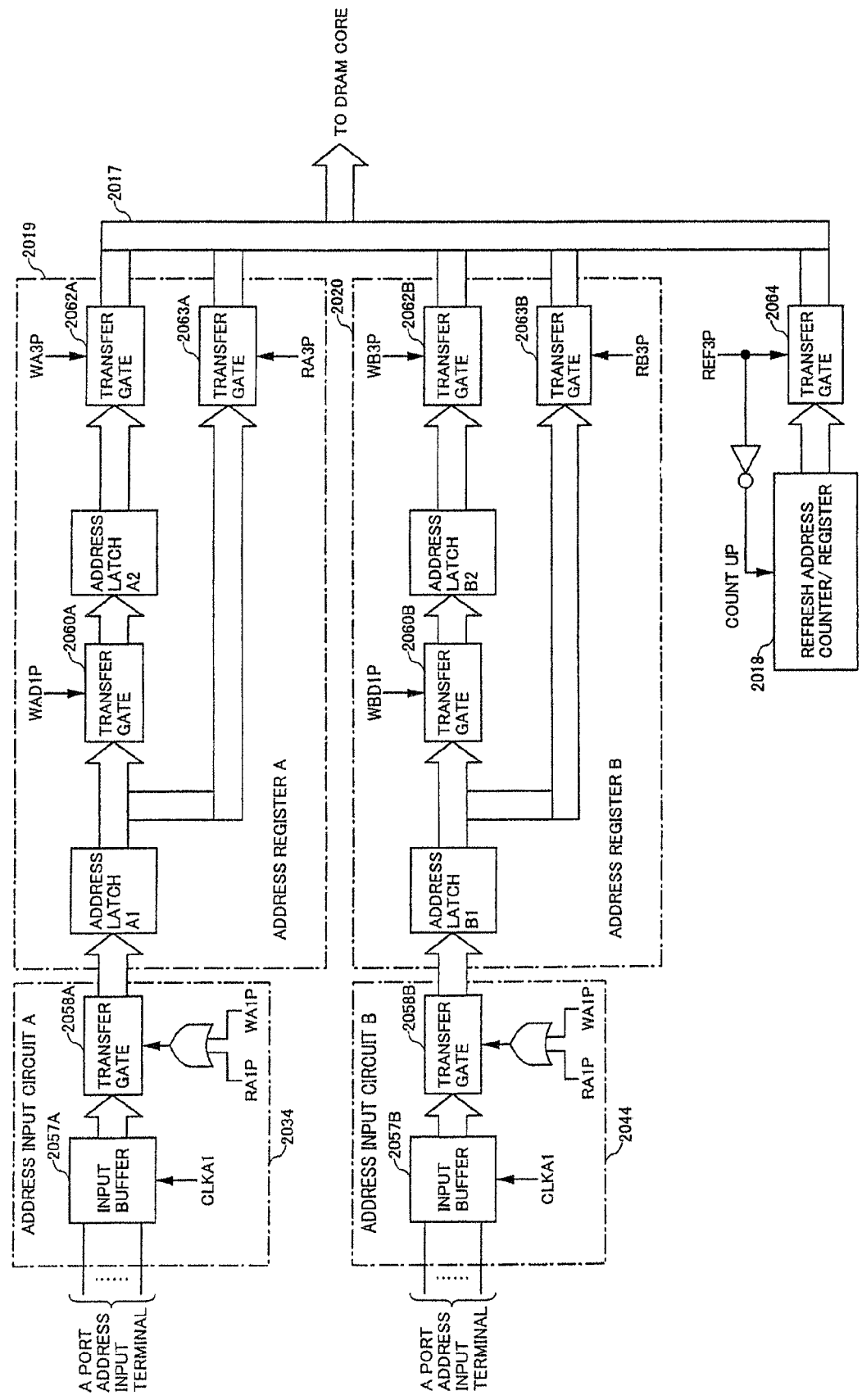
FIG. 47 is a drawing showing a configuration of a portion relevant to address processing according to the first embodiment.

FIG. 47 is a drawing showing a configuration of a portion relevant to address processing according to the first embodiment. Hereinafter, a signal having the letter "P" at the end of its signal name represents a signal that has pulses made from rising edges of a signal of a corresponding signal name. As shown in the figure, the address input circuits 2034 and 2044 include input buffers 2057A and 2057B and transfer gates 2058A and 2058B, respectively. Further, the address register A 2019 and the address register B 2020 include address latches A1 and B1, transfer gates 2060A and 2060B, address latches A2 and B2, transfer gates 2062A and 2062B, and transfer gates 2063A and 2063B, respectively. An address supplied from the transfer gates 2062A, 2062B, 2063A, and 2063B is transmitted to the DRAM core 2011 through an address bus 2017. Further, a refresh address supplied from the refresh-address counter/register 2018 is also transmitted to the DRAM core 2011 through the transfer gate 2064 and the address bus 17.

When a Read command or a Write command is input from an exterior of the device, an address supplied to the input buffer 2057A or 2057B concurrently with the input command is transmitted to the address latch A1 or B1 through the transfer gate 2058A or 2058B, respectively. In the case of a Read command, the address is sent to the DRAM core 2011 through the transfer gate 2063A or 2063B in synchronization with the transfer of the command to the DRAM core. In the case of a Write command, an address is transferred further to the address latch A2 or B2 at the timing of the last data acquisition, and, then, is transferred through the transfer gates 2062A or 2062B to the DRAM core 2011 in synchronization with the transfer of the command to the DRAM core. Further, the refresh-address counter/register 2018 generates and keeps therein a refresh address, which is then transmitted through the transfer gate 2064 to the DRAM core 2011 in synchronization with the transfer of the refresh command to the DRAM core.

Figure 48:
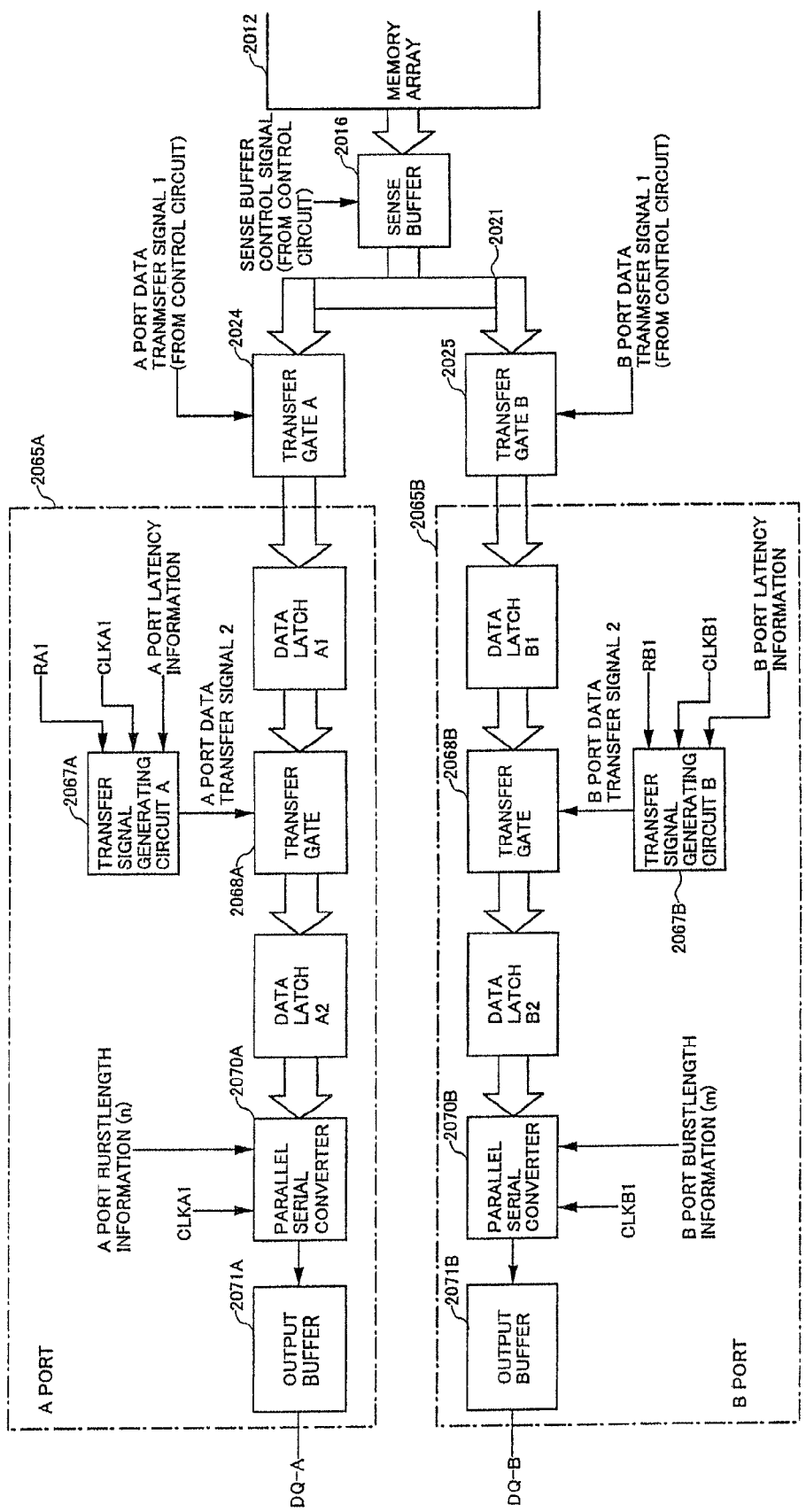
FIG. 48 is a drawing showing a configuration of a portion relevant to data outputting according to the first embodiment.
Figure 49:
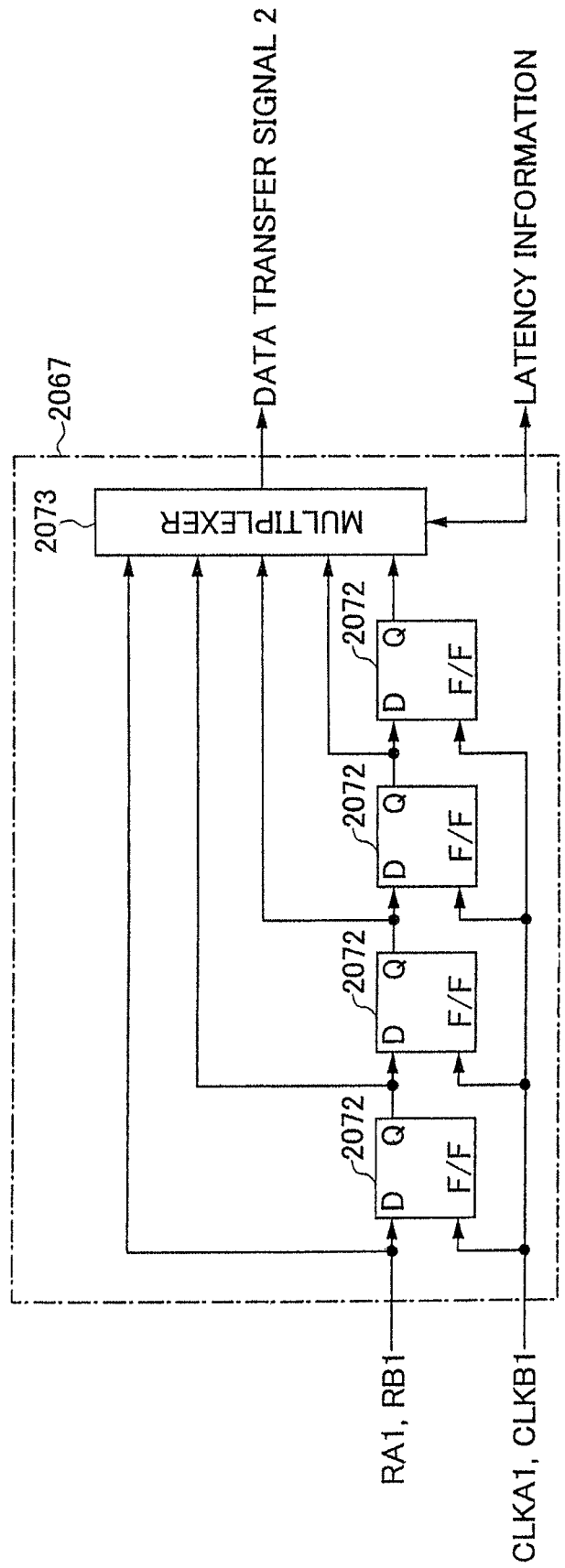
FIG. 49 is a drawing showing a transfer signal generating circuit of FIG. 48.

FIG. 48 is a drawing showing a configuration of a portion relevant to data outputting according to the first embodiment. FIG. 49 is a drawing showing a transfer signal generating circuit of FIG. 48. The respective data I/O circuits 2033 and 2043 of the A port 2030 and the B port 2040 include data-output-purpose circuits 2065A and 2065B and data-input-purpose circuits 2074A and 2074B, respectively, which will be described later. As shown in the figure, data read from the memory array 2012 through the sense buffer 2016 are transmitted to the data-output-purpose circuit 2065A or 2065B through the data bus 2021 and the transfer gate 2024 or 2025, respectively.

The data-output-purpose circuits 2065A and 2065B include data latches A1 and B1, transfer signal generating circuits 2067A and 2067B, transfer gates 2069A and 2069B, data latches A2 and B2, parallel-to-serial converters 2070A and 2070B, and output buffers 2071A and 2071B, respectively.

The transfer gates 2024 and 2025 are controlled by the control circuit 2014 of the DRAM core 2011 based on the internal operations. If the executed command is Read-A (i.e., a read operation with respect to the A port), the transfer gate 2024 will be open. If the executed command is Read-B, the transfer gate 2025 will be open. The data latches A1 and B1 store the data therein, which are then transmitted the respective data latches A2 and B2 a predetermined latency after the reception of Read commands in the respective ports where such latency is introduced through operations of the transfer gates 2068A and 2068B. The data are then converted by the parallel-to-serial converters 2070A and 2070B, followed by being transferred to the output buffers 2071A and 2071B to be outputted therefrom, respectively.

As shown in FIG. 49, the transfer signal generating circuits 2067A and 2067B employ a series of flip-flops 2072 to delay the respective Read commands RA1 and RB1 by such a number of clock cycles as determined by the latency settings, thereby generating a data transfer signal 2002. Since the transfer of read data from the transfer gates 2068A and 2068B is responsive to the data transfer signal 2002, the read data ends up being delayed from the timing of read operation by as many clock cycles as equivalent to the latency.

Figure 50:
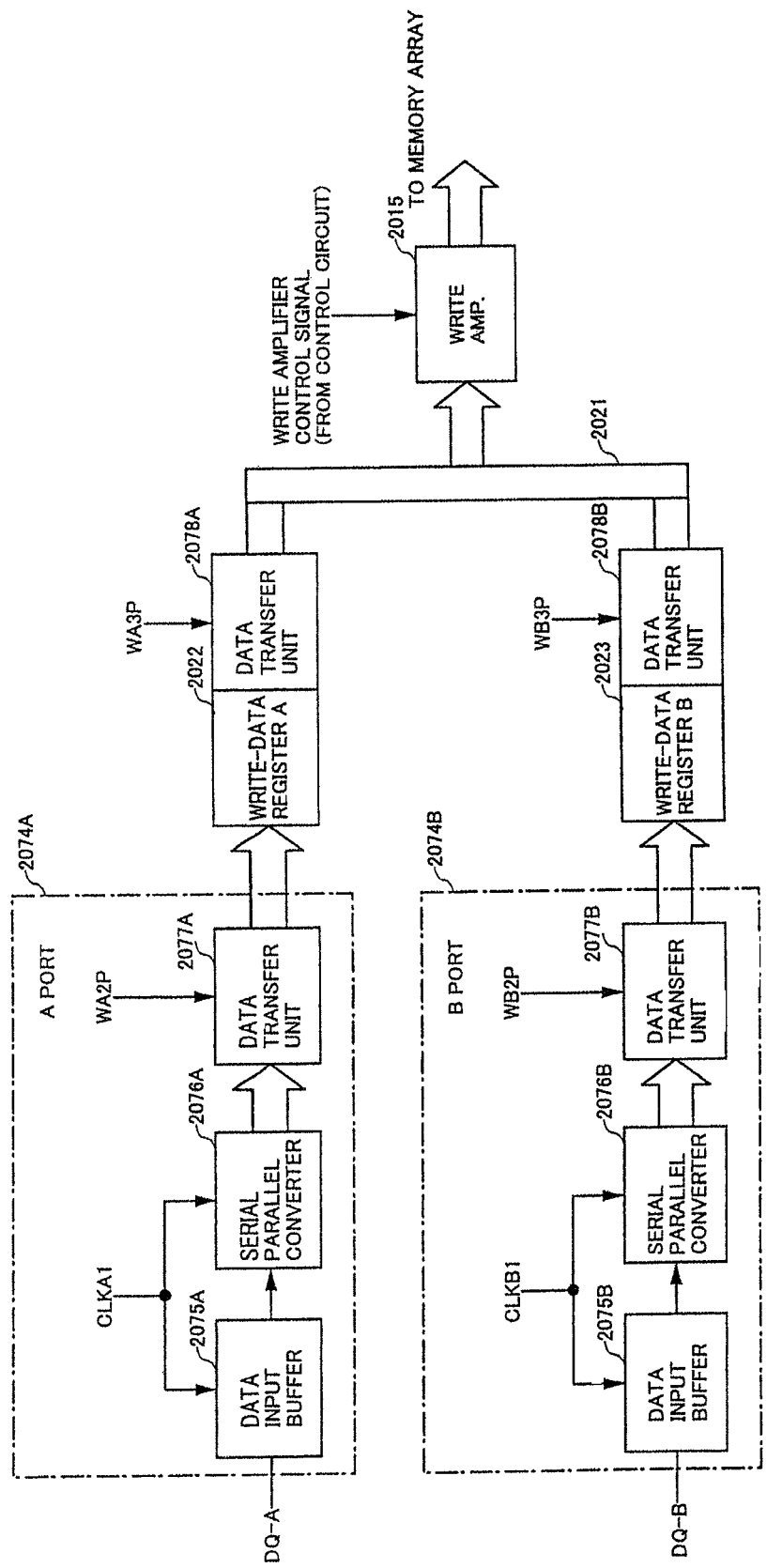
FIG. 50 is a drawing showing a configuration of a portion relevant to data inputting according to the first embodiment.

FIG. 50 is a drawing showing a configuration of a portion relevant to data inputting according to the first embodiment. The data-input-purpose circuits 2074A and 2074B include data input (Din) buffers 2075A and 2075B, serial-to-parallel converters 2076A and 2076B, and data transfer units 2077A and 2077B, respectively. Write data from the data transfer units 2077A and 2077B are sent to the WriteAmmp 2015 through the Write data registers 2022 and 2023, the data transfer units 2078A and 2078B, and the data bus 21, respectively, and are written in the memory array 2012.

Serially input data are converted from serial to parallel according to the burst length, and are then transmitted to the Write registers 2022 and 2023 at the timing at which the last data item is input. When the Write command is transmitted to the DRAM core 2011 from the arbiter 2026, the corresponding data will also be transmitted to the DRAM core 2011 through the data transfer gate 2078A or 2078B.

FIG. 51 to FIG. 58 are time charts which show operations of the multi-port memory of the first embodiment. FIG. 51 and FIG. 52, FIG. 54 and FIG. 55, and FIG. 57 and FIG. 58 are drawings which divide a single time chart for the sake of proper illustration, one showing the first half of the time chart and the other showing the second half with some overlaps therebetween.

Figure 51:
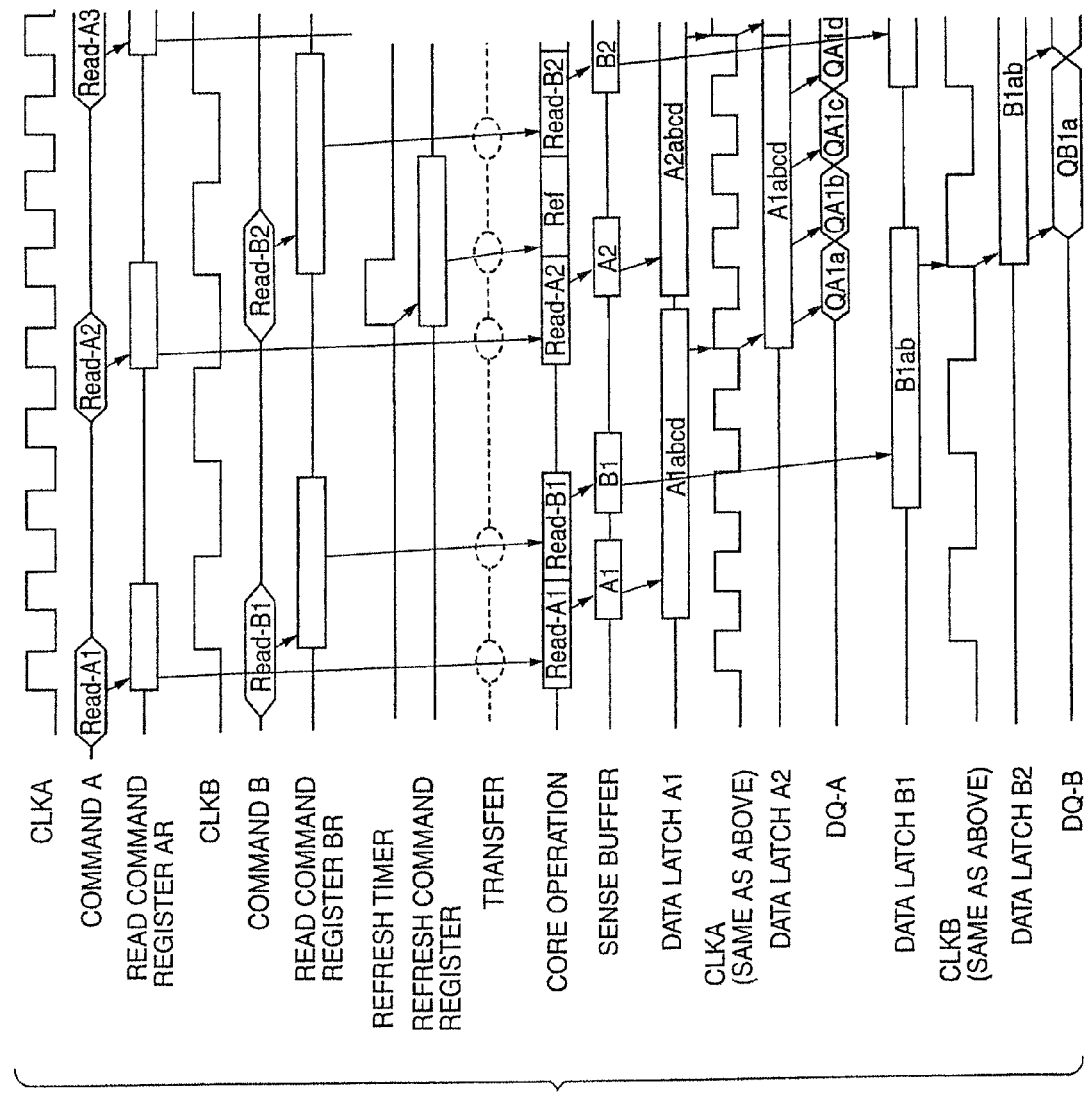
FIG. 51 shows operations performed when Read commands are consecutively input to the two ports.
Figure 52:
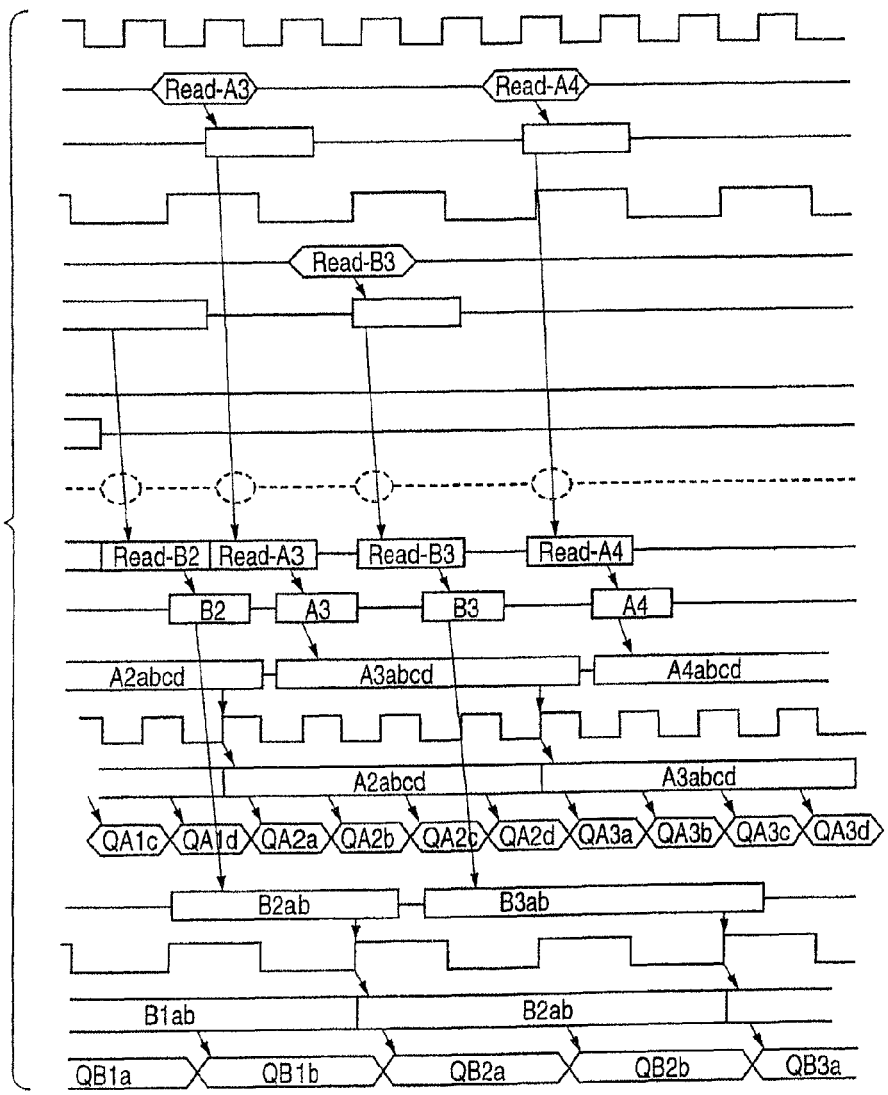
FIG. 52 shows operations performed when Read commands are consecutively input to the two ports.

FIG. 51 and FIG. 52 show operations performed when Read commands are consecutively input to the two ports. The A port and the B port, which are provided with the respective clocks CLKA and CLKB having mutually different frequencies, take in a command, an address, and write data in synchronization with the received clock, and output retrieved data in synchronization with the clocks. In this example, the A port operates at a maximum clock frequency, and the B port operates at a clock frequency slightly slower. For the A port, a Read command cycle=4 (CLKA), a data latency=4, and a burst length=4. For the B port, a Read command cycle=2 (CLKB), a data latency=2, and a burst length=2. The data latencies and the burst lengths are set in the mode registers 2031 and 2041 of the respective ports. In this example, the inputting/outputting of data is performed 4 times in synchronization with clocks in response to one command, and the retrieved data is output 4 clocks after the inputting of a read command.

The commands supplied to the ports A and B are stored in the command registers 2028 and 2029, respectively. When the refresh timer 2051 generates a signal, the refresh command register 2027 stores therein a refresh command. The arbiter 2026 monitors these command registers, and transmits these commands to the DRAM core 2011 in the order in which they are issued. A next command is transmitted after processing of the last transmitted command is completed. Data read from the DRAM core 2011 are transmitted to the data latches 2069A and 2069B of the respective ports from the sense buffer 2016, and are then converted into serial data from parallel data, followed by being output as burst data in synchronization with the respective external clocks.

As shown in the figure, a command Read-A2 is input into the Read command register AR and a command Read-B2 is input into the Read command register BR. Before this, a refresh occurs once, and a refresh command is input into the refresh command register. According to the order of command issuances, the arbiter 2026 transmits these commands to the DRAM core 2011 in the order of Read-A2→Ref→Read-B2, and these commands are then executed by the core. Even when a refresh operation is performed internally, it appears externally that data are output after a predetermined data latency. There is thus no need to pay any regard to refresh operations.

Figure 53:
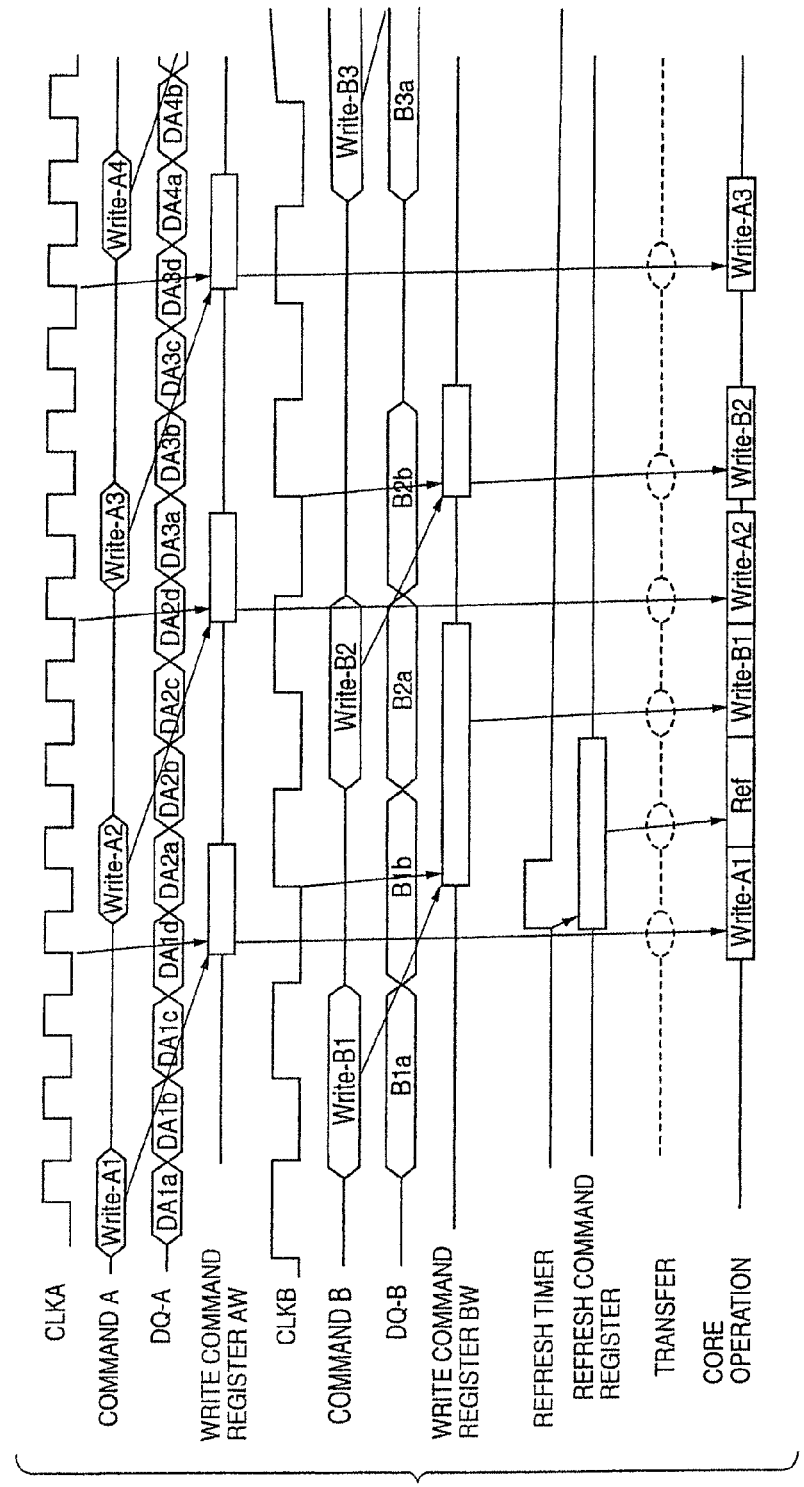
FIG. 53 shows an example in which Write commands are consecutively input.

FIG. 53 shows an example in which Write commands are consecutively input under the same conditions as described above. Data input from the exterior of the device at the time of a Write operation is also given in the form of burst inputs. The Write command is stored in the Write command register AW at the timing at which the last data piece is input. In this case also, there is no need to pay any regard to refresh operations even when a refresh command is generated and executed internally.

Figure 54:
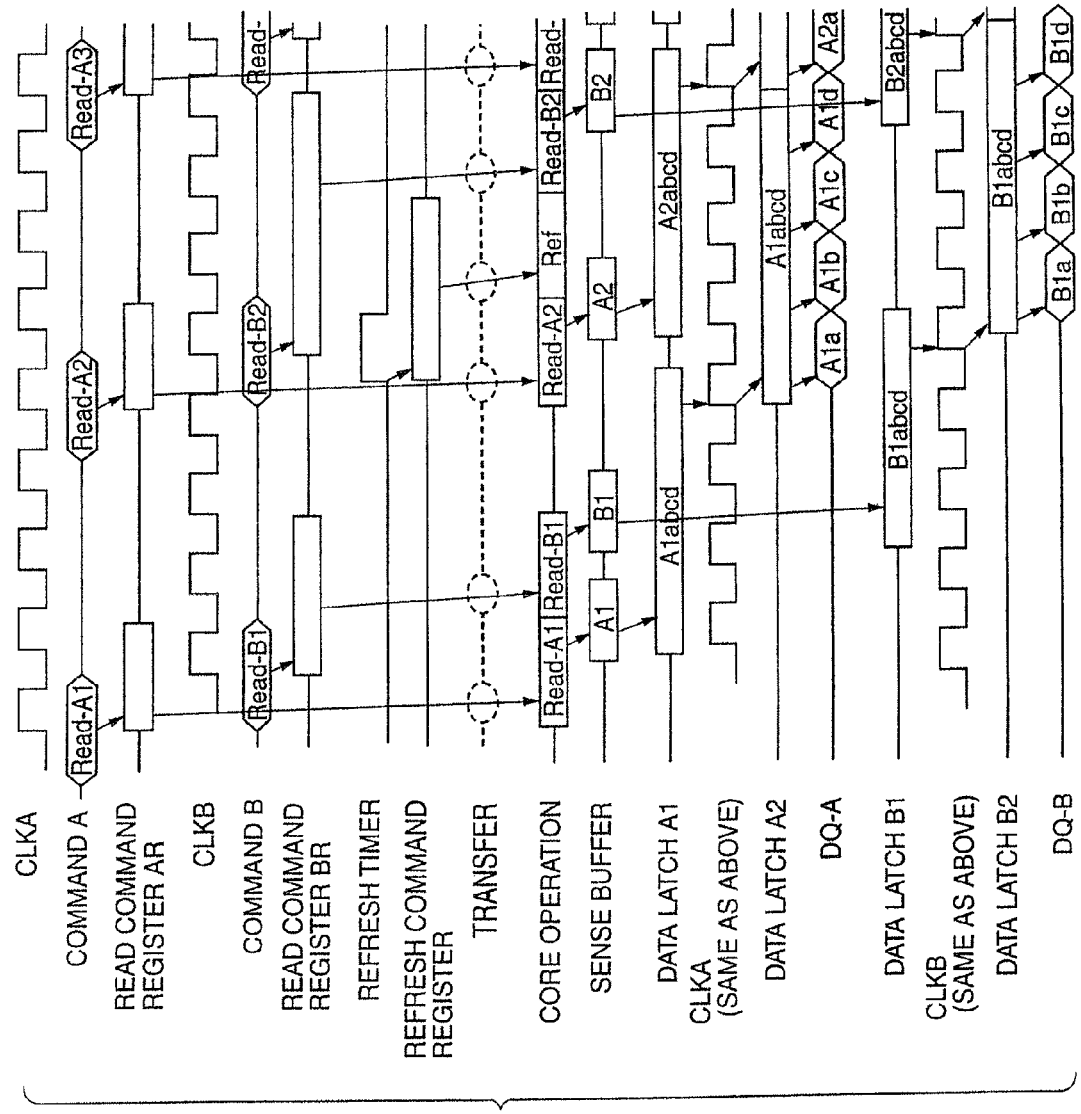
FIG. 54 shows operations performed when both the A port and the B port operate for Read operations at the maximum clock frequency.
Figure 55:
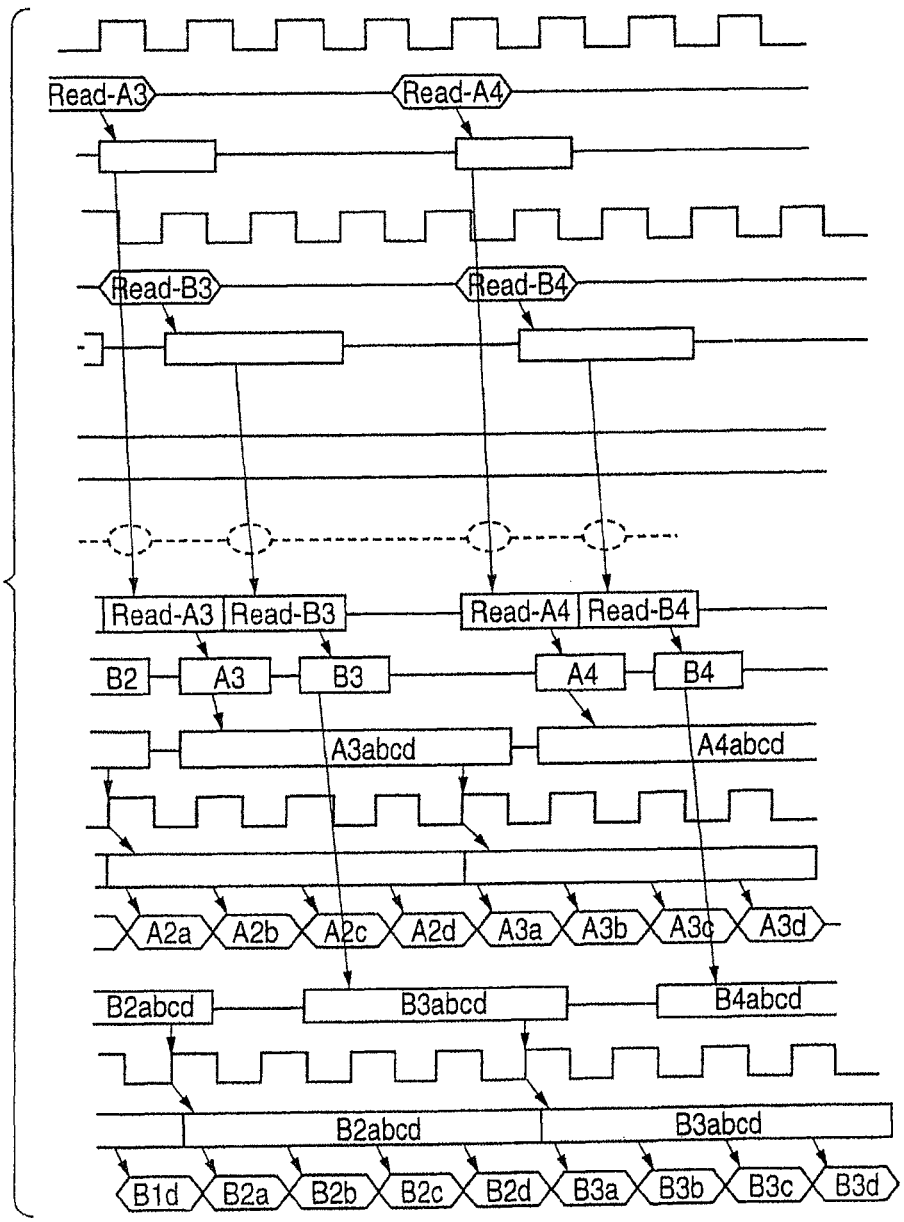
FIG. 55 shows operations performed when both the A port and the B port operate for Read operations at the maximum clock frequency.
Figure 56:
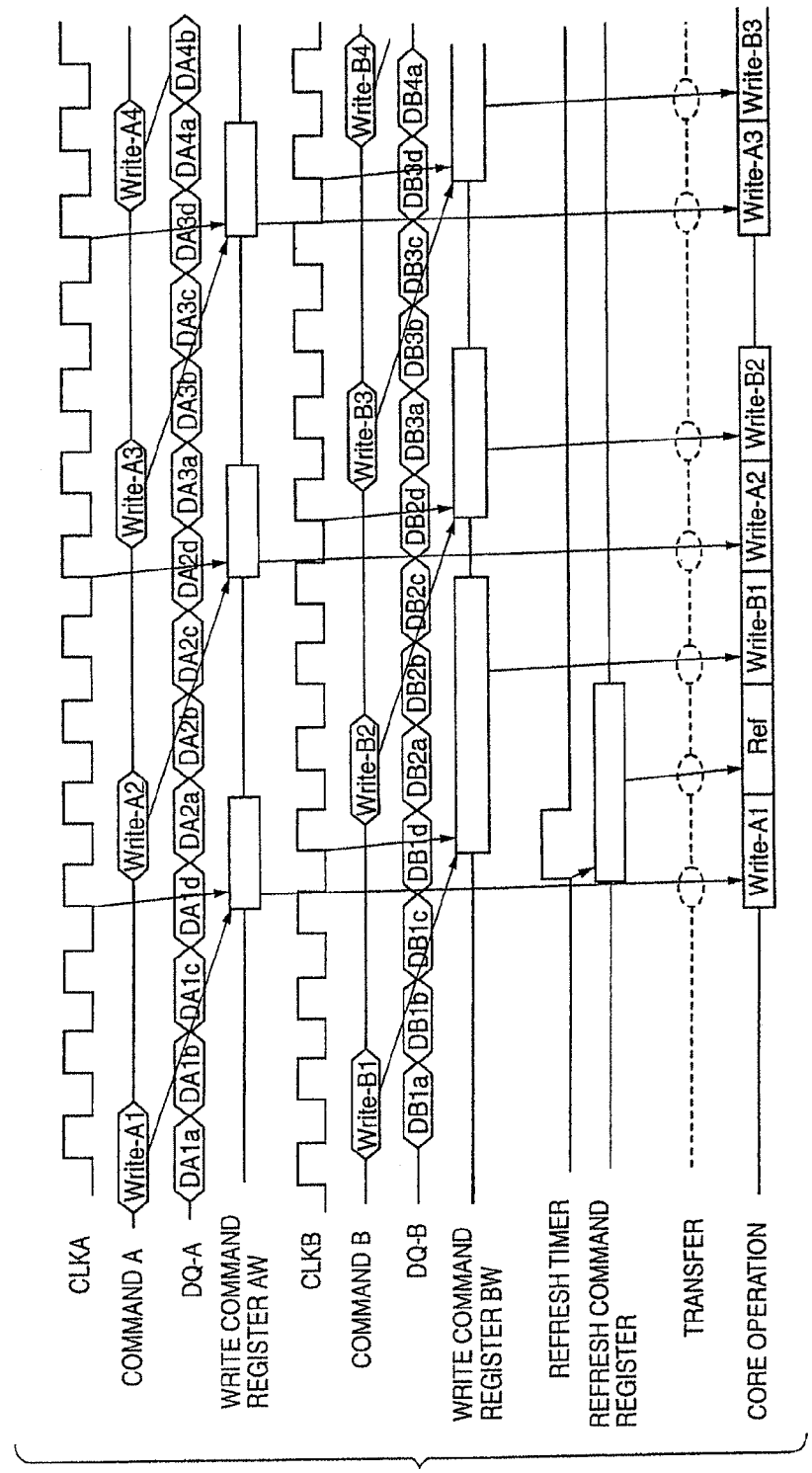
FIG. 56 is a drawing showing operations performed when both the A port and the B port operate for Write operations at the maximum clock frequency.

FIG. 54 and FIG. 55 show operations performed when both the A port and the B port operate for Read operations at the maximum clock frequency. FIG. 56 is a drawing showing operations performed when both the A port and the B port operate for Write operations at the maximum clock frequency. In this case, a phase difference may exist in the clocks of both ports. For both ports, a Read command cycle=4, a Write command cycle=4, a data latency=4, and a burst length=4. As can be seen from the figure, operations are properly performed also in this case.

Figure 57:
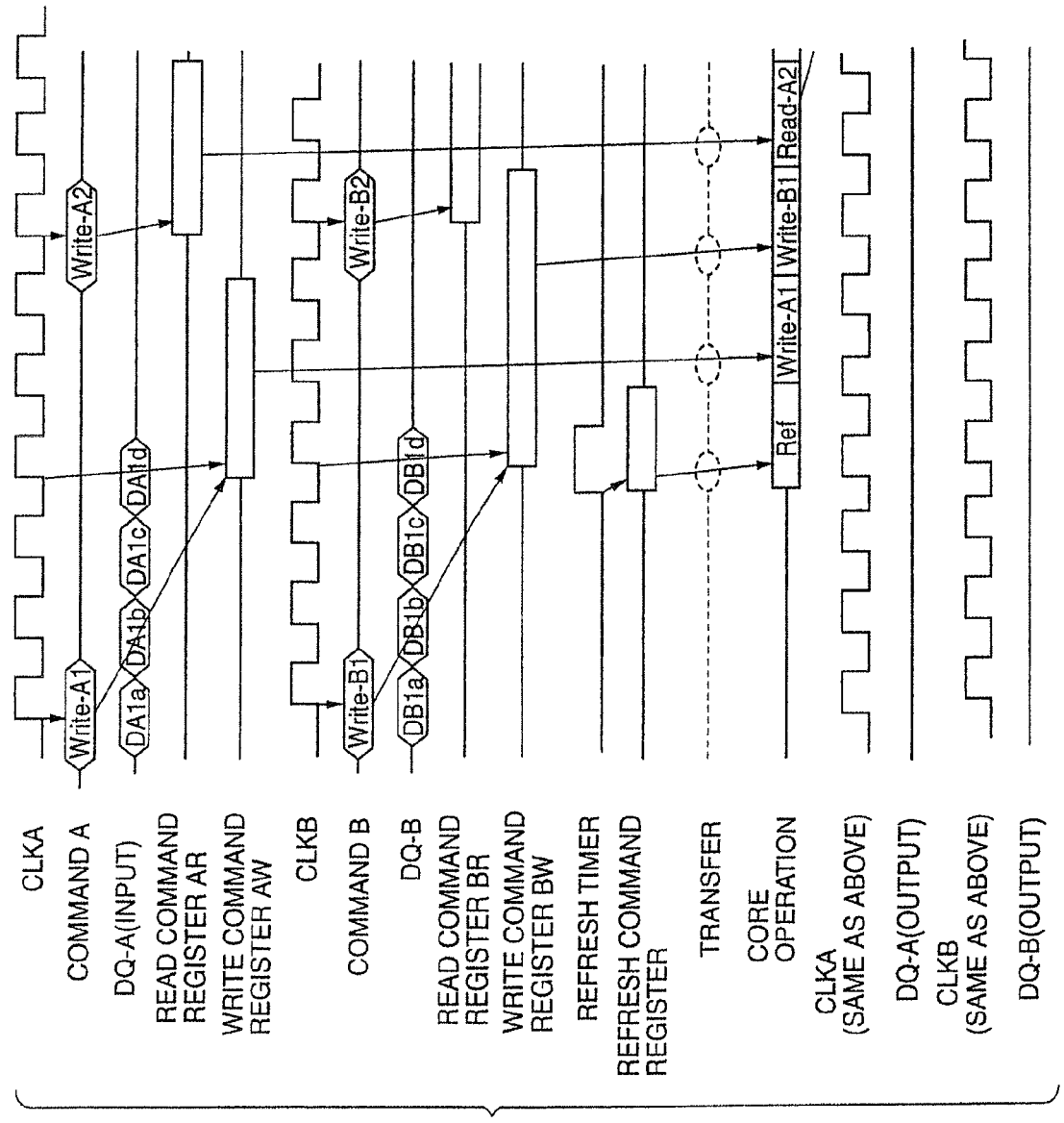
FIG. 57 is a time chart showing operations performed when both ports operate at the highest frequency, and undergo changes from Write commands to Read commands, with a refresh command being generated internally.
Figure 58:
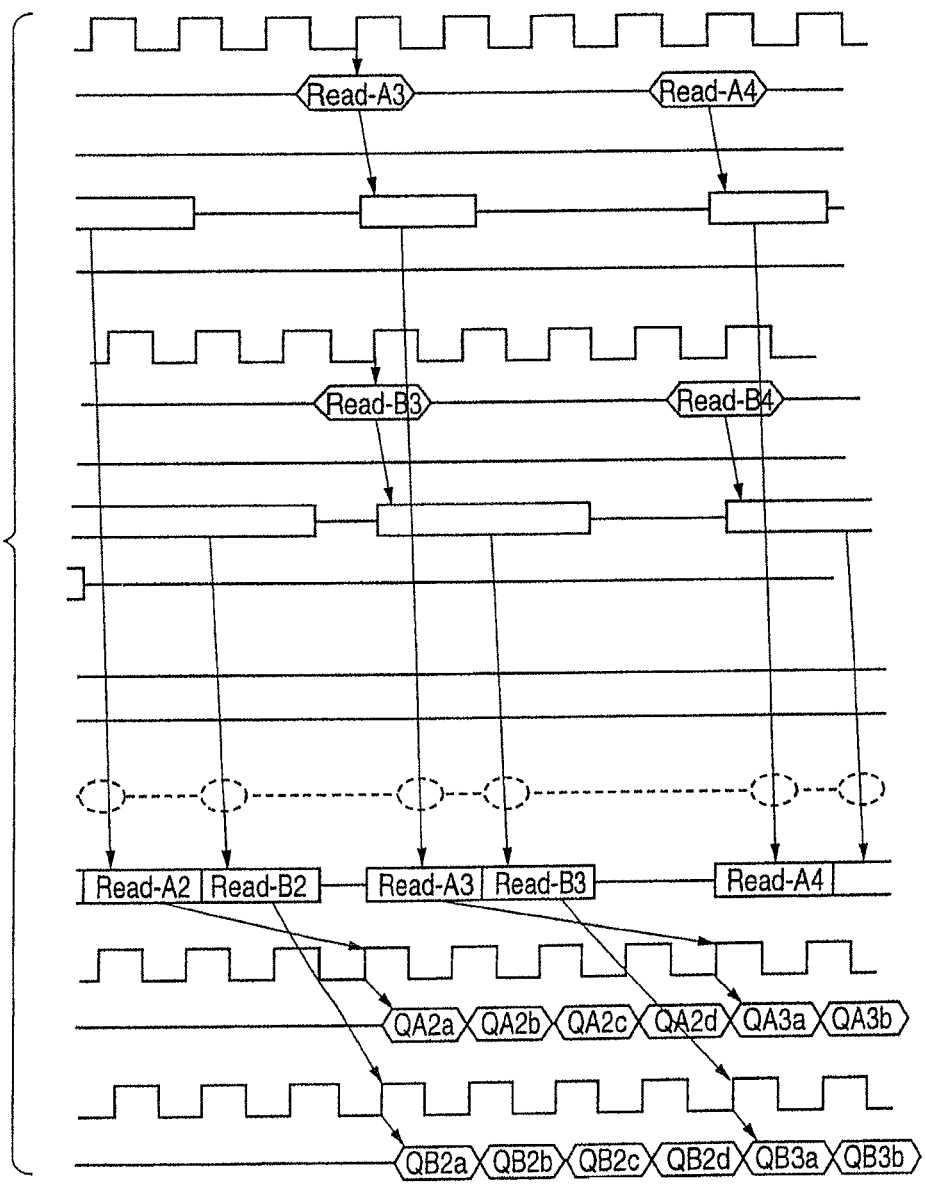
FIG. 58 is a time chart showing operations performed when both ports operate at the highest frequency, and undergo changes from Write commands to Read commands, with a refresh command being generated internally.

FIG. 57 and FIG. 58 are time charts showing operations performed when both ports operate at the highest frequency, and undergo changes from Write commands to Read commands, with a refresh command being generated internally. This is the case in which commands are crowded most.

As illustrated, the DRAM core 2011 operates in the order of Ref→Write-A1→Write-B1→Read-A2→Read-B2 without any gaps therebetween. In this example, Read-A2 and Read-B2 are input 6 clocks after the inputting of Write commands. Even if these timings are advanced by 2 clocks, it is not possible to advance the internal operations of the DRAM core. The output timing of read data is controlled by the data latency from the inputting of a Read command. If the input timings of Read-A2 and Read-B2 are advanced, the data output timings also need to be brought forward. In this case, the data output timing in response to Read-B2 comes too close to the start of the DRAM-core operation, so that Read-B2 cannot be executed properly. Because of this reason, the command interval of a Write→Read transition needs to be set relatively long such as 6 clocks as in this example.

As for the command interval of Read→Write, since Write data cannot be input into DQ terminals unless the outputting of Read data is completed, the command interval inevitably becomes long.

FIGS. 59A and 59B are drawings showing operations of the DRAM core 2011. FIG. 59A shows a Read operation, and FIG. 59B shows a Write operation. As shown in the figures, a series of operations are performed in response to a single command, in the order of word line selection→data amplification→write-back→precharge, thereby completing the whole operation.

As described above, a command interval is elongated at the time of command transition from a Write command to a Read command in the first embodiment. This is improved in a second embodiment. While a relevant command interval in the first embodiment is six clock cycles, the second embodiment can shorten this to five clock cycles.

Figure 60:
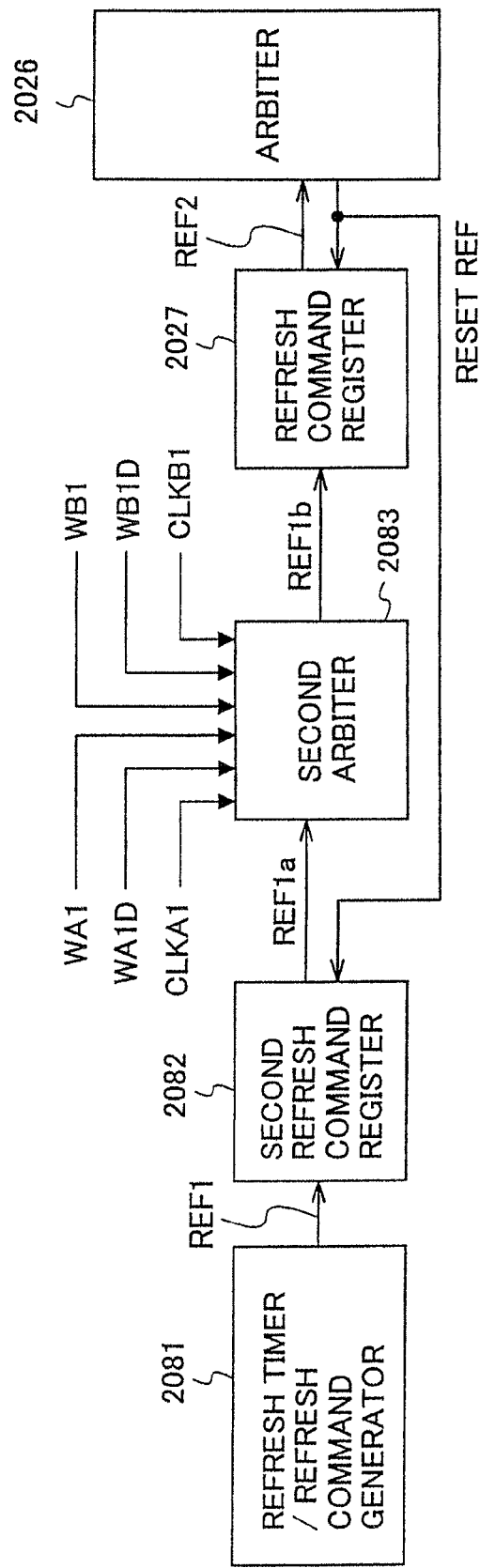
FIG. 60 is a circuit diagram showing a configuration of a refresh circuit.
Figure 61:
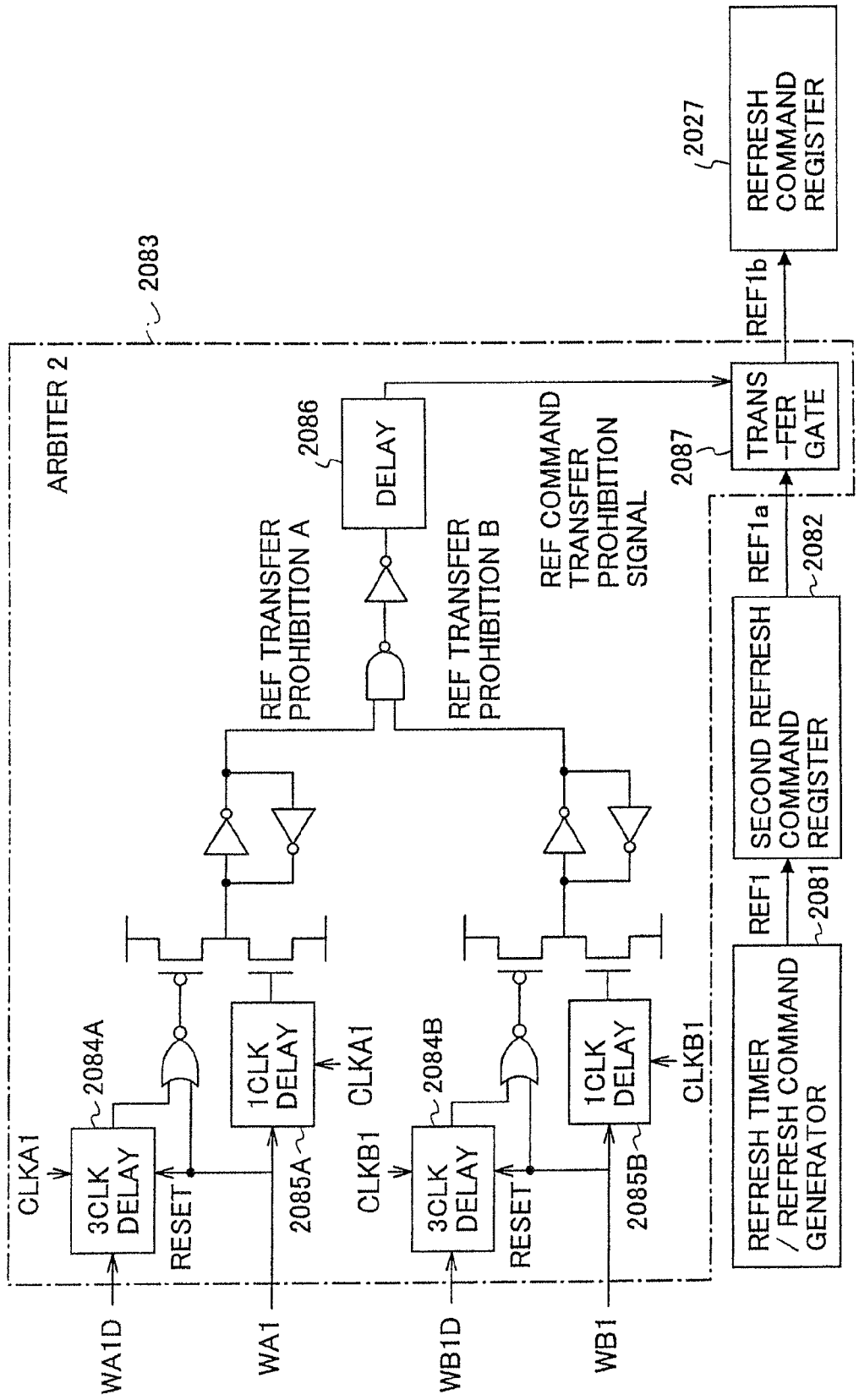
FIG. 61 is a drawing showing the circuit configuration of a second arbiter.

The multi-port memory of the second embodiment of the present invention has a configuration similar to that of the multi-port memory of the first embodiment, and differs only in that a refresh circuit has a configuration as shown in FIG. 60. FIG. 61 is a drawing showing the circuit configuration of a second arbiter 2083.

As shown in FIG. 60, the refresh circuit of the second embodiment includes a refresh-timer/refresh-command-generator 2081 combining the refresh timer 2051 and the refresh command generator 2052 of FIG. 43C, a second refresh command register 2082, and a second arbiter 2083, and a refresh command output from the second arbiter 2083 is input into the refresh command register 2027. The refresh command REF2 of the refresh command register 2027 is input into the arbiter 2026 as in the first embodiment. In this configuration, a reset signal ResetREF output from the arbiter 2026 to the refresh command register 2027 after the completion of a refresh operation is also supplied to the second refresh command register 2082.

In the refresh circuit of the second embodiment, the second arbiter 2083 is provided along the path of a refresh command. If it is expected that commands are crowded as in the case of a command transition of Write command→Read command, the second arbiter 2083 delays transfer of a refresh command to the refresh command register 2027. The second arbiter 2083 checks whether a change from a Write command to a Read command takes place by using a circuit configuration as shown in FIG. 61, and delays transfer of a refresh command from the second refresh command register 2082 to the refresh command register 2027 if such a change is detected.

As shown in FIG. 61, REF transfer prohibition signals A and B are deactivated upon reception of a Write command supplied from the exterior of the device by the respective ports, and are activated one clock cycle later, followed by being deactivated again several clock cycles (i.e., 3 clock cycles in this example) after receiving the last data item. 3CLK delays 2084A and 2084B of FIG. 61 include flip-flops etc., and are reset by WA1 and WB1, respectively, which results in WA1D and WB1D being reset while passing through the delays. A logic AND of the REF transfer prohibition signals A and B is obtained to generate a REF command transfer prohibition signal. This logic AND is obtained because the problem in this example arises only when both ports experience changes from a Write command to a Read command, and no problem exists when only one port experiences such a change. Further, the reason why the REF transfer prohibition signals A and B are deactivated only for one clock cycle after reception of a Write command is that this gives an extra time to perform refresh operation before the reception of the last data item. Further, the delay 2086 is provided for the purpose of slightly delaying the timing relative to the clock so as to enhance a difference in relative timings between the REF command transfer prohibition signal and the command supplied from the exterior of the device.

Figure 70:
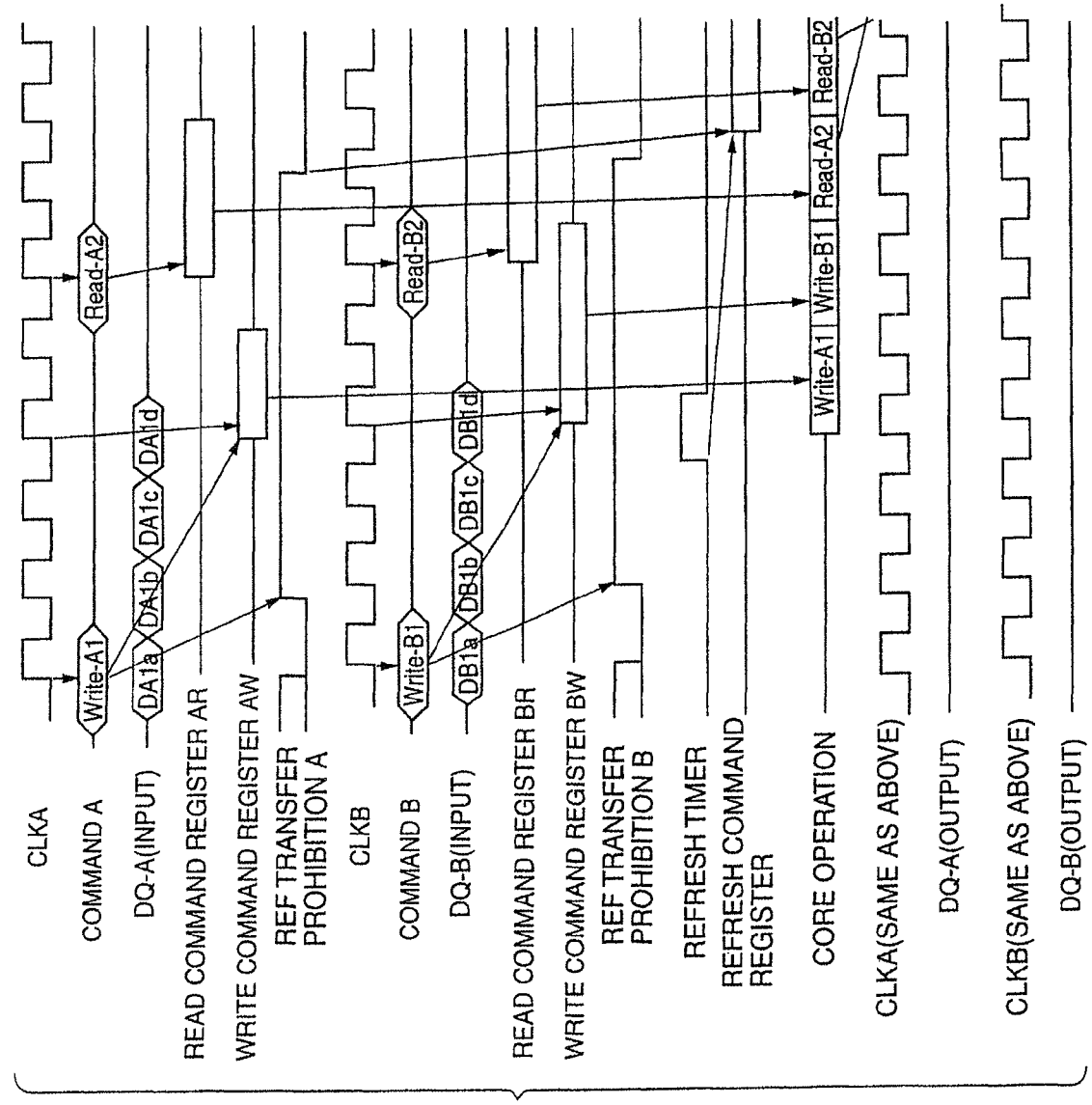
FIG. 70 is a time chart showing operations of the second embodiment corresponding to operations of the first embodiment shown in FIG. 57 and FIG. 58.
Figure 71:
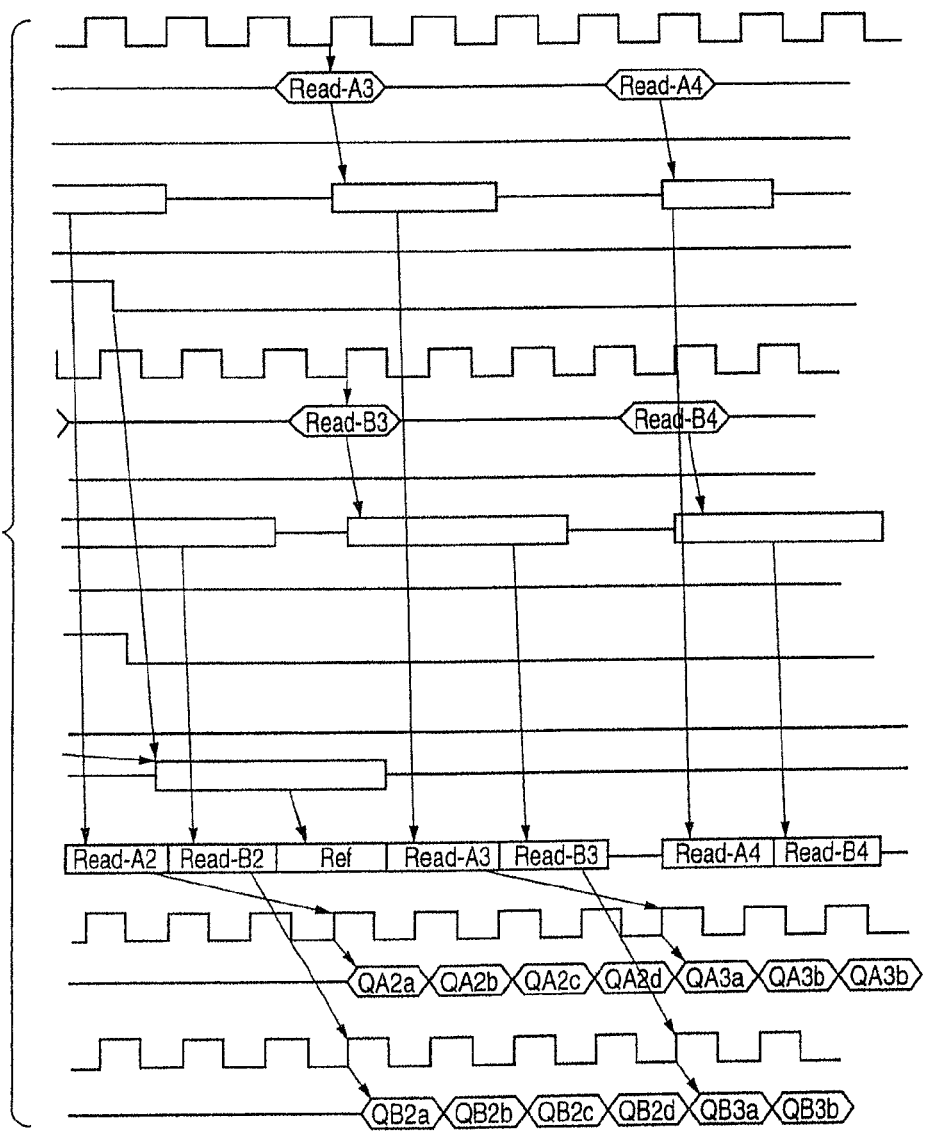
FIG. 71 is a time chart showing operations of the second embodiment corresponding to operations of the first embodiment shown in FIG. 57 and FIG. 58.
Figure 72:
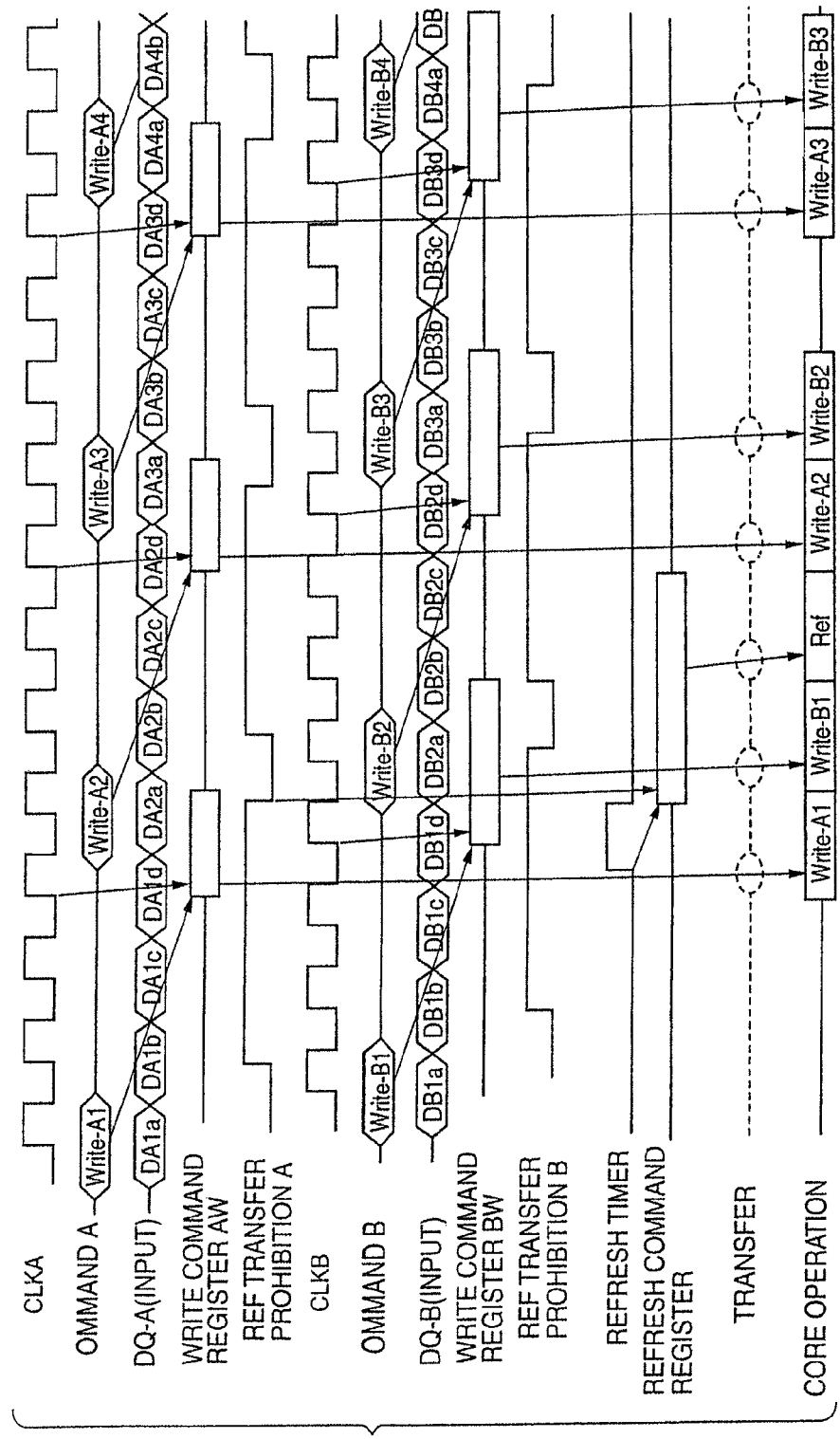
FIG. 72 is a time chart showing operations of the second embodiment corresponding to operations of the first embodiment shown in FIG. 56.

FIG. 62 to FIG. 69 are time charts which show operations of the second arbiter. FIG. 70 through FIG. 72 are time charts showing operations of the multi-port memory of the second embodiment. FIG. 62 and FIG. 63, FIG. 64 and FIG. 65, FIG. 66 and FIG. 67, FIG. 68 and FIG. 69, and FIG. 70 and FIG. 71 are drawings which divide a single time chart by half for the sake of illustration, one showing the first half of the time chart and the other showing the second half, with some overlaps therebetween.

Figure 62:
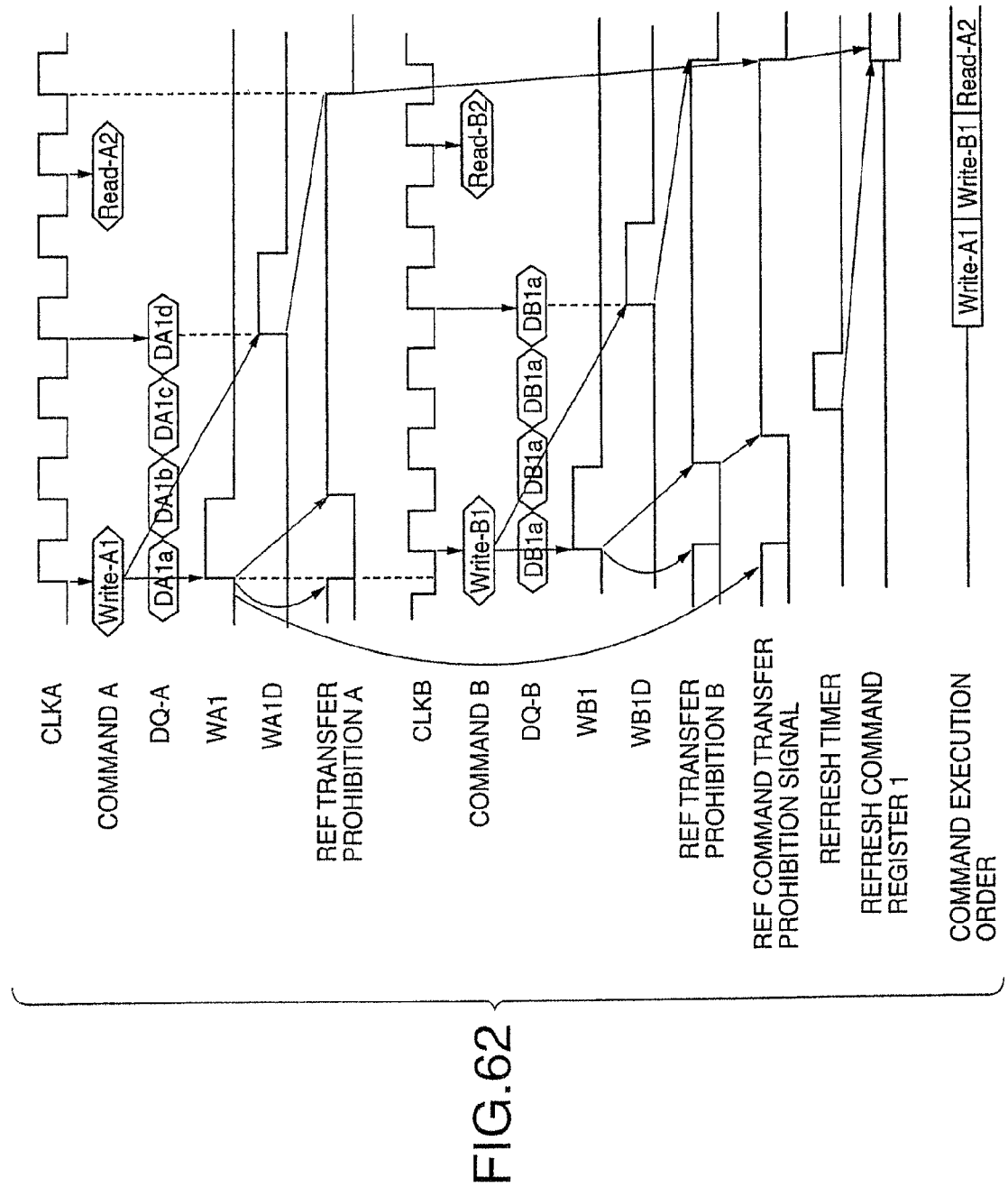
FIG. 62 shows a case in which both ports experience a Write→Read command change, and a refresh timer event occurs during a REF transfer prohibition period.
Figure 63:
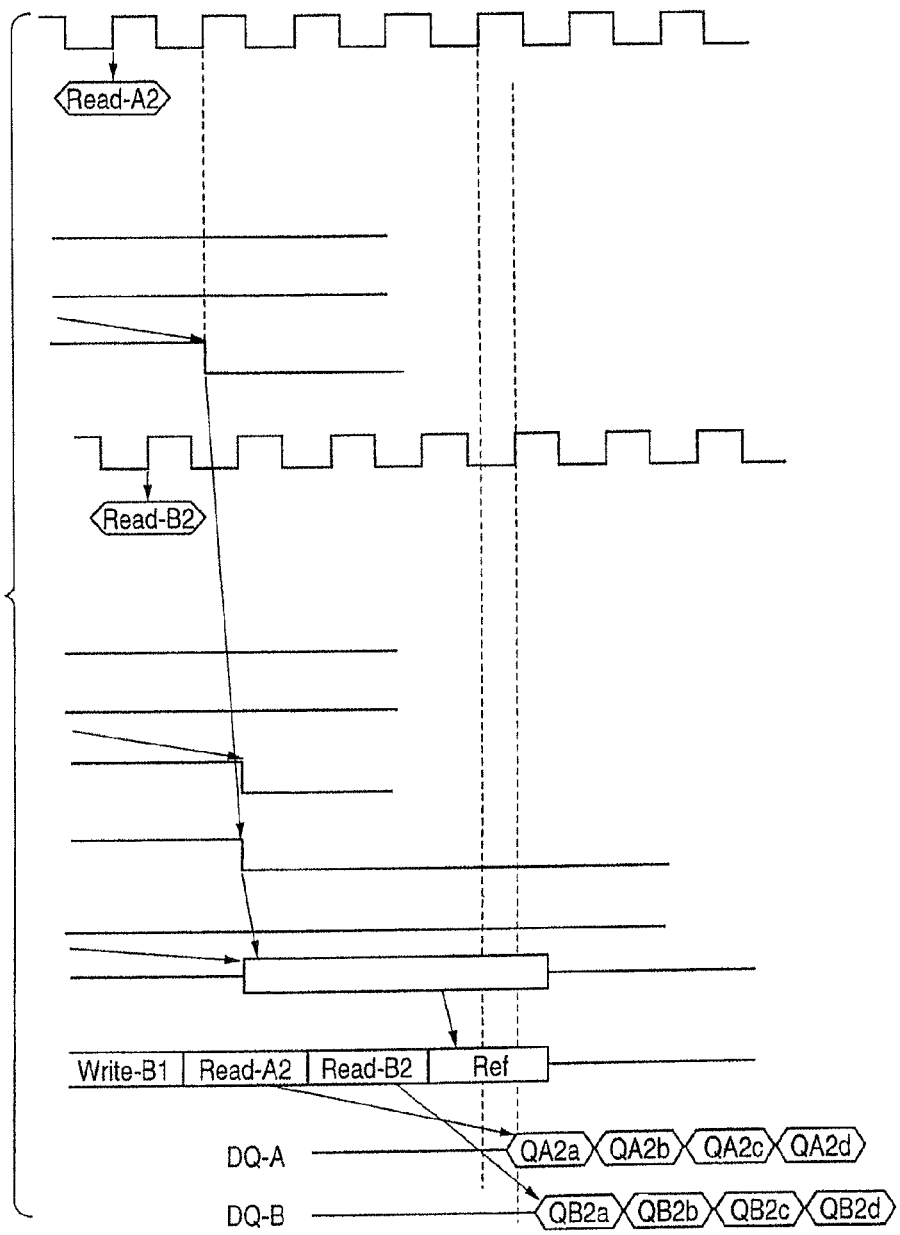
FIG. 63 shows a case in which both ports experience a Write→Read command change, and a refresh timer event occurs during a REF transfer prohibition period.

FIG. 62 and FIG. 63 show a case in which both ports experience a Write→Read command change, and a refresh timer event occurs during a REF transfer prohibition period. In this case, a refresh operation Ref is performed after the completion of Read-A2 and Read-B2.

Figure 64:
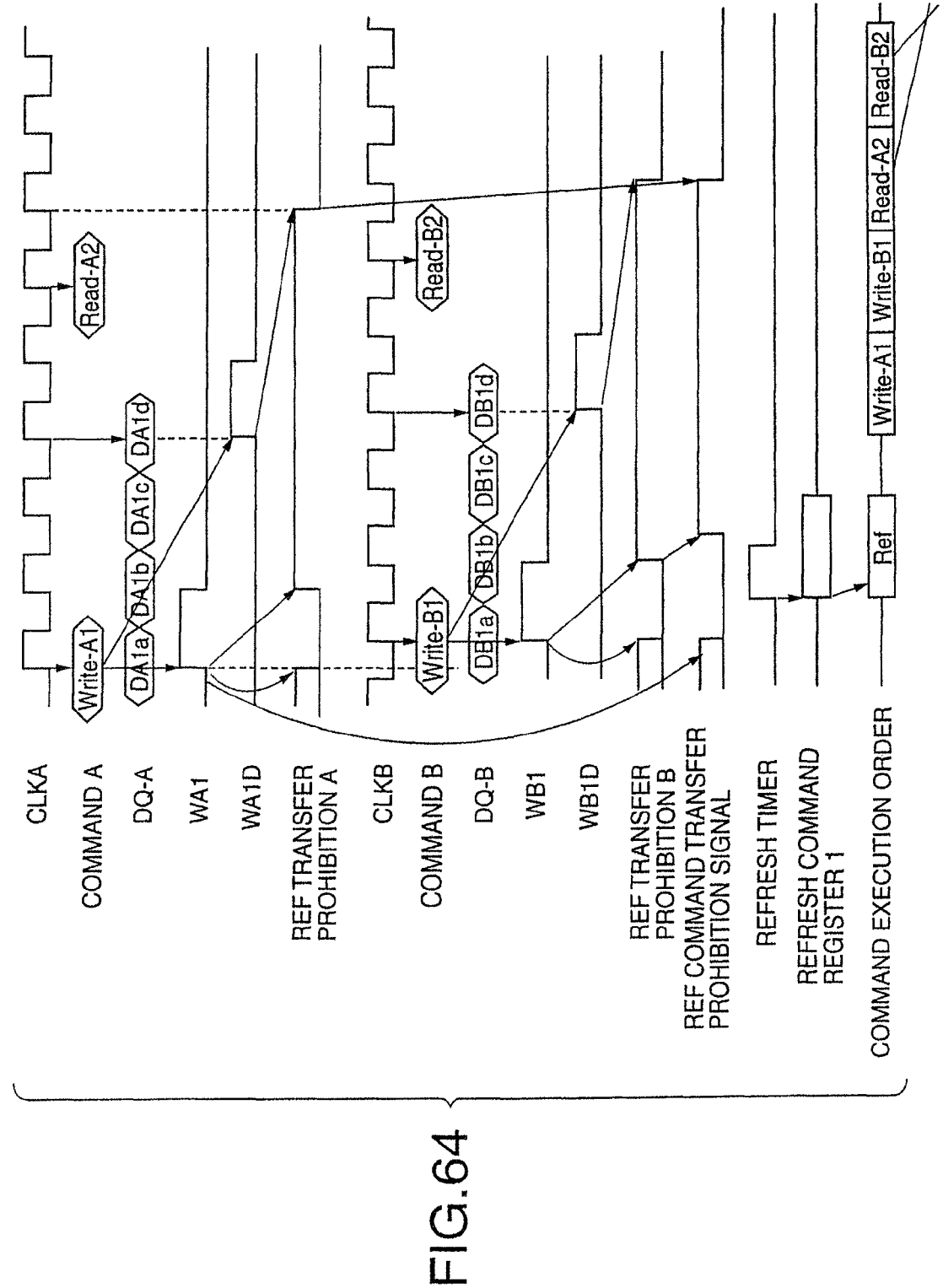
FIG. 64 shows a case in which both ports experience a Write→Read command change as in the above case, but a refresh timer occurs before a REF transfer prohibition period.
Figure 65:
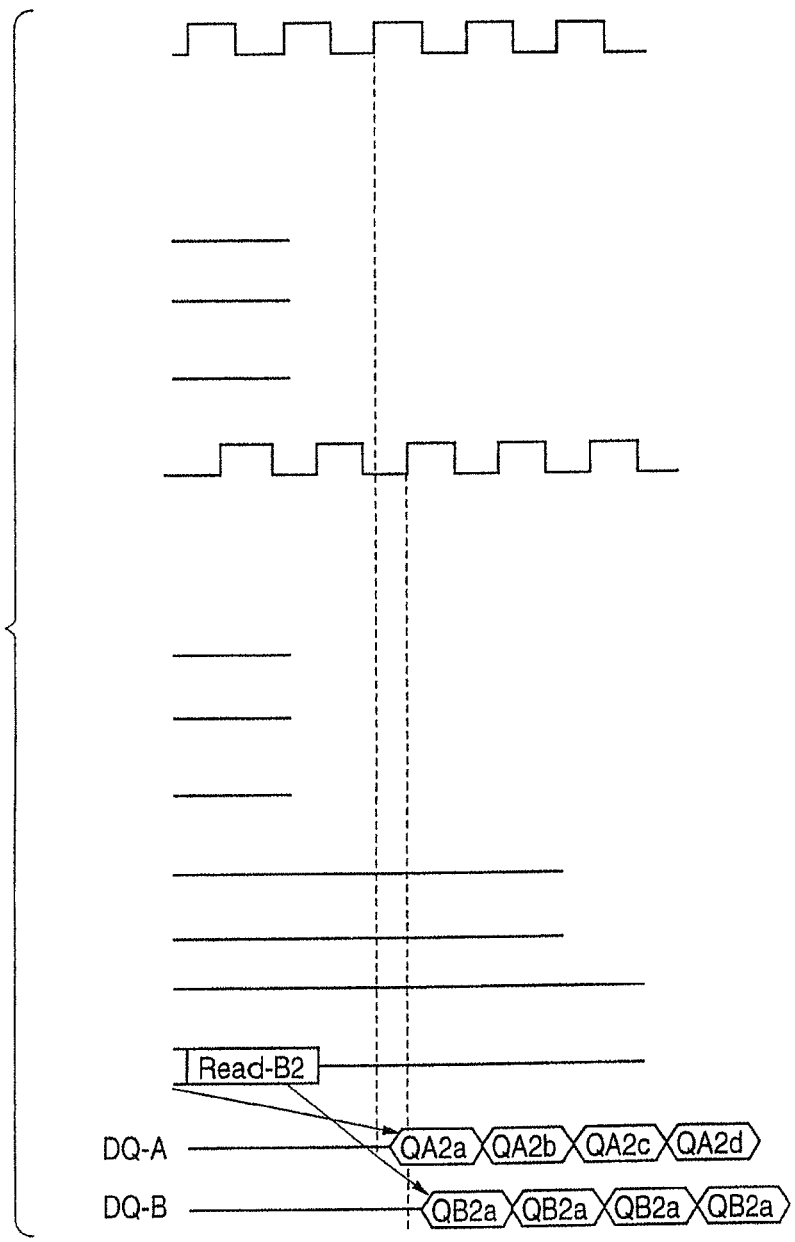
FIG. 65 shows a case in which both ports experience a Write→Read command change as in the above case, but a refresh timer occurs before a REF transfer prohibition period.

FIG. 64 and FIG. 65 show a case in which both ports experience a Write→Read command change as in the above case, but a refresh timer occurs before a REF transfer prohibition period. In this case, a Write operation and a Read operation are performed after a refresh operation Ref is performed.

Figure 66:
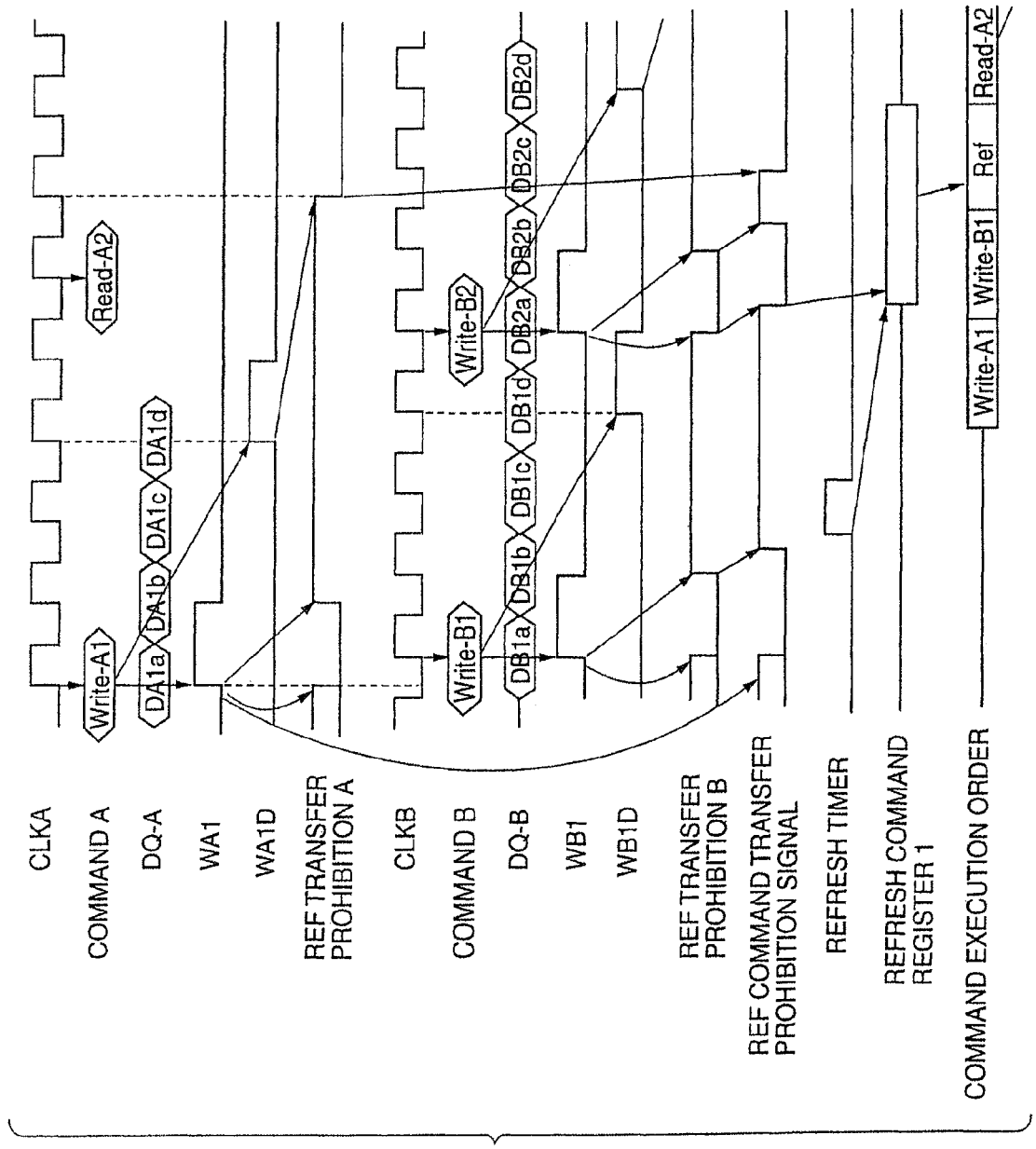
FIG. 66 illustrates a case in which only the A port undergoes a Write→Read command transition, and a refresh timer event occurs during a REF transfer prohibition period.
Figure 67:
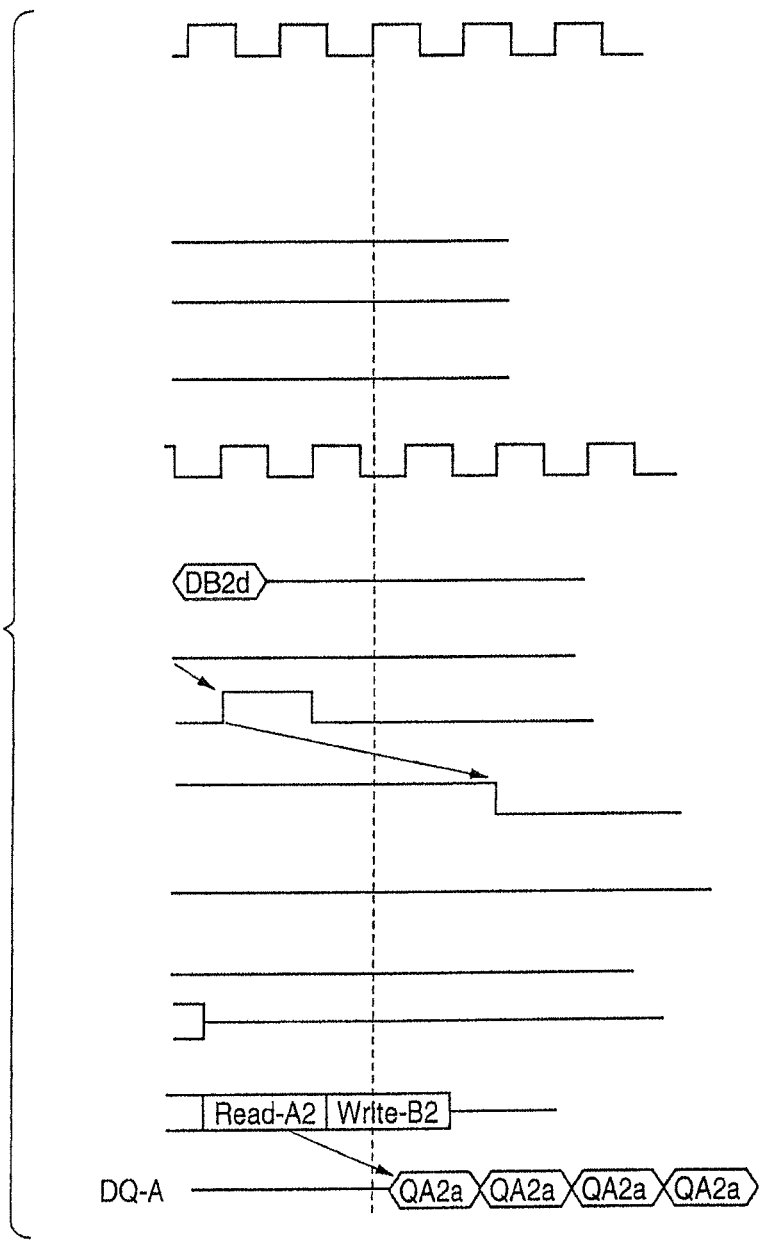
FIG. 67 illustrates a case in which only the A port undergoes a Write→Read command transition, and a refresh timer event occurs during a REF transfer prohibition period.

FIG. 66 and FIG. 67 illustrate a case in which only the A port undergoes a Write→Read command transition, and a refresh timer event occurs during a REF transfer prohibition period. In this case, a refresh operation Ref is performed after the completion of a Write operation, and a Read operation is then performed.

Figure 68:
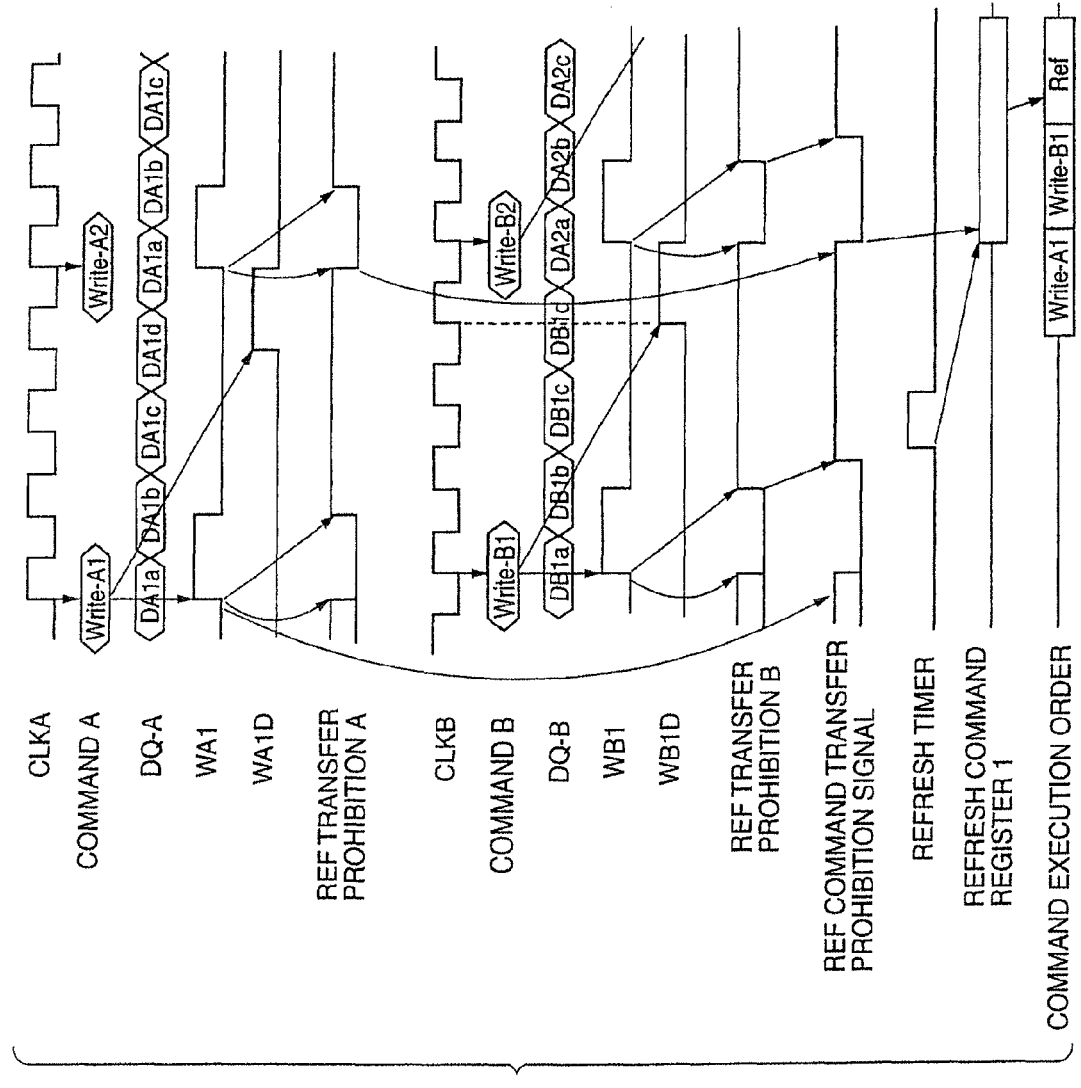
FIG. 68 is a time chart showing a case in which Write continues in both ports.
Figure 69:
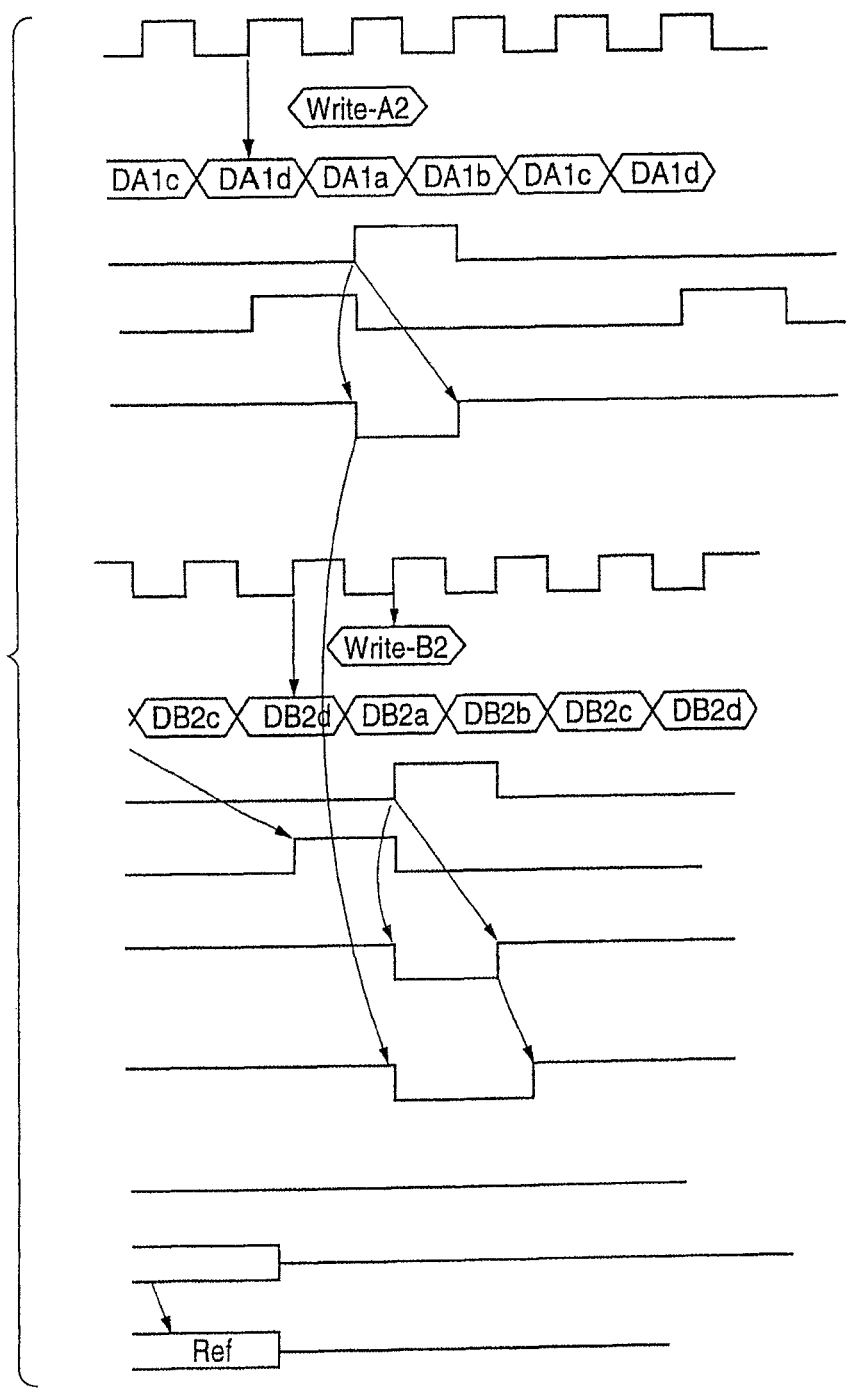
FIG. 69 is a time chart showing a case in which Write continues in both ports.

FIG. 68 and FIG. 69 exhibit a case in which Write continues in both ports. In this case, no sooner has the Write command been input following the last data input, the 3CLK delays 2084A and 2084B are deactivated.

FIG. 70 and FIG. 71 are time charts showing operations of the second embodiment corresponding to operations of the first embodiment shown in FIG. 57 and FIG. 58. The command interval of a Write→Read command transition is shortened from six clocks to five clocks compared with the first embodiment.

FIG. 72 is a time chart showing operations of the second embodiment corresponding to operations of the first embodiment shown in FIG. 56. Although the order of command execution regarding a refresh operation is changed compared with the first embodiment, orderly operations are maintained.

As described above, the second embodiment can perform operations properly under any conditions, and can shorten the command interval of a Write command→Read command transition to 5 clock cycles.

As described above, the present invention allows the multi-port memory to be used without any regard to refresh operations when the memory array is implemented based on a DRAM core, thereby providing a multi-port memory at a low cost that has a large capacity and is easy to use.

[Third Aspect of the Invention]

In the following a third aspect of the present invention will be described.

There are several kinds of multi-port memories. Hereinafter, it refers to a memory having a plurality of ports, and allows accesses from the respective ports to be made independently of each other to a common memory array. For example, a multi-port memory of a two-port type is equipped with an A port and a B port, and allows read/write accesses to the common memory to be independently made from a CPU-A linked to the A port and from a CPU-B connected to the B port.

As a multi-port memory of this kind, a memory having an SRAM memory array is known, in which word lines and bit line pairs are provided in duplicate sets, and each memory cell is connected to 2 sets of word lines and bit line pairs. However, this multi-port memory has a problem of low circuit density in that the duplicate sets of word lines and bit line pairs need to be provided.

To obviate this, it is conceivable to use the same mechanism as shared memories used by a computer having a multiprocessor configuration. A shared memory has a plurality of ports provided for a common memory. Typically, an SRAM is used as a memory, and the plurality of ports are implemented as discrete ICs. When accesses are made simultaneously from the plurality of ports, operations responsive to the plurality of ports cannot be performed simultaneously because the memory array is of shared use. The easiest way to prevent such a problem is to generate a busy signal to a port to prevent an access thereto when access is being made from another port. This, however, gives rise to a problem of limiting usage of the memory. In consideration of this, an arbitration circuit called arbiter is provided for a common memory, and determines priority of access requests received by the plurality of ports. A control circuit of the memory array is configured to carry out operations responsive to access requests in an order of priority. For example, access requests are attended in an order of arrival, i.e., in an order in which the access requests are supplied to respective ports. However, this does not change the situation that a new command cannot be executed while a command of another port is being processed. A busy signal needs to be transmitted in such a case, and, also, a device that accesses the memory needs to be provided with a mechanism that handles busy signals.

The memory array ends up being accessed at random from the plurality of ports. Because of this, a column access operation that successively accesses consecutive column addresses at the same row address is not provided whereas such a column access operation is typically available in DRAMs. That is, a cell is selected, accessed for read/write operation, and reset, all of which are performed in response to a single access.

When a shared memory is to be implemented, in general, an SRAM is conventionally used as a memory array. This is because an SRAM is capable of high-speed random access operations, and, also, it is easy to use an SRAM because there is no need for refresh operation. Moreover, a multi-port memory of a single chip is conventionally provided with duplicate sets of word lines and bit line pairs, and a multi-port memory of a single chip based on a memory array having an ordinary SRAM configuration has not yet been used in practice.

In summary, multi-port memories and shared memories are implemented by using SRAMs, and DRAMs are not used that require refresh operations.

The amount of data to be processed increases as systems offer increasingly high performance, and multi-port memories are also required to have a large capacity. It is conceivable to implement a multi-port memory by using a dynamic-type-memory-cell (DRAM) array that has a higher circuit density than the SRAMs, thereby providing a multi-port memory having a large storage capacity at a low cost. Refresh operation of the memory cells, however, poses a problem.

In conventional DRAms, a refresh command needs to be provided at constant intervals from an exterior of the device between read/write commands. To this end, a controller device in a DRAM-based system is provided with a timer and/or a control circuit for refresh management. Such a circuit, however, is not provided in systems that use SRAM-based multi-port memories. Even in a case where memories are implemented based on DRAMs, such memories need to be usable in the same manner in these systems as are the conventional multi-port memories. Namely, a multi-port memory that has a memory array thereof comprised of DRAMs needs to take care of refresh operations by itself.

When an arbiter outputs a busy signal, there is a problem in that the use of the memory is rather cumbersome as described above.

The present invention is aimed at providing a multi-port memory that has a memory array thereof comprised of a DRAM core, and can be used without any regard to refresh operations, thereby providing a multi-port memory at a low cost that has a large capacity and is easy to use.

In order to obviate the problems described above, a multi-port semiconductor memory device of the present invention is configured to be capable of carrying out n internal operations during a time period m (m≧2) times as long as a minimum input cycle of each external port where mN<n<m(N+1) is satisfied.

The condition described above requires that the minimum command cycle of each one of N ports be set to a time period allowing N internal operation cycles plus a time period $\alpha$ that is shorter than a single internal operation cycle. When N=2, for example, the minimum external command cycle of each port is set to a time period allowing two internal operation cycles plus a time period $\alpha$. Here, the time period $\alpha$ is shorter than one internal operation cycle.

The present invention utilizes the time period allowing two internal operation cycles to obviate the problem of cumbersome use of the memory caused by the arbiter outputting a busy signal, and utilizes the time period $\alpha$ to attend to the problem of refresh operations.

Figure 73:
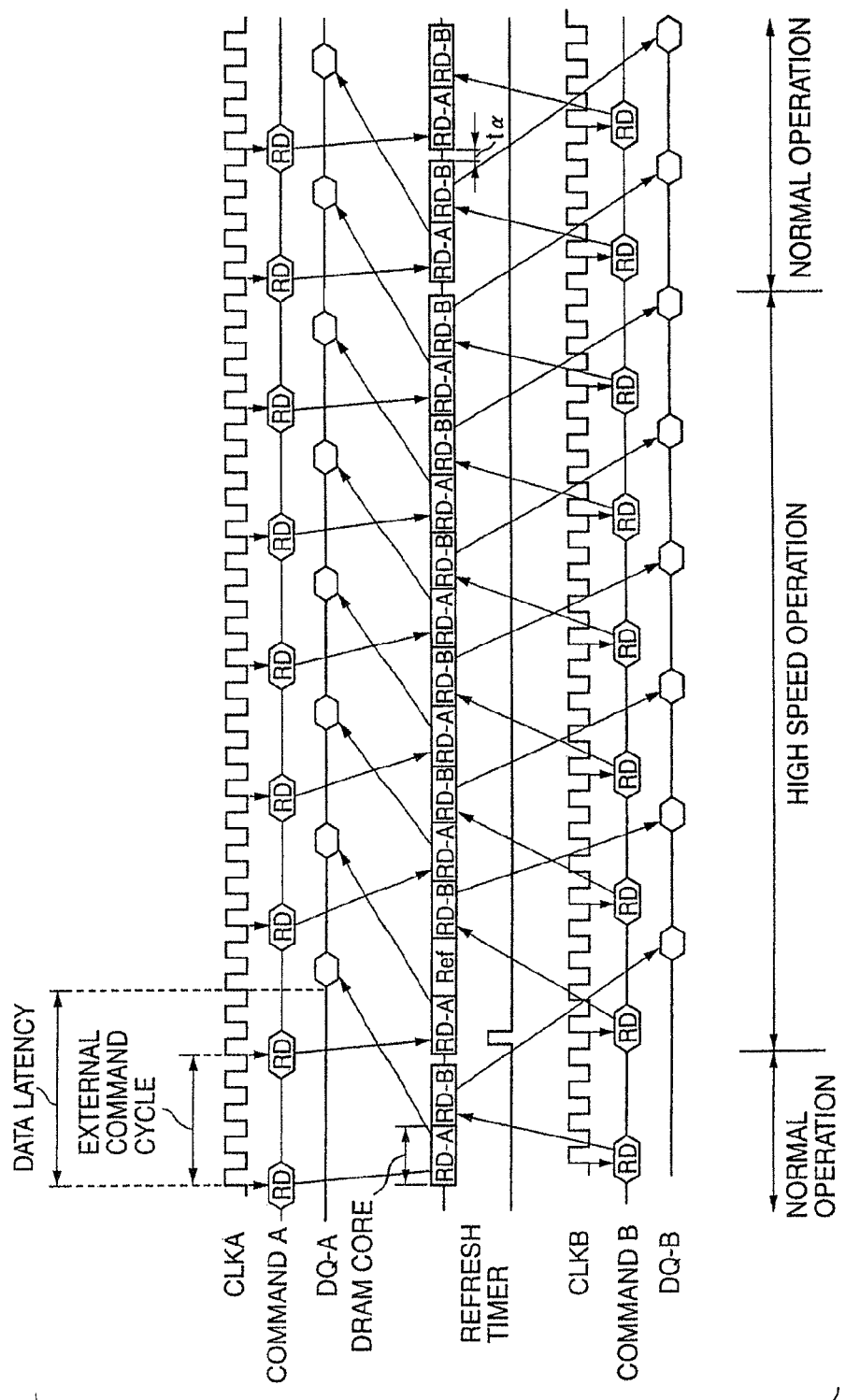
FIG. 73 is a drawing for explaining the principle of the present invention (third aspect), showing a case in which read operations are performed with respect to two ports.

FIG. 73 is a drawing for explaining the principle of the present invention (third aspect), and shows a case in which read operations are performed with respect to two ports.

Commands to the two external ports, the A port and the B port, are entered at a minimum interval during which internal operation cycles can be performed 2.2 times. That is, 2.2 times the internal operation cycle is equal to the minimum external command cycle, and an external command cycle is set to more than the time period that allows internal operation cycles to be performed 2.2 times. Clocks CLKA and CLKB are input into the A port and the B port, respectively, and the inputting/outputting of a command, an address, and data into/from an external port is performed in synchronization with a corresponding clock. Although not illustrated, an address is input simultaneously with a command. When read commands are supplied to the A port and the B port at the minimum external command cycles, as shown in the figure, an arbitration circuit attends to control that gives priority to a command of a first arrival when performing core operations.

The DRAM core performs two read operations to read data from a memory array during one external command cycle, and outputs the data to the A port and the B port. The A port and the B port hold the retrieved data, respectively, and output the retrieved data in synchronization with a particular clock timing of the respective clock signals that is the 6th clock from the inputting of the read commands. That is, the data latency in this case is 6.

A refresh timer is provided as internal circuitry, and generates a refresh command on its own. When a refresh operation does not occur, the internal circuitry of the device operates in a routine manner so as to perform two operations corresponding to commands A and B during one external command cycle. Since the internal operations can be carried out 2.2 times during one external command cycle, the DRAM core will have an extra time tα remaining after completing the two internal operations.

When a refresh command is internally generated, the internal circuitry of the device operates at a fast speed. Here, the fast speed means that operations are carried out without producing an extra time tα. When a refresh command is generated, the device performs a refresh operation. Since commands are input to the A port and the B port in the meantime, commands that should be processed will accumulate. The device executes commands one after another at the fast speed without providing the extra time tα. Although commands are input to the A port and the B port one after another, refresh commands take place only at longer intervals than the external command cycle, and only the commands A and the commands B have to be executed until the next refresh command is generated. Since the speed of internal command processing is faster, there will be no accumulated commands in the end. In other words, the internal processing will catch up with the inputting of external commands. Thereafter, the device returns to its routine operation. The extra time α is determined by taking into consideration the number of external ports, the number of internal operation cycles, a refresh interval, etc.

The delay time (data latency) of a data output responding to a Read command (RD) needs to be set to 3 cycles of internal operations (in the case of two ports) since the timing becomes the worst when an internal refresh command and a command input to another port take place immediately prior to the Read command. However, since an external command cycle slightly longer than two internal operation cycles is all that is necessary for proper device operation, a data transfer rate is rather high.

As described above, the present invention can conceal refresh operations from the exterior of the device, and sets the external command cycle to only slightly longer than two internal operation cycles. There is no need to attend to refresh control from the exterior, and even when a refresh operation is carried out internally, it is completely invisible to the exterior, and does not affect the way the device operations appear to the exterior. Accordingly, access to the memory can be made from each external port without any regard to other ports.

In this manner, the present invention can provide a multi-port memory using DRAM memory cells that has a large capacity and a fast data transfer rate, while allowing use of the memory without any regard to refresh operations as if it was implemented based on the SRAMs.

In the example of FIG. 73, one item of read data is output in synchronization with the external clock in response to one read command. That is, a burst length is 1. After the outputting of read data is completed in one clock cycle, therefore, the external ports will not output any data during the three remaining clock cycles of the external command cycle, which results in inefficient data transfer. This problem can be obviated by elongating the burst length.

Figure 74:
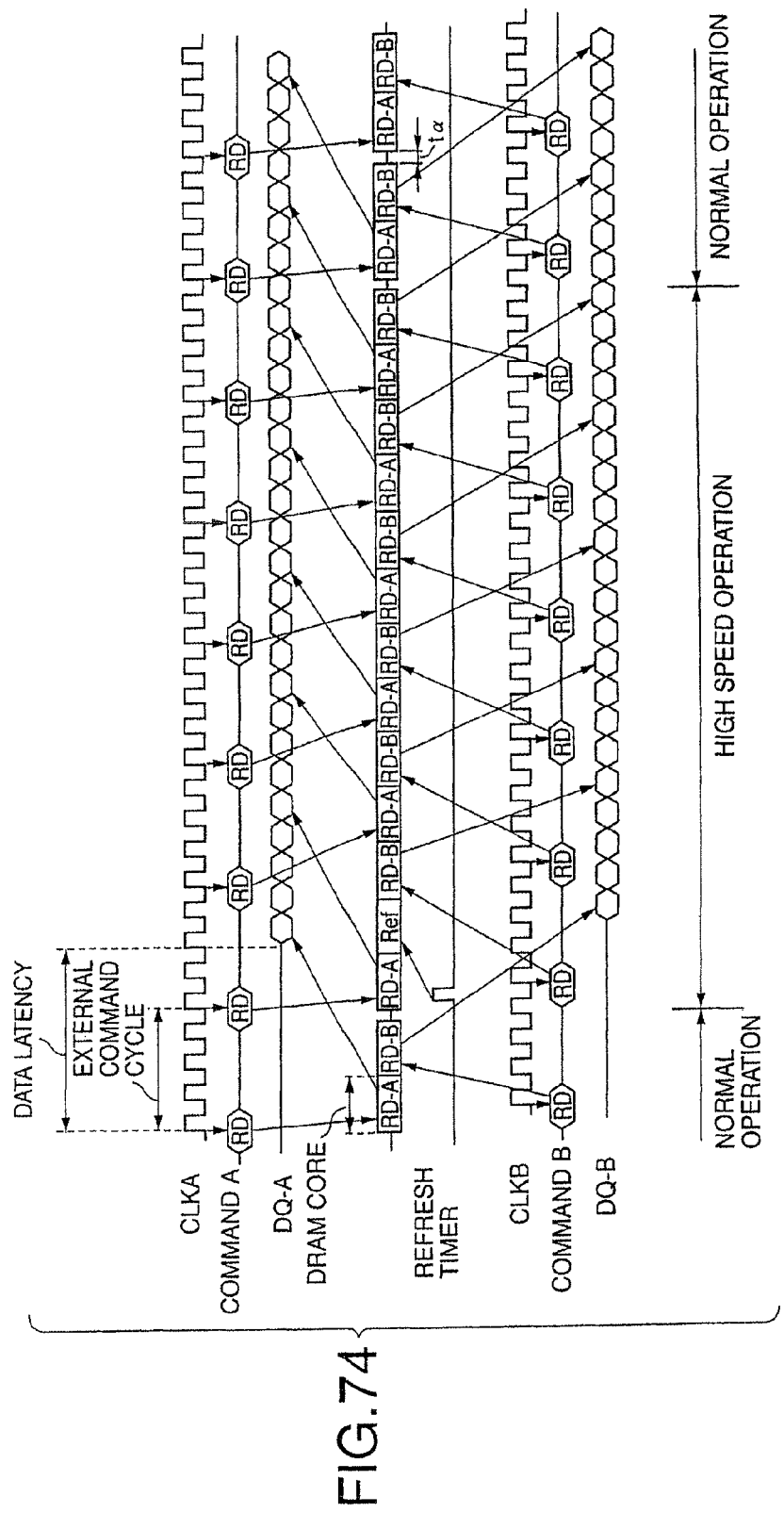
FIG. 74 is a drawing for explaining the principle of the present invention (third aspect), showing an example in which a burst length is 4.

FIG. 74 is a drawing for explaining the principle of the present invention, and shows an example in which the burst length is 4. In this example, like the previous case, the external command cycles of the two external ports are set to a length that can accommodate 2.2 internal operation cycles. Further, one external command cycle corresponds to four clock cycles. Data are output four times from an external port during a single external command cycle in synchronization with the clock in such a manner as to provide a data latency of 6. Therefore, if the burst length is set according to the number of clock cycles of one external command cycle, gapless read operations are achieved in both of the two ports, thereby significantly boosting the data transfer rate. In this case, it is required that data items as many as the burst length be input/output internally into/from the memory array in response to a single access. For example, if the number of data input/output pins of an external port is 4, and the burst length is 4, it is necessary to ensure that 16-bit data be output/input from/into the memory array by a single access operation.

It should be noted that the A port and the B port do not have to operate in synchronization, and respective external command cycles can be set independently of each other to any timings as long as the minimum cycle is set equal to a duration necessary for N internal operation cycles plus a duration α shorter than a single internal operation cycle.

Figure 75:
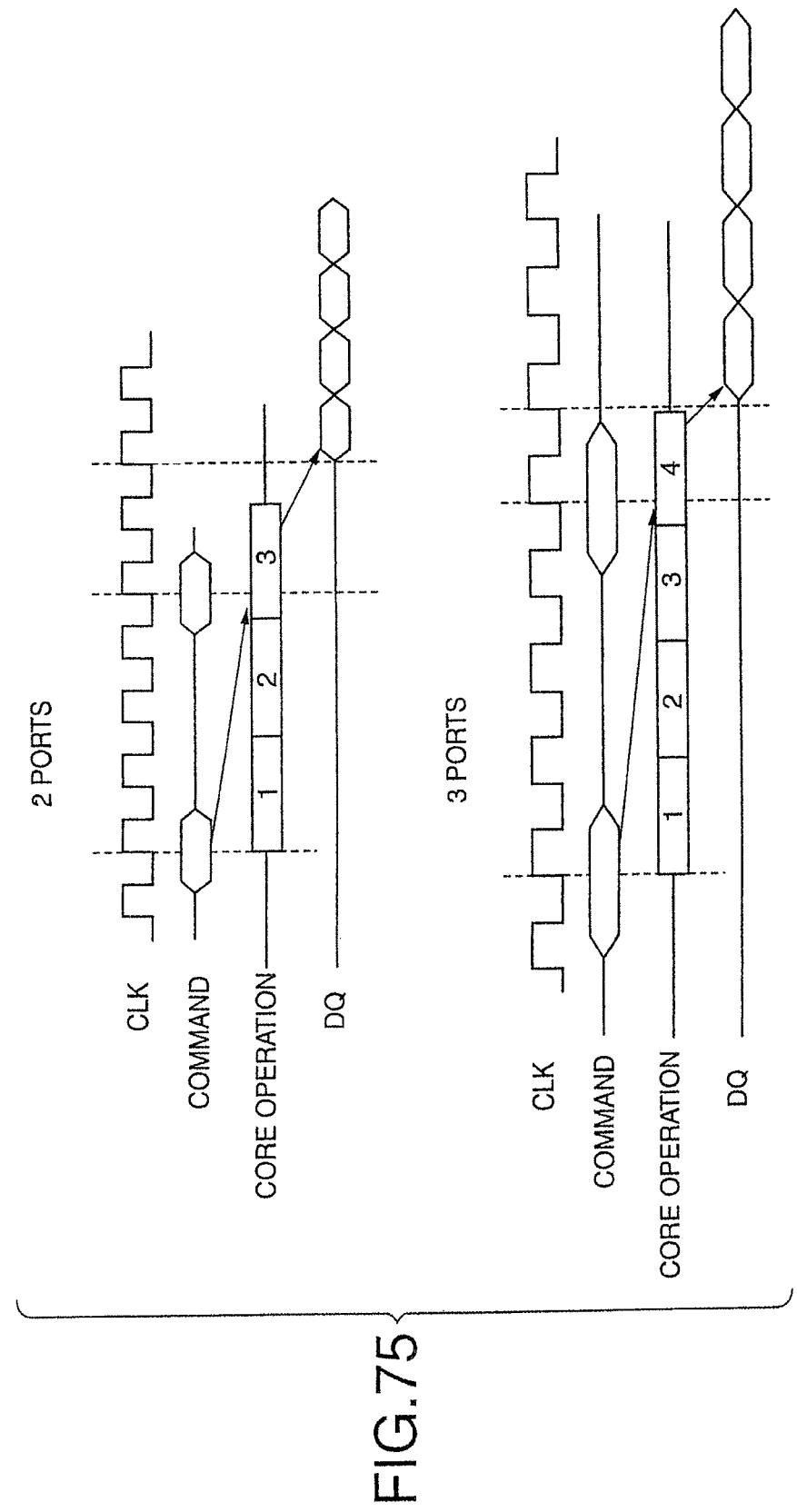
FIG. 75 is a drawing showing the relationship between a minimum external command cycle and internal operation cycles in the case of 2 and 3 ports.
Figure 76:
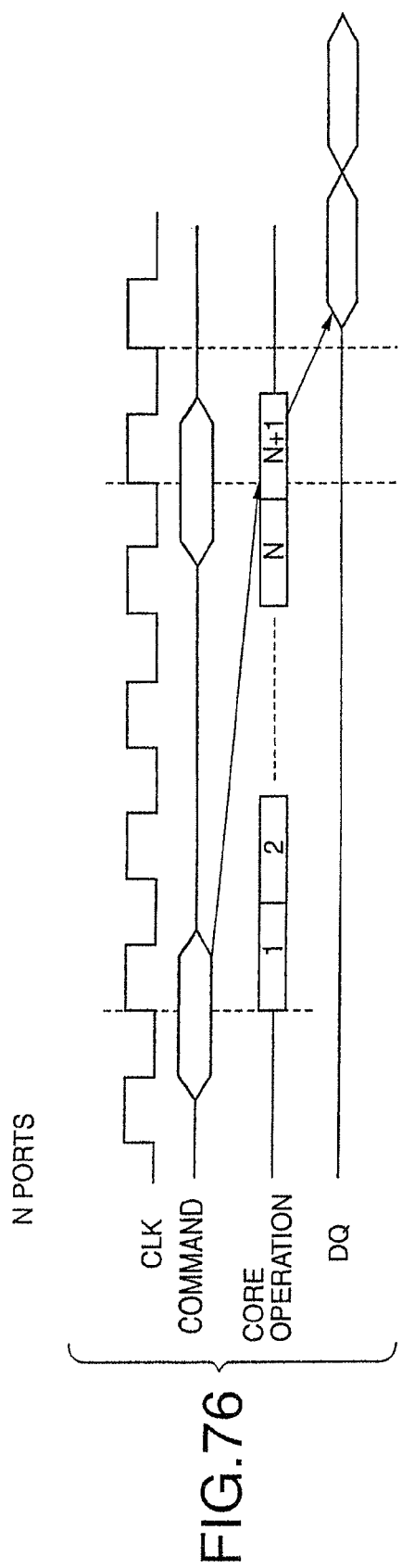
FIG. 76 is a drawing showing the relationship between a minimum external command cycle and internal operation cycles in the case of N ports.

FIG. 75 and FIG. 76 are drawings showing the relationship between a minimum external command cycle and internal operation cycles in the case of 2, 3, and N ports. As shown in the figures, if the number of ports is 2, the minimum external command cycle is a time length allowing two internal operations plus α, and if the number of ports is 3, the minimum external command cycle is a time period allowing three internal operations plus α. Further, if the number of ports is N, the minimum external command cycle is equal to a time length in which N+1 internal operations can be carried out, plus a time length α.

Figure 77:
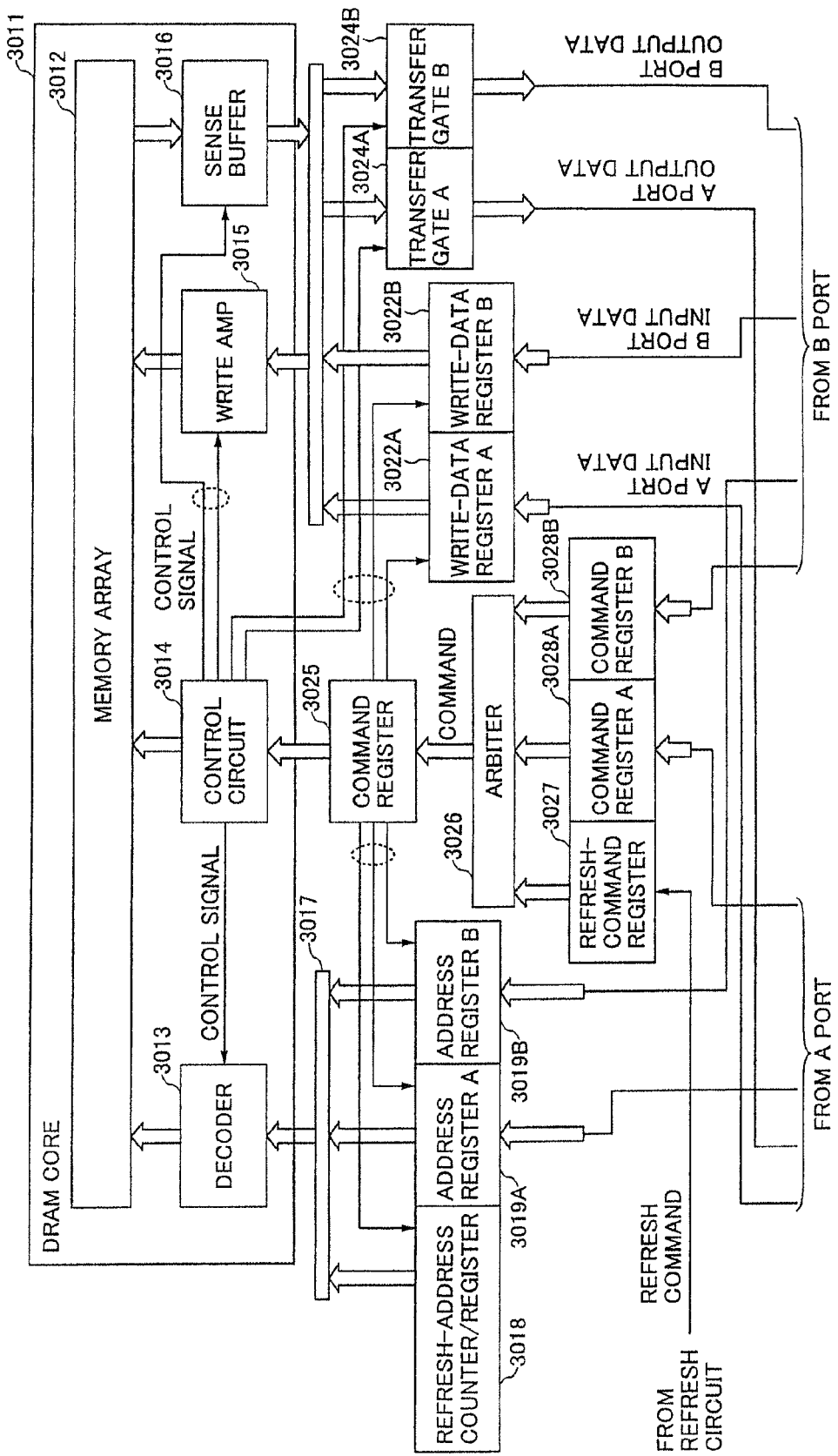
FIG. 77 is a drawing showing a configuration of the multi-port memory according to an embodiment of the present invention (third aspect)
Figure 78A:
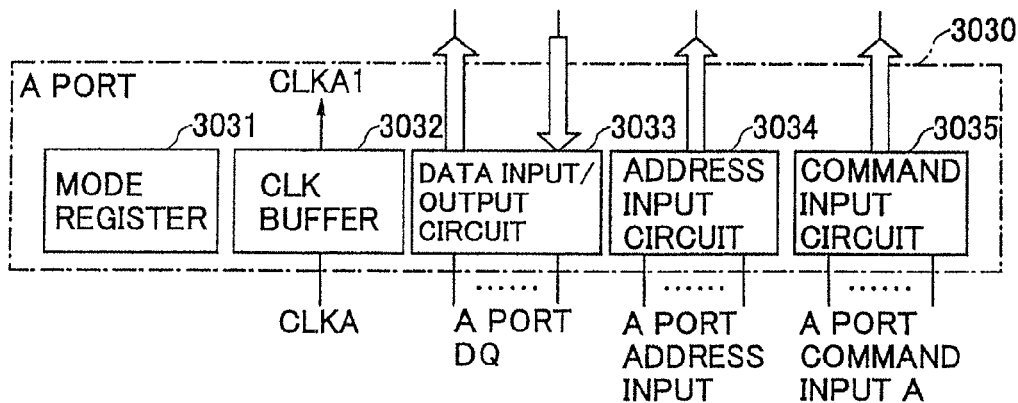
FIGS. 78A through 78C are drawings showing a configuration of the multi-port memory according to the above embodiment of the present invention (third aspect)
Figure 78B:
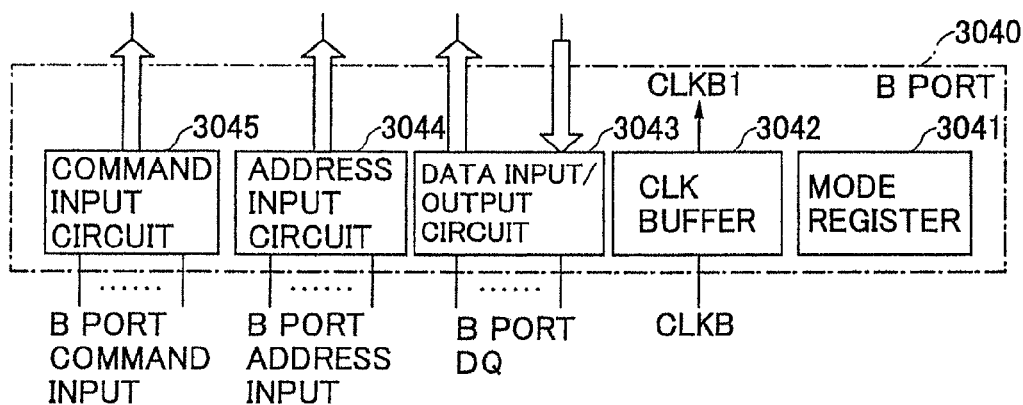
Figure 78C:
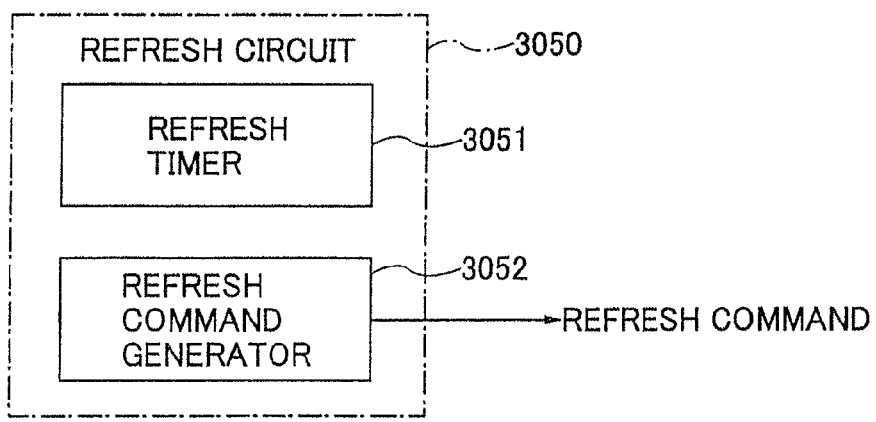

FIG. 77 and FIGS. 78A through 78C are drawings showing a configuration of the multi-port memory according to an embodiment of the present invention. FIG. 77 shows a DRAM core and its relevant circuitry, and FIG. 78A shows the A port, and FIG. 78B shows the B port. Further, FIG. 78C shows a refresh circuit. Circuits shown in FIGS. 78A through 78C are connected to respective portions of FIG. 77.

As shown in the figures, the multi-port memory of this embodiment includes a DRAM core 3011, an arbiter 3026 for the controlling purpose of determining an operation order and insuring that operations are performed in the determined order, command register 3025 that temporarily stores commands supplied from the arbiter 3026, and that transfers these commands to a control circuit 3014 of the DRAM core 3011 in the order in which the commands are received, sets of registers that temporarily store commands, addresses, and data of respective ports, two external ports comprised of an A port 3030 and a B port 3040, and a refresh circuit 3050.

The A port 3030 and the B port 3040 include mode registers 3031 and 3041, the CLK buffers 3032 and 3042, data I/O circuits 3033 and 3043, address input circuits 3034 and 3044, and command input units 3035 and 3045, respectively, which operate based on respective separate clock frequencies supplied from the exterior of the device. A data latency and a burst length are stored in the mode registers 3031 and 3041, so that they can be set separately. The data I/O circuits 3033 and 3043 are equipped with a mechanism to perform the parallel-to-serial conversion and serial-to-parallel conversion of input/output data according to the burst length.

The refresh circuit 3050 includes a refresh timer 3051 and a refresh command generator 3052. The refresh timer 3051 generates a refresh start signal at predetermined intervals, and the refresh command generator 3052 generates a refresh command in response.

Commands supplied to the A port and the B port are stored in a command register A 28A and a command register B 28B, respectively. Addresses are stored in an address register A 19A and an address register B 19B, respectively, and data to be written are stored in a Write data register A 22A and a Write data register B 22B, respectively. Further, a refresh command is stored in a refresh command register 3027, and a refresh address is stored in a refresh-address counter/register 3018.

The arbiter 3026 determines an order of command execution based on the order of command arrivals, and transfers the commands to the command register 3025 in the order that is determined. The command register 3025 sends these commands to the control circuit 3014 of the DRAM core 3011 in the order in which the commands are received from the arbiter 3026. When the DRAM core processes a given command, the control circuit 3014 is placed in a state in which it can receive a next command. In response, the command register 3025 sends the next command to the control circuit 3014. Commands that are supplied from the arbiter 3026 in the meantime are temporarily stored in the command register 3025. Further, the command register 3025 transmits a transfer signal to a corresponding address register and a corresponding data register (in the case of write operation) in addition to transferring the commands to the control circuit 3014 of the DRAM core 3011. In the DRAM core 3011, the control circuit 3014 responds to the supplied command, and controls a decoder 3013, a write amplifier (WriteAmmp) 3015, and a sense buffer 3016 accordingly, thereby performing an access operation with respect to the memory array 3012. In the case of a write operation, the decoder 3013 decodes an address to be accessed for the write operation so as to activate a word line and a column signal line in the memory array 3012, resulting in the write data stored in the Write data registers A and B being written in the memory array 3012 through the WriteAmp 3015. In the case of a read operation, the memory array 3012 is accessed in a similar manner, resulting in the read data being transferred from the sense buffer 3016 to the data output circuits of respective ports through transfer gates A and B designated as 3024A and 3024B, respectively. Transfer timings of the transfer gates are controlled according to operation cycles of the DRAM core 3011, and are determined by the control circuit 3014. Output data are output from the data output circuit of each port in synchronization with the corresponding external clock.

In the following, details that are relevant to each of command processing, address processing, and data processing will be described.

Figure 79:
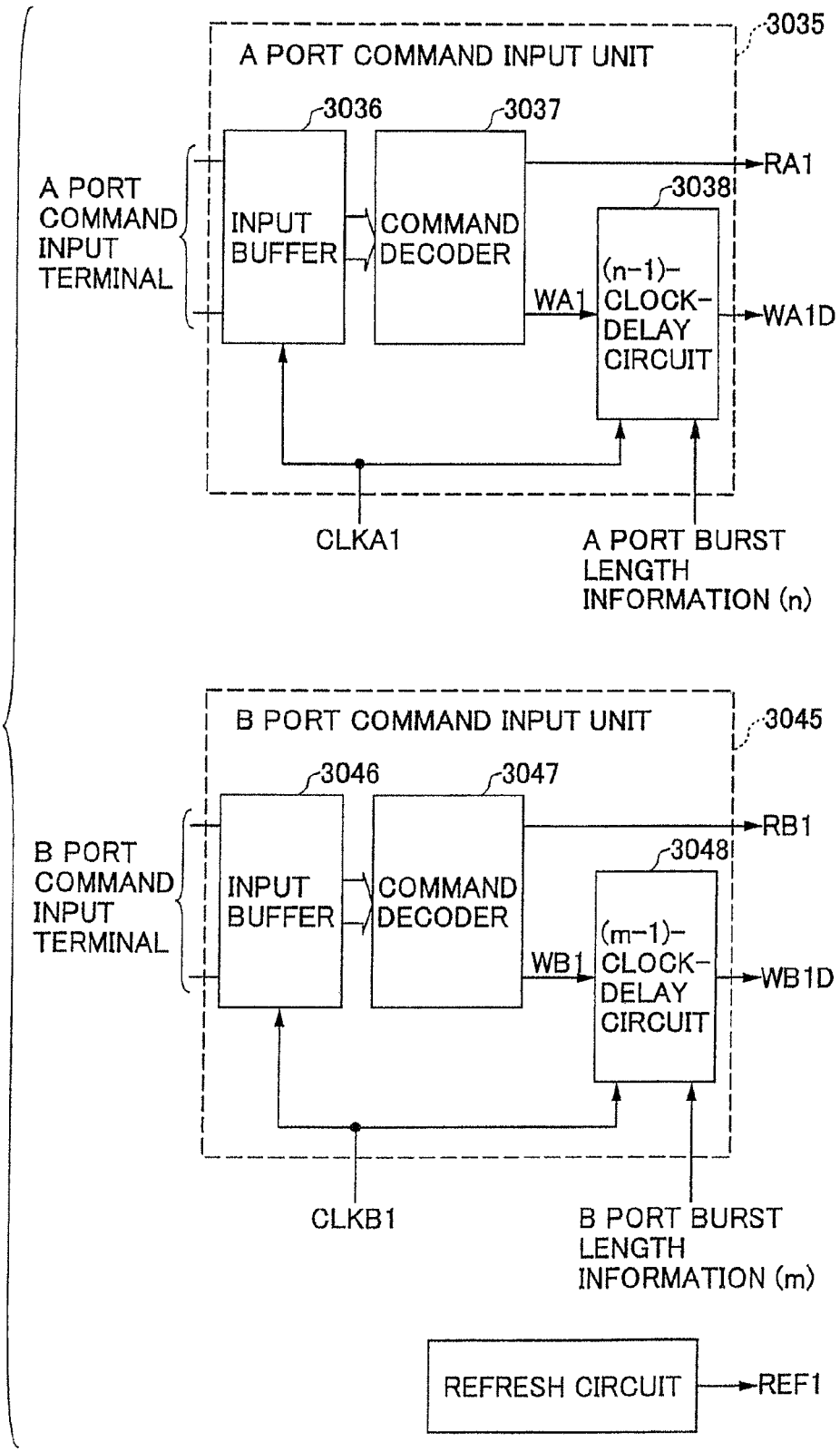
FIG. 79 is a drawing showing a configuration of units relevant to command processing according to a first embodiment.
Figure 80:
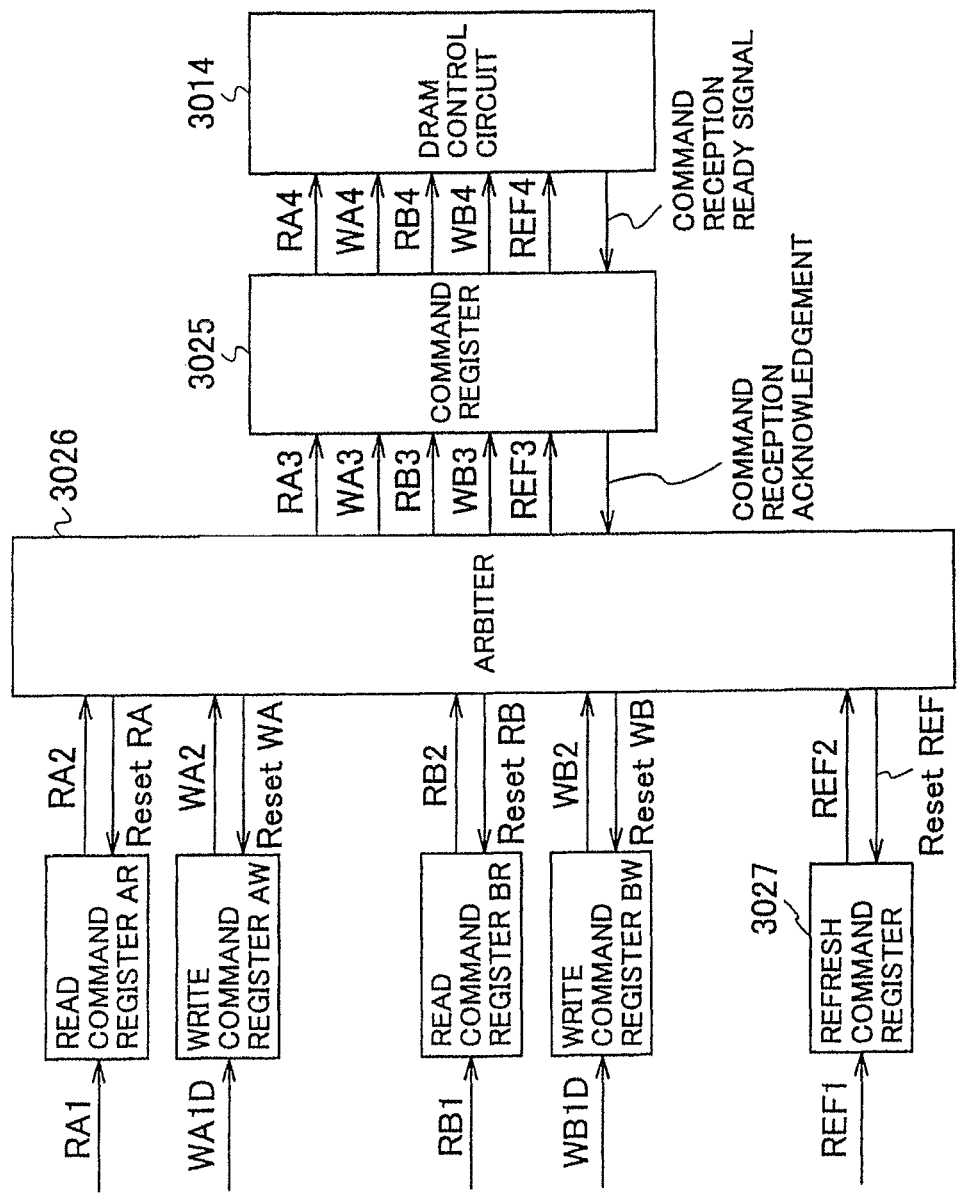
FIG. 80 is a drawing showing a configuration of units relevant to command processing according to the first embodiment.

FIG. 79 and FIG. 80 are drawings showing a configuration of units relevant to command processing according to a first embodiment. The same elements as those of FIG. 77 and FIGS. 78A-78C are referred to by the same reference numerals. The same applies in the case of other drawings.

As shown in FIG. 79, the command input unit 3035 of the A port includes an input buffer 3036, a command decoder 3037, and an (n−1)-clock delay 3038, and the command input unit 3045 of the B port includes an input buffer 3046, a command decoder 3047, and an (m−1)-clock delay 3048. Here, n and m are burst lengths. Moreover, as shown in FIG. 80, the command register A includes a Read command register AR and a Write command register AW, and the command register B includes a Read command register BR and a Write command register BW.

The input buffers 3036 and 3046 acquire supplied Read commands in synchronization with the respective clocks CLKA1 and CLKB1, and the command decoders 3037 and 3047 attend to decoding processes. The command decoders 3037 and 3047 generate RA1 and RB1, respectively, in the case of a read command, and generate WA1 and WB1, respectively, in the case of a write command. The signals RA1 and RB1 are transmitted to the Read command registers AR and BR, respectively, without any timing manipulation, whereas the signals WA1 and WB1 are delayed by the (n−1)-clock delay 3038 and the (m−1)-clock delay 3048 until the last data item of burst data is input, followed by being transmitted to the Write command registers AW and BW, respectively. Moreover, a refresh command REF1 generated by the refresh circuit 3050 is transmitted to the refresh command register 3027.

The arbiter 3026 detects an order in which commands are transferred to these five command registers AR, AW, BR, BW, and 3027, and sends these commands one after another in the detected order to the command register 3025. Upon reception of a command sent from the arbiter 26, the command register 3025 transmits a command reception acknowledgement to the arbiter 3026. In response to the command reception acknowledgement, the arbiter 3026 sends a next command to the command register.

The command register 3025 transfers the commands one after another to the control circuit 3014 of the DRAM core 3011 in the order in which these commands are received from the arbiter 3025. The control circuit 3014 of the DRAM core executes the received commands, and transmits a command reception ready signal to the command register 3025 when the command execution finishes or comes close to an end. In response to the command reception ready signal, the command register 3025 transmits the next command to the control circuit 3014. In the meantime, commands that are supplied from the arbiter 3026 are temporarily stored in the 3025.

Figure 81:
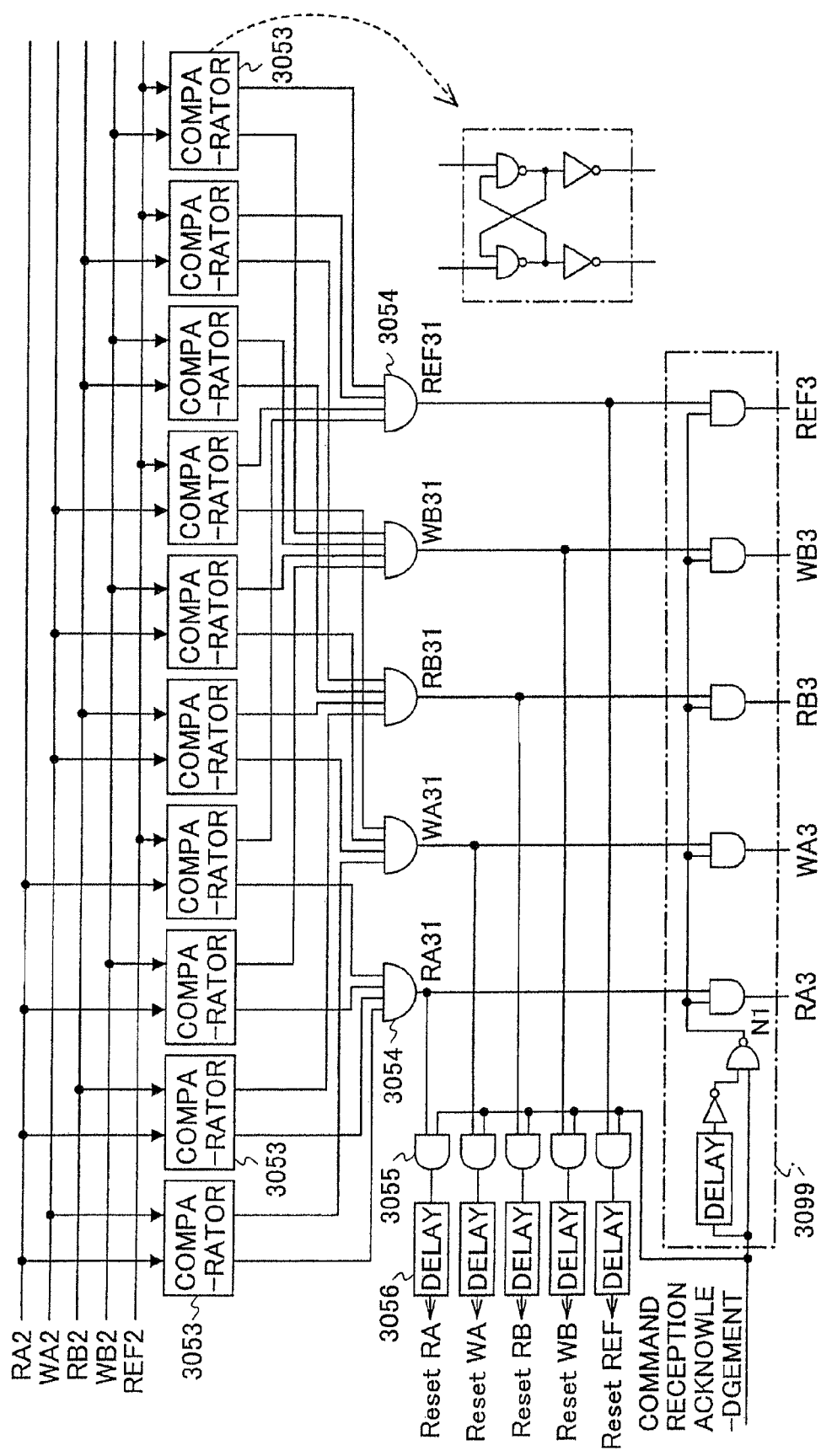
FIG. 81 is an embodiment of an arbiter.

FIG. 81 is an embodiment of the arbiter 3026. An order in which commands arrive in the five command registers (the Read command register AR, the Write command register AW, the Read command register BR, the Write command register BW, and the refresh command register 3027) of FIG. 80 is detected by comparators 3053 as shown in the figure. Each comparator 3053 compares the timings of two command registers, and changes an output thereof to "H" on the side where "H" is input first. An AND gate 3054 determines whether a given command is input ahead of all the four other commands by checking whether all the relevant outputs of the related comparators 3053 are 'H'. Signals RA31, WA31, RB31, WB31, and REF31 corresponding to respective commands become "H" if a corresponding command is the earliest, and are transferred to the command register 3025. If RA2 is the earliest of RA2 through REF2, the comparators connected to RA2 has an output thereof being "H" on the side where the RA2 is connected, resulting in RA31 being "H". At this particular instant, the command reception acknowledgement has not yet been produced (="L"), so that N1="H", resulting in RA3 being "H". The command RA3 is thus sent to the command register 3025.

The command register 3025 generates a command reception acknowledgement when receiving a command. When this happens, an "L" pulse is generated at a node N1, resulting in RA3 through REF3 being all "L". In the meantime, one of ResetRA through ResetREF will be generated. If RA31 is "H", ResetRA is generated, thereby resetting the Read command register AR. In response, RA2 becomes "L", and one of RA31 through REF31 then becomes "H" indicative of a command next in line. When N1 becomes "H" at an end of the "L" pulse, the command next in line is transferred to the command register 3025. The operations described above are repeated thereafter.

Figure 82:
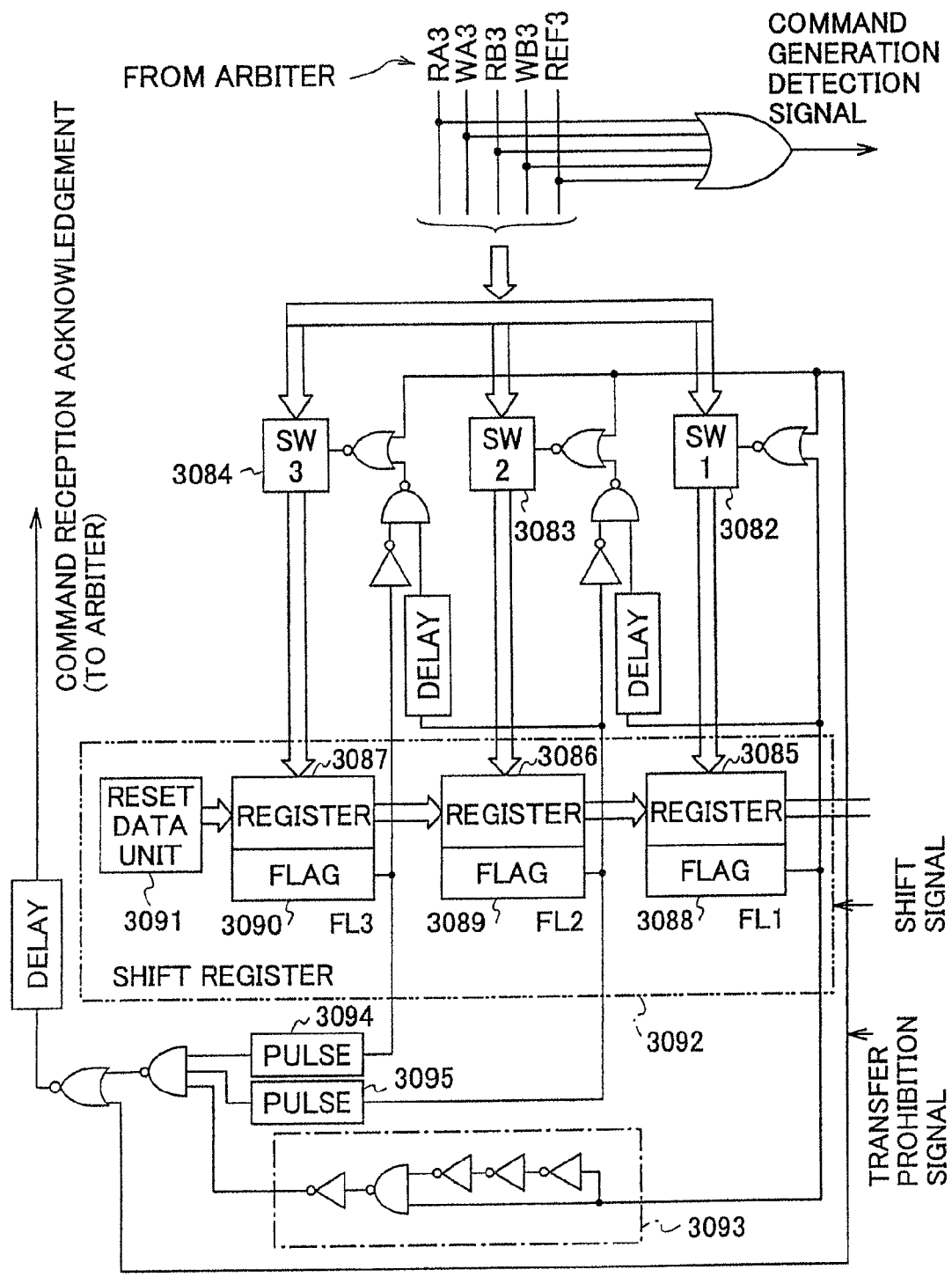
FIG. 82 is a drawing showing a configuration of a command register.
Figure 83:
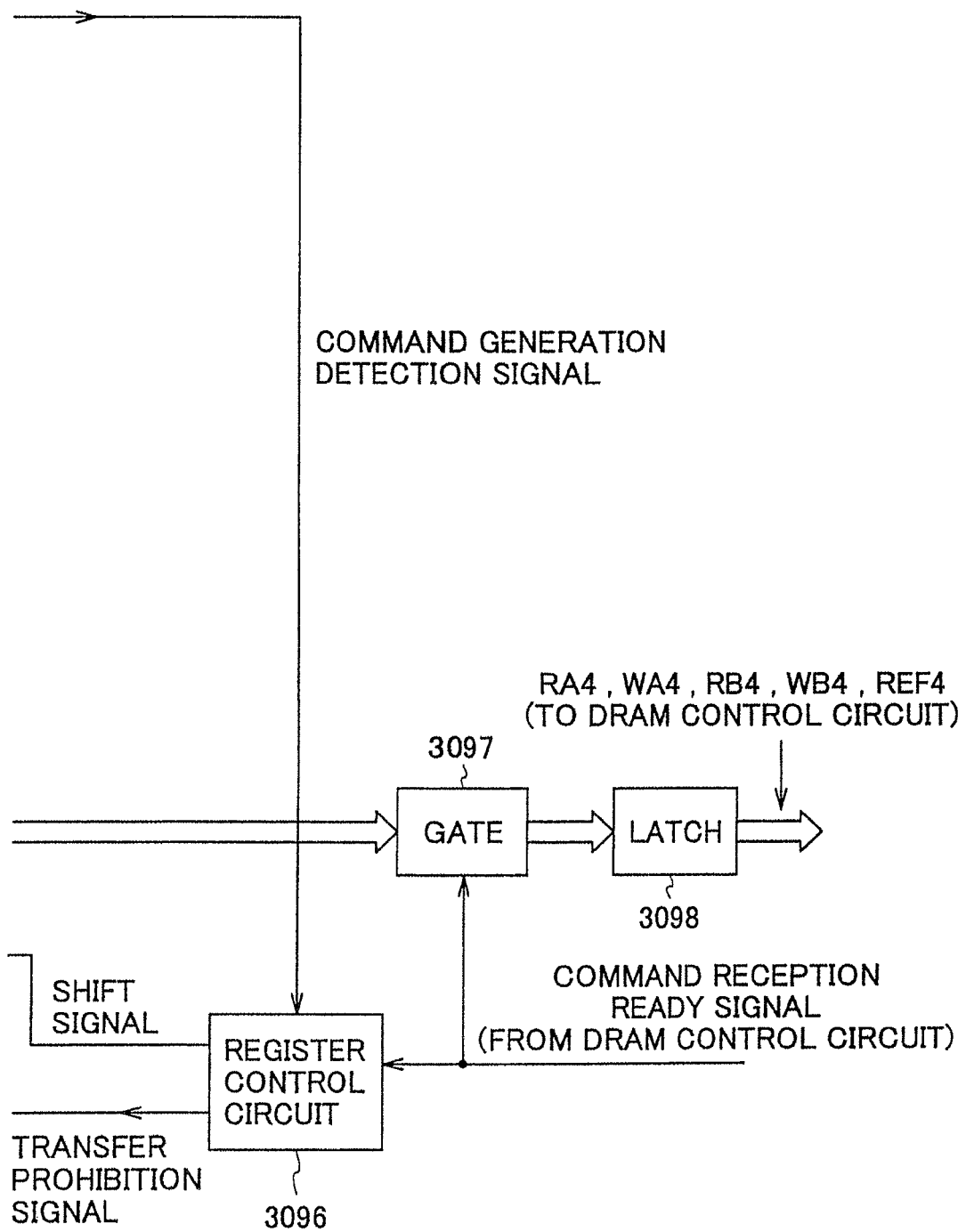
FIG. 83 is a drawing showing a configuration of the command register.

FIG. 82 and FIG. 83 are drawings showing a configuration of the command register 3025. It is divided and shown in the two drawings.

The command register 3025 mainly includes a shift register 3092 that stores therein commands and successively outputs these commands to the DRAM core 3011, and includes switches (SW1-SW3) 3082-3084 which transfer the commands received from the arbiter 3026 to the shift register 3092. In this example; the shift register 3092 has a three-stage configuration, and includes registers 3085-3087 for storing commands, flags 3088-3090 indicative of storage statuses of the registers 3085-3087, and a reset data unit 3091 which resets the state of the registers 3085-3087. In the state where no command is stored in the registers 3085-3087, flag 3088-3090 are all low (FL1-FL3="L"), so that the switch 3082 (SW1) is connected. The first command is stored in the register 3085 through SW1, so that FL1 becomes "H". When FL1 becomes "H", a "H"-edge pulse circuit 3093 generates a pulse, so that a command reception acknowledgement is transmitted to the arbiter 3026.

If the command reception ready signal is asserted by the DRAM core 3011 at this particular instant, the gate 3097 is opened to transfer the command of the register 3085 to a latch 3098, the command then being sent to the control circuit 3014 of the DRAM core 3011. At the same time, an address corresponding to the command and the like are transmitted to the DRAM core 3011. The DRAM core 3011 negates the command reception ready signal while starting operations according to the received command. The gate 3097 is thus closed. The register-control circuit 3096 generates a shift signal that prompts the data of the register 3086 to move to the register 3085 and the data of the register 3087 to the register 3086. If a command is not stored in the register 3086 prior to the generation of a shift signal, a shift operation results in the register 3085 being reset and FL1 becoming "L". The register-control circuit 3096 generates a transfer inhibiting signal concurrently with the generation of the shift signal so as to disconnect SW1-SW3, thereby prohibiting data from being transferred to the shift register 3092 during the shift operation. When the first command (command 1) is supplied to the register 3085 through SW1, the command is stored in the register 3085 if the DRAM core 3011 is executing the preceding command. FL1 becomes "H", which disconnects SW1, and further disconnects SW2 after a predetermined delay. Here, the predetermined delay corresponds to a time period from the generation of a command reception acknowledgement to the resetting of an arbiter output. If the next command (command 2) is supplied from the arbiter 3026 before the DRAM core 3011 is ready to receive a command, the command 2 is stored in the register 3086 through SW2. FL2 becomes "H", which generates a command reception acknowledgement, and disconnects SW2, followed by further disconnecting SW3 after a predetermined delay time. When the DRAM core is in such a state as to be able to receive a command, a command reception ready signal is generated to open the gate 3097, so that the command 1 of the register 3085 is transmitted to the latch 3098 and then to the DRAM core 3011. The DRAM core 3011 negates the command reception ready signal while starting operations thereof according to the command 1. In response, the gate 3097 is closed. The register-control circuit 3096 generates a shift signal, which shifts the command 2 of the register 3086 to the register 3085, and also shifts the contents (reset state) of the register 3087 to the register 3086. The register 3085 ends up storing the command 2, and the registers 3086 and 3087 end up being in a reset state. Since FL1 is "H" and FL2 and FL3 are "L", SW2 is connected whereas SW1 and SW3 are disconnected.

The reset data unit 3091 is connected to the register 3087 of the shift register 3092 on the left-hand side thereof. This configuration is provided for the purpose of shifting the command of the register 3087 to the register 3086 by a subsequent shift signal when commands are stored all the way up to the register 3087. In this manner, the command register 3025 temporarily accumulates commands sent from the arbiter 3026, and detects the state of the DRAM core 3011, followed by transmitting the commands one after another.

Figure 84:
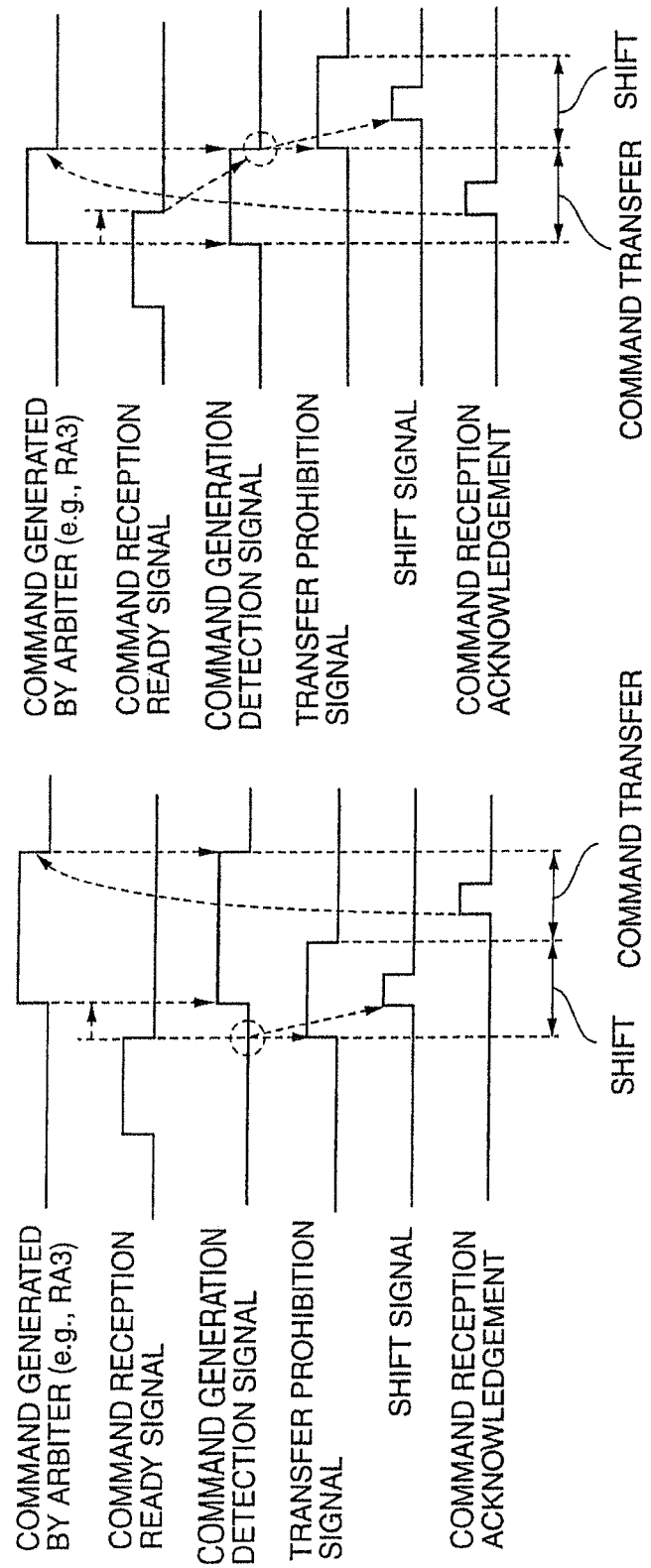
FIGS. 84A and 84B show operations of a register-control circuit.

A command generation detecting signal is input into the register-control circuit 3096. The command generation detecting signal is generated when a command is transmitted from the arbiter 3026. FIGS. 84A and 84B show operations of the register-control circuit 3096. A shift signal and a transfer inhibiting signal are generated when the command reception ready signal to the register-control circuit 3096 is deactivated. When a command is transmitted from the arbiter 3026 immediately before the command reception ready signal is deactivated, however, it is preferable to perform a shift operation only after transmitting an earlier received command to the shift register 3092. Because of this, a comparison is made as to which one of the falling edge of the command reception ready signal and the rising edge of the command generation detecting signal is earlier. If the former is earlier, a shift signal and a transfer inhibiting signal are generated in response to the former falling edge, and if the latter is earlier, a shift signal and a transfer inhibiting signal are generated in response to the falling edge of the latter signal.

Figure 85:
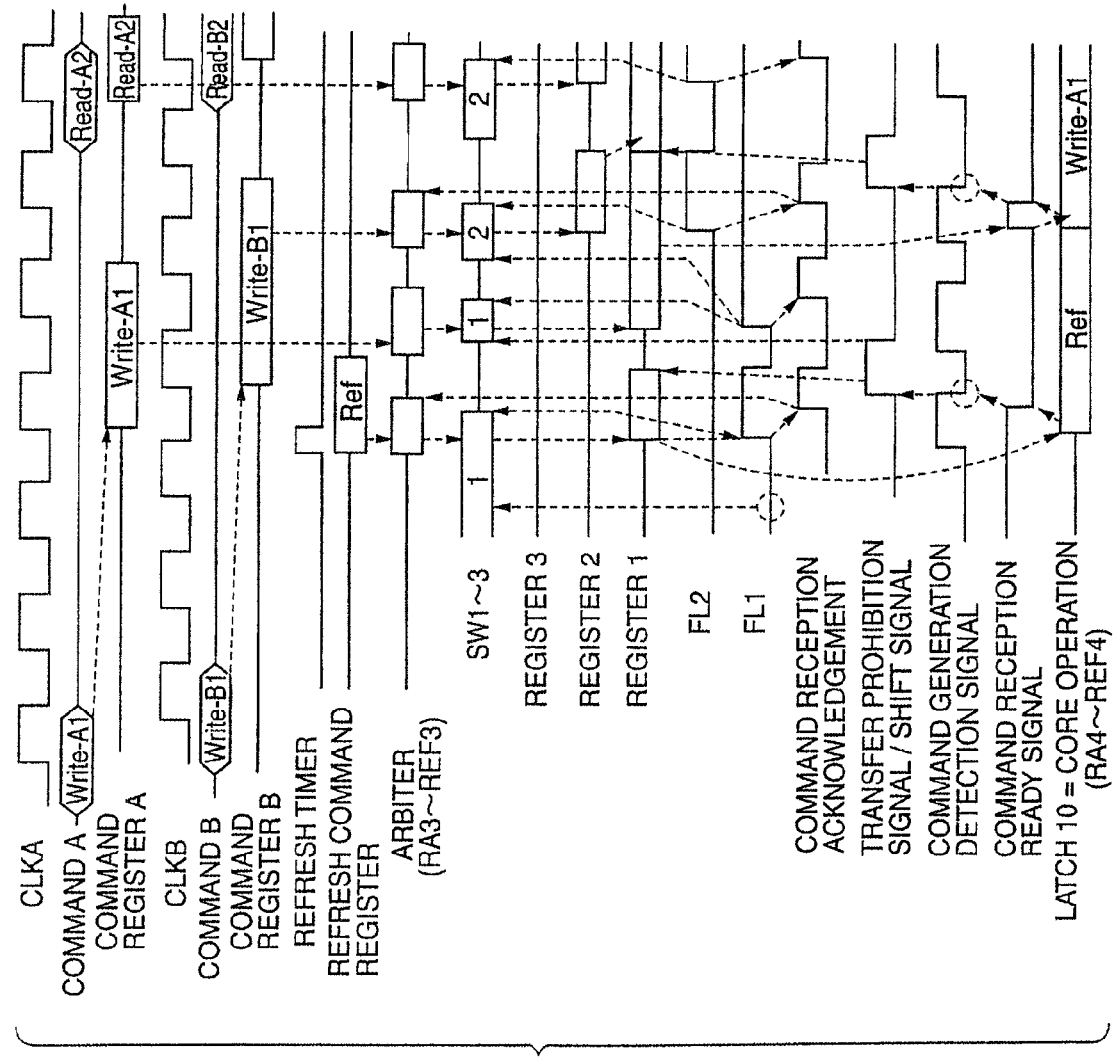
FIG. 85 is a drawing showing operations of the command register.
Figure 86:
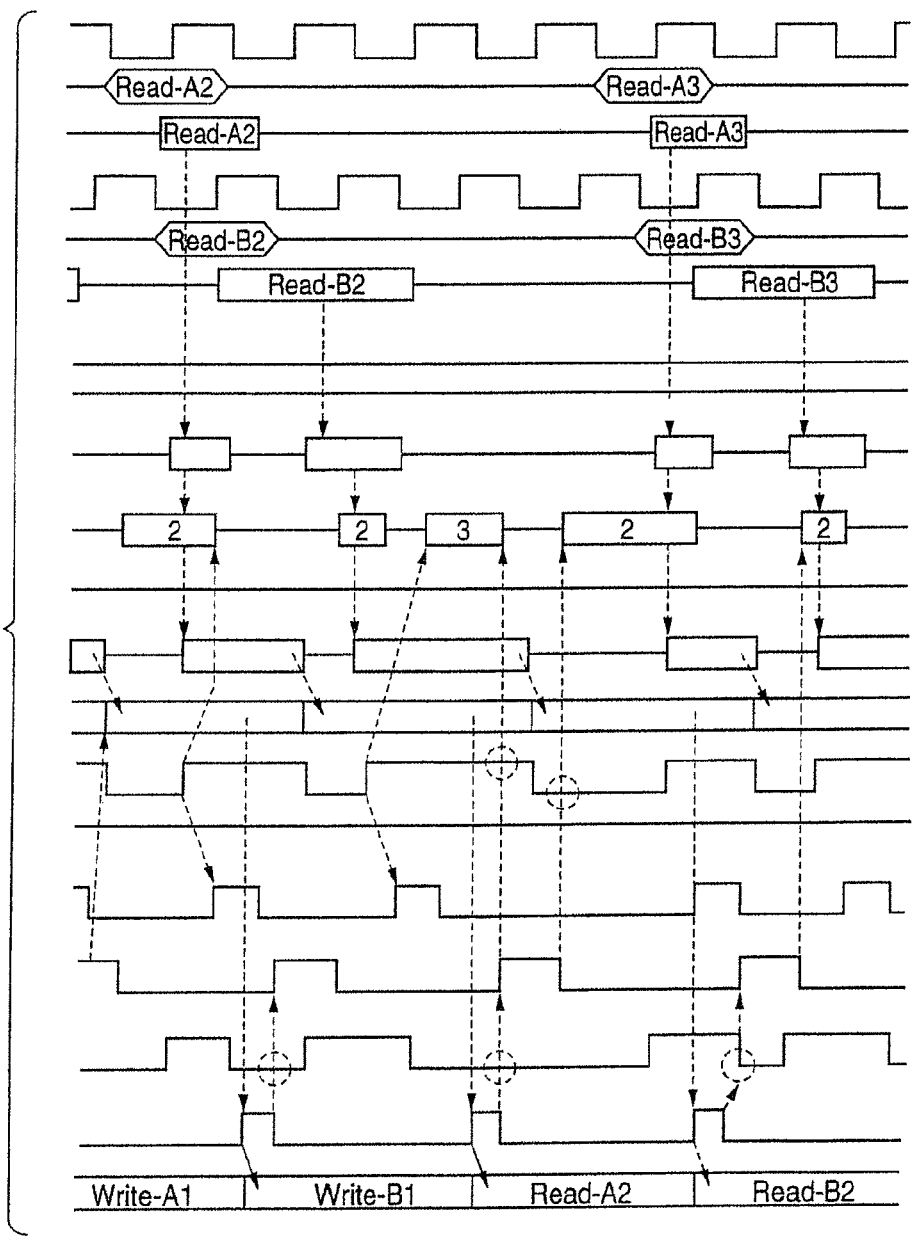
FIG. 86 is a drawing showing operations of the command register.

FIG. 85 and FIG. 86 are drawings showing operations of the command register 3025. Illustration is given here with regard to a case in which a refresh command is generated at the time of a Write→Read command transition that presents a timing condition most crowded with input commands. Numbers of SW1 through SW3 shown in the figures indicate an SW that is connected, and the duration for which an SW is connected is illustrated. Further, resisters 1 through 3-correspond to the registers 3085 through 3087, respectively.

Figure 87:
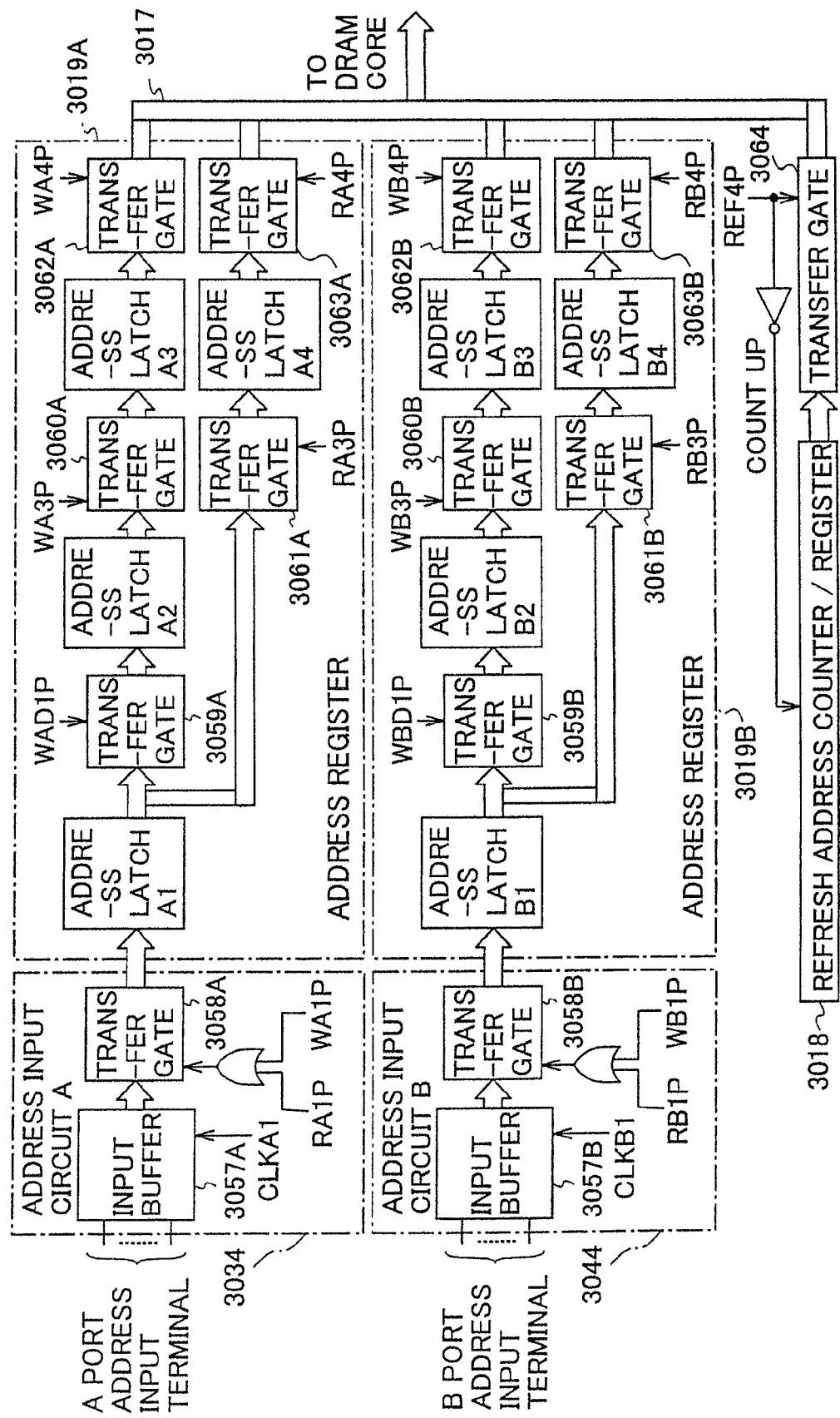
FIG. 87 is a drawing showing a configuration of a portion relevant to address processing according to the embodiment.

FIG. 87 is a drawing showing a configuration of a portion relevant to address processing according to the embodiment. Hereinafter, a signal having the letter "P" at the end of its signal name represents a signal that has pulses made from rising edges of a signal of a corresponding signal name. As shown in the figure, the address input circuits 3034 and 3044 include input buffers 3057A and 3057B and transfer gates 3058A and 3058B, respectively. Further, the address register 3019A and the address register 3020B include address latches A1 through A4 and B1 through B4, and transfer gates 3059A through 3063A and 3059B through 3063B, respectively. An address supplied from the transfer gates 3062A, 3062B, 3063A, and 3063B is transmitted to the DRAM core 3011 through an address bus 3017. Further, a refresh address supplied from the refresh-address counter/register 3018 is also transmitted to the DRAM core 3011 through the transfer gate 3064 and the address bus 3017.

When a Read command or a Write command is input from an exterior of the device, an address supplied to the input buffer 3057A or 3057B concurrently with the input command is transmitted to the address latch A1 or B1 through the transfer gate 3058A or 3058B, respectively. In the case of a Read command, the address is sent to the DRAM core 3011 through the transfer gates 3061A and 3063A or 3061B and 3063B and the address latch A4 or B4 in synchronization with the transfer of the command to the DRAM core. In the case of a Write command, an address is transferred further to the address latch A2 or B2 at the timing of the last data acquisition, and, then, is transferred through the transfer gate 3062A or 3062B to the DRAM core 3011 in synchronization with the transfer of the command to the DRAM core. Further, the refresh-address counter/register 3018 generates and keeps therein a refresh address, which is then transmitted through the transfer gate 3064 to the DRAM core 3011 in synchronization with the transfer of the refresh command to the DRAM core.

Figure 88:
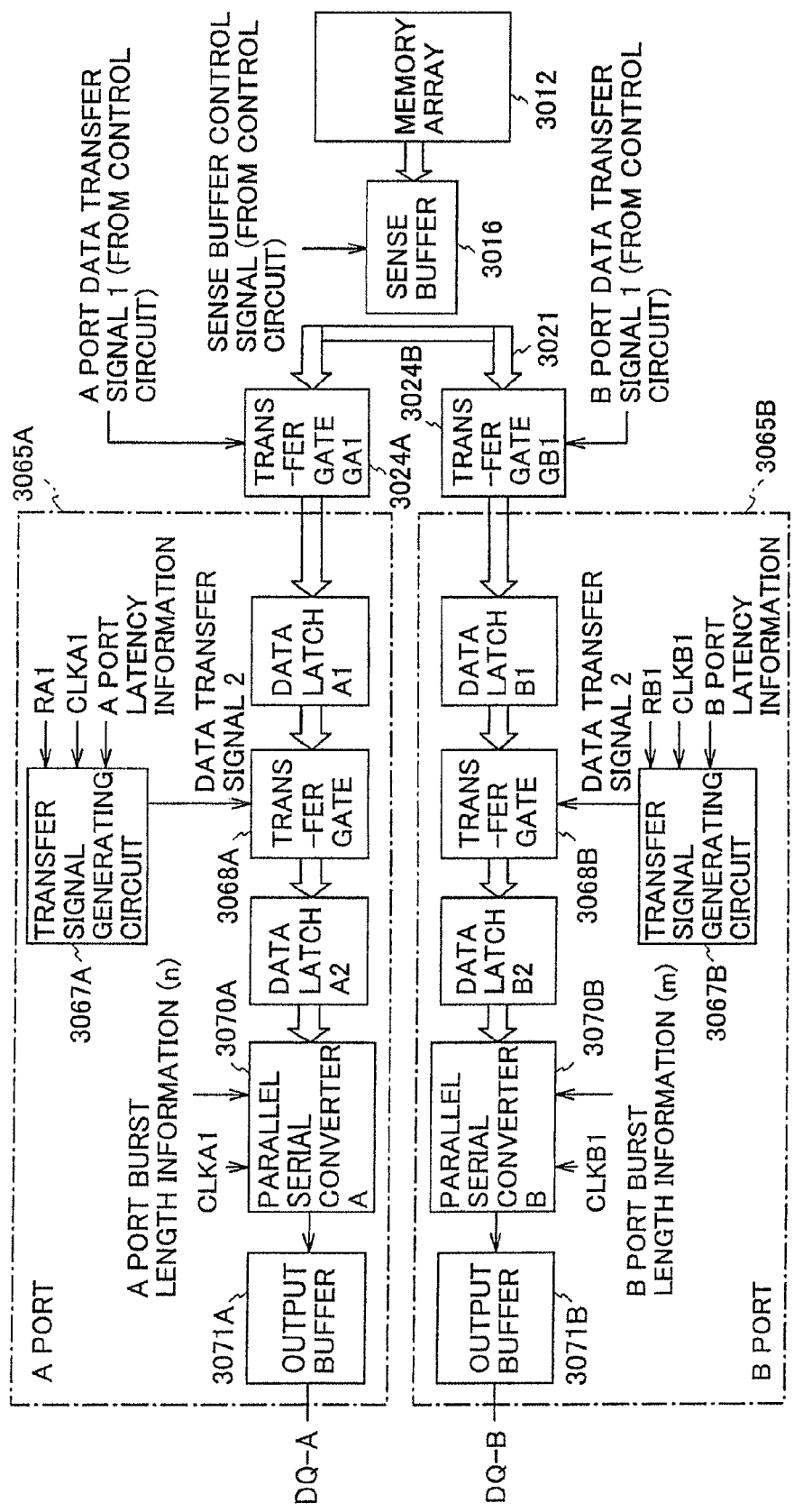
FIG. 88 is a drawing showing a configuration of a portion relevant to data outputting according to the embodiment.
Figure 89:
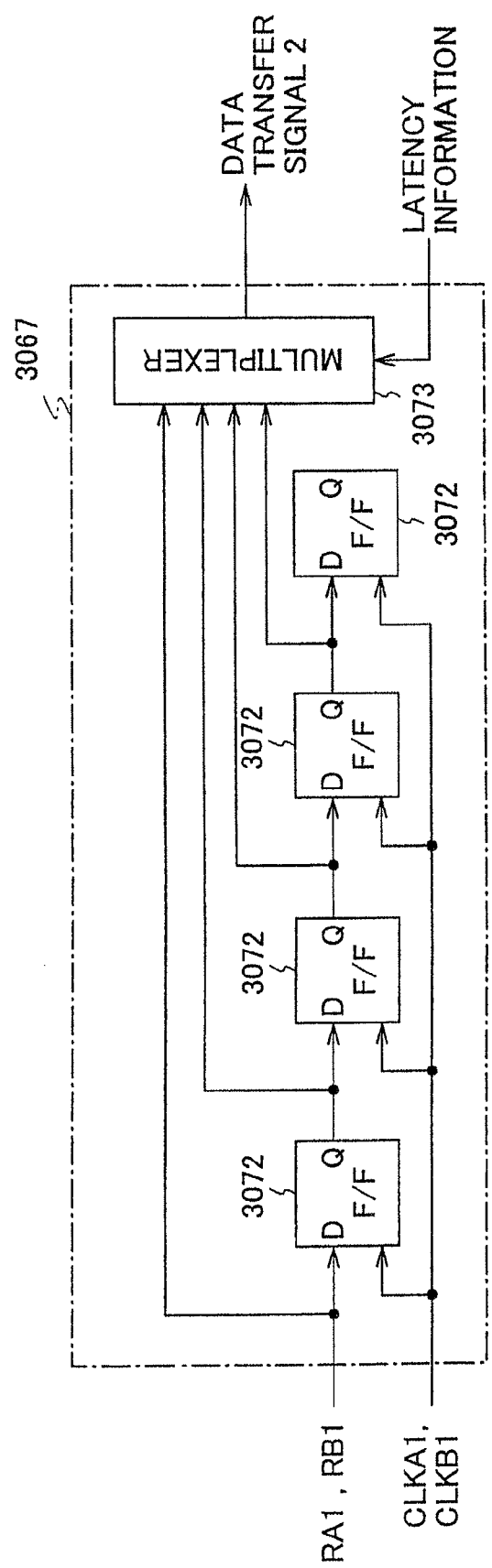
FIG. 89 is a drawing showing a transfer signal generating circuit of FIG. 88.

FIG. 88 is a drawing showing a configuration of a portion relevant to data outputting according to the embodiment. FIG. 89 is a drawing showing a transfer signal generating circuit of FIG. 88. The respective data I/O circuits 3033 and 3043 of the A port 3030 and the B port 3040 include data-output-purpose circuits 3065A and 3065B and data-input-purpose circuits 3074A and 3074B, respectively. As shown in the figure, data read from the memory array 3012 through the sense buffer 3016 are transmitted to the data-output-purpose circuit 3065A or 3065B through the data bus 3021 and the transfer gate 3024A or 3024B, respectively.

The data-output-purpose circuits 3065A and 3065B include data latches A1 and B1, transfer signal generating circuits 3067A and 3067B, transfer gates 3068A and 2068B, data latches A2 and B2, parallel-to-serial converters 3070A and 3070B, and output buffers 3071A and 3071B, respectively.

The transfer gates 3024A and 3024B are controlled by the control circuit 3014 of the DRAM core 3011 based on the internal operations. If the executed command is Read-A (i.e., a read operation with respect to the A port), the transfer gate 3024A will be open. If the executed command is Read-B, the transfer gate 3024B will be open. The data latches A1 and B1 store the data therein, which are then transmitted the respective data latches A2 and B2 a predetermined latency after the reception of Read commands in the respective ports where such latency is introduced through operations of the transfer gates 3068A and 3068B. The data are then converted by the parallel-to-serial converters 3070A and 3070B, followed by being transferred to the output buffers 3071A and 3071B to be outputted therefrom, respectively.

As shown in FIG. 89, the transfer signal generating circuit 3067 (i.e., 3067A or 3067B) employs a series of flip-flops 3072 to delay a respective Read command RA1 or RB1 by such a number of clock cycles as determined by the latency settings, thereby generating a data transfer signal 3002. Since the transfer of read data through the transfer gates 3068A and 3068B is responsive to the data transfer signal 3002, the read data ends up being delayed from the timing of read operation by as many clock cycles as the latency settings.

Figure 90:
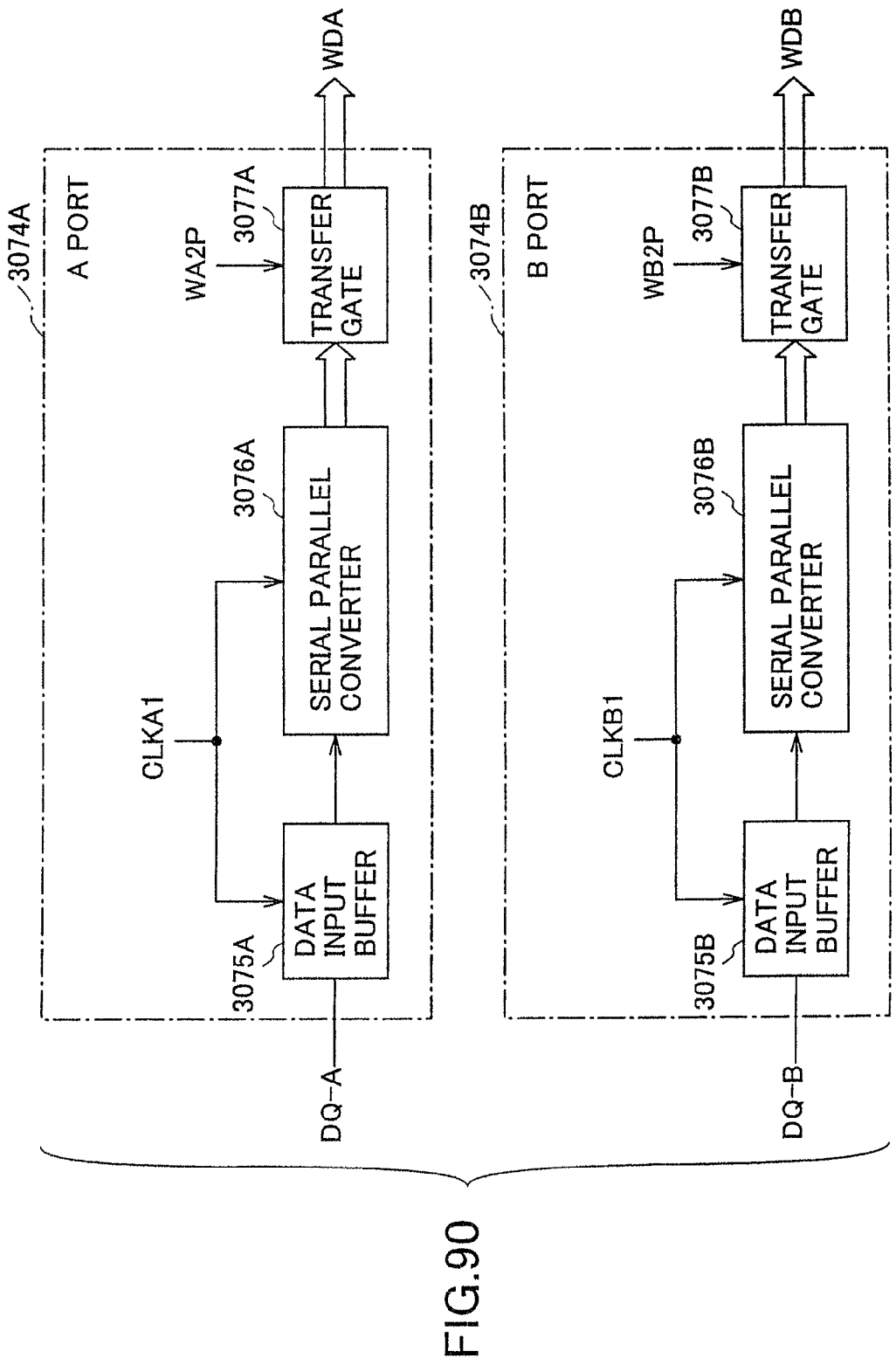
FIG. 90 is a drawing showing a configuration of a portion relevant to data inputting according to the embodiment.
Figure 91:
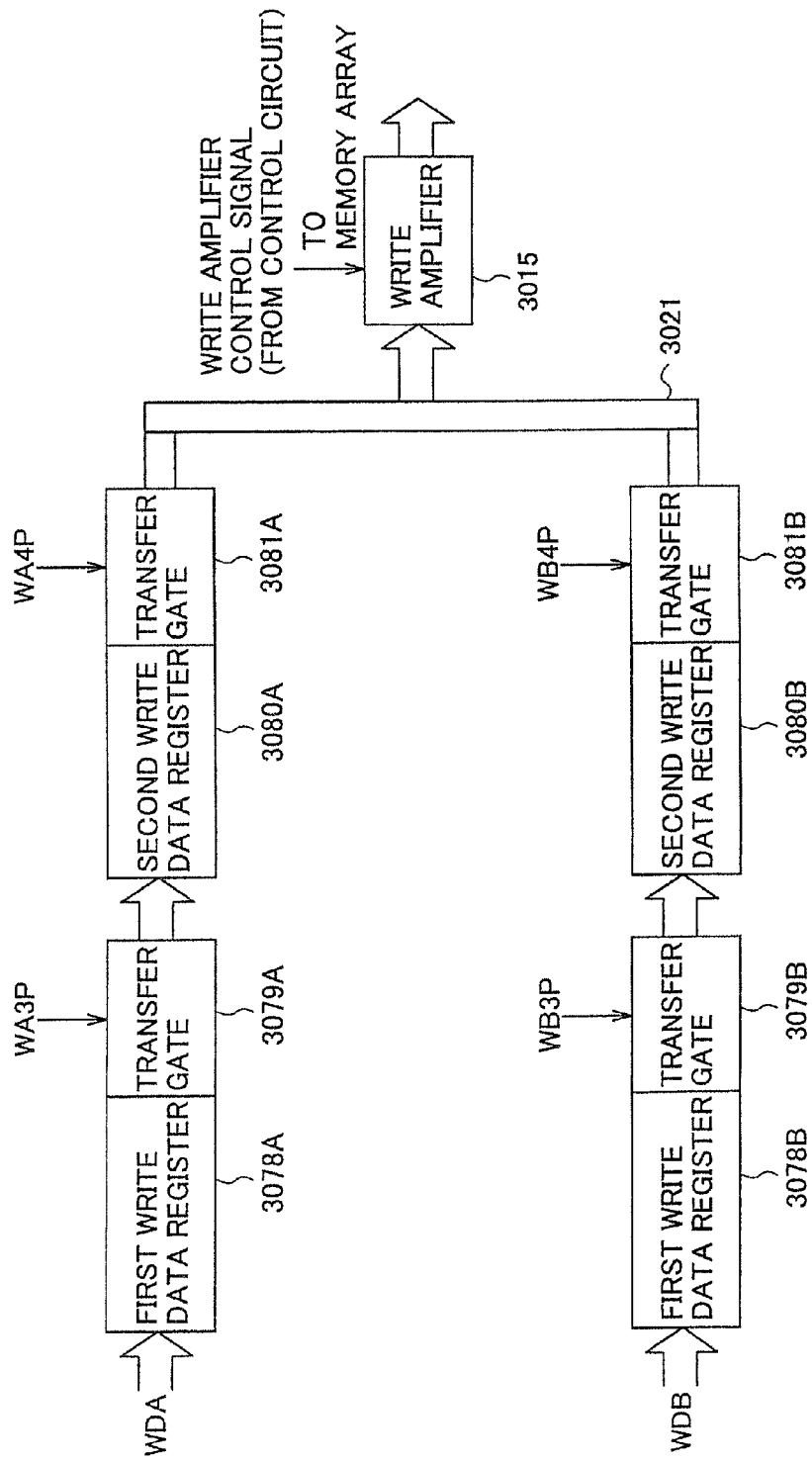
FIG. 91 is a drawing showing a configuration of a portion relevant to data inputting according to the embodiment.

FIGS. 90 and 91 are drawings showing a configuration of a portion relevant to data inputting according to the embodiment. The data-input-purpose circuits 3074A and 3074B include data input (Din) buffers 3075A and 3075B, serial-to-parallel converters 3076A and 3076B, and data transfer units 3077A and 3077B, respectively. Write data WDA and WDB from the data transfer units 3077A and 3077B are sent to the WriteAmmp 3015 through first Write data registers 3078A and 3078B, data transfer gates 3079A and 3079B, second Write data registers 3080A and 3080B, data transfer gates 3081A and 3081B, and the data bus 3021, respectively, and are then written in the memory array 3012.

Serially input data are converted from serial to parallel according to the burst length, and are then transmitted to the first Write data registers 3078A and 3078B at the timing at which the last data item is input. When the Write command is transmitted to the DRAM core 3011 from the command register 3025, the corresponding data will also be transmitted to the DRAM core 3011.

FIG. 92 to FIG. 99 are time charts which show operations of the multi-port memory of the first embodiment. FIG. 92 and FIG. 93, FIG. 95 and FIG. 96, and FIG. 98 and FIG. 99 are drawings which divide a single time chart for the sake of proper illustration, one showing the first half of the time chart and the other showing the second half of the time chart with some overlaps therebetween.

Figure 92:
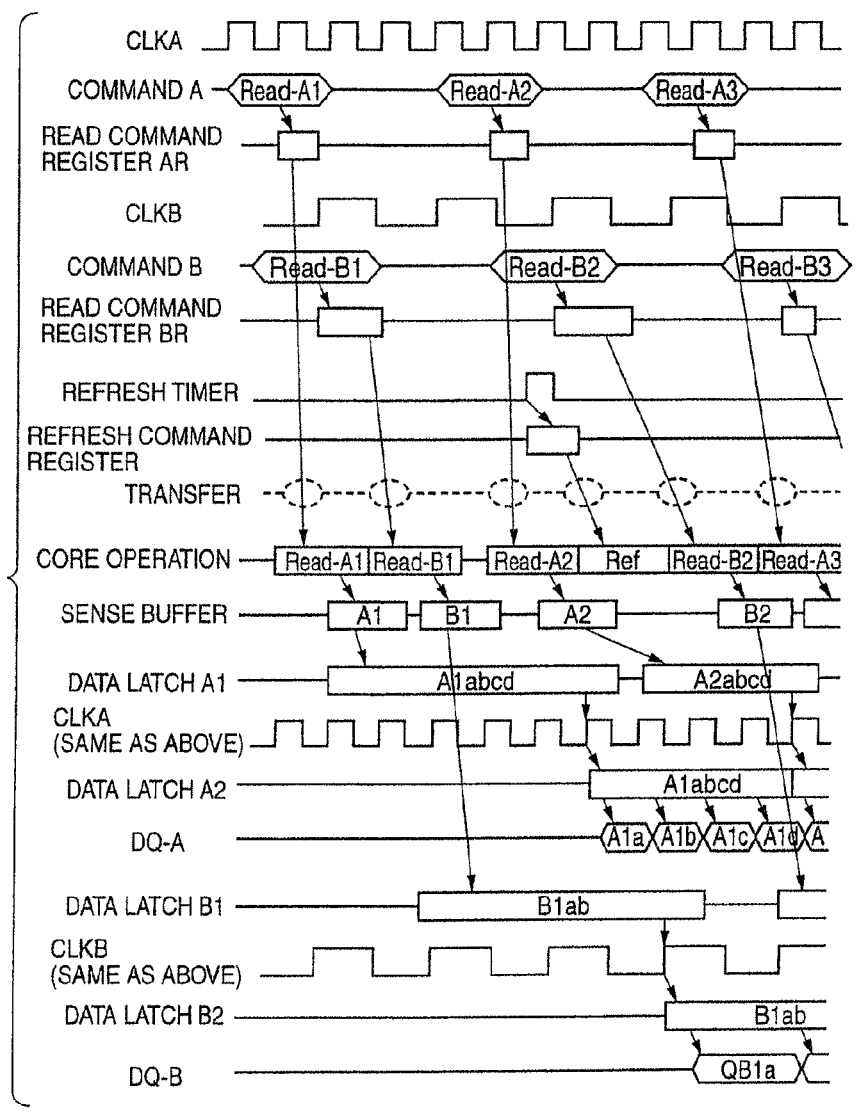
FIG. 92 shows operations performed when Read commands are consecutively input to the two ports.
Figure 93:
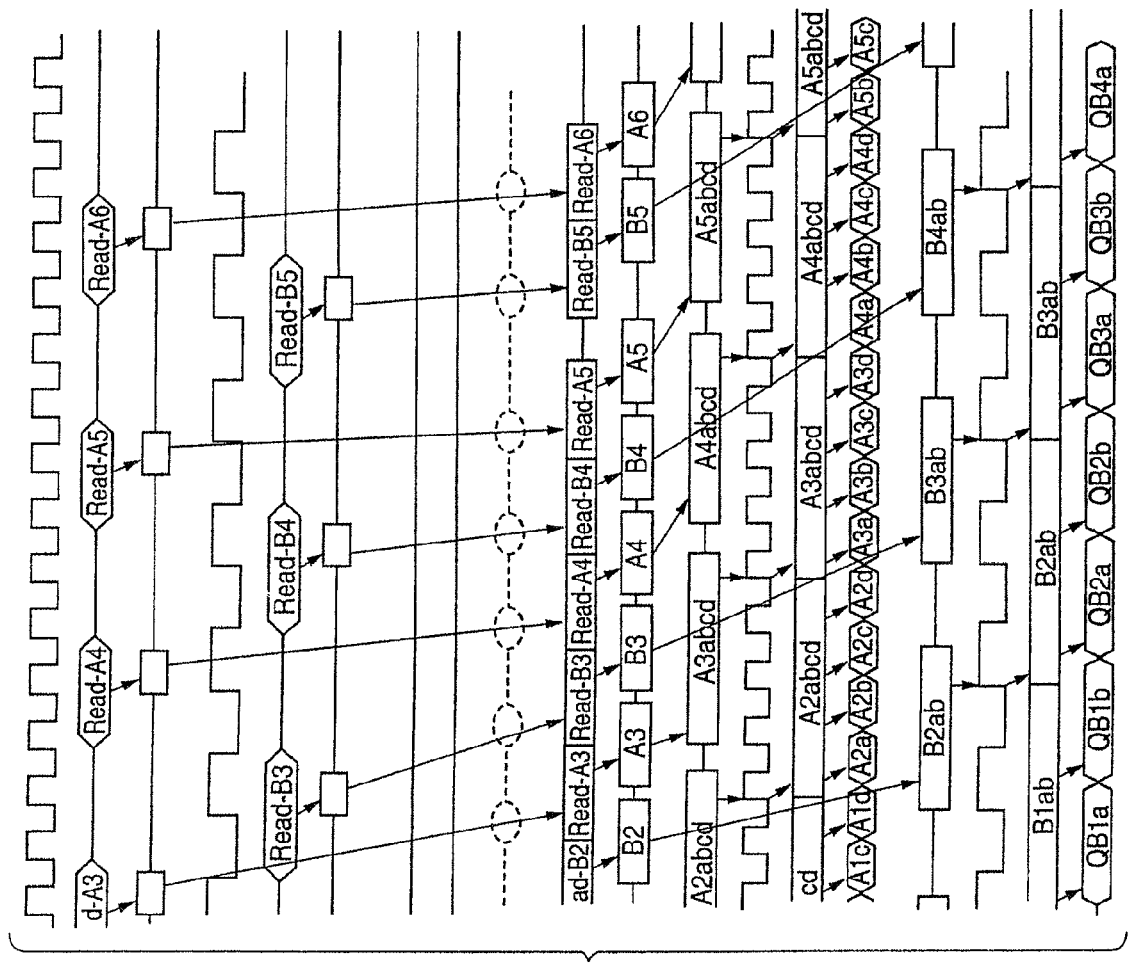
FIG. 93 shows operations performed when Read commands are consecutively input to the two ports.

FIG. 92 and FIG. 93 show operations performed when Read commands are consecutively input to the two ports. The A port and the B port, which are provided with the respective clocks CLKA and CLKB having mutually different frequencies, take in a command, an address, and write data in synchronization with the received clocks, and output retrieved data in synchronization with the clocks. In this example, the A port operates at a maximum clock frequency, and the B port operates at a clock frequency slightly slower. For the A port, a Read command cycle=4 (CLKA), a data latency=6 (CLKA), and a burst length=4. For the B port, a Read command cycle=2 (CLKB), a data latency=3 (CLKB), and a burst length=2. The data latencies and the burst lengths are set in the mode registers 3031 and 3041 of the respective ports. With respect to the A port, the inputting/outputting of data is performed 4 times in synchronization with the clock in response to one command, and the retrieved data is output 6 clock cycles after the inputting of a read command. With respect to the B port, the inputting/outputting of data is performed 2 times in synchronization with the clock in response to one command, and the retrieved data is output 3 clock cycles after the inputting of a read command.

The commands supplied to the ports A and B are stored in the command registers 3028A and 3028B, respectively. When the refresh timer 3051 generates a signal, the refresh command register 3027 stores therein a refresh command. The arbiter 3026 monitors these command registers, and transmits these commands to the command register 3025 in the order in which they are issued. The command register 3025 temporarily stores the received commands, and transfers them successively to the DRAM core 3011 in the order in which they are received. That is, a next command is transmitted after processing of the last transmitted command is completed.

As shown in the figure, a command Read-A2 is input into the Read command register AR, and a command Read-B2 is input into the Read command register BR. Before this, a refresh occurs once, and a refresh command is input into the refresh command register. According to the order of command issuances, the arbiter 3026 transmits these commands to the DRAM core 3011 in the order of Read-A2→Ref→Read-B2, and these commands are then executed by the core.

There is an extra time between Read-B1 and Read-A2 in terms of core operations, and normal and routine operations are performed up to this point. When a refresh occurs, Refresh is performed immediately after Read-A2 without any time gap therebetween. Thereafter, Read-B2, Read-A3, and so on are consecutively performed without any time gaps until the execution of Read-A5. Fast operations, as opposed to the normal and routine operations, are performed up to this point.

Due to the execution of a refresh command, internal operations exhibit some delay relative to the inputting of commands from an exterior of the device. The fast operations make up for the delay, and catch up by the time the command Read-A5 is executed. There is again an extra time between Read-A5 and Read-B5, indicating a return of normal and routine operations. Data read from the DRAM core 3011 through the sense buffer 3016 are transmitted through transfer gates to the data latch (data latch A1 or B1) of a port that received a corresponding Read command. The data latch A1 or B1 provides time adjustment for the data, which are then transferred to the data latch A2 or B2, and are output in synchronization with the clock signal of the corresponding port.

Even when a refresh operation is performed internally, it appears externally that data are output after a predetermined data latency. There is thus no need to pay any regard to refresh operations.

Figure 94:
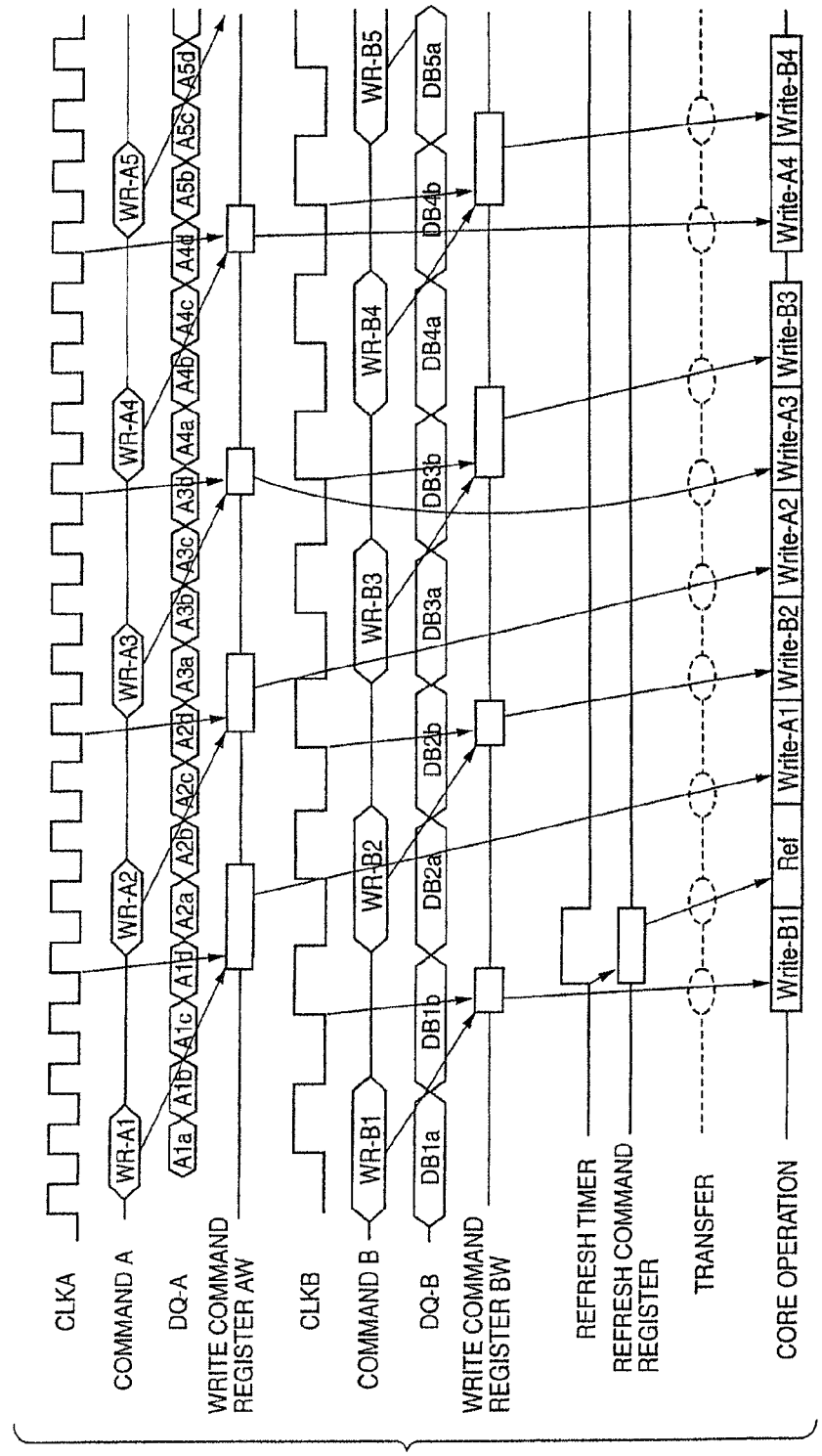
FIG. 94 shows an example in which Write commands are consecutively input.

FIG. 94 shows an example in which Write commands are consecutively input under the same conditions as described above. Data input from the exterior of the device at the time of a Write operation is also given in the form of burst inputs. The Write command is stored in the Write command register AW at the timing at which the last data piece is input. In this case also, there is no need to pay any regard to refresh operations even when a refresh command is generated and executed internally.

Figure 95:
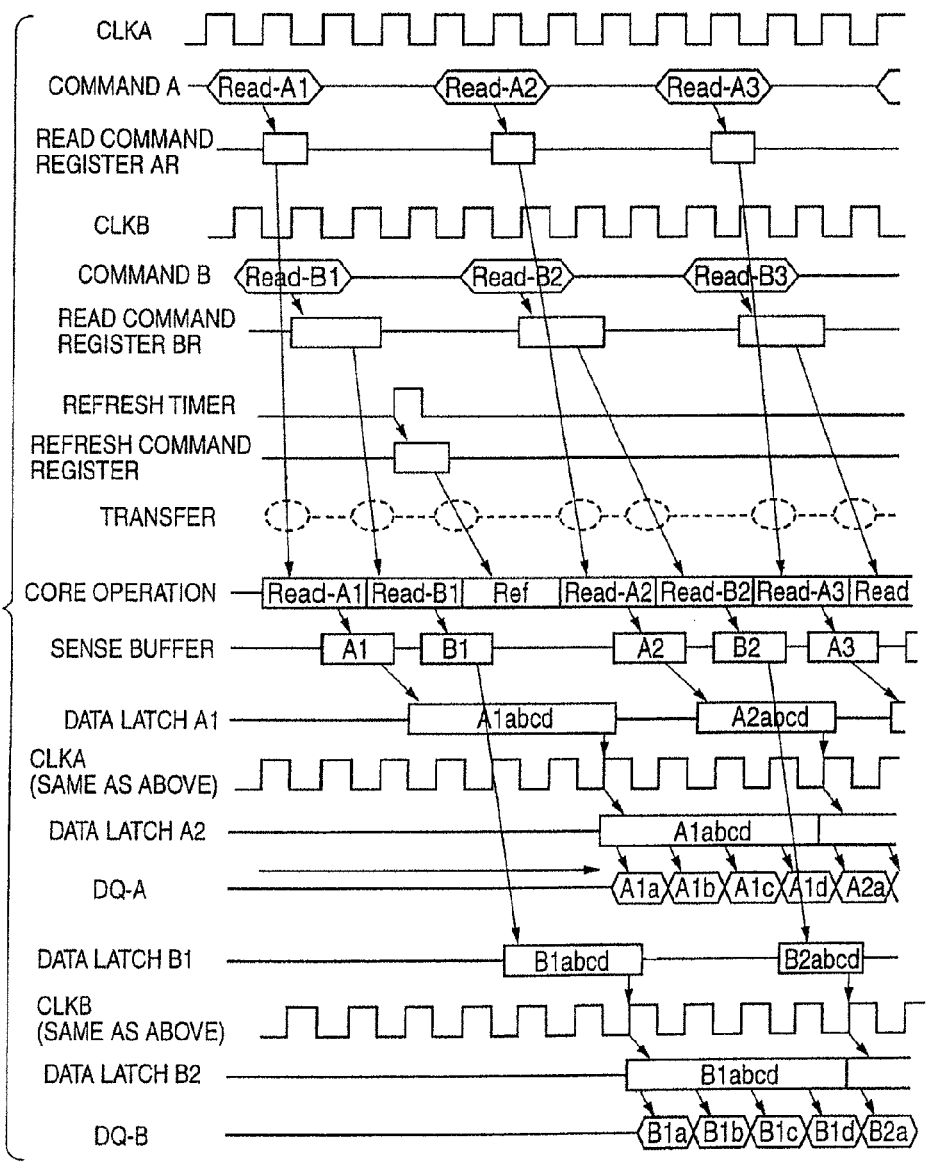
FIG. 95 shows operations performed when both the A port and the B port operate for Read operations at maximum clock frequencies.
Figure 96:
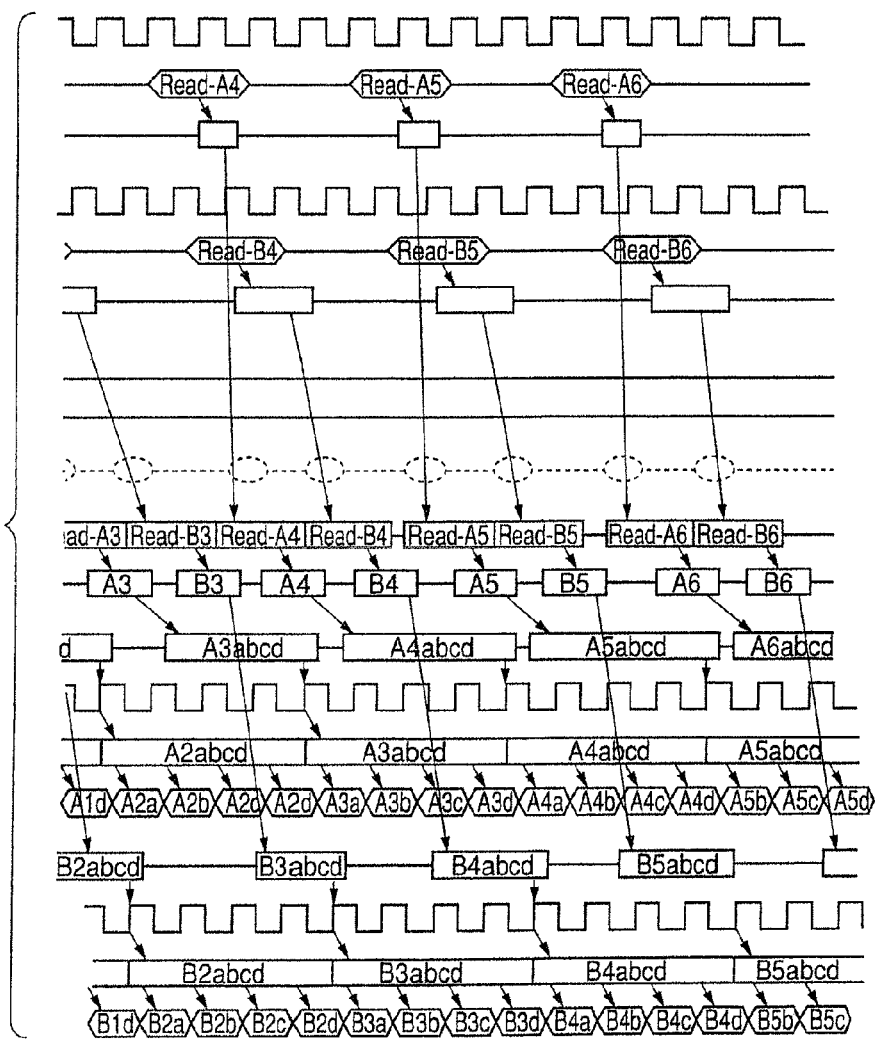
FIG. 96 shows operations performed when both the A port and the B port operate for Read operations at maximum clock frequencies.
Figure 97:
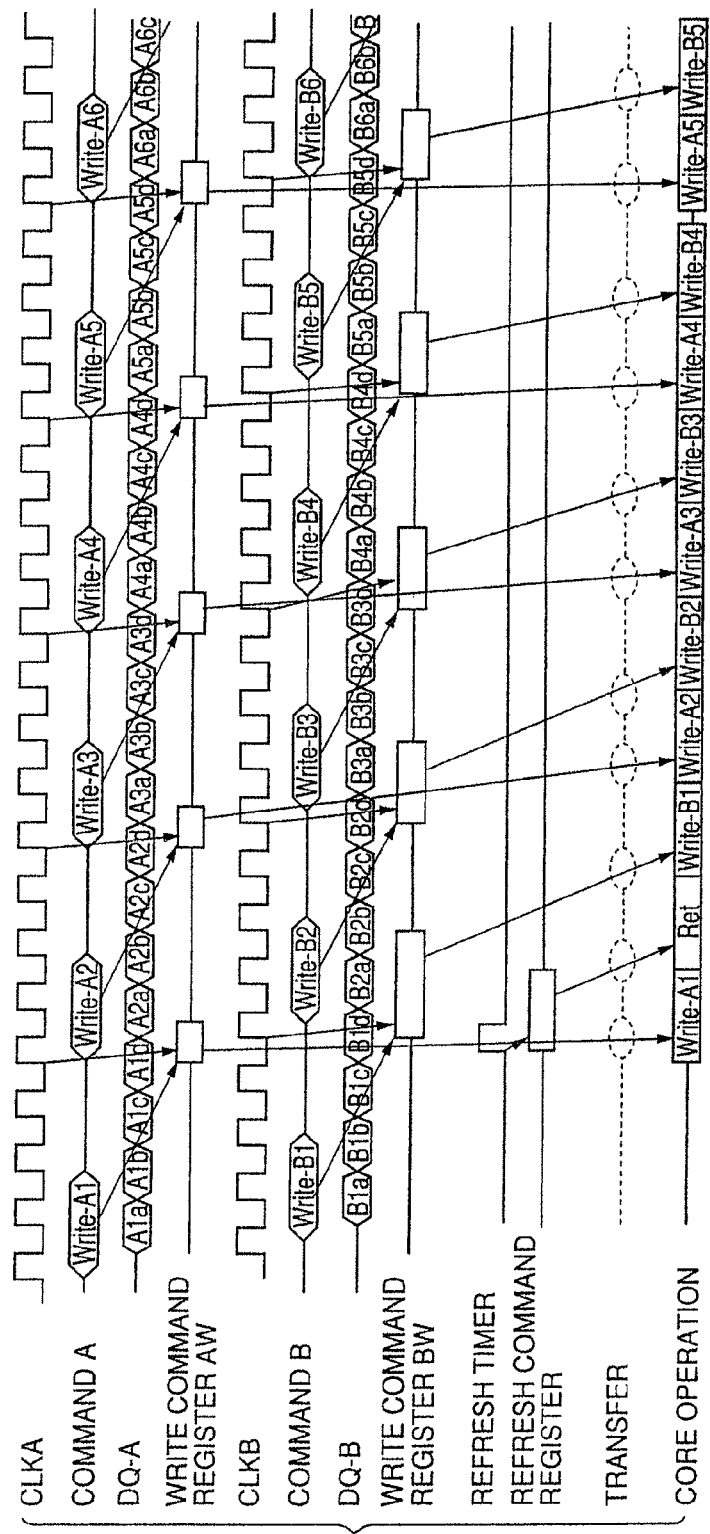
FIG. 97 is a drawing showing operations performed when both the A port and the B port operate for Write operations at maximum clock frequencies.

FIG. 95 and FIG. 96 show operations performed when both the A port and the B port operate for Read operations at the maximum clock frequencies. FIG. 97 is a drawing showing operations performed when both the A port and the B port operate for Write operations at the maximum clock frequencies. In this case, a phase difference may exist in the clocks of the two ports. For both ports, a Read command cycle=4, a Write command cycle=4, a data latency=6, and a burst length=4. As can be seen from the figure, operations are properly performed also in this case.

Figure 98:
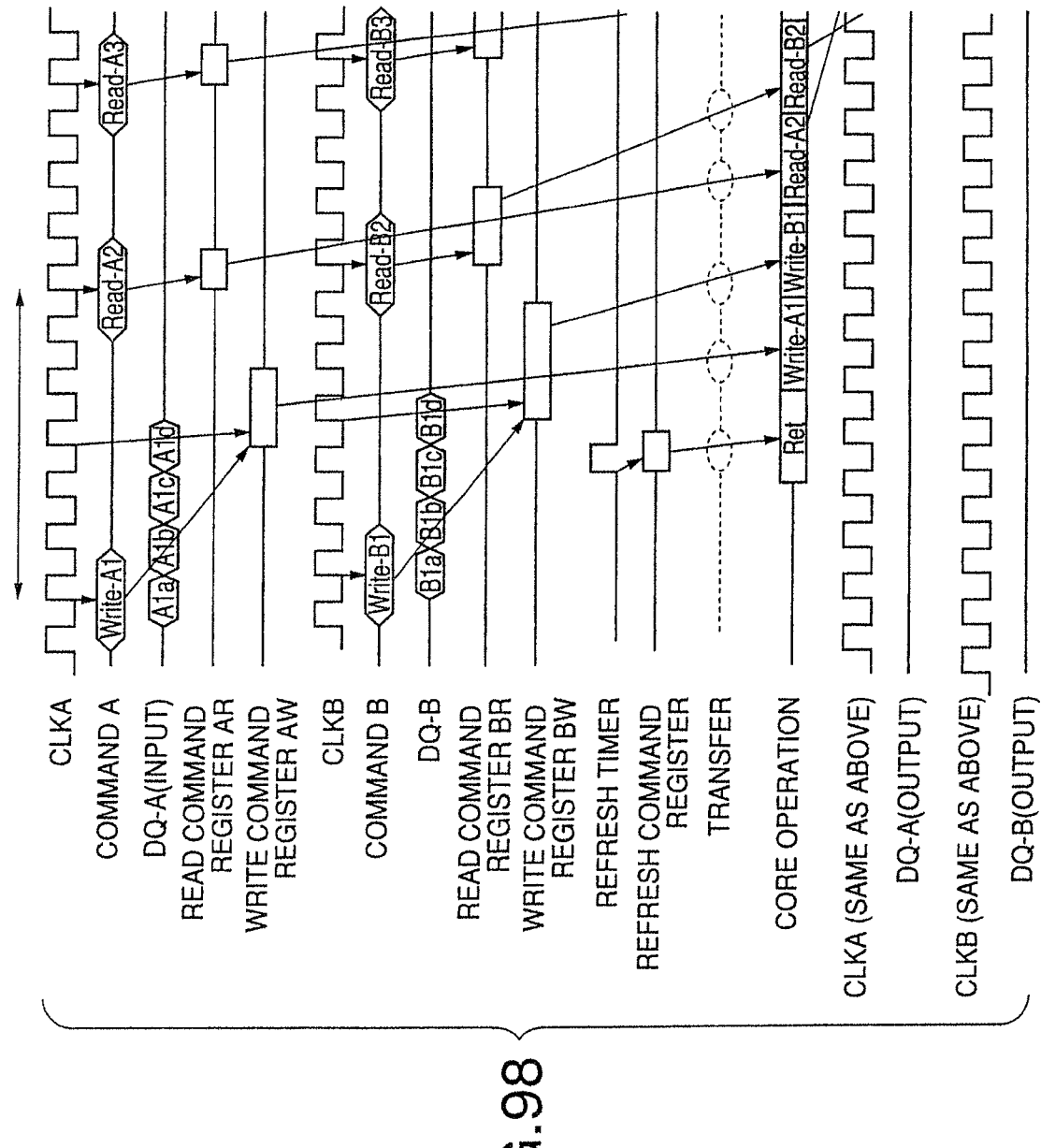
FIG. 98 is a time chart showing operations performed when both ports operate at the highest frequency, and undergo changes from Write commands to Read commands, with a refresh command being generated internally.
Figure 99:
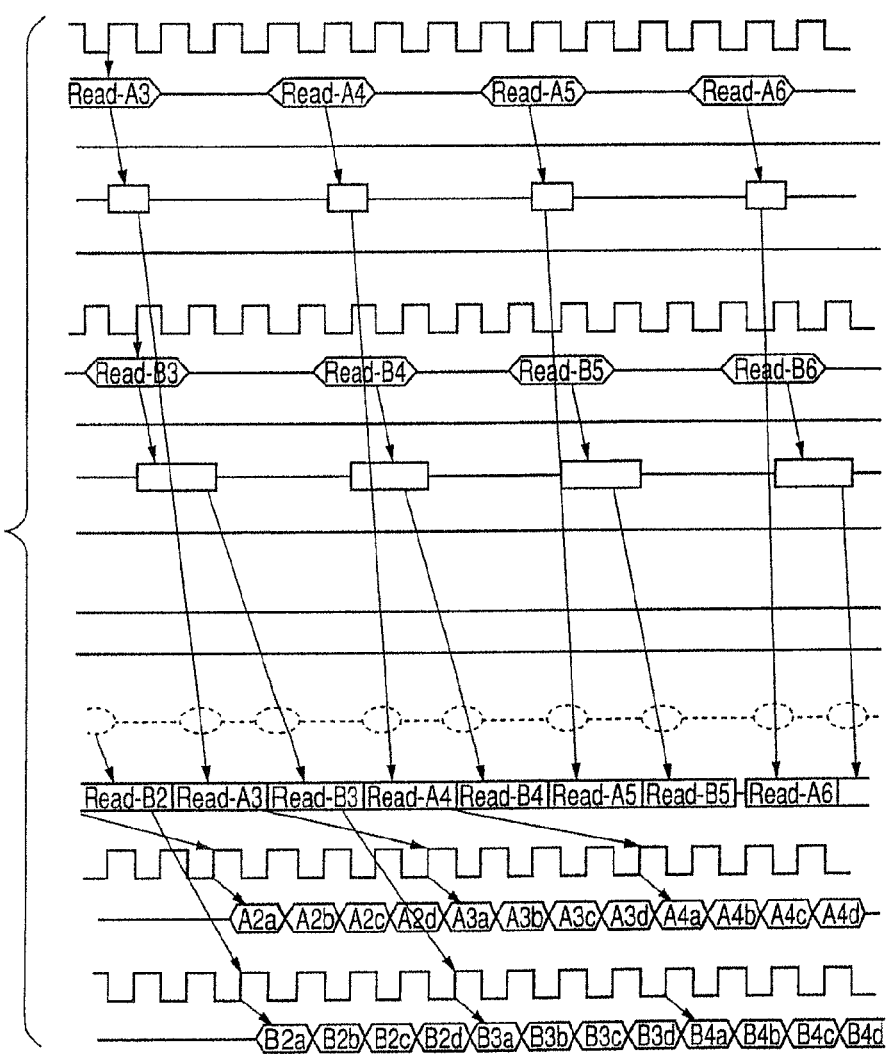
FIG. 99 is a time chart showing operations performed when both ports operate at the highest frequency, and undergo changes from Write commands to Read commands, with a refresh command being generated internally.

FIG. 98 and FIG. 99 are time charts showing operations performed when both ports operate at the highest frequency, and undergo changes from Write commands to Read commands, with a refresh command being generated internally. This is the case in which commands are crowded most.

As illustrated, the DRAM core 3011 operates in the order of Ref→Write-A1→Write-B1→Read-A2→Read-B2 without any gaps therebetween. In this example, Read-A2 and Read-B2 are input 6 clock cycles after the inputting of Write commands. Even if these timings are advanced by 2 clocks, it is not possible to advance the internal operations of the DRAM core. The output timing of read data is controlled by the data latency from the inputting of a Read command. If the input timings of Read-A2 and Read-B2 are advanced, the data output timings also need to be advanced accordingly. If Read-B2 is input 4 clock cycles after Write-B1, for example, the data output timing in response to Read-B2 comes too close to the start of the DRAM-core operation, so that Read-B2 cannot be executed properly. Because of this reason, the command interval of a Write→Read transition needs to be set relatively long such as 6 clocks as in this example.

As for the command interval of Read→Write, since Write data cannot be input into DQ terminals unless the outputting of Read data is completed, the command interval inevitably becomes long.

FIGS. 100A and 100B are drawings showing operations of the DRAM core 3011. FIG. 100A shows a Read operation, and FIG. 100B shows a Write operation. As shown in the figures, a series of operations are performed in response to a single command, in the order of word line selection→data amplification→write-back→precharge, thereby completing the whole operation. The DRAM core 3011 deactivates the command reception ready signal upon receiving a command, and generates the command reception ready signal when the execution of a command is completed or comes close to an end.

As described above, the present invention allows the multi-port memory to be used without any regard to refresh operations when the memory array is implemented based on a DRAM core, thereby providing a multi-port memory at a low cost that has a large capacity and is easy to use.

[Forth Aspect of the Invention]

In the following, a fourth aspect of the present invention will be described.

Multi-port memories, which are semiconductor memory devices equipped with a plurality of ports, can be classified into various types. When the term "multi-port memory" is used hereinafter, it refers to a memory that is provided with a plurality of ports, and that allows access to be independently made from any one of the ports to a common memory array. Such a memory may have an A port and a B port, and allows a read/write operation to be conducted with respect to the common memory array independently from a CPU linked to the A port and from a CPU linked to the B port.

A multi-port memory is equipped with an arbitration circuit called an arbiter. The arbiter determines priority of access requests received from the plurality of ports, and a control circuit of a memory array attends to access operations one after another according to the determined priority. For example, the earlier the arrival of an access request to a port, the higher priority the access is given.

In such a case, since the memory array is accessed from the plurality of ports at random, it is necessary to reset the memory array immediately after a read or write access operation is carried out, thereby making sure to be prepared for next access. That is, if a word line is kept in the selected state in response to an access from a given port, and column addresses are successively shifted to read successive data as in a column access operation generally used in DRAMs, access from another port will be kept waiting during this operation. Accordingly, it is necessary to reset the memory array immediately after each read or write operation.

Conventionally, an SRAM has typically been used as a memory array of a multi-port memory. This is because an SRAM allows high-speed random accessing, and, also, non-destructive read operation is possible.

In a multi-port memory having two ports, for example, one SRAM memory cell is provided with two sets of word lines and bit line pairs. One of the ports performs a read/write operation by using one set of a word line and a bit line pair, and the other one of the ports performs a read/write operation by using the other set of a word line and a bit line pair. In this manner, read/write operations can be independently carried out from the two different ports. However, since it is impossible to perform two write operations simultaneously when the two ports attempt to write data in the same cell at the same time, one of the ports is given priority to perform the write operation, and the other one of the ports is given a BUSY signal. This is called a BUSY state.

As a system develops to have improved performance, the amount of data treated by the system also increases. As a result, a multi-port memory needs a large capacity. The SRAM-type multi-port memories, however, have a drawback in that the size of a memory cell is large.

In order to obviate this, it is conceivable to adopt a DRAM array in a multi-port memory to make a new-type multi-port memory. In order to attain a significantly higher circuit density than multi-port SRAMs, one DRAM memory cell used for a multi-port memory needs to be connected to only one word line and one bit line in the same manner as a typical DRAM cell. If memory blocks are implemented by using DRAM cells in such a manner, one of the ports cannot access a given block if another one of the ports is carrying out a read or write operation with respect to this block. This is because only a destructive read operation is possible in a DRAM cell. That is, when information is read, another word line in the same block cannot be selected until this information is amplified and restored in the cell and a word line and a bit line are precharged.

In multi-port memories of the conventional SRAM type, a BUSY state will be created only when a plurality of ports make simultaneous write requests to the same memory cell. Accordingly, a multi-port memory of the DRAM type needs to be provided with a unique function of BUST-state control that is different from conventional SRAM-type multi-port memories.

Further, unlike an SRAM-type multi-port memory, a DRAM-type multi-port memory needs a refresh operation to be periodically performed for the purpose of maintaining stored information, so that some measure has to be taken to insure proper refresh timing.

Accordingly, the present invention is aimed at providing a DRAM-type multi-port memory that obviates problems particularly associated with DRAMs.

According to the present invention, a semiconductor memory device includes a plurality of N external ports, each of which receives commands, a plurality of N buses corresponding to the respective external ports, a plurality of memory blocks connected to the N buses, an address comparison circuit which compares addresses that are to be accessed by the commands input into the N respective external ports, and an arbitration circuit which determines which one or ones of the commands accessing a same memory block are to be executed and which one or ones of the commands accessing the same memory block are to be not executed when the address comparison circuit detects accesses to the same memory block based on the address comparison.

In the invention described above, if commands input into the ports from the exterior of the device attempt to access the same memory block, an arbitration circuit determines which one of the commands is to be executed and which one of the commands is not to be executed. For example, command timings are compared, and the earliest command is executed while the other command(s) is (are) not executed. When there is a command that is not executed, a BUSY signal or the like is generated and output to the exterior of the device. This makes it possible to perform a proper access operation and achieve proper BUSY control even when command accesses are in conflict with each other in the DRAM-core-based multi-port memory.

According to one aspect of the present invention, the memory blocks include cell arrays implemented based on dynamic-type memory cells, and the semiconductor memory device includes a refresh circuit which defines a timing at which the memory cells are refreshed. The memory cells are refreshed in a first mode in response to a refresh command that is input into at least one of the N external ports, and the memory cells are refreshed in a second mode at the timing indicated by the refresh circuit.

The invention described above is provided with an operation mode for performing a refresh operation in response to an instruction from the exterior of the device and an operation mode for performing a refresh operation in response to an instruction from the internal refresh circuit. This makes it possible to use the multi-port memory in such a manner that a predetermined external port is assigned as a port for refresh management to receive refresh commands at constant intervals, or to use the multi-port memory in such a manner that the internal refresh circuit initiates refresh operations when all the external ports are in the deactivated state. Accordingly, the present invention provides a basis for flexible refresh management that conforms to the system requirements.

In the following, embodiments of the present invention (fourth aspect) will be described with reference to the accompanying drawings.

Figure 101:
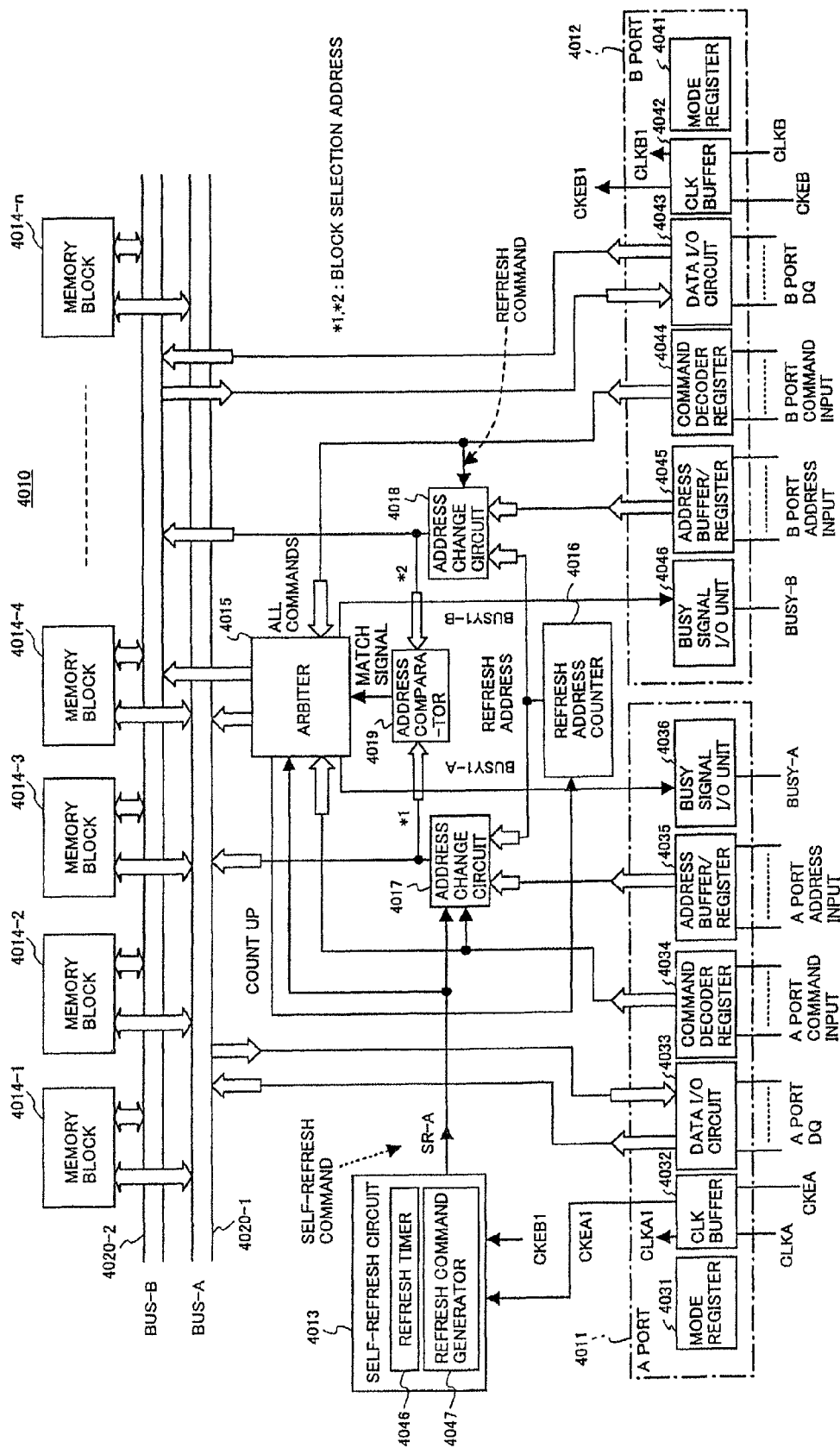
FIG. 101 is a block diagram showing an embodiment of a multi-port memory according to the present invention (fourth aspect)

FIG. 101 is a block diagram showing an embodiment of the multi-port memory according to the present invention. In this example, a configuration is such that two ports, i.e., an A port and a B port, are provided.

A multi-port memory 4010 of FIG. 101 includes an A port 4011, a B port 4012, a self-refresh circuit 4013, memory blocks 4014-1 through 4014-n, an arbiter 4015, a refresh address counter 4016, an address change circuit 4017, an address change circuit 4018, an address comparator 4019, a bus A 4020-1, and a bus B 4020-2.

The A port 4011 includes a mode register 4031, a CLK buffer 4032, a data I/O circuit 4033, a command decoder register 4034, an address buffer/register 4035, and a BUSY signal I/O unit 4036. Further, the B port 4012 includes a mode register 4041, a CLK buffer 4042, a data I/O circuit 4043, a command decoder register 4044, an address buffer/register 4045, and a BUSY signal I/O unit 4046. At the A port 11 and the B port 12, access to/from an external bus is established independently in synchronization with respective clock signals CLKA and CLKB. The mode registers 4031 and 4041 can store therein mode settings such as a data latency and a burst length with respect to respective ports. In this embodiment, both the A port 4011 and the B port 4012 are provided with the respective mode register, so that each port can make mode settings. However, a mode register may be arranged only in one of the ports, for example, such that settings for both ports may be made by making settings to this one port.

The self-refresh circuit 4013 includes a refresh timer 4046 and a refresh command generator 4047. The self-refresh circuit 4013 generates a refresh command inside the device, and receives signals CKEA1 and CKEB1 from the A port 4011 and the B port 4012, respectively. The signals CKEA1 and CKEB1 are obtained by buffering external signals CKEA and CKEB by the CLK buffers 4032 and 4042, respectively. The external signals CKEA and CKEB are used to suspend the clock buffers of respective ports and to deactivate the respective ports. If both the A port 4011 and the B port 4012 are brought into a deactivated state, the self-refresh circuit 13 starts an operation thereof.

The memory blocks 4014-1 through 4014-n are each connected to the internal bus A 4020-1 and the internal bus B 4020-2. There are a plurality of external ports (i.e., the A port and the B port), wherein the A port 4011 interfaces with each one of the memory blocks 4014-1 through 4014-n through the bus A 4020-1, and the B port interfaces with each one of the memory blocks 4014-1 through 4014-n through the bus A 4020-2.

If access from the A port 4011 and access from the B port 4012 are input at the same time, accessed memory blocks independently perform operations thereof corresponding to these access requests, provided that these accesses are directed to different memory blocks.

If access from the A port 4011 and access from the B port 4012 are directed to the same memory block, the arbiter (arbitration circuit) 4015 determines an order of command arrivals, and executes the command of the first arrival while canceling the command of the second arrival. When the command is canceled, the arbiter 4015 generates a BUSY signal so as to notify an external controller that an access requested by the command of the second arrival has been canceled.

The address comparator 4019 determines whether access requests entered into the two ports are directed to the same memory block. In detail, the address comparator 4019 compares block selection addresses that are included in the addresses entered into the two ports. If they are identical, a match signal is supplied to the arbiter 4015.

When the A port 4011 or the B port 4012 is in an activated state, a refresh command is input from the A port 4011 or the B port 4012.

The arbiter 4015 determines an order of command arrivals if a refresh command entered into one of the two ports accesses the same memory block as does a read command or a write command that is input to the other one of the two ports. If the refresh command is later than the other command, the refresh command is canceled. In this case, the arbiter 4015 generates a BUSY signal, and supplies it to an exterior of the device. When detecting a BUSY signal, the external controller will provide a refresh command to the multi-port memory 4010 again after the BUSY signal is turned off.

If the refresh command is earlier than the other command, or if a self-refresh command is supplied from the self-refresh circuit 4013, the arbiter 4015 generates a count-up signal, and supplies it to the refresh address counter 4016.

The refresh address counter 4016 counts up addresses in response to the count-up signal, thereby generating refresh addresses. The reason why the count-up signal needs to be supplied from the arbiter 4015 is that counting-up operations should be responsive only to a refresh command actually issued from the arbiter 4015 since a refresh command can be canceled as described above. Here, the counting-up operation is performed after the refresh operation is performed.

The address change circuit 4017 transfers an address externally input into the A port 4011 to the bus A 4020-1 if the command input to the A port 4011 is a Read command (read-out command) or a Write command (write-in command). If the command input to the A port 4011 is a refresh command, an address that is generated by the refresh address counter 4016 is transmitted to the bus A 4020-1.

The address change circuit 4018 transfers an address externally input into the B port 4012 to the bus B 4020-2 if the command input to the B port 4012 is a Read command (read-out command) or a Write command (write-in command). If the command input to the B port 4012 is a refresh command, on the other hand, an address that is generated by the refresh address counter 4016 is transmitted to the bus B 4020-2.

As mentioned above, if both the A port 4011 and the B port 4012 are in the deactivated state, the self-refresh circuit 4013 generates a refresh command based on the timing signal of the refresh timer 46 provided as internal circuitry. In this embodiment, a self-refresh command and a self-refresh address are transmitted to the memory blocks 4014-1 through 4014-n through the bus A 4020-1. Since self-refresh does not conflict with commands of the A port 4011 and the B port 4012, there is no need for the arbiter 4015 to determine priority. Since a count-up signal needs to be generated by the arbiter 4015, however, the self-refresh command is also supplied to the arbiter 4015.

Figure 102:
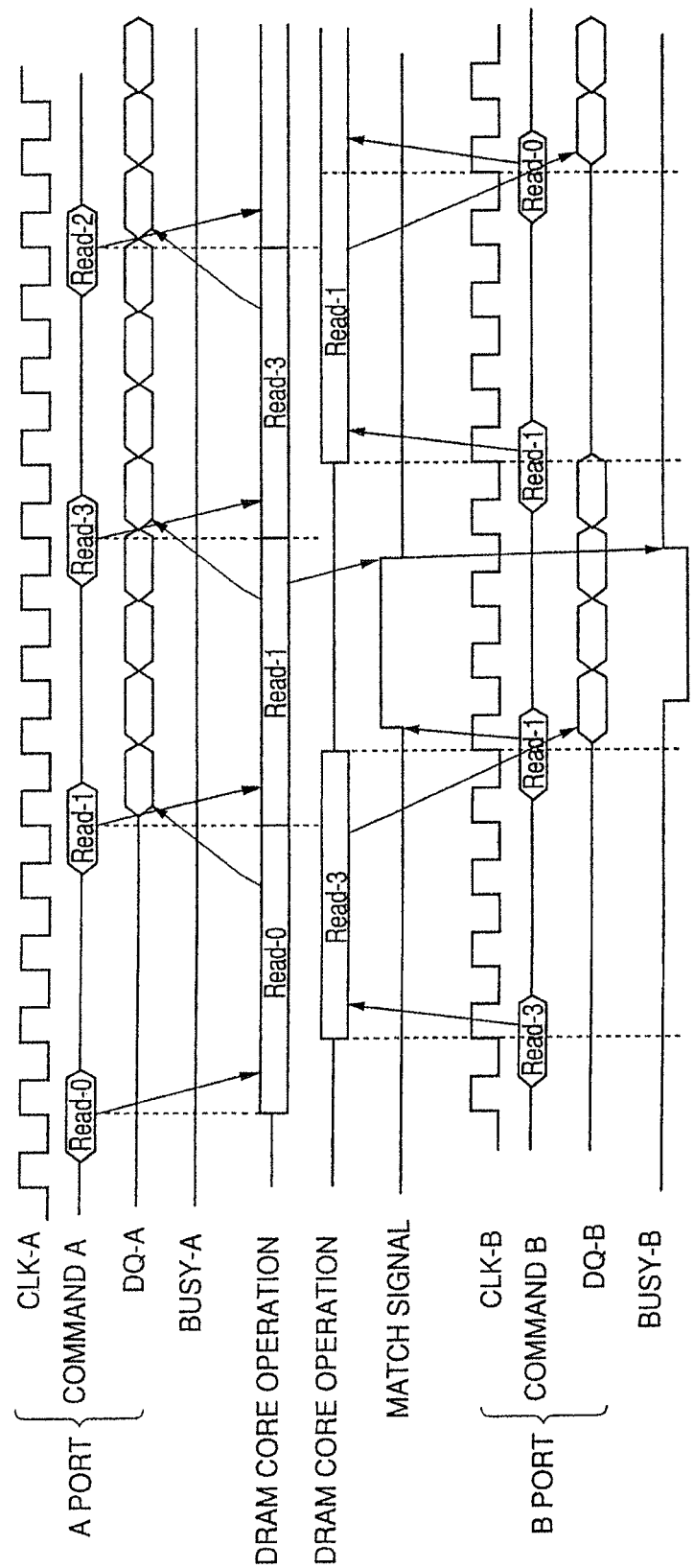
FIG. 102 is a timing chart showing an example of operations of the multi-port memory according to the present invention (fourth aspect)

FIG. 102 is a timing chart showing an example of operations of the multi-port memory 4010 according to the present invention.

A command Read-x is a Read command directed to a memory block 4014-(x+1). Read-0 is input into the A port 4011 first, and Read-3 is then input into the B port 4012. In this case, memory blocks to be accessed are different, so that the memory block 4014-i and the memory block 4014-4 operate in parallel.

Thereafter, Read-1 is input into the A port 4011, followed by Read-1 input into the B port 4012. Since memory blocks to be accessed are the same in this case, a match signal is generated, canceling the command that is input to the B port 4012. Furthermore, a BUSY-B (negative logic) is output from the BUSY signal I/O unit 4046 of the B port 4012.

The external controller of the B port 4012 detects the BUSY-B, and supplies Read-1 again to the multi-port memory 4010 after this signal is turned off.

Figure 103:
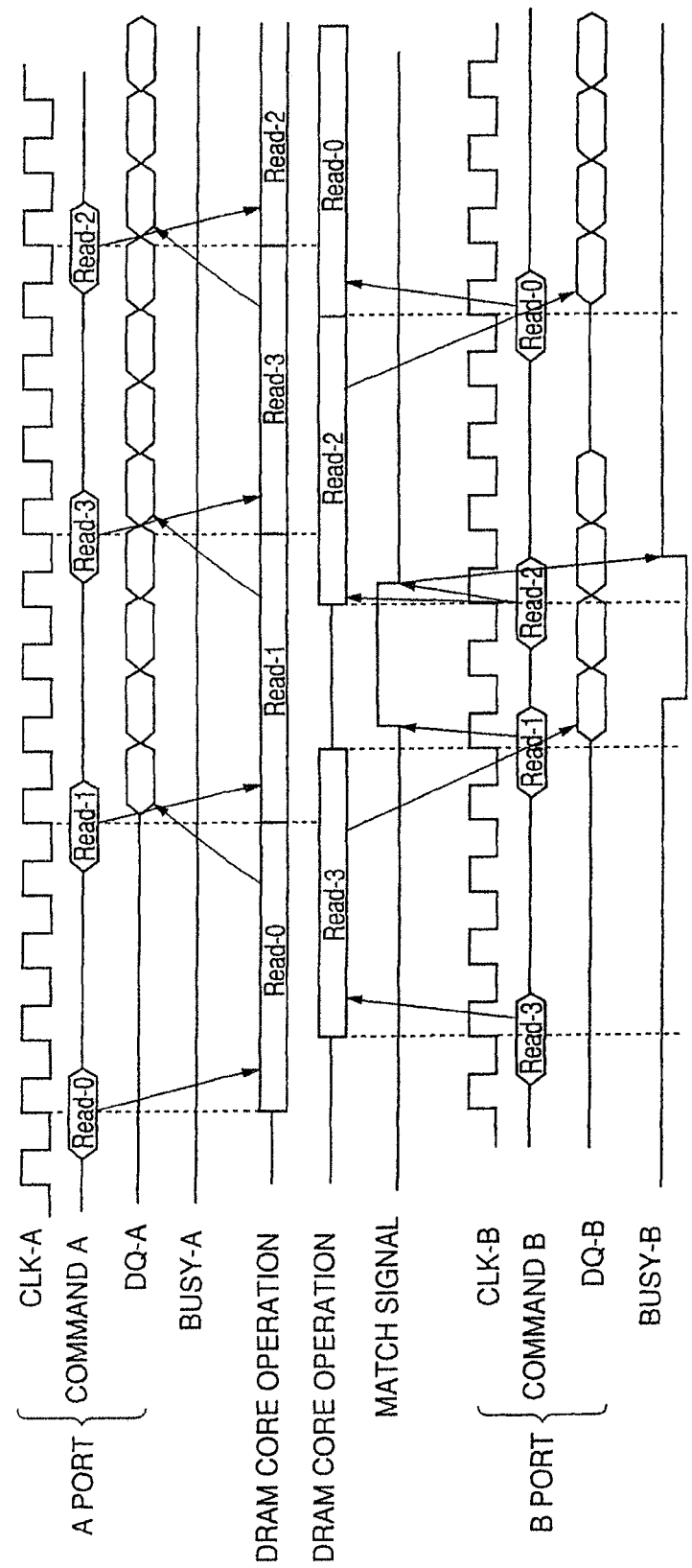
FIG. 103 is a timing chart showing another example of operations of the multi-port memory according to the present invention (fourth aspect)

FIG. 103 is a timing chart showing another example of operations of the multi-port memory 4010 according to the present invention.

Operations shown in FIG. 103 are the same as those of FIG. 102 until the second commands Read-1 are input into the A port 4011 and the B port 4012, generating BUSY-B. After BUSY-B occurs in response to the Read-1 input into the B port 4012 in this example, a read command Read-2 is entered in order to access another memory block before BUSY-B comes to an end. In this manner, a next command can be input even during the period in which the BUSY is asserted as long as the next command is directed to another block.

Figure 104:
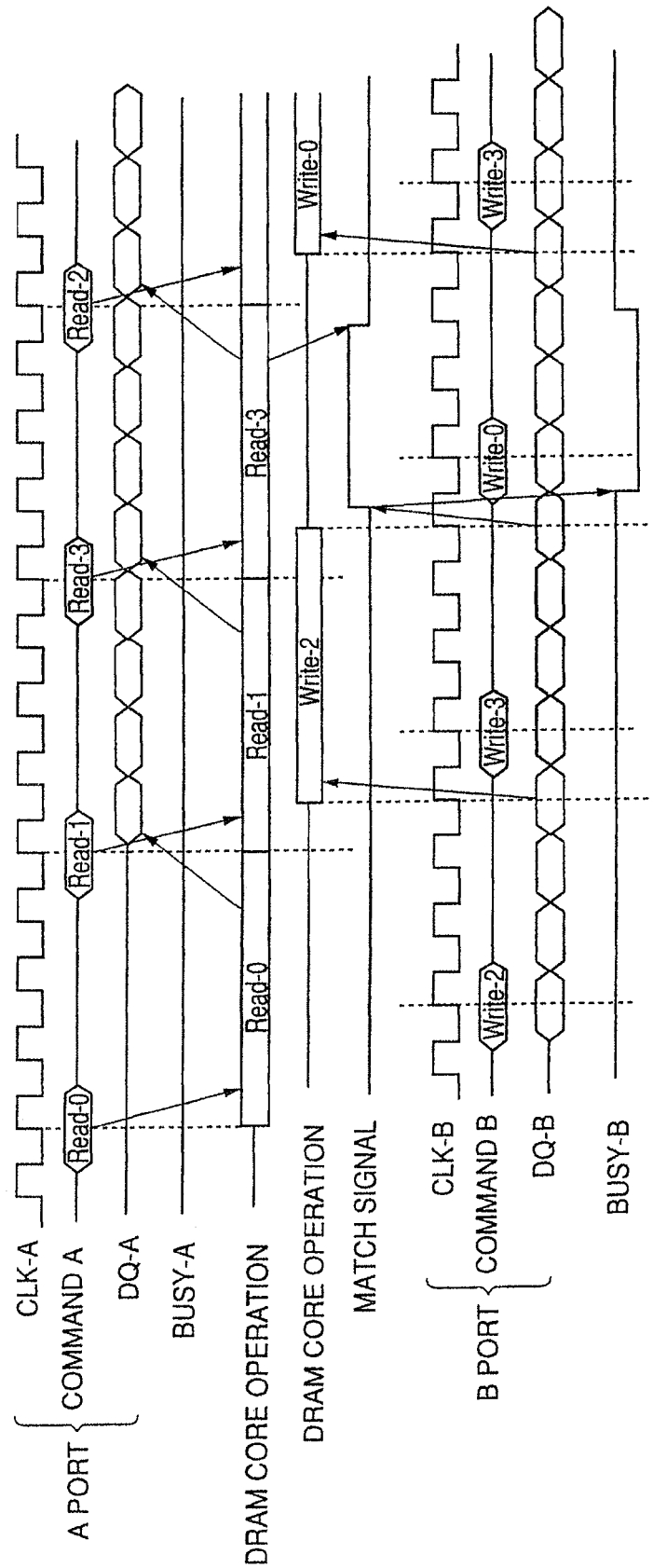
FIG. 104 is a timing chart showing yet another example of operations of the multi-port memory according to the present invention (fourth aspect)

FIG. 104 is a timing chart showing yet another example of operations of the multi-port memory 4010 according to the present invention.

The example of FIG. 104 shows a case in which a Write command is input. A Read command is input into the A port 4011, followed by a Write command input into the B port 4012.

In this embodiment, input/output data is that of a burst type. That is, data output is obtained by reading parallel data from a plurality of column addresses and by converting it into serial data in the data I/O circuits 4033 and 4043 at the time of data outputting. Data input is input serially, and is then converted into parallel data in the data I/O circuits 4033 and 4043, followed by writing the parallel data into a plurality of column addresses of a relevant memory block. Use of this kind of burst operation can enhance data transfer speed. In this example, burst length is 4, so that four data items are output/input continuously.

In the case of Write operation, a Write operation cannot be started unless all the four data items are input. Therefore, timing at which the arbiter 4015 can determine priority for a Write operation is the timing at which the last item of a series of serial data inputs is given.

In FIG. 104, the third command input Read-3 of the A port 4011 and the second command input Write-3 of the B port 4012 attempt to access the same memory block. Although the Write-3 of the B port 4012 is ahead of the other in terms of input timing of commands into the ports, the Read-3 of the A port 4011 is given before the last item of write data is entered. Accordingly, the arbiter 4015 determines that the command of the A port 4011 is ahead of the other, and cancels the command of the B port 4012.

As shown in FIG. 101, the A port 4011 and the B port 4012 are provided with the CLK buffers 4032 and 4042, respectively, and receive different clock signals from the exterior of the device. The clock signals have phases and frequencies that may be the same or may be different.

Figure 105:
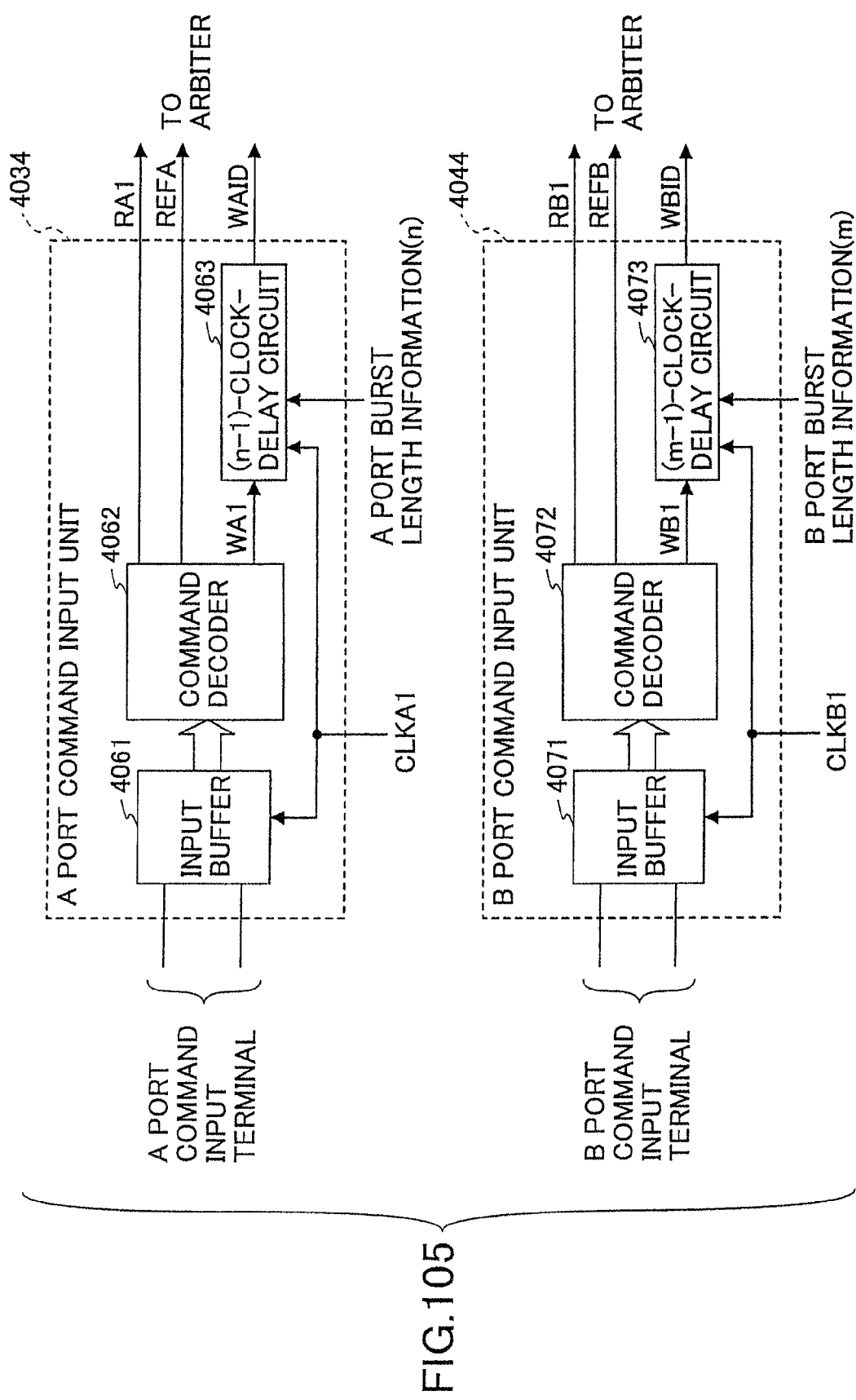
FIG. 105 is a block diagram of a command decoder registers.

FIG. 105 is a block diagram of the command decoder registers 4034 and 4044.

The command decoder register 4034 includes an input buffer 4061, a command decoder 4062, and an (n−1)-clock-delay circuit 4063. The command decoder register 4044 includes an input buffer 4071, a command decoder 4072, and an (n−1)-clock-delay circuit 4073.

If a command input into the input buffer 4061 or 4071 is a Read command (RA1, RB1) or a refresh command (REFA, REFB), the input command is transmitted to the arbiter 4015 through the command decoder 4062 or 4072 without any timing manipulation. In the case of a Write command (WA1, WB1), the input command is delayed (n−1) clock cycles by the (n−1)-clock-delay circuit 4063 or 4073, and is transmitted to the arbiter 4015 at the timing at which the last and n-th data item of the series of burst write input is given.

Figure 106:
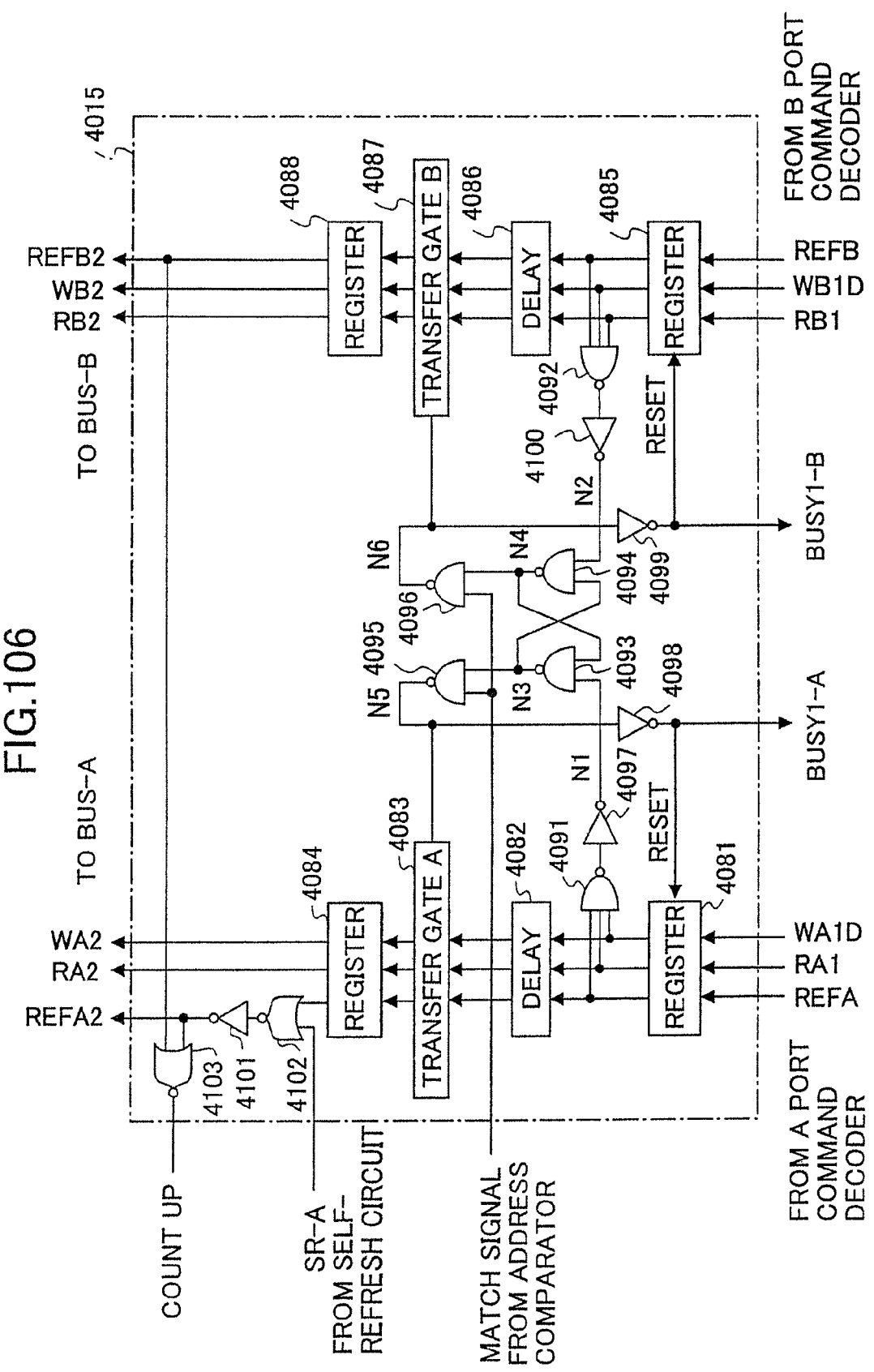
FIG. 106 is a block diagram of an arbiter according to the embodiment of the present invention (fourth aspect)

FIG. 106 is a block diagram of the arbiter 4015 according to the embodiment of the present invention.

The arbiter 4015 includes a register 4081, a delay circuit 4082, a transfer gate 4083, a register 4084, a register 4085, a delay circuit 4086, a transfer gate 4087, a register 4088, NOR circuits 4091 and 4092, NAND circuits 4093 through 4096, inverters 97 through 101, and NOR circuits 102 and 103.

A command transmitted from the command decoder register 4034 or 4044 is stored in the register 4081 or 4085, respectively. When the A port 4011 is given a command input, a HIGH signal is generated at the node N1 that is the output of the inverter 4097. When the B port 4012 is given a command input, a HIGH signal is generated at the node N2 that is the output of the inverter 100. The earlier of the signal of N1 or the signal of N2 is latched at the node N3 or N4.

If the block selection addresses do not match between the A port 4011 and the B port 4012, the address comparator 4019 generates a match signal that is LOW. In this case, therefore, N5 and N6 are set to HIGH. In response to these HIGH signals, both the transfer gate A 4083 and the transfer gate B 4087 open, so that the commands of the registers 4081 and 4085 are transmitted to registers 4084 and 4088 without exception.

If the block selection addresses match between the A port 4011 and the B port 4012, the address comparator 4019 generates a match signal that is HIGH. In this case, therefore, signal levels at the nodes N5 and N6 will be controlled by the signal levels of the nodes N3 and N4. If the A port 4011 is earlier, N5 is set to HIGH, and N6 is set to LOW. In response to the HIGH state of N5, the transfer gate A 4083 opens, so that the command of the A port 4011 is transmitted to the register 4084. Further, the LOW state of N6 closes the transfer gate B 4087, so that the command of the B port 4012 is not transmitted to the register 4088.

Moreover, based on the signal levels of N5 and N6, reset signals BUSY1-A and BUSY1-B are generated that reset the respective registers 4081 and 4085. If the command of the A port 11 is selected, for example, BUSY1-B is generated, and the register 4085 is reset.

There is no need to determine priority for a self-refresh command, the self-refresh command is combined with the refresh command REFA of the A port 4011 at the output stage of the register 4084. A refresh command signal REFA2 created in this manner with respect to the A port 4011 is combined with a refresh command signal REFB2 of the B port 4012 so as to generate a count-up signal. In response to occurrence of a refresh command, the count-up signal is supplied to the refresh address counter 4016 from the arbiter 4015.

Figure 107:
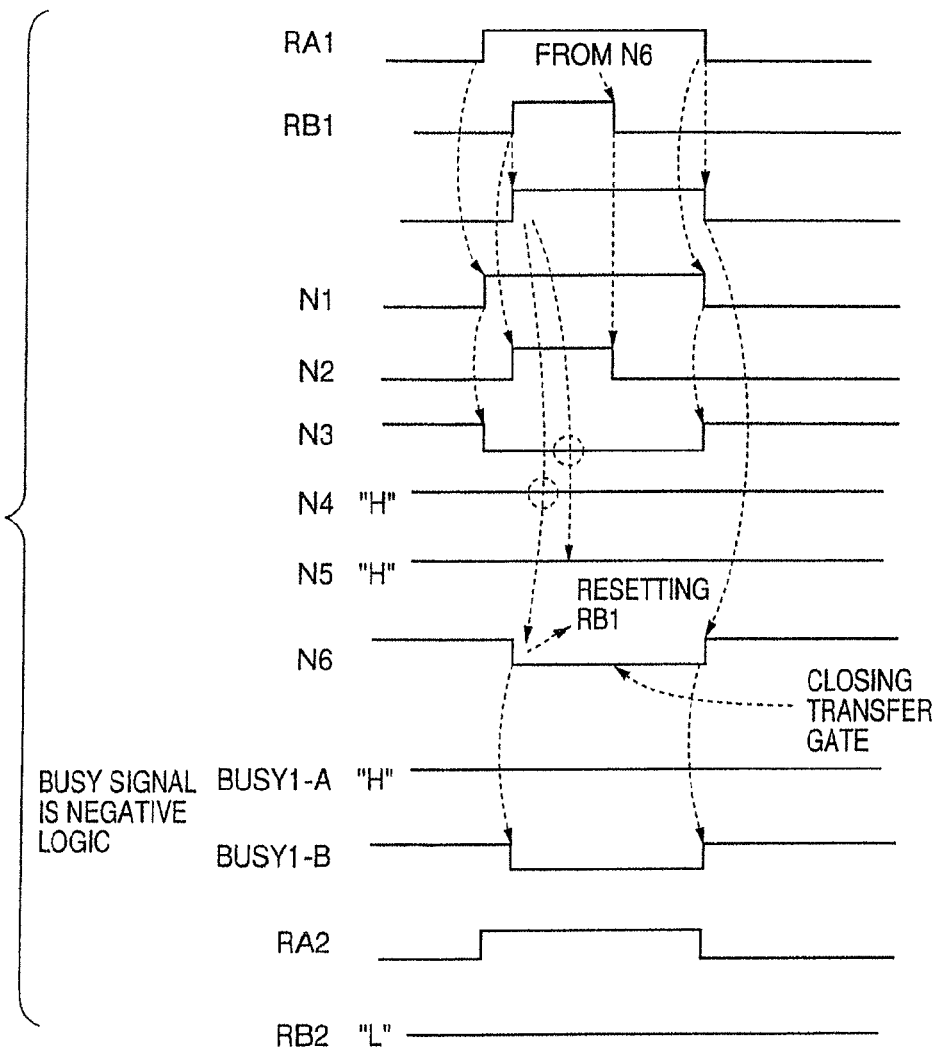
FIG. 107 is a timing chart showing operations of the arbiter.

FIG. 107 is a timing chart showing operations of the arbiter 4015.

FIG. 107 shows a case in which the block selection addresses match between the A port 4011 and the B port 4012, and a Read command RA1 of the A port 4011 is earlier than a Read command RB1 of the B port 4012. In the same manner as described above, signal levels of the nodes N5 and N6 are controlled by signal levels of the nodes N3 and N4 that reflect signal levels of the nodes N1 and N2, and the Read command RA2 is transmitted from the arbiter 4015 accordingly. The Read command of the B port 4012 is canceled without being output, and a BUSY1-B signal is generated.

Figure 108:
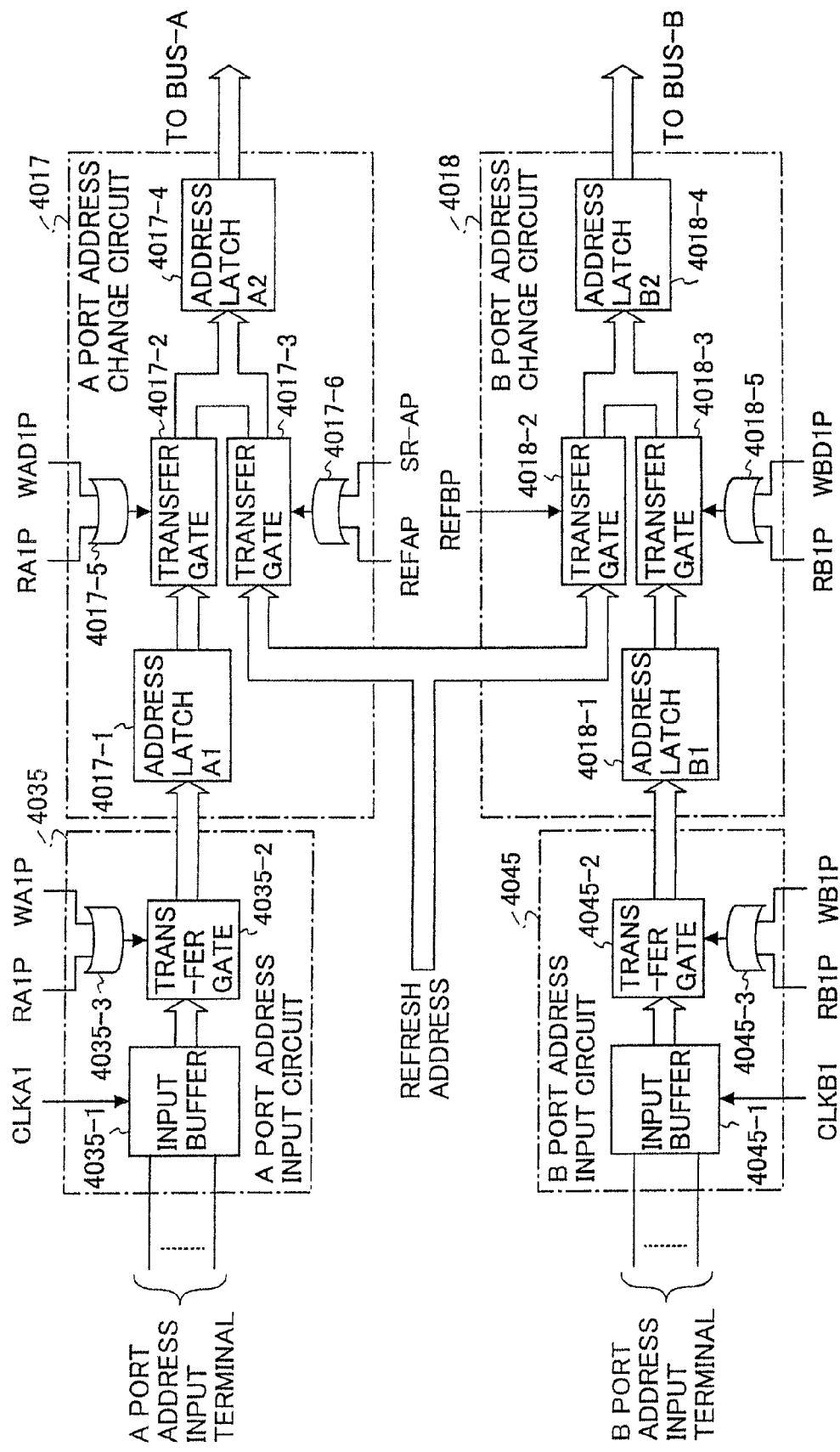
FIG. 108 is a block diagram of an address buffer/register and an address change circuit.

FIG. 108 is a block diagram of the address buffer/register and the address change circuit.

In FIG. 108, a signal having a signal name (e.g., RA1P) with a letter "P" added to the end of a signal name (e.g., RA1) is generated by creating pulses at rising edge timings of a signal having the latter signal name (e.g., RA1).

The address buffer/register 4035 of the A port 4011 include an input buffer 4035-1, a transfer gate 4035-2, and an OR circuit 4035-3. With respect to a read command signal RA1 output from the command decoder 4062 shown in FIG. 105, rising edges are converted into pulses to generate a pulse signal RA1P, which is then supplied to one input of the OR circuit 4035-3. With respect to a write command signal WA1 output from the command decoder 4062 shown in FIG. 105, rising edges are converted into pulses to generate a pulse signal WA1P, which is then supplied to the other input of the OR circuit 4035-3. An output of the OR circuit 4035-3 is supplied to the transfer gate 4035-2 as a transfer direction signal that orders data transfer.

The address buffer/register 4045 of the B port 4012 include an input buffer 4045-1, a transfer gate 4045-2, and an OR circuit 4045-3. The configuration of the address buffer/register 4045 for the B port 4012 is the same as the configuration of the address buffer/register 4035 for the A port 4011.

The address change circuit 4017 includes an address latch 4017-1, transfer gates 4017-2 and 4017-3, an address latch 4017-4, and OR circuits 4017-5 and 4017-6. The OR circuit 4017-5 receives signals RA1P and WAD1P, and supplies an output thereof to the transfer gate 4017-2 as a transfer instructing signal. The OR circuit 4017-6 receives signals REFAP and SR-AP, and supplies an output thereof to the transfer gate 4017-3 as a transfer instructing signal.

The address change circuit 4018 includes an address latch 4018-1, transfer gates 4018-2 and 4018-3, an address latch 4018-4, and an OR circuit 4018-5. The OR circuit 4018-5 receives signals RB1P and WBD1P, and supplies an output thereof to the transfer gate 4018-3 as a transfer instructing signal. Also, a signal REFBP is supplied to the transfer gate 4018-2 as a transfer instructing signal.

When a Read command or a Write command is input from the exterior of the device, an address input together with the command is transmitted to the address change circuit 4017 or 4018. In the case of a Read command, the command is transmitted to the address latch 4017-4 or 4018-4 without any timing manipulation. In the case of a Write command, the command is transmitted to the address latch 4017-4 or 4018-4 at the timing at which the last item of a series of write data input is acquired.

In the case of a refresh command, a refresh address generated by the refresh address counter 4016 is transmitted to the address latch 4017-4 or 4018-4 at the timing of a signal REFA, REFB, or SR-A.

Figure 109:
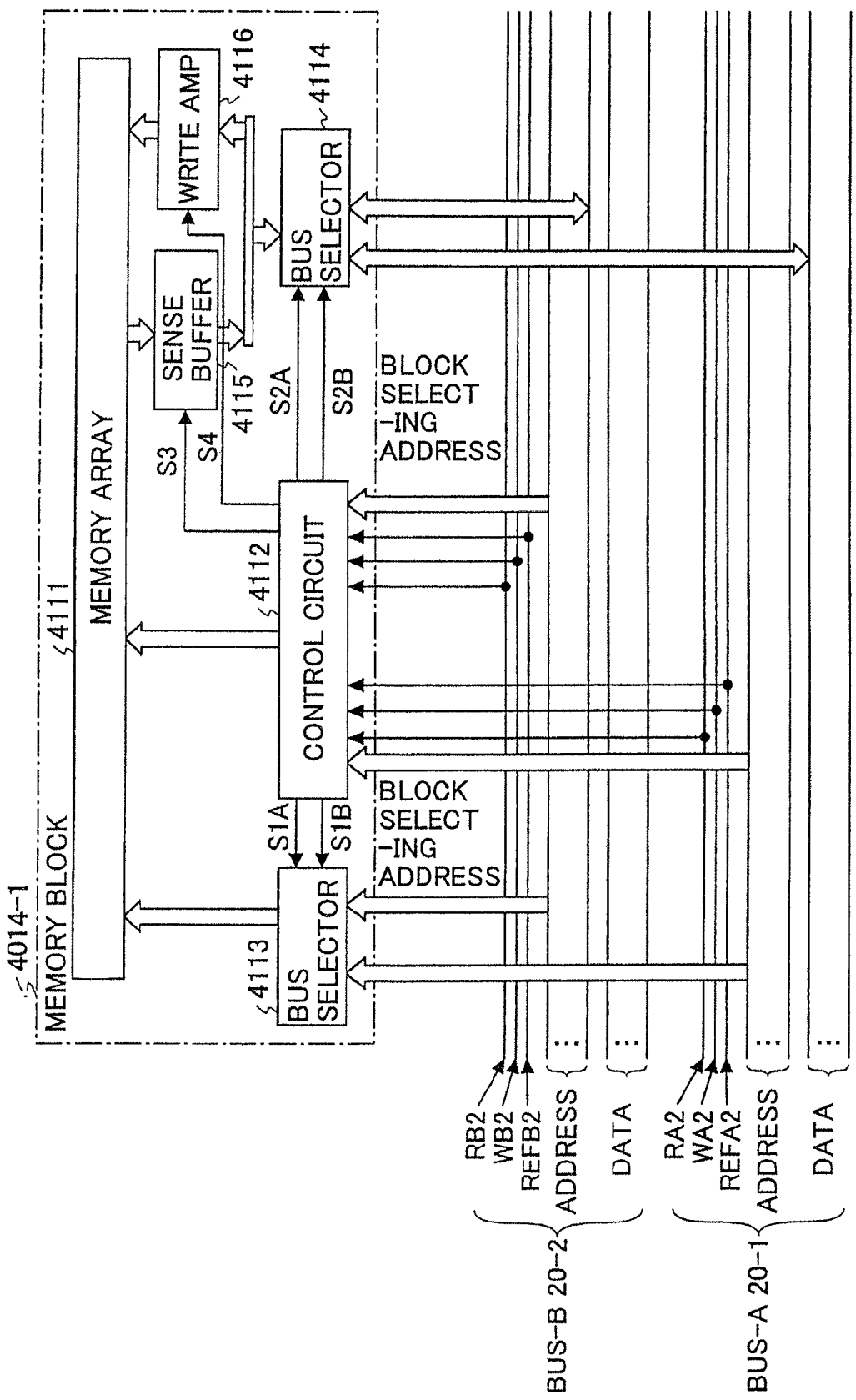
FIG. 109 is a block diagram of a memory block.

FIG. 109 is a block diagram of a memory block.

FIG. 109 shows the Memory block 4014-1 as an example of the memory blocks 4014-1 through 4014-n. The memory blocks 4014-1 through 4014-n has the same configuration.

The memory block 4014-1 includes a memory array 4111, a control circuit 4112, bus selectors 4113 and 4114, a sense amplifier buffer 4115, and a write amplifier 4116. The memory array 4111 includes DRAM memory cells, cell gate transistors, word lines, bit lines, sense amplifiers, column lines, column gates, etc., and stores data for read operations and write operations. The control circuit 4112 controls the operation of the memory block 4014-1. The write amplifier 4116 amplifies data to be written in the memory array 4111. The sense buffer 4115 amplifies data read from the memory array 4111.

The control circuit 4112 is connected to the bus A 4020-1 and the bus B 4020-2, and is selected in response to a relevant block selection address corresponding to its own block. When selected, the control circuit 4112 acquires a command from one of the buses that has issued the relevant block selection address. If the command of the bus A 4020-1 is acquired, the bus selector 4113 is controlled such as to send address signals of the bus A 4020-1 to the memory array 4111. Further, the bus selector 4114 is controlled so as to connect the sense buffer 4115 or the write amplifier 4116 to the data lines of the bus A 4020-1. If the command of the bus B 4020-2 is acquired, the bus selector 4113 is controlled such as to send address signals of the bus B 4020-2 to the memory array 4111. Further, the bus selector 4114 is controlled such as to connect the sense buffer 4115 or the write amplifier 4116 to the data lines of the bus B 4020-2. If the command acquired by the control circuit 4112 is a refresh command, the bus selector 114 needs not be operated.

One of the buses is selected as described above, and, then, word line selection, cell-data amplification, either Read, Write, or Refresh, and a precharge operation are successively performed as a series of continuous operations.

Figure 110A:
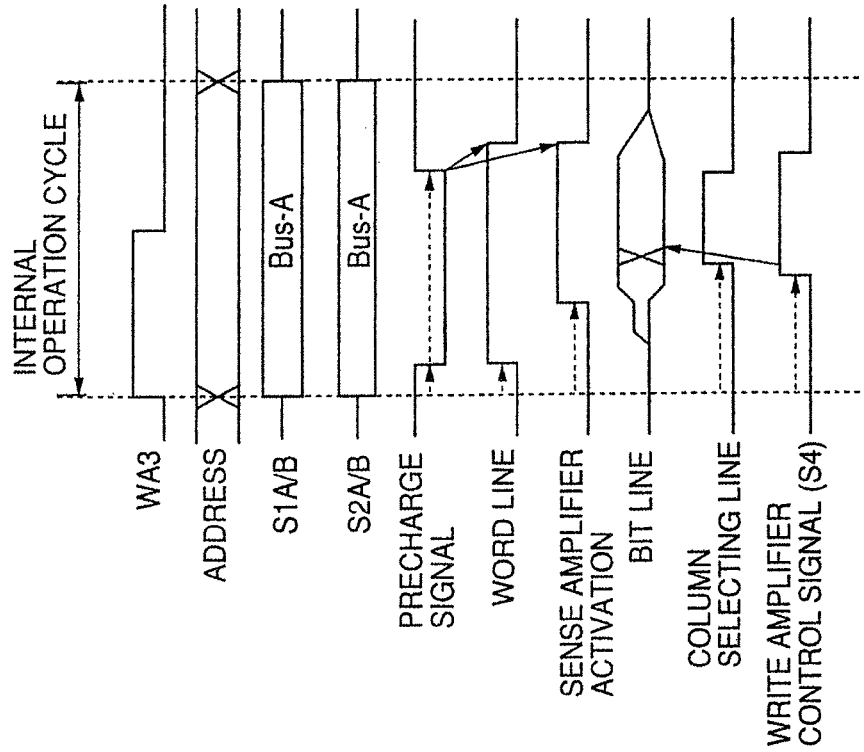
FIGS. 110A and 110B are timing charts showing operations of the memory block.
Figure 110B:
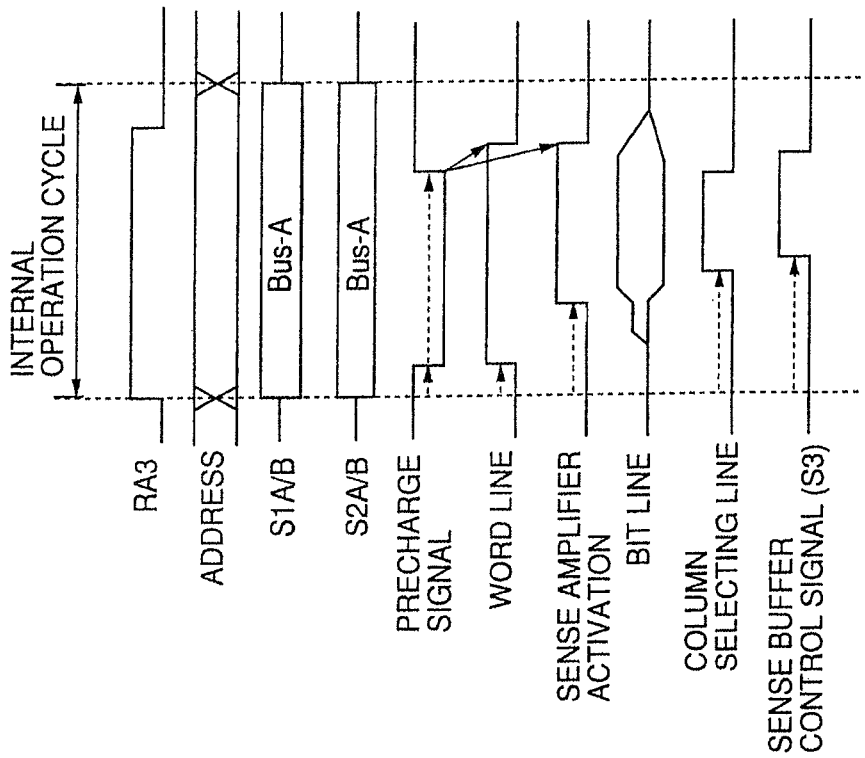

FIGS. 110A and 110B are timing charts showing operations of the memory block.

FIG. 110A shows a case of a read operation, and FIG. 110B shows a case of a write operation. At operation timings as shown in FIGS. 110A and 110B, word line selection, data amplification, either a read operation or a write operation, a write-back (data-restore) operation, and a precharge operation are successively performed in response to a single command, thereby completing a requested operation.

In the present invention (fourth aspect), if commands input into the ports from the exterior of the device attempt to access the same memory block, an arbitration circuit determines which one of the commands is to be executed and which one of the commands is not to be executed. For example, command timings are compared, and the earliest command is executed while the other command(s) is (are) not executed. When there is a command that is not executed, a BUSY signal or the like is generated and output to the exterior of the device. This makes it possible to perform a proper access operation and achieve proper BUSY control even when command accesses are in conflict with each other in the DRAM-core-based multi-port memory.

Further, the present invention is provided with an operation mode for performing a refresh operation in response to an instruction from the exterior of the device and an operation mode for performing a refresh operation in response to an instruction from the internal refresh circuit. This makes it possible to use the multi-port memory in such a manner that a predetermined external port is assigned as a port for refresh management to receive refresh commands at constant intervals, or to use the multi-port memory in such a manner that the internal refresh circuit initiates refresh operations when all the external ports are in the deactivated state. Accordingly, the present invention provides a basis for flexible refresh management that conforms to the system requirements.

[Fifth Aspect of the Invention]

In the following, a fifth aspect of the present invention will be described.

Multi-port memories have two or more sets of input/output terminals (i.e., a plurality of input/output ports), and perform memory operations responsive to received signals. Unlike ordinary memories, a read operation and a write operation can be executed simultaneously. For example, if a plurality of buses exists in a system, and if a plurality of controllers (CPU or the like) needs to use the respective buses, the system can be implemented by connecting input/output ports of a multi-port memory to the respective buses. This eliminates a need for using a specifically designed control logic circuitry (FIFO logic or the like).

Moreover, multi-port memories are also developed as image memories (generally as dual-port report memories). An image memory has random access ports through which access to any memory cell can be made and serial access ports that exchange data with a display device.

This kind of multi-port memory employs an SRAM memory core or a DRAM memory core in the memory cell area.

However, multi-port memories have yet to be developed that receive different clock signals at respective input/output ports and make random access to one of the memory cell area in synchronization with the clock signals. That is, it is not yet known how to implement details of circuitry and how to control a clock-synchronized multi-port memory of such a kind.

Moreover, conventional multi-port memories (especially, dual-port memories) are provided with bit lines and sense amplifiers separately for respective sets of input/output ports. Because of this reason, there is a problem in that the layout size of a memory core becomes large, thereby undesirably enlarging the chip size of a multi-port memory.

Accordingly, the present invention is aimed at providing a clock-synchronized multi-port memory that allows random access to be made.

The present invention is further aimed at providing a multi-port memory that receives mutually different clock signals at respective sets of input/output ports, and operates in a reliable manner.

The present invention is moreover aimed at providing a multi-port memory that can drive a memory core by receiving a command signal at any time regardless of status of other input/output ports.

The present invention is furthermore aimed at providing a multi-port memory small having a reduced chip size.

According to the present invention (fifth aspect), some of the plurality of memory cores operate based on clock signals and address signals supplied to a plurality of input/output ports. Each of the input/output ports includes a clock terminal for receiving a clock signal, address terminals for receiving address signals that are supplied in synchronization with the clock signal, and data input/output terminals for inputting/outputting data signals. Control circuits are provided for the respective memory cores.

A control circuit makes a memory core operate in response to address signals received first if address signals indicating the same memory core are supplied to two or more of the input/output ports. That is, the memory operation is performed with respect to an input/output port that received address signals first. The memory cores may be so defined as to correspond to respective sense amplifier areas where a sense amplifier area is an area in which sense amplifiers operate together. A memory core is selected by an upper portion of the address signals. Memory cells of the memory core are selected by a lower portion of the address signals. Data signals of the memory cells selected by the lower portion of the address signals are input from or output to the exterior of the device via an input/output port that corresponds to the upper portion of the address signals that are received first.

The control circuit can be implemented as a simple circuit since all that is necessary is to compare address signals. This contributes to a chip size reduction.

Since each input/output port has a clock terminal, frequency of the clock signal can be controlled separately for each input/output port. That is, a plurality of controllers having different operation frequencies can be connected to the multi-port memory.

In the multi-port memory of the present invention, the address signals are settled a predetermined setup time prior to a particular edge of the clock signal that is used for acquiring the address signals. The control circuit determines an order of arrivals of address signals by using the address signals that are settled before this particular edge of the clock signal. Because of this, an order of address signal arrivals can be determined by using an edge of a clock signal that is received first. This makes it possible to identify an input/output port having priority before a start of memory core operation, thereby achieving a high-speed memory operation. Since the address signals are compared at a predetermined timing (i.e., the edge of the clock signal), a wrong comparison of address signals irrelevant to memory operations can be prevented.

According to the present invention, some of the plurality of memory cores operate based on clock signals and address signals supplied to a plurality of input/output ports. Each of the input/output ports includes a clock terminal for receiving a clock signal, address terminals for receiving address signals that are supplied in synchronization with the clock signal, and data input/output terminals for inputting/outputting data signals. Control circuits are provided for the respective memory cores.

A control circuit makes a memory core operate in response to address signals received first if address signals indicating the same memory core are supplied to two or more of the input/output ports. Thereafter, the control circuit makes the memory core operate in response to address signals in an order in which the address signals are received. A memory core is selected by an upper portion of the address signals. Memory cells of the memory core are selected by a lower portion of the address signals. Data signals of the memory cells selected by the lower portion of the address signals are successively input from or output to the exterior of the device via input/output ports that correspond to respective address signals. Accordingly, memory operations are performed without exception for all the input/output ports that received requests for memory operations.

Namely, the multi-port memory is in a ready state at all times. A controller connected to the multi-port memory does not have to detect a busy state of the multi-port memory. This simplifies the operation of the controller in terms of hardware and software. The control circuit can be implemented as a simple circuit since all that is necessary is to compare address signals. This contributes to a chip size reduction.

Since each input/output port has a clock terminal, frequency of the clock signal can be controlled separately for each input/output port. That is, a plurality of controllers having different operation frequencies can be connected to the multi-port memory.

In the multi-port memory of the present invention, each input/output port is provided with a command terminal for receiving a command signal in synchronization with the clock signal for controlling memory core operations. In each input/output port, the command signals for activating memory cores are supplied at intervals at least twice as long as the operation period of memory cores that is necessary for a read operation and a write operation. If the multi-port memory is provided with two input/output ports or four input/output ports, the intervals of command signals may be set to twice the operation period or four times the operation period, respectively. With such settings, the multi-port memory is in a ready state to respond to the external controller.

If the command signals are supplied at intervals shorter than the predetermined intervals, the command signals are invalidated to prevent malfunction. If the command signals are supplied to different input/output ports, these command signals are accepted even if the intervals are not shorter than the predetermined intervals.

According to the present invention, further, data read from or written in the memory cells are transferred between the data input/output terminals and the memory cells via a buffer. The buffer stores therein data having a predetermined number of bits that is equal in amount to two or more of the memory cells.

At a start of a read operation and a write operation, for example, the data having a predetermined number of data is transferred from the memory cells to the buffer. In the read operation, data corresponding to respective address signals are read from the buffer and output to the exterior from the data input/output terminals. In the write operation, data corresponding to respective address signals are stored in the buffer, and the data of the buffer are written in the memory cells at once at the end of the write operation.

In this manner, a page operation is readily performed. In general, memory cores (sense amplifiers and the like) must be kept activated during a page operation. If the buffer of the present invention was not provided, it would be impossible to perform a memory operation with respect to an input/output port during a page operation that is performed for another input/output port. In the present invention, data of the memory cells are transferred to the buffer at the start of an operation, so that the memory cores can be deactivated immediately after this. As a result, a controller connected to the multi-port memory does not have to detect a busy state of the multi-port memory even during the page operation.

In the following, embodiments of the present invention (fifth aspect) will be described with reference to the accompanying drawings.

FIG. 111 shows a first embodiment of a multi-port memory according to the present invention (fifth aspect). A multi-port memory M is formed on a silicon substrate by using a CMOS process.

The multi-port memory M includes two input/output ports PORT-A and PORT-B, an I/O circuit 5010 that outputs and inputs signals to and from the ports PORT-A and PORT-B, and a plurality of memory blocks MB. The memory blocks MB each includes a DRAM memory core (including memory cells, sense amplifier lines SA, etc.), and further includes control circuitry, decoders, etc., that are not illustrated in the drawing. The memory cells each include a capacitor that store electric charge responsive to the value of a data signal. One of the memory cores is selected according to a row address signal supplied through the port PORT-A or the port PORT-B. All the sense amplifiers of the sense amplifier line SA in a given memory core are activated simultaneously in response to the selection of the given memory core. Namely, a memory core is activated in response to an active command ACT, which will be described later, and all the memory cell areas in this memory core are selected. Read data or write data is read or written at a memory cell according to a column address signal supplied after the activation of sense amplifiers.

Figure 112:
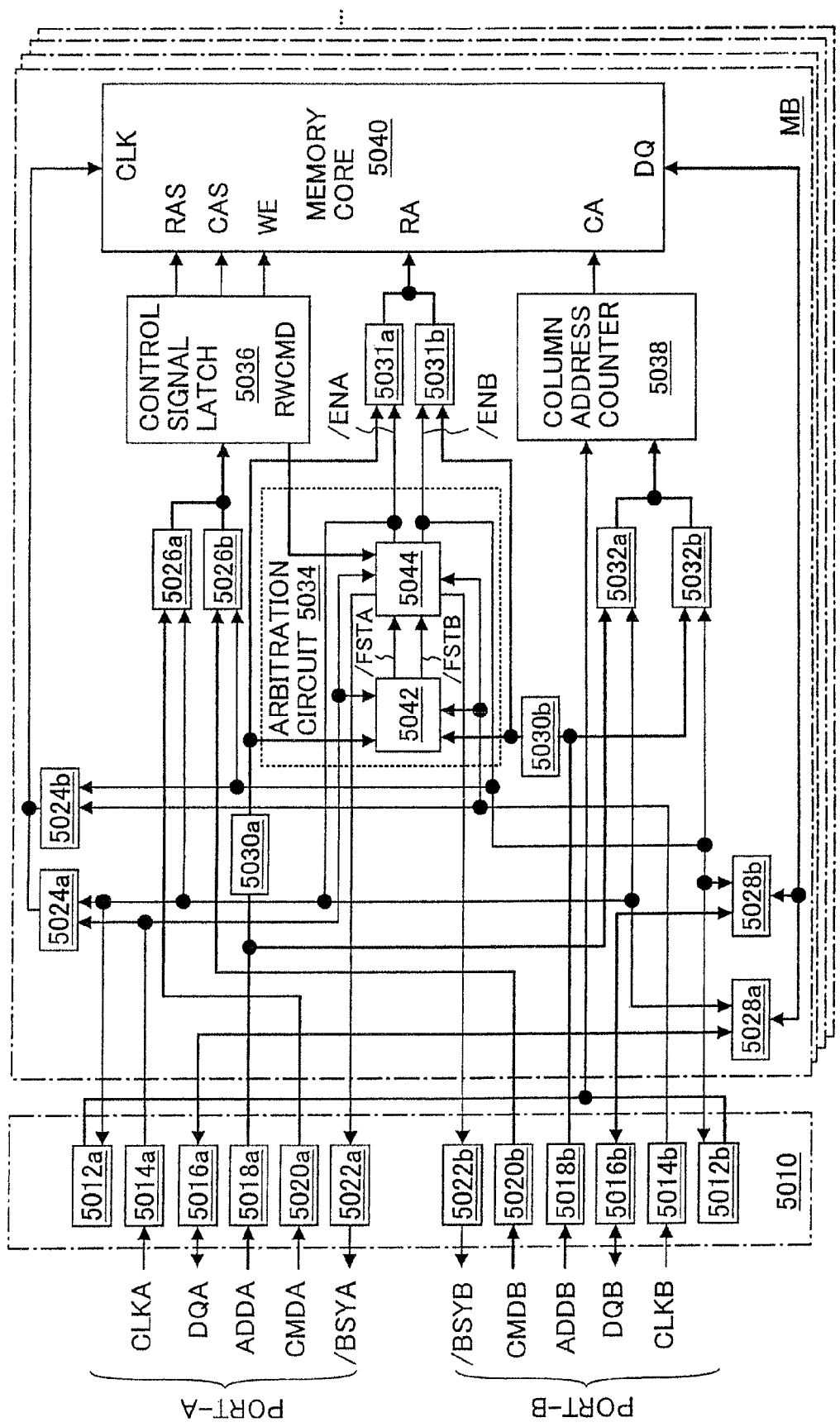
FIG. 112 shows details of an I/O circuit 5010 and a memory block MB of the multi-port memory.

FIG. 112 shows details of the I/O circuit 5010 and a memory block MB of the multi-port memory M. In the figure, signal lines shown by thick line illustration are each comprised of a plurality of lines.

The I/O circuit 5010 includes mode registers 5012a and 5012b, clock buffers 5014a and 5014b, data input/output buffers 5016a and 5016b, address buffer/registers 5018a and 5018b, command buffers 5020a and 5020b, and busy buffers 5022a and 5022b, corresponding to the input/output ports PORT-A and PORT-B, respectively. The mode registers

5012*a* and 5012*b* are registers for setting an operation mode of the multi-port memory M from the exterior of the device.

The clock buffer 5014*a*, the address buffer/register 5018*a*, and the command buffer 5020*a* supply a clock signal CLKA, address-signals ADDA, and command signals CMDA, respectively, to the memory block MB as they are supplied from the exterior of the device. The input/output buffer 5016*a* are used to output and input data signals DQA from and to the memory block MB. The busy buffer 5022*a* outputs a busy signal /BSYA to the exterior of the device. The clock buffer 5014*b*, the address buffer/register 5018*b*, and the command buffer 5020*b* supply a clock signal CLKB, address-signals ADDB, and command signals CMDB, respectively, to the memory block MB as they are supplied from the exterior of the device. The input/output buffer 5016*b* are used to output and input data signals DQB from and to the memory block MB. The busy buffer 5022*b* outputs a busy signal /BSYB to the exterior of the device. The clock signal signals CLKA and CLKB, the address-signal ADDA and ADDB, the command signals CMDA and CMDB, the data signals DQA and DQB, and the busy signals /BSYA and /BSYB are transferred through clock terminals, address terminals, command terminals, data input/output terminals, and busy terminals, respectively. The active command ACT and an operation command (e.g., a read command RD, a write command WR), etc., are supplied as the command signals CMDA and CMDB for controlling operation of the memory core.

The address signals ADDA and ADDB are each supplied as row address signals RA and column address signals CA separate from each other. In the input/output port PORT-A, the row address signals RA, the column address signals CA, and command signals CMDA are supplied in synchronization with rising edges of the clock signal CLKA. In the input/output port PORT-B, the row address signals RA, the column address signals CA, and command signals CMDB are supplied in synchronization with rising edges of the clock signal CLKB. In this manner, the multi-port memory M receives the clock signals CLKA and CLKB of exclusive use at the input/output ports PORT-A and PORT-B, respectively, and operates in synchronization with the clock signal CLKA and CLKB.

The memory block MB includes clock buffers 5024*a* and 5024*b*, command latches 5026*a* and 5026*b*, data latches 5028*a* and 5028*b*, row address latches 5030*a* and 5030*b*, column address buffers 5031*a* and 5031*b*, and column address latches 5032*a* and 5032*b*, corresponding to input/output port PORT-A and PORT-B, respectively. The memory block MB includes an arbitration circuit 5034, a control signal latch 5036, a column address counter 5038, and a memory core 5040, which are common to the input/output ports PORT-A and PORT-B. The memory core 5040 is of a type that takes in command signals RAS, CAS, and WE, the row address signals RA, and the column address signals CA in synchronization with the clock signal.

The mode register 5012*a*, the clock buffer 5024*a*, the command latch 5026*a*, the data latch 5028*a*, the row address buffer 5031*a*, and the column address latch 5032*a* corresponding to the input/output port PORT-A operate when an enable signal /ENA supplied from the arbitration circuit 5034 is activated. The mode register 5012*b*, the clock buffer 5024*b*, the command latch 5026*b*, the data latch 5028*b*, the row address buffer 5031*b*, and the column address latch 5032*b* corresponding to the input/output port PORT-B operate when an enable signal /ENB supplied from the arbitration circuit 5034 is activated.

Namely, at the time of activation of the enable signal /ENA, the clock buffer 5024*a* supplies the clock signal. CLKA to a clock terminal CLK of the memory core 5040. Further, the command latch 5026*a* supplies the latched command signals CMDA to the control signal latch 5036, and the row address buffer 5031*a* supplies the latched row address signal RA (e.g., corresponding to upper address bits) to row address terminals RA of the memory core 5040. Moreover, the column address latch 5032*a* supplies the latched column address signal CA (e.g., corresponding to lower address bits) to the column address counter 5038, and the data latch 5028*a* exchanges data signals with data input/output terminals DQ of the memory core 5040 and the input-output-buffer 5016*a*.

Similarly, at the time of activation of the enable signal /ENB, the clock buffer 5024*b* supplies the clock signal CLKB to the clock terminal CLK of the memory core 5040. Further, the command latch 5026*a* supplies the latched command signals CMDB to the control signal latch 5036, and the row address buffer 5031*b* supplies the latched row address signal RA to the row address terminals RA of the memory core 5040. Moreover, the column address latch 5032*b* supplies the latched column address signal CA to the column address counter 5038, and the data latch 5028*b* exchanges data signals with data input/output terminals DQ of the memory core 5040 and the input-output-buffer 5016*b*.

The control signal latch 5036 generates a row address strobe signal RAS, a column address strobe signal CAS, and a write enable signal WE for operating the memory core 5040 according to the received command signals CMDA and CMDB, and supplies the generated signals to the memory core 5040. Moreover, the control signal latch 5036 supplies to the arbitration circuit 5034 the Read/Write command signals RWCMD that indicate one of the read operation and the write operation.

The column address counter 5038 generates the column address signal CA according to the information about the burst length supplied from the mode registers 5012*a* and 5012*b* and the address signals ADDA and ADDB, and outputs the column address signal to the memory core 5040.

The arbitration circuit 5034 includes an address comparison circuit 5042 and an arbitration control circuit 5044. The address comparison circuit 5042 compares the row address signals RA between the address signals ADDA and ADDB supplied from the input/output ports PORT-A and PORT-B, and decides which one is earlier to arrive. The arbitration control circuit 5044 generates the busy signals /BSYA and /BSYB and the enable signals /ENA and /ENB for operating an internal circuitry according to the comparison by the address comparison circuit 5042.

Figure 113:
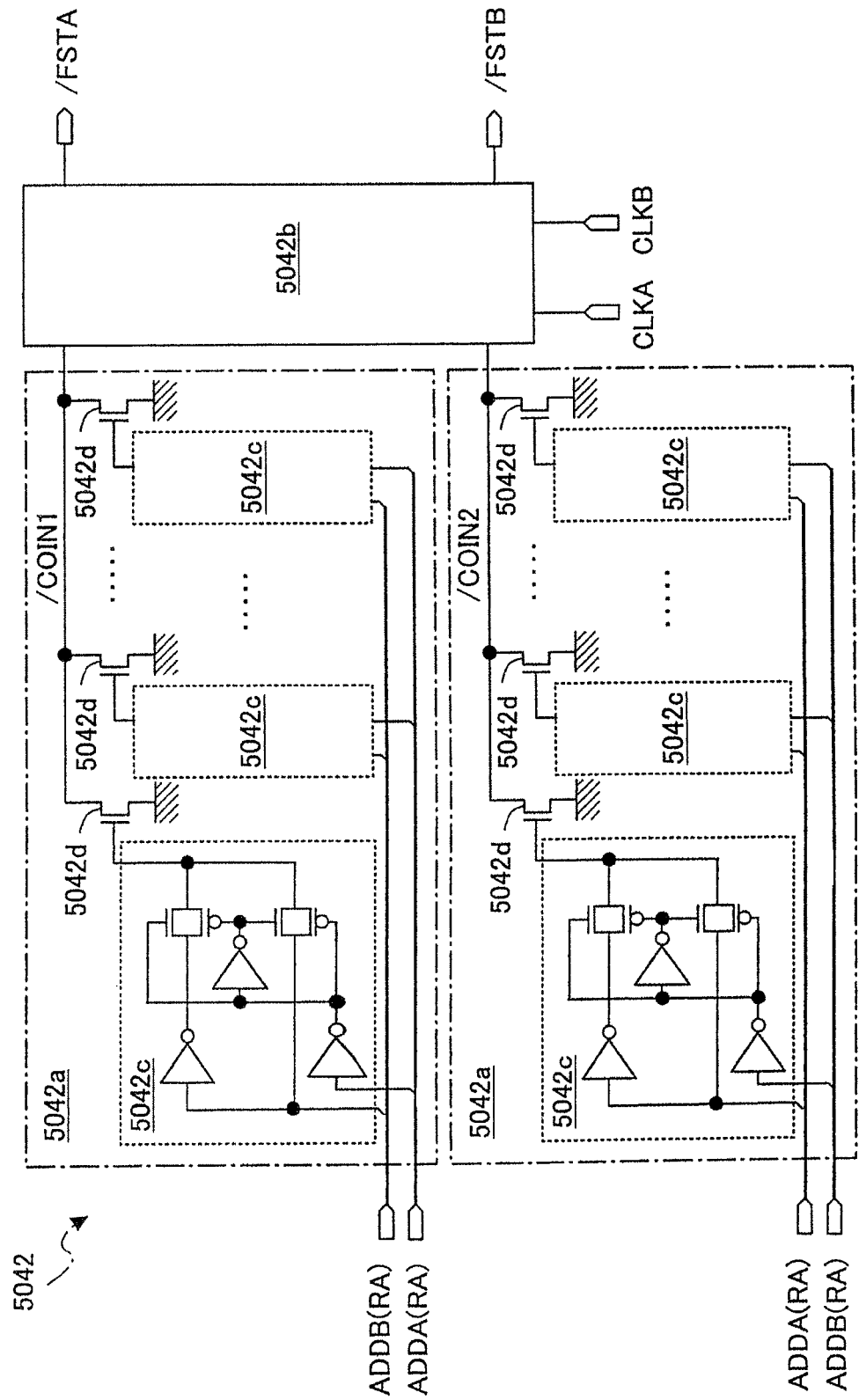
FIG. 113 shows the details of an address comparison circuit.

FIG. 113 shows the details of the address comparison circuit 5042.

The address comparison circuit 5042 includes two address matching circuits 5042*a* and an address comparator 5042*b*, which detects an order of address arrivals. The address matching circuits 5042*a* includes a plurality of EOR circuits 5042*c*, each of which compares corresponding bits of the row address signals RA between the address signal ADDA and the address signal ADDB, and further includes a plurality of nMOS transistors 5042*d* which correspond to the respective EOR circuit 5042*c*. The nMOS transistors 5042*d* each have the gate thereof connected to the output of a corresponding EOR circuit 5042*c*, the source thereof grounded, and the drain thereof connected with each other. Each EOR circuit 5042*c* outputs a low level signal when bit values of the row address signals RA match each other between the input/output ports PORT-A and PORT-B, and outputs a high level signal when the bit values of the row address signals RA do not match. The nMOS transistors 5042*d* are turned off in response to the low level signal from the EOR circuits 5042*c*, and turns on in response to the high level signal. Namely, match signals /COIN1 and /COIN2 output from the address matching circuits 5042a become floating when all the bits of the row address signals RA match between corresponding bits, and become a low level signal when at least one bit of the row address signals differs between corresponding bits. The two address matching circuits 5042a are arranged at the respective upper end and lower end of the memory block MB shown in FIG. 111 (i.e., arranged close to the input/output circuits 5010). Arrangement of the address matching circuits 5042a close to the I/O circuits 5010 makes it possible to shorten the propagation delay of the address signals ADDA and ADDB all the way to the address matching circuits 5042a. Consequently, the address signals ADDA and ADDB can be compared at an early timing, thereby attaining a high-speed operation.

The comparator 5042b receives matching signals /COIN1 and /COIN2 and the clock signals CLKA and CLKB, and outputs first-arrival signals /FSTA and /FSTB.

Figure 114:
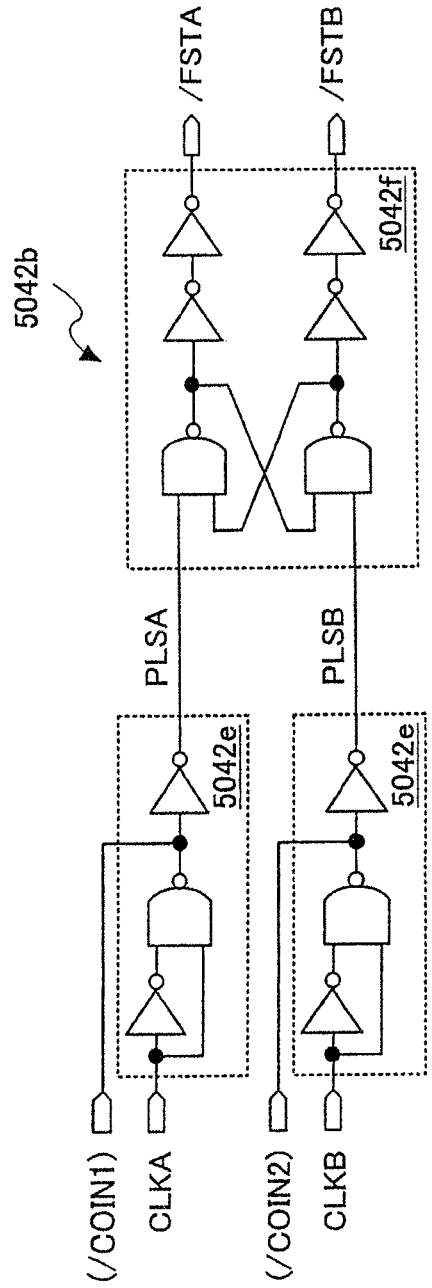
FIG. 114 shows the details of a comparator.

FIG. 114 shows the details of the comparator 5042b.

The comparator 5042b includes pulse generators 5042e, which generate positive pulses PLSA and PLSB, respectively, in synchronization with rising edges of the clock signal CLKA and CLKB, and further includes a flip-flop 5042f, which receives the pulses PLSA and PLSB at the input terminals thereof. The comparator 5042b receives the match signals /COIN1 and /COIN2 as inputs to respective inverters that output the pulses PLSA and PLSB, respectively. NAND gates that generate respective pulse signals in the comparator 5042b are implemented as circuit elements of a small size, so that priority is given to the match signals /COIN1 and /COIN2 when the signals output from the NAND gates have conflicting signal levels with the match signals /COIN1 and /COIN2. The Flip-flop 5042f brings down the first-arrival signal /FSTA to a low level when the pulse PLSA is received, and brings down the first-arrival signal /FSTB to a low level when the pulse PLSB is received.

Figure 115:
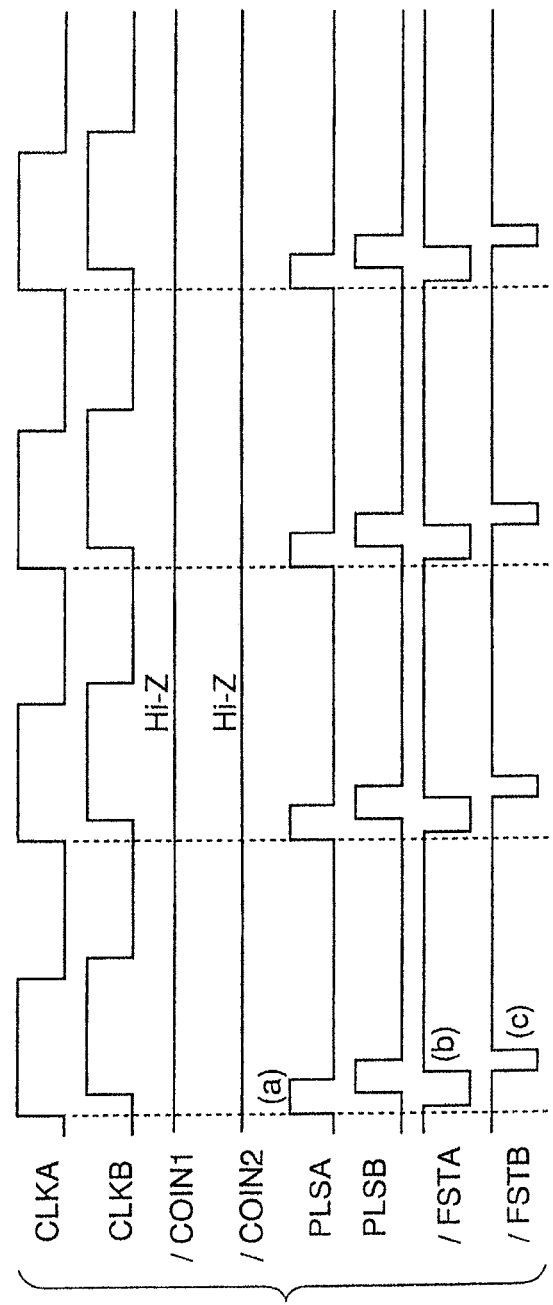
FIG. 115 shows operations of the comparator performed when row address signals supplied to input/output ports PORT-A and PORT-B match each other.

FIG. 115 shows operations of the comparator 5042b performed when the row address signals supplied to the input/output ports PORT-A and PORT-B match each other. In this example, the clock signals CLKA and CLKB have the same cycle.

The address matching circuit 5042a shown in FIG. 113 brings the match signals /COIN1 and /COIN2 to a floating state (Hi-z) when the row address signals RA match. In response, the pulses PLSA and PLSB are generated in synchronization with the rising edge of the clock signals CLKA and CLMB, respectively, (FIG. 115-(a)). The flip-flop 5042f shown in FIG. 114 activates the first-arrival signal /FSTA in response to the pulse PLSA that is received ahead of the other (FIG. 115-(b)). The first-arrival signal /FSTB that corresponds to the later received pulse PLSB is activated after the deactivation of the first-arrival signal /FSTA (FIG. 115-(c)).

Figure 116:
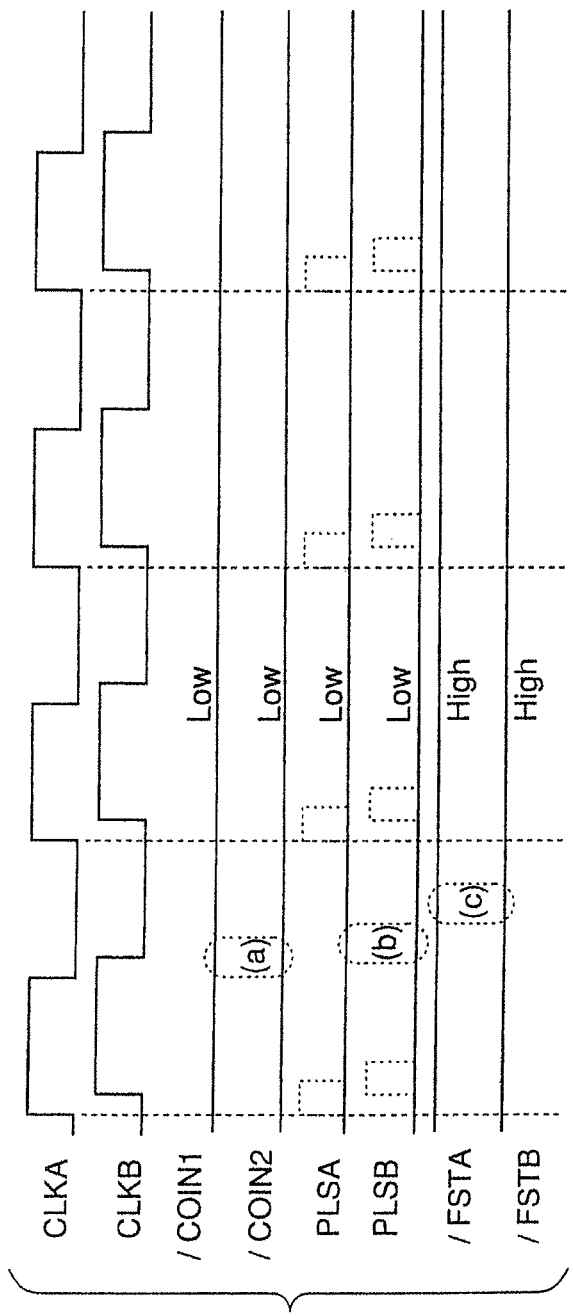
FIG. 116 shows operations of the comparator in a case in which row address signals RA do not match between the input/output ports PORT-A and PORT-B.

FIG. 116 shows operations of the comparator 5042b in a case in which the row address signals RA do not match between the input/output ports PORT-A and PORT-B. In this example, the clock signals CLKA and CLKB have the same cycle.

The address matching circuit 5042a brings down each of the match signals /COIN1 and /COIN2 to a low level (FIG. 116-(a)) when the row address signals RA do not match even by one bit. In response, the pulse generator 5042e shown in FIG. 114 forces the pulse signals PLSA and PLSB to be brought down to the low level regardless of the clock signals CLKA and CLKB (FIG. 116-(b)). Consequently, the first-arrival signals /FSTA, and /FSTB are held at the high level (FIG. 116-(c)).

Figure 117:
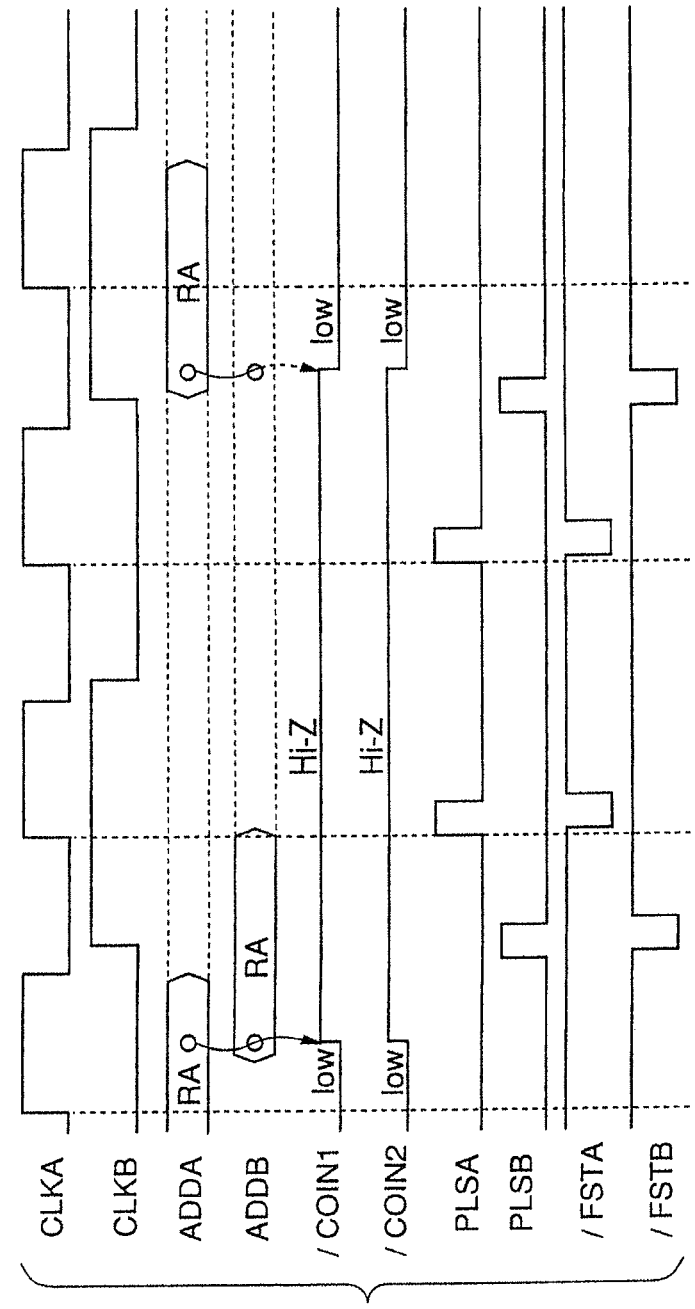
FIG. 117 shows operations of the comparator when the row address signals RA supplied to the input/output ports PORT-A and PORT-B match under the condition of a clock signal CLKA having a cycle different from the cycle of a clock signal CLKB.

FIG. 117 shows operations of the comparator 5042b when the row address signals RA supplied to the input/output ports PORT-A and PORT-B match under the condition of the clock signal CLKA having a cycle different from the cycle of the clock signal CLKB. In this example, the cycle of the clock signal CLKB is set equal to double the cycle of the clock signal CLKA. The row address signals RA are acquired in synchronization with the rising edges of the clock signals CLKA and CLKB, respectively. In the drawing, the row address signals RA shown by solid lines illustrate signals supplied to the input/output ports PORT-A and PORT-B, and the row address signals RA shown by dashed lines illustrate the signals latched by the respective row-address latches 5030a and 5030b shown in FIG. 112.

When the row address signals RA match, the match signals /COIN1 and /COIN2 are brought into the floating state (Hi-Z) in the same manner as in FIG. 115. With the match signals /COIN1 and /COIN2 being in the floating state, the pulse generator 5042e shown in FIG. 114 comes into effect, so that the pulse signals PLSA and PLSB and the first-arrival signals /FSTA and /FSTB are generated in synchronization with the rising edges of the clock signals CLKA and CLKB, respectively.

Figure 118:
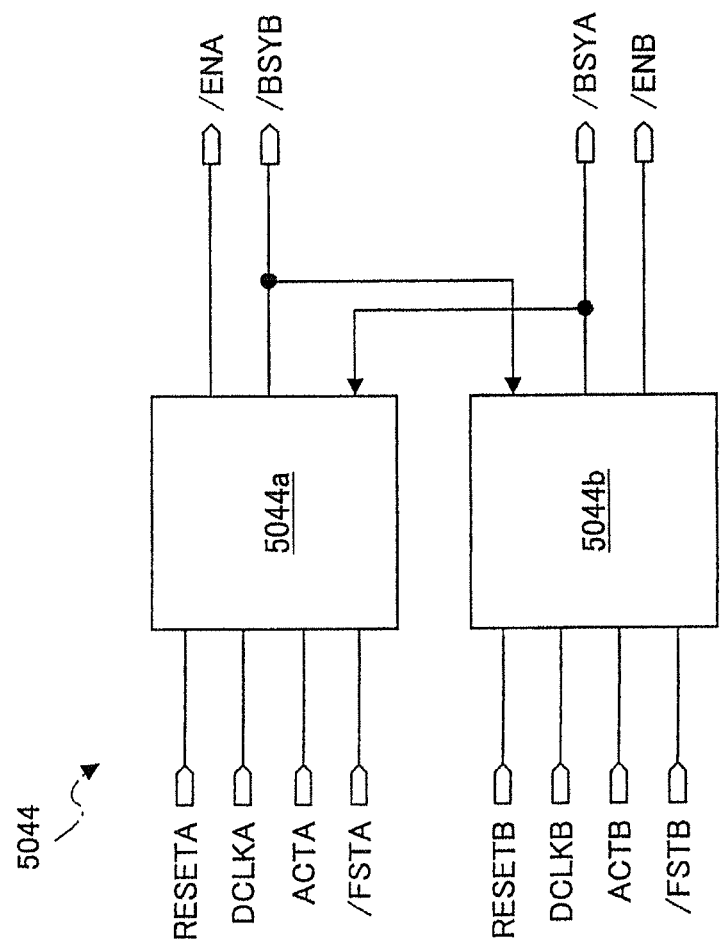
FIG. 118 shows an arbitration control circuit provided in an arbitration circuit shown in FIG. 112.

FIG. 118 shows the arbitration control circuit 5044 provided in the arbitration circuit 5034 shown in FIG. 112.

The arbitration control circuit 5044 includes control circuits 5044a and 5044b respectively corresponding to the input/output ports PORT-A and PORT-B. The control circuit 5044a receives a reset signal RESETA, a delay clock signal DCLKA, an active command signal ACTA, and the first-arrival signal /FSTA, and a busy signal /BSYA, and outputs an enable signal /ENA and a busy signal /BSYB. The control circuit 5044b receives a reset signal RESETB, a delay clock signal DCLKB, an active command signal ACTB, the first-arrival signal /FSTB, and a busy signal /BSYB, and outputs an enable signal /ENB and a busy signal /BSYA.

When read or write operations corresponding to the input/output ports PORT-A and PORT-B are completed, the reset signals RESETA and RESETB are activated for respective predetermined periods. The delay clock signals DCLKA and DCLKB are signals obtained by delaying the clock signals CLKA and CLKB, respectively. The active command signals ACTA and ACTB are activated when an active command ACT is supplied to the input/output ports PORT-A and PORT-B.

Figure 119:
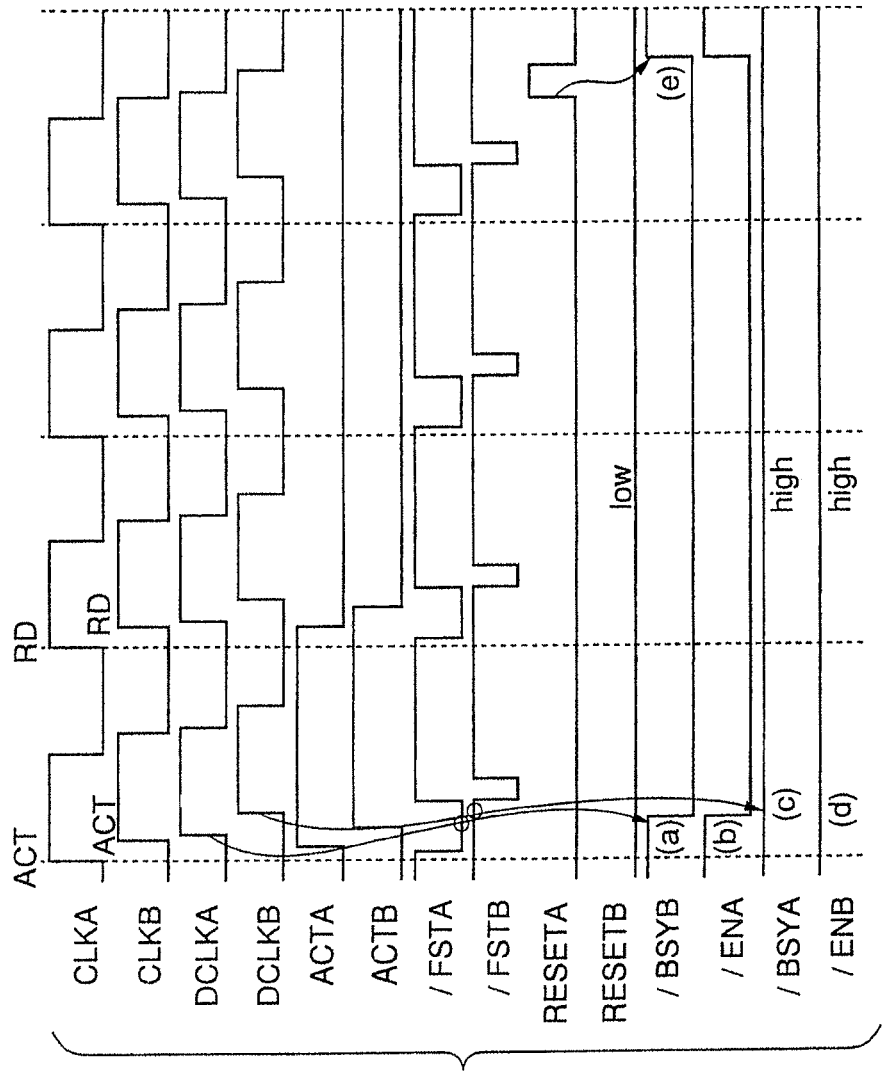
FIG. 119 shows operations of the arbitration control circuit performed when row address signals supplied to the input/output ports PORT-A and PORT-B match.

FIG. 119 shows operations of the arbitration control circuit 5044 performed when the row address signals supplied to the input/output ports PORT-A and PORT-B match. In this example, the cycles of clock signals CLKA and CLKB are the same. An active command ACT is supplied in synchronization with the clock signal CLKA, immediately followed by an active command ACT being supplied in synchronization with the clock signal CLKB.

The control circuit 5044a takes in the first-arrival signal /FSTA of a low level in synchronization with a rising edge of the delay clock signal DCLKA, and activates the busy signal /BSYB (FIG. 119-(a)). In response to the activation of the active command signal ACTA and a deactivated state of the busy signal /BSYA, the control circuit 5044a activates the enable signal /ENA (FIG. 119-(b)). Since the control circuit 5044b acquires the first-arrival signal /FSTB of a high level in synchronization with a rising edge of the delay clock signal DCLKB, the busy signal /BSYA is not activated (FIG. 119-(c)). Although the control circuit 5044b receives the active command signal ACTB of an activated state, the control circuit 5044b does not activate the enable signal /ENB since the busy signal /BSYB is activated (FIG. 119-(d)).

In response to the activation of the enable signal /ENA, the signal supplied to the input/output port PORT-A is transmitted to the memory core 5040. The memory core 5040 is activated, performing a read operation according to the read command RD supplied to the input/output port PORT-A. After the completion of the read operation, the control circuit 5044a responds to the activation of the reset signal RESETA to deactivate the enable signal /ENA and the busy signal /BSYB (FIG. 119-(e)).

In the following, the multi-port memory M described above will be further described with regard to operations thereof.

Figure 120:
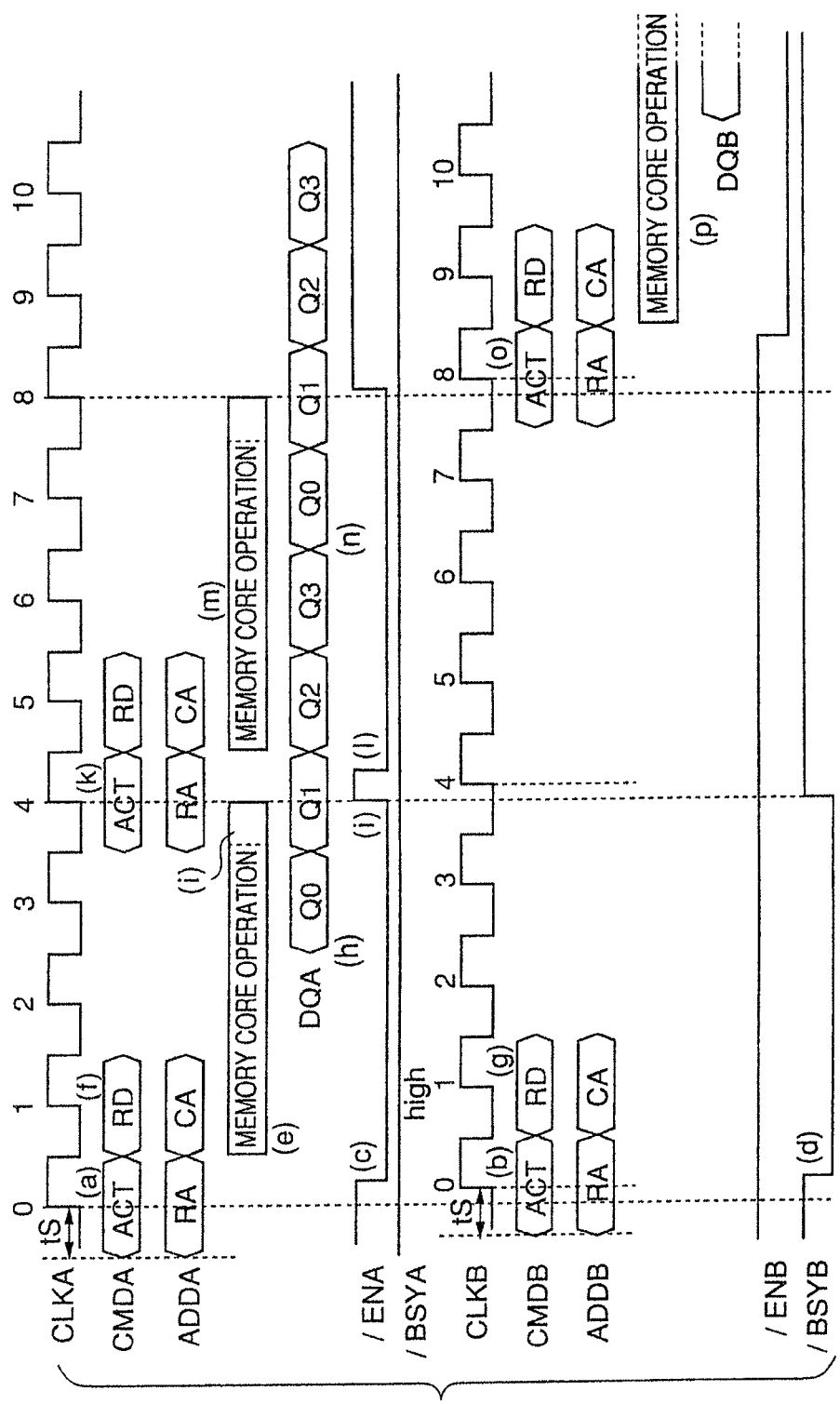
FIG. 120 shows operations performed when row address signals RA supplied to the input/output ports PORT-A and PORT-B match each other.

FIG. 120 shows operations performed when the row address signals RA supplied to the input/output ports PORT-A and PORT-B match each other. In this example, the clock signals CLKA and CLKB have the same cycle, and the phase of the clock signal CLKA is slightly ahead of the phase of the clock signal CLKB. Both the burst lengths of the input/output ports PORT-A and PORT-B are set equal to 4 by the respective mode registers 5012a and 5012b. Here, the burst length is the number of the data items that are output and input during one write or read operation.

The input/output port PORT-A receives the active command ACT (command signal CMDA) and the row address signals RA (address signals ADDA) in synchronization with a rising edge of the clock signal CLKA (FIG. 120-(a)). Immediately after the signal reception by the input/output port PORT-A, the input/output port PORT-B receives an active command ACT (command signal CMDB) and the row address signals RA (address-signals ADDB) in synchronization with a rising edge of the clock signal CLKB (FIG. 120-(b)). Here, the command signals CMDA and CMDB and the address signals ADDA and ADDB have signal levels thereof settled a predetermined setup time tS before the respective rising edges of the clock signals CLKA and CLKB (i.e., according to timing specifications).

Since the row address signals RA supplied to the port PORT-B is the same as the row address signals RA supplied to the port PORT-A, the first-arrival signals /FSTA and /FSTB are generated one after another as shown in FIG. 115. The arbitration control circuit 5044 activates the enable signal /ENA and the busy signal/BSYB (FIG. 120-(c) and (d)) in response to the first-arrival signals /FSTA and /FSTB as described in connection with FIG. 119. In this manner, the first one to arrive between the two address signals is determined by using the row address signals RA supplied during the setup time tS and by utilizing a rising edge of the clock signal (CLKA in this example) having an earlier phase. Thereafter, the memory core 5040 corresponding to the row address signals RA operates in response to the activation of the enable signal /ENA (FIG. 120-(e)).

In response to the busy signal /BSYB, a controller such as a CPU connected to the input/output port PORT-B ascertains that the active command ACT supplied to the multi-port memory M is invalid.

The input/output port PORT-A receives a read command RD (i.e., a command signal CMD) and column address signals CA (address-signals ADDA) in synchronization with the following rising edge of the clock signal CLKA (FIG. 120-(f)). The input/output port PORT-B receives a read command RD (command signal CMDB) and column address signals CA (address signals ADDB) in synchronization with the following rising edge of the clock signal CLKB (FIG. 120-(g)). The read commands RD (or write commands WR) are supplied after the active commands ACT in synchronization with the next rising edges of the respective clock signals CLKA and CLMB (according to timing specifications). Depending on the busy signal /BSYB, the controller connected to the input/output port PORT-B may not supply the read command RD and the column address signals CA.

The memory block MB successively outputs data as a data signal DQA (Q0-Q3) (FIG. 120-(h)) as they are read from memory cells corresponding to the column address signals CA supplied to the input/output port PORT-A. The data signal DQA is output 2 clocks after the reception of the read command RD. After outputting the data signal DQA as many as the burst length (=4), the memory core 5040 performs a precharge operation (FIG. 120-(i)), thereby completing one memory cycle. The enable signal /ENA is deactivated in response to the completion of the read operation (FIG. 120-(j)). Here, the precharge operation charges bit lines for transferring data to and from memory cells to a predetermined potential, and deactivates circuitry relevant to row address operations. This precharge operation is automatically performed at every memory operation. The timing of precharge operation is determined according to the larger of the burst length of the input/output port PORT-A or the burst length of the input/output port PORT-B, which is stored in the corresponding mode register. In this embodiment, if the burst length is 4, the memory cycle (i.e., the time period required for a single read or write operation) is fixed to four clock cycles. That is, the read operation and the write operation are always completed a predetermined time after the reception of an active command.

In synchronization with the clock signal CLKA used for outputting the data Q1, a next active command ACT is supplied to the input/output port PORT-A (FIG. 120-(k)). Since a command signals CMDB is not supplied to the input/output port PORT-B at this particular instant, comparison of the row address signals RA by the address comparison circuit 5042 shown in FIG. 113 produces a result indicative of a mismatch. Because of this, the busy signals /BSYA and /BSYB are not activated, and only the enable signal /ENA is activated (FIG. 120-(l)). The first-arrival signals /FSTA and /FSTB are held at a high level, as shown in FIG. 116.

The memory core 5040 operates according to the row address signals RA supplied to the input/output port PORT-A as was previously described (FIG. 120-(m)). The memory block MB outputs the data signal DQA (Q0-Q3) one after another according to a read command RD and column address signals CA that are supplied in synchronization with the following clock signal CLKA (FIG. 120-(n)).

After the operation of the memory core 5040 corresponding to the input/output port PORT-A is completed, an active command ACT and a read command RD are successively supplied to the input/output port PORT-B (FIG. 120-(o)). Since a command signals CMDA is not supplied to the input/output port PORT-A at this particular instant, the memory core 5040 operates with respect to the input/output port PORT-B, thereby outputting a data signal DQB (FIG. 120-(p)).

Although not shown in the figure, a refresh operation that restores charge in the capacitors of memory cells is performed in response to row address signals RA and a refresh command supplied in synchronization with a rising edge of a clock signal where the row address signals RA specify the memory core 5040 to be refreshed. Refresh operation can be requested via either the input/output port PORT-A or the input/output port PORT-B. In this manner, refresh operations are performed by the unit of one memory core 5040 according to the address signals supplied from the exterior of the device.

Figure 121:
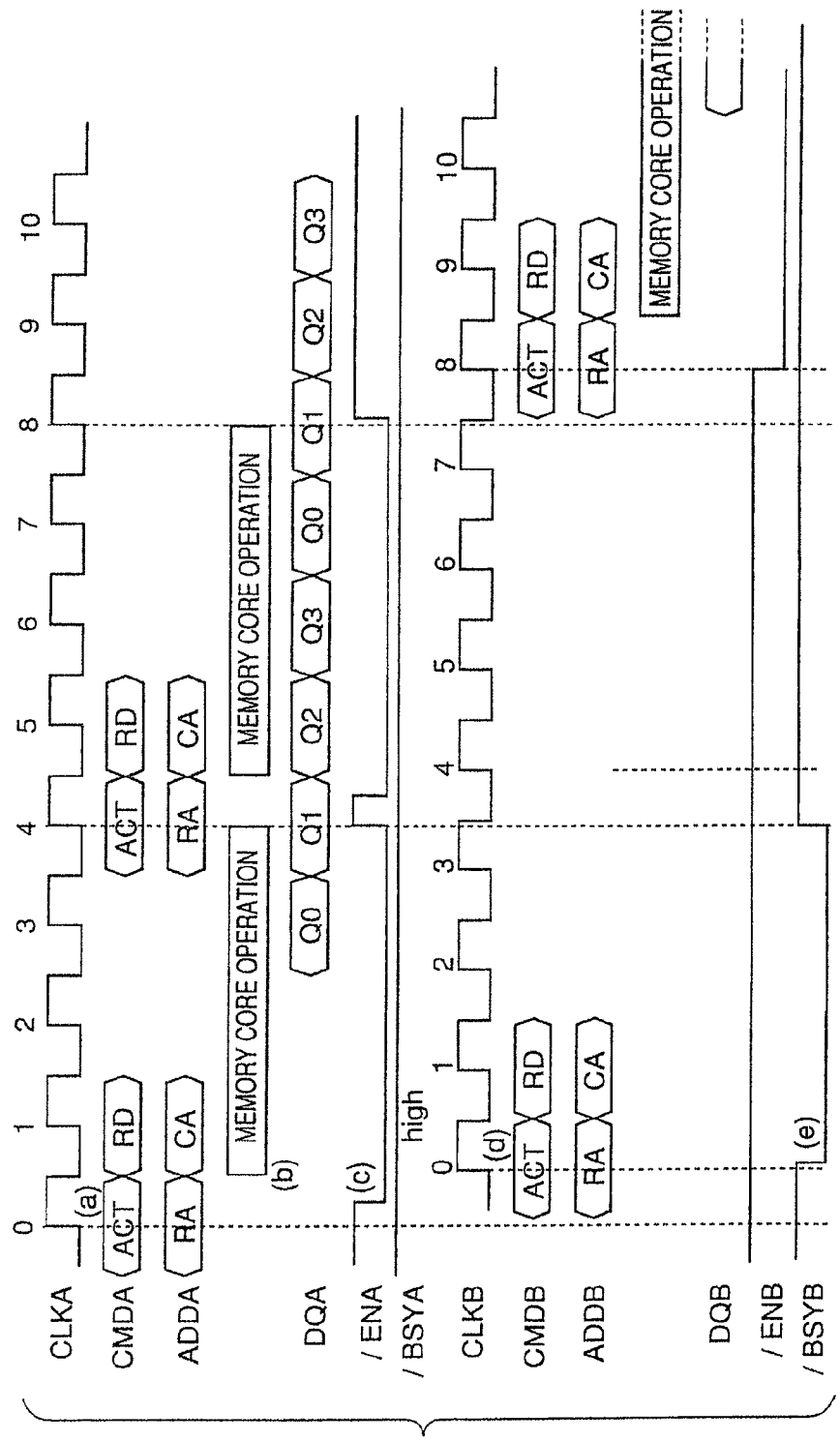

FIG. 121 shows operations performed when the cycles of the clock signals CLKA and CLKB are the same, and the phase of clock signal CLKA is ahead of the phase of clock signal CLKB by more than half a cycle. The command signals CMDA and CMDB and the address signals ADDA and ADDB supplied to the multi-port memory M are the same as in the case of FIG. 120.

In this example, when an active command ACT and row address signals RA are supplied to the input/output port PORT-A (FIG. 121-(a)), a command signal CMDB and address signals ADDB are not yet supplied to the input/output port PORT-B. Because of this, the enable signal /ENA is activated (FIG. 121-(b)), and the memory core 5040 operates with respect to the input/output port PORT-A (FIG. 121-(c)). Thereafter, an active command ACT and the same row address signals RA as the input/output port PORT-A are supplied to the input/output port PORT-B (FIG. 121-(d)).

The control circuit 5044b shown in FIG. 118 activates the busy signal /BSYB (FIG. 121-(e)) according to the activation of the first-arrival signal /FSTA and the activation of the enable signal /ENA. In response to the busy signal /BSYB, a controller such as a CPU connected to the input/output port PORT-B ascertains that the active command ACT supplied to the multi-port memory M is invalid. Operations thereafter are the same as those of FIG. 120 described above.

Figure 122:
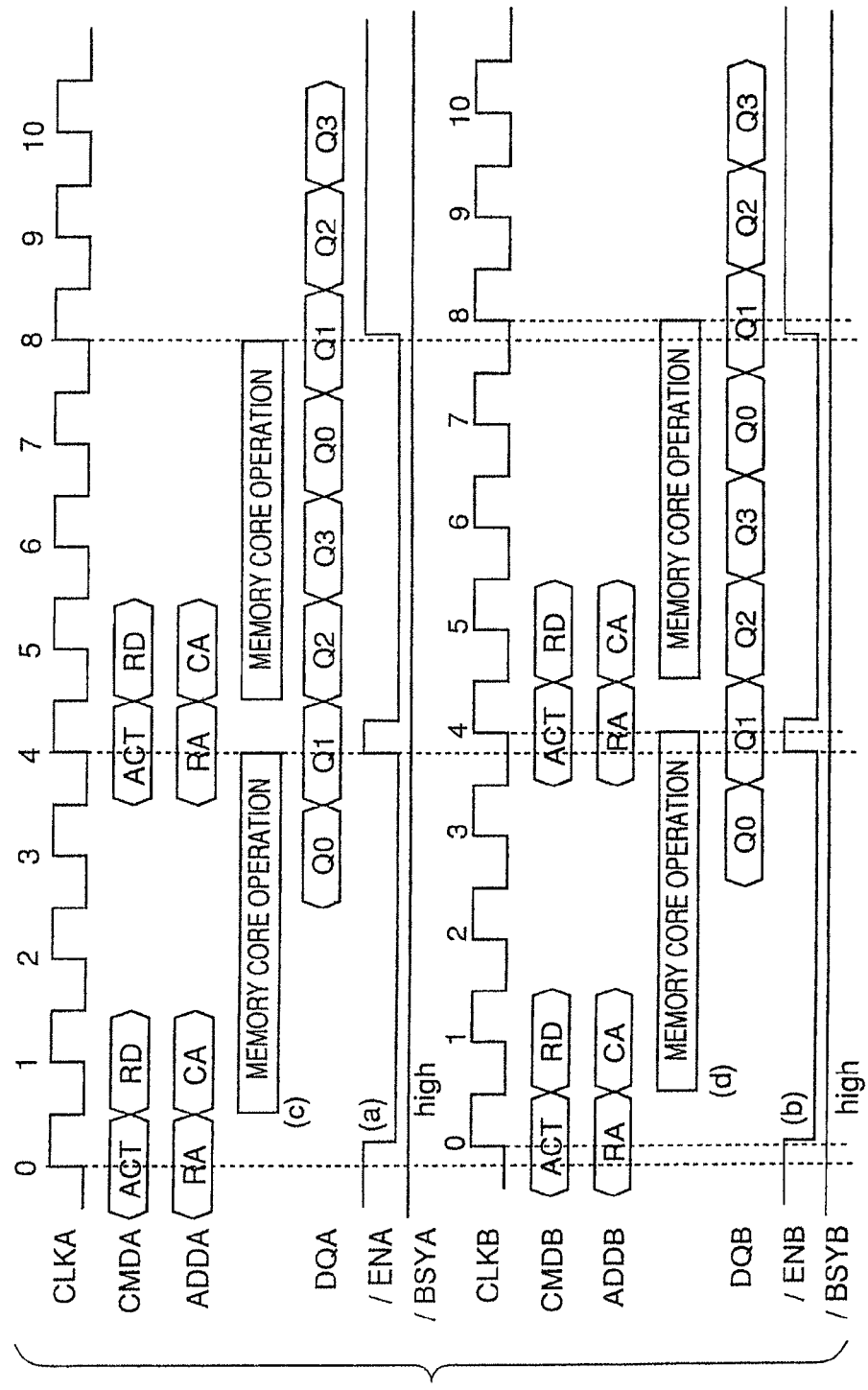

FIG. 122 shows operations in the case where the row address signals RA almost simultaneously supplied to the input/output ports PORT-A and PORT-B differ from each other. The clock signals CLKA and CLKB have the same clock cycle, and the phase of the clock signal CLKA is slightly ahead of the phase of the clock signal CLKB. The bust length is set equal to 4 with respect to both of the input/output ports PORT-A and PORT-B by the mode register 12.

When the row address signals RA differ, different memory cores 5040 operate. The comparator 5042b shown in FIG. 114 thus deactivates both the first-arrival signals /FSTA and /FSTB. That is, address arbitration is not performed. The arbitration control circuit 5044 responds to the deactivated state of the first-arrival signals /FSTA and /FSTB and the activation of the active command signals ACTA and ACTS, and activates the enable signals /ENA and /ENB (FIG. 122-(a) and (b)). As a result, a relevant memory core 5040 operates (FIG. 122-(c)) in response to the active command ACT and the row address signals RA supplied to the input/output port PORT-A, and another memory core 5040 operates (FIG. 122-(d)) in response to the active command ACT and the row address signals RA supplied to the input/output port PORT-B. Namely, the input/output ports PORT-A and PORT-B operate independently of each other. Since the row address signals RA differ from each other, neither the busy signal /BSYA or the busy signal /BSYB is activated.

In this embodiment described above, the memory core 5040 operates with respect to the first one to arrive between the two row address signals RA when the input/output ports PORT-A and PORT-B receive the two row address signals RA indicative of the same memory core 5040 in synchronization with the clock signals CLKA and CLKB, respectively. That is, the multi-port memory M of a clock synchronization type can thus be implemented.

The arbitration circuit 5034 satisfies all that is expected thereof by comparing the row address signals RA, and, thus, can be implemented through a simple configuration. Consequently, the chip size of the multi-port memory M can be made small.

Since the input/output ports PORT-A and PORT-B have the respective clock terminals CLKA and CLKB, the frequency of the clock signals CLKA and CLKB can be set separately for each one of the input/output ports PORT-A and PORT-B.

That is, a plurality of controllers operating on different operation frequencies can be connected to the multi-port memory M.

Further, the first one to arrive between the two addresses is decided by using the row address signals RA that are settled before the relevant rising edges of the clock signals CLKA and CLKB. Namely, the first one to arrive is identified by utilizing the setup time tS of address signals. Because of this, an input/output port that will be given priority can be identified before the memory core 5040 starts operation thereof, thereby achieving high-speed memory operation. Further, since the first one to arrive is determined based on a rising edge of the clock signal CLKA (or CLKB) having an earlier phase, the memory operation speed can be further enhanced.

In the arbitration circuit 5034, the address comparison circuit 5042 compares the row address signals RA, and the arbitration control circuit 5044 checks an address match in synchronization with the clock signals CLKA and CLKB that are used to acquire the active commands ACT. Since the row address signals RA are always compared with each other at a predetermined timing (i.e., at the edge of a clock signal), it is possible to prevent a malfunction of the memory core 5040 caused by address signals irrelevant to memory operations.

Figure 123:
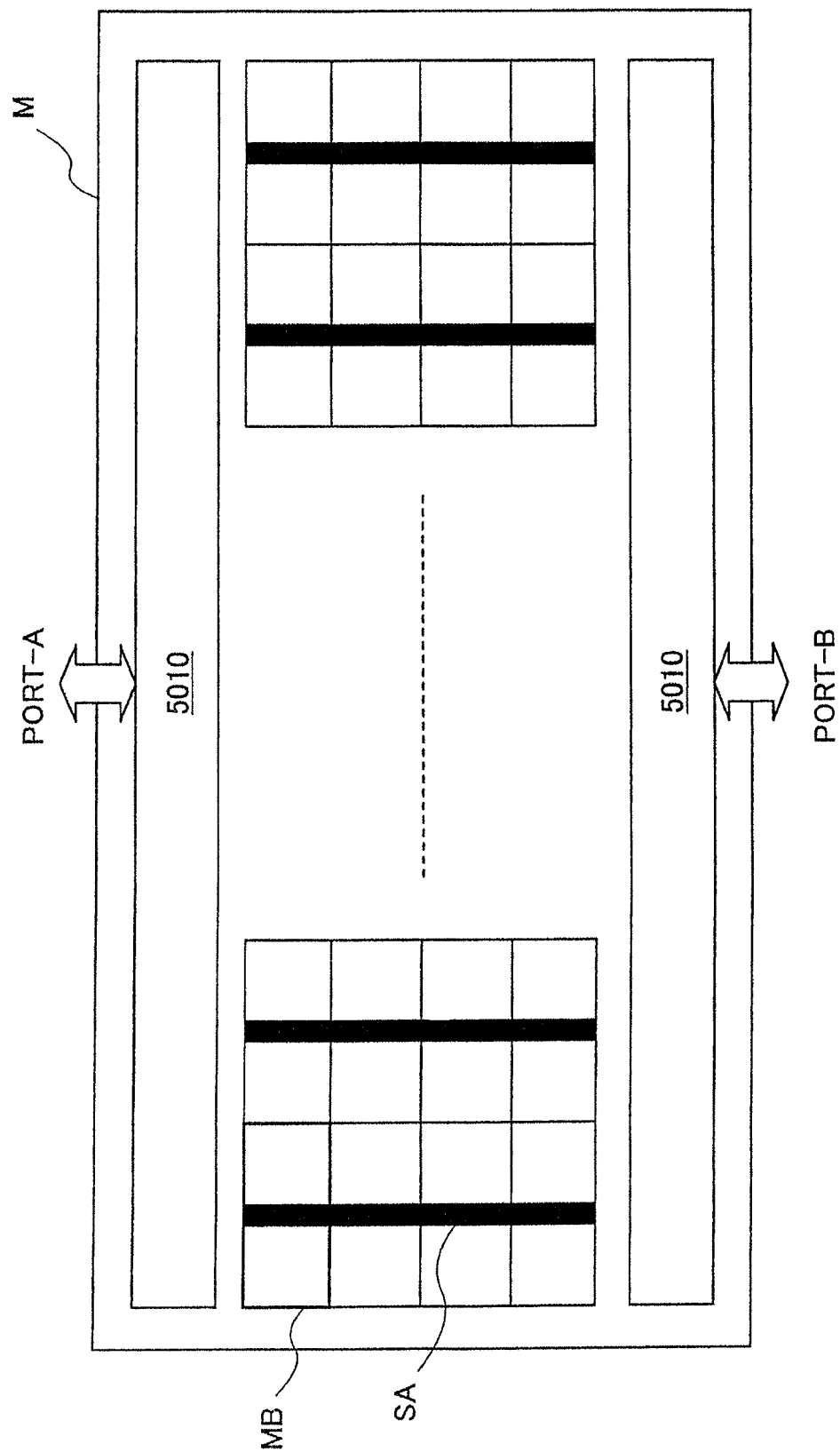

FIG. 123 shows a second embodiment of the multi-port memory and the method of controlling the multi-port memory according to the present invention (fifth aspect). The same elements as those of the first embodiment are referred to by the same numerals, and a detailed description thereof will be omitted.

In this embodiment, one memory block MB (illustrated as a thick-line frame in the figure) is formed one fourth of the size of the first embodiment. That is, the number of sense amplifiers activated simultaneously is one quarter of that of the first embodiment. Except for the size of the memory block MB, configurations are the same as the first embodiment. Since the multi-port memory M of FIG. 123 has fewer sense amplifiers driven simultaneously, power consumption at the time of memory operation is reduced.

This embodiment can produce the same advantages as the first embodiment described above. In addition, power consumption can be reduced in this embodiment.

Figure 124:
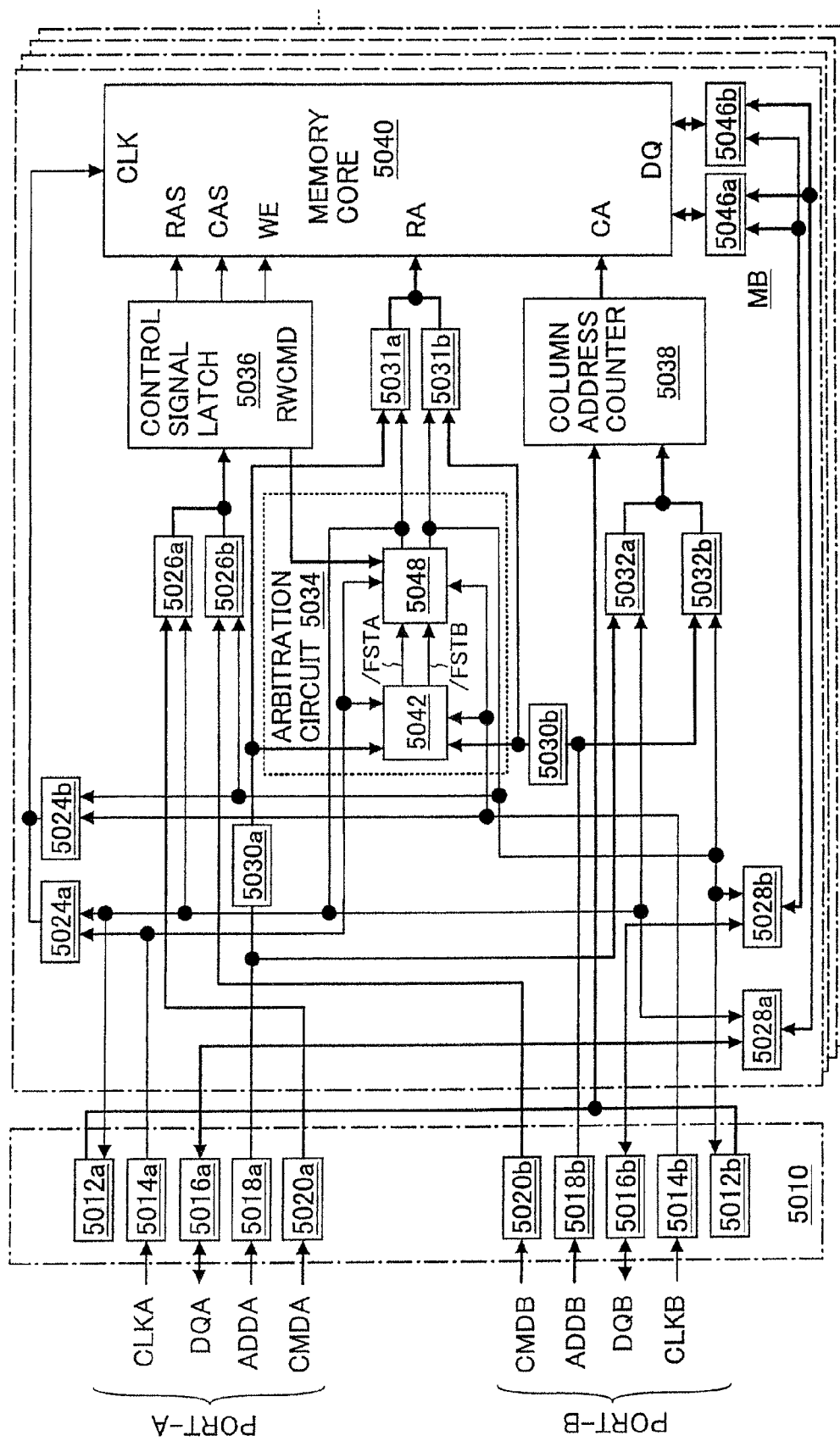

FIG. 124 shows a third embodiment of the multi-port memory and the method of controlling the multi-port memory according to the present invention (fifth aspect). The same elements as those of the first embodiment are referred to by the same numerals, and a detailed description thereof will be omitted.

In this embodiment, data registers (buffers) 5046a and 5046b that temporarily store respective data signals DQA and DQB between the data latches 5028 and the memory core 5040 are provided in each memory block MB. The data registers 5046a and 5046b operate in association with either one the input/output ports PORT-A and PORT-B. Moreover, the arbitration control circuit 5048 of the arbitration circuit 5034 is different from the arbitration control circuit 5044 of the first embodiment. The arbitration control circuit 5048 does not output the busy signals /BSYA and /BSYB, and no busy buffer is provided in the I/O circuit 5010. Other configurations are almost the same as that of the first embodiment. Namely, in the input/output ports PORT-A and PORT-B, the clock signals CLKA and CLKB, the address signals ADDA and ADDB, the command signals CMDA and CMDB, and the data signals DQA and DQB are transferred through clock terminals, address terminals, command terminals, and data input/output terminals, respectively. The memory block MB includes the DRAM memory core 5040, and further includes control circuitry, decoders, and the like, which are not illustrated. Memory cells include capacitors that store electric charge in accordance with values of data signals.

This multi-port memory M can perform memory operations with respect to both the input/output ports PORT-A and PORT-B even when the input/output ports PORT-A and PORT-B simultaneously receive a request for memory operation in respect of the same row address signals RA, as will be later described. Because of this, there is no need to output the busy signals /BSYA and /BSYB to the exterior of the device as in the first embodiment.

In each input/output ports PORT-A and PORT-B, intervals at which the active commands ACT are supplied are set equal to more than double the operation period of the memory core 5040 (according to timing specifications). If the intervals of the active commands ACT are smaller than the above-identified period in the same input/output port PORT-A (or PORT-B), the supplied active command ACT is cancelled. Intervals of the active commands ACT supplied to different input/output ports are not limited.

A read commands RD and a write command WR are supplied as in the first embodiment in synchronization with a particular timing of the clock signal following the timing that is used to receive the active command ACT. The memory core 5040 is automatically pre-charged following the operation thereof. In this embodiment, the cycle tCLK of the clock signals CLKA and CLKB is set to 10 ns, the burst length BL to 4, and the data latency DL to 4, for example. The data latency DL defines the number of clock cycles from the inputting of a read command RD to the outputting of data. The burst length BL and the data latency DL are set in the mode registers 5012a and 5012b.

Figure 125:
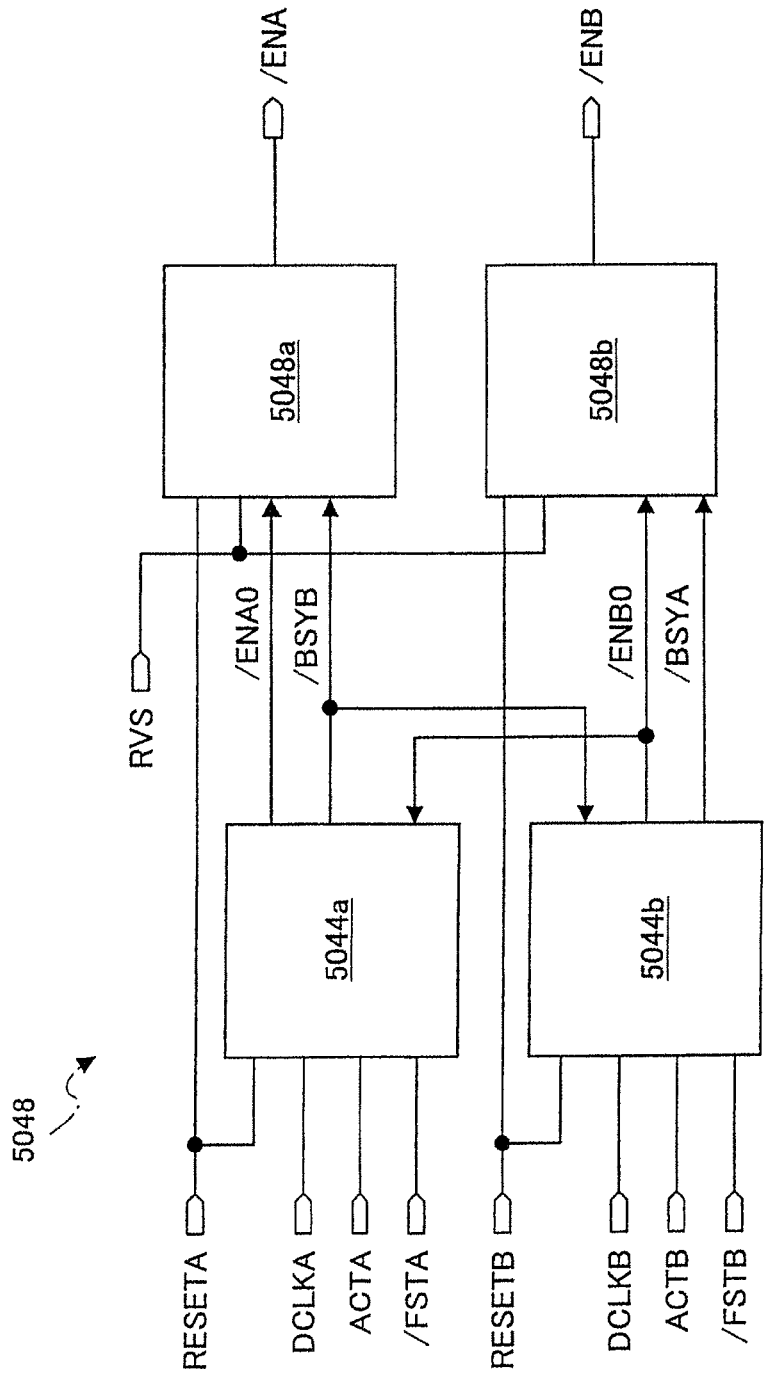

FIG. 125 shows details of the arbitration control circuit 5048.

The arbitration control circuit 5048 is configured by adding control circuits 5048a and 5048b to the control circuits 5044a and 5044b of the first embodiment, respectively. The control circuit 5048a corresponding to the input/output port PORT-A receives a reset signal RESETA and a reverse signal RVS as well as an enable signal /ENA0 and a busy signal/BSYB from the control circuit 5044a, and outputs an enable signal /ENA. The control circuit 5048b corresponding to the input/output port PORT-B receives a reset signal RESETB and a reverse signal RVS as well as an enable signal /ENB0 and a busy signal /BSYA from the control circuit 5044b, and outputs an enable signal /ENB. The enable signals /ENA0 and /ENB0 are generated at the same timing as the enable signals /ENA and /ENB of the first embodiment.

Figure 126:
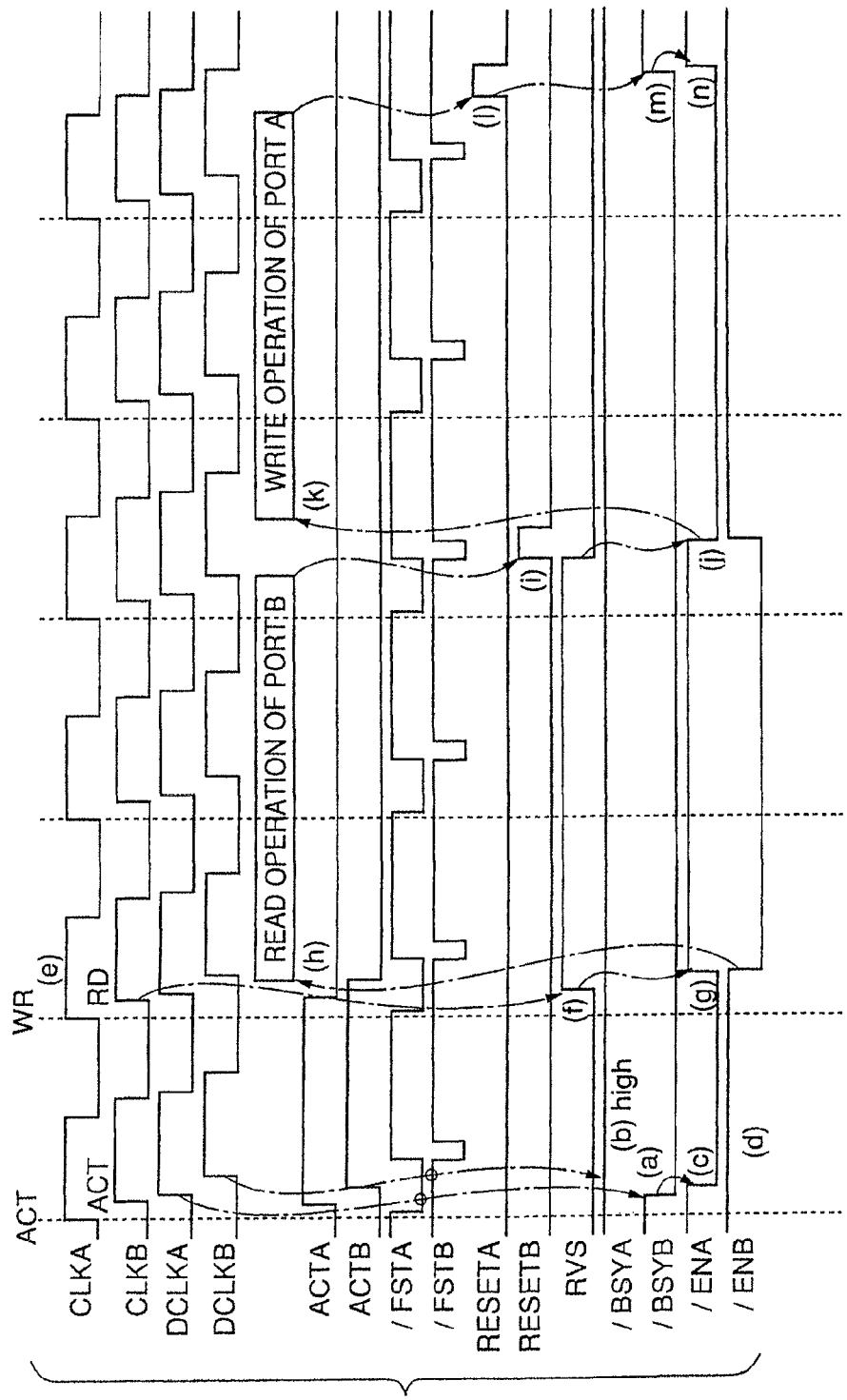

FIG. 126 shows operations of the arbitration control circuit 5048 performed when the row address signals supplied to the input/output ports PORT-A and PORT-B match each other. In this example, the cycles of clock signals CLKA and CLKB are the same. In synchronization with the clock signal CLKA, an active command ACT is supplied to the input/output port PORT-A. Immediately following this, an active command ACT is supplied to the input/output port PORT-B in synchronization with the clock signal CLKB. The controller, connected to the input/output port PORT-A requests a write operation, and the controller connected to the input/output port PORT-B requests a read operation.

Operations of the control circuits 5044a and 5044b are almost identical to those of the first embodiment (FIG. 119) previously described. The control circuit 5044a takes in the first-arrival signal /FSTA of a low level in synchronization with a rising edge of the delay clock signal DCLKA, and activates the busy signal /BSYB (FIG. 126-(a)). Since the control circuit 5044b acquires the first-arrival signal /FSTB of a high level in synchronization with a rising edge of the delay clock signal DCLKB, the busy signal /BSYA is not activated (FIG. 126-(b)). The control circuit 5048a responds to the activation of the busy signal/BSYB and the low level of the reverse signal RVS to activate the enable signal /ENA (FIG. 126-(c)). The control circuit 5048b responds to the deactivated state of the busy signal /BSYA and the low level of the reverse signal RVS to deactivate the enable signal /ENB (FIG. 126-(d)).

In synchronization with the next timing of the clock signals CLKA and CLKB, a write command WR and a read command RD are supplied, respectively (FIG. 126-(e)). In response to the write command WR and the read command RD, the control circuit (not shown) that generates the reverse signal RVS activates the reverse signal RVS (FIG. 126-(f)).

The control circuits 5048a and 5048b respond to the activation of the reverse signal RVS to switch the levels of the enable signals /ENA and /ENB (FIG. 126-(g)), respectively. Then, the read operation in respect of the input/output port PORT-B is performed first (FIG. 126-(h)). After the completion of the read operation, the reset signal RESETB is activated, and the reverse signal RVS is deactivated (FIG. 126-(i)). The control circuits 5048a and 5048b respond to the deactivation of the reverse signal RVS to return the levels of the enable signals /ENA and /ENB to their respective original levels (FIG. 126-(j)). Then, a read operation with respect to the input/output port PORT-A is performed (FIG. 126-(k)) in response to the activation of the enable signal /ENA.

After the completion of the read operation, the reset signal RESETA is activated (FIG. 126-(l)), and the busy signal /the BSYB is deactivated (FIG. 126-(m)). The control circuit 5048a deactivates the enable signal /ENA in response to the deactivation of the busy signal /BSYB (FIG. 126-(n)). In this manner in this embodiment, when the row address signals RA are the same, and when the command of the first arrival requests a write operation followed by the command of the second arrival requesting a read operation, the memory core 5040 is controlled such as to perform a read operation first. In memory LSIs such as DRAMs having a multi-port memory, a write operation is carried out by driving the memory core after receiving data to be written, and a read operation is performed by driving a memory core first and outputting data next. Because of this, when a read operation is performed after a write operation, total operation cycles usually become lengthy. In this embodiment, a read operation is carried out first when a write operation and a read operation compete with each other, thereby shortening total operation cycles and improving usage efficiency of the data bus that transfers data signals.

In the following, operations of the multi-port memory M according to the third embodiment will be described.

Figure 127:
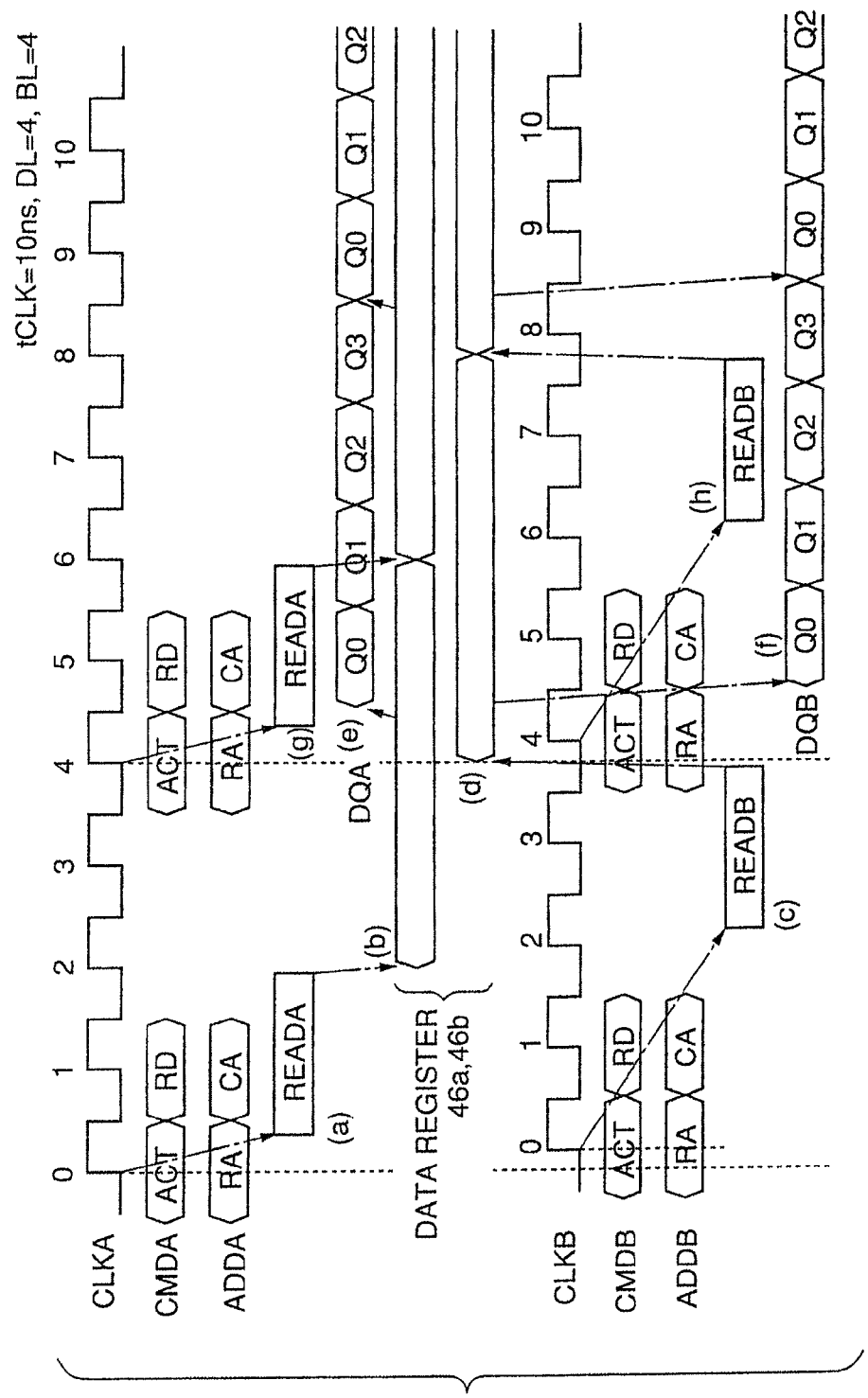

FIG. 127 shows the way a read operation is performed when the input/output ports PORT-A and PORT-B receive active commands ACT and the same row address signals RA. The phase of the clock signal CLKA is slightly ahead of the phase of the clock signal CLKB. Namely, inputting of an active command ACT to the input/output port PORT-A is slightly earlier than entering of an active command ACT in the input/output port PORT-B.

With respect to the input/output port PORT-A, a read operation READ is performed in response to the active command ACT (FIG. 127-(a)). Data read from memory cells are stored in the data register 5046a (or 5046b). With respect to the input/output port PORT-B, then, a read operation READ is performed in response to the active command ACT (FIG. 127-(b)). The read operation READB with respect to the input/output port PORT-B is performed after the completion of the read operation READA under the control of the arbitration circuit 5034 (FIG. 127-(c)). The data read from the memory cells through the read operation READB is stored in the data register 5046b (or 5046a) (FIG. 127-(d)). In this manner, even when the active command ACT and the same row address signals RA are supplied substantially simultaneously to the input/output ports PORT-A and PORT-B, a read operation (or a write operation) is successively performed with respect to each of the input/output ports PORT-A and PORT-B. The memory core 5040 automatically performs a pre-charge operation after the completion of each of the read operations READA and READB, thereby completing a memory cycle.

The retrieved data that are stored in the register 5046a corresponding to the input/output port PORT-A are successively output as output data Q0-Q3 after inputting of the read command RD in synchronization with the fifth to eighth clock signals CLKA shown in the figure (FIG. 127-(e)). The retrieved data that are stored in the register 5046 corresponding to the input/output port PORT-B are successively output as output data Q0-Q3 after inputting of the read command RD in synchronization with the fifth to eighth clock signals CLKB shown in the figure (FIG. 127-(f)).

Both the input/output ports PORT-A and PORT-B receive the next active command ACT 4 clocks after the first active command ACT, and perform further read operations READA and READB, respectively (FIG. 127-(g) and (h)). When the active commands ACT are supplied once in every four clock cycles, retrieved data can be continuously output without any gap (i.e., gapless read). Moreover, random access operations are attained by receiving active commands. ACT once in every four clock cycles.

Figure 128:
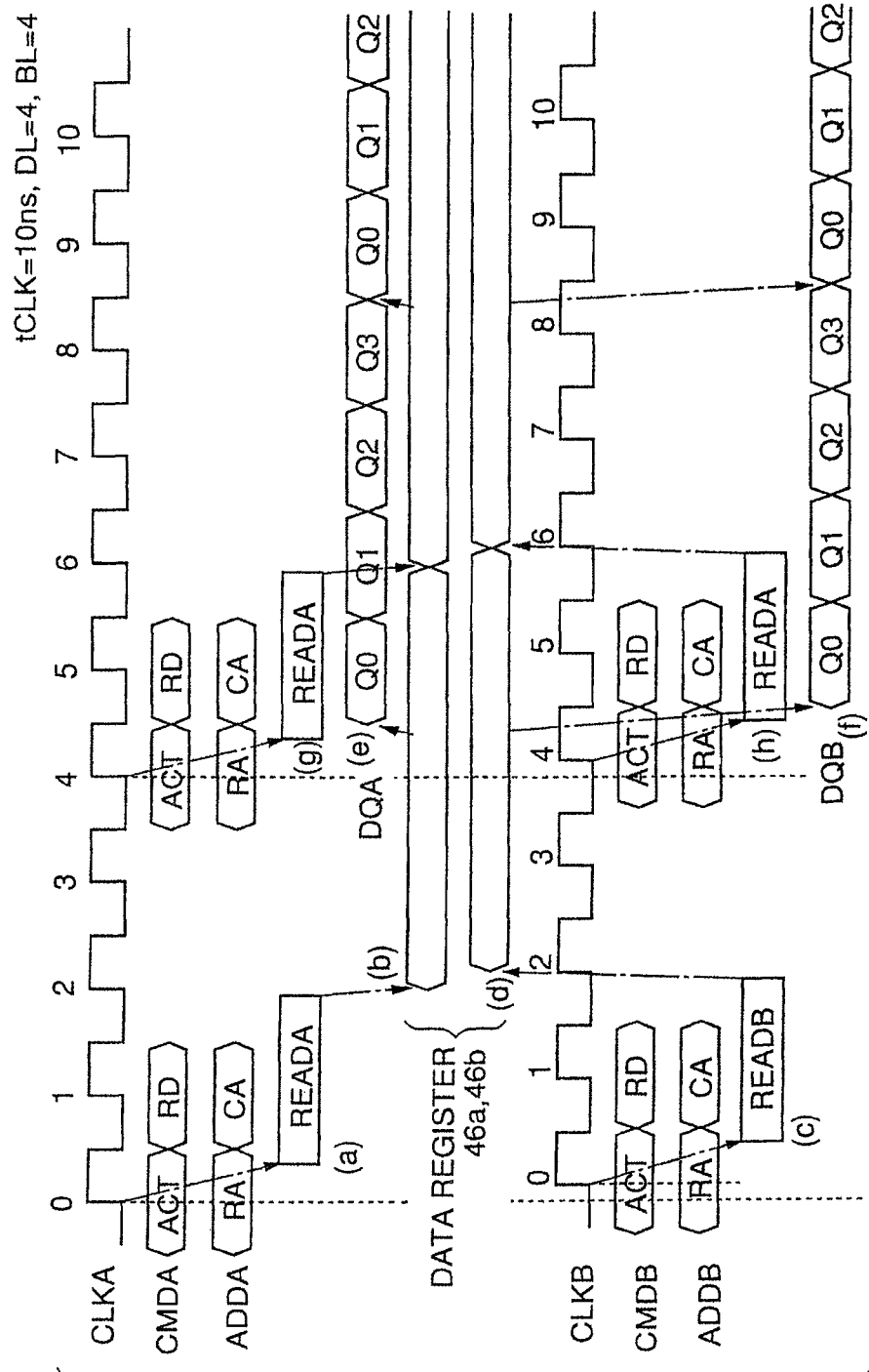

FIG. 128 shows the way a read operation is performed when active commands ACT and mutually different row address signals RA are supplied to the input/output ports PORT-A and PORT-B.

With respect to the input/output port PORT-A which has received an active command ACT and row address signals RA first, a read operation READA is performed in response to the active command ACT (FIG. 128-(a)). Data read from memory cells are stored in the data register 5046a (FIG. 128-(b)). With respect to the input/output port PORT-B, then, a read operation READB directed to another memory core 5040 different from the one for the read operation READA is performed in response to the active command ACT (FIG. 128-(c)). Namely, the read operation READA and the read operation READB are performed independently of the each other. Data read from memory cells by the read operation READB are stored in the data register 5046b (FIG. 128-(d)).

The retrieved data stored in the register 5046a are successively output as output data Q0-Q3 after inputting of the read command RD in synchronization with the fifth to eighth clock signals CLKA shown in the figure (FIG. 128-(e)). The retrieved data that are stored in the register 5046 corresponding to the input/output port PORT-B are successively output as output data Q0-Q3 after inputting of the read command RD in synchronization with the fifth to eighth clock signals CLKB shown in the figure (FIG. 128-(f)).

Both the input/output ports PORT-A and PORT-B receive the next active command ACT 4 clocks after the first active command ACT, and perform further read operations READA and READB, respectively (FIG. 128-(g) and (h)).

Figure 129:
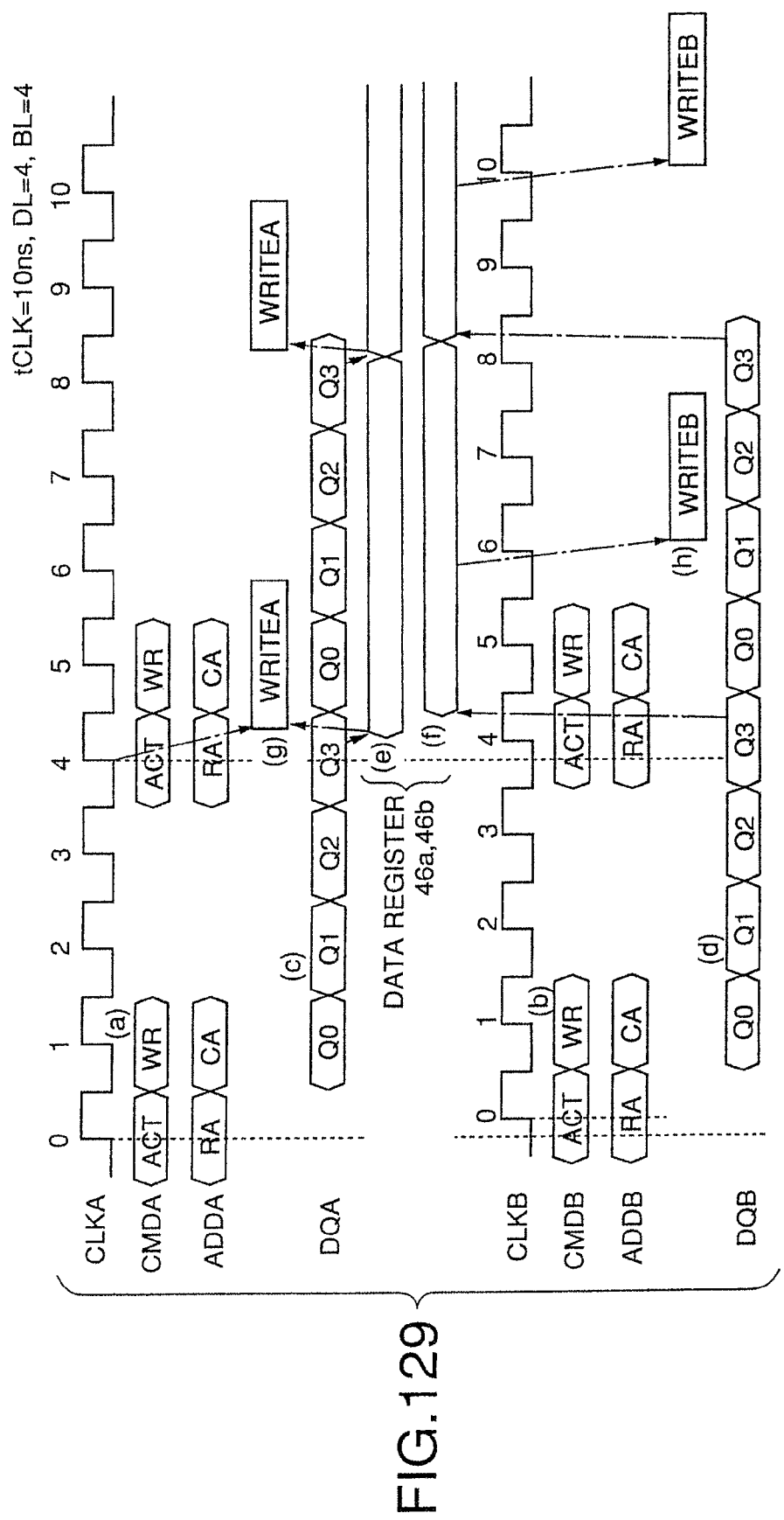

FIG. 129 shows the way a write operation is performed when the input/output ports PORT-A and PORT-B receive active commands ACT and the same row address signals RA.

In the input/output ports PORT-A and PORT-B, a write command WR, column address signals CA, and the first write data Q0 and Q0 are supplied (FIG. 129-(a) and (b)) in synchronization with a rising edge of the respective clock signals CLKA and CLKB next following the rising edge that is used to receive the active command ACT. Thereafter, write data Q1-Q3 and Q0-Q3 are supplied (FIG. 129-(c) and (d)) in synchronization with the respective clock signals CLKA and CLKB. The write data Q0-Q3 and Q0-Q3 are stored in the separate data registers 5046a and 5046b, respectively (FIG. 129-(e) and (f)). With respect to the input/output port PORT-A which received the active command ACT and the row address signals RA first, a write operation WRITEA is performed in synchronization with a particular timing of the clock signal CLKA that acquires the write data Q3 (FIG. 129-(g)). A write operation WRITEB corresponding to the input/output port PORT-B is performed after the completion of the write operation WRITEA (FIG. 129-(h)). Through the write operations WRITEA and WRITEB, the write data Q0-Q3 and Q0-Q3 stored in the respective data registers 5046a and 5046b are written in memory cells corresponding to the column address signals CA, thereby completing the write operations.

In write operations also, a set of write data is supplied once in every four clock cycles, so that the write data can be continuously entered without any gap (i.e., gapless write).

FIG. 130 shows a case in which a write operation and a read operation are successively performed with respect to the input/output port PORT-A and a write operation directed to the same row address signals RA as those of the write operation of the input/output port PORT-A and a write operation directed to the same row address signals RA as those of the read operation of the input/output port PORT-A are consecutively performed with respect to the input/output port PORT-B. The timing of the first write operation is the same as that of FIG. 127, and a description thereof will be omitted.

In the input/output port PORT-B, an active command ACT corresponding to the second write operation is supplied at the same timing as FIG. 127 (FIG. 130-(a)). Since a command signal CMDA is not supplied to the input/output port PORT-A, a write operation WRITEB is performed immediately after the acquisition of write data Q0-Q3 (FIG. 130-(b)).

In the input/output port PORT-A, a next active command ACT is supplied in synchronization with the 7-th clock signal CLKA shown in the figure (FIG. 130-(c)). Although not illustrated, the enable signal /ENB with respect to the input/output port PORT-B is activated at this particular instant. As a result, a read operation READA is performed after the completion of the write operation WRITEB (FIG. 130-(d)). Since the multi-port memory M carries out the write operation WRITEB and the read operation READA in the order in which the respective commands are received, there is no chance of data of memory cells being read before the write operation is completed.

In addition, since the input/output port PORT-A can output as retrieved data the data stored in the data register 5046b that corresponds to the input/output port PORT-B, it is possible to perform the read operation READA of the input/output port PORT-A ahead of the write operation WRITEB of the input/output port PORT-B.

FIG. 131 shows a case in which a write operation and a read operation are successively performed with respect to the input/output port PORT-A and a read operation directed to the same row address signals RA as those of the write operation of the input/output port PORT-A and a write operation directed to the same row address signals RA as those of the read operation of the input/output port PORT-A are consecutively performed with respect to the input/output port PORT-B. The timing of the first write operation for the input/output port PORT-A and the timing of the first read operation for the input/output port PORT-B are the same as the write operation of FIG. 129 and the read operation of FIG. 128, respectively.

In the input/output port PORT-A, an active command ACT and a read command RD are supplied in synchronization with the 7th and 8th clock signals CLKA shown in the figure (FIG. 131-(a)). Since an active command ACT is not supplied to the input/output port PORT-B at this particular instant, a read operation READA with respect to the input/output port PORT-A is performed (FIG. 131-(b)).

Next, in the input/output port PORT-B, an active command ACT and a write command WR are supplied in synchronization with the 8th and 9th clock signals CLKB shown in the figure (FIG. 131-(c)). After receiving data Q0-Q3, a write operation (not shown) with respect to the input/output port PORT-B is performed.

FIG. 132 shows operations performed when the row address signals RA supplied to the input/output ports PORT-A and PORT-B match each other in the case of the clock signals CLKA and CLKB having different clock cycles. In this example, the cycle of the clock signal CLKB is twice as long as the cycle of the clock signal CLKA.

In the input/output port PORT-A, a set of an active command ACT and a read command RD is supplied once in every four clock cycles, and read operations are performed in the same manner as in FIG. 127. In the input/output port PORT-B also, a set of an active command ACT and a read command RD is supplied once in every four clock cycles. Inputting of the first active command ACT to the input/output port PORT-B is later than inputting of the first active command ACT to the input/output port PORT-A (FIG. 132-(a)). Because of this, a read operation READB is performed after the read operation READA as in the case of FIG. 127 (FIG. 132-(b)). A next read operation READB responding to the following active command ACT of the input/output port PORT-B is carried out between two read operations READA (FIG. 132-(c)).

This embodiment can provide the same advantages as the first embodiment previously described. In addition, this embodiment uses the interval (according to timing specifications) of active commands ACT that is more than double the operation cycle of the memory core 5040 in each of the input/output ports PORT-A and PORT-B. Because of this, even when the row address signals RA supplied to the input/output ports PORT-A and PORT-B are the same, a read operation and a write operation can surely be performed with respect to each port. Accordingly, the controller that controls the multi-port memory M does not need to detect the busy state of the multi-port memory M. Control of the controller (in terms of hardware and software) is thus simplified.

FIG. 133 shows a fourth embodiment of the multi-port memory and the method of controlling the multi-port memory according to the present invention (fifth aspect). The same elements as those of the first and third embodiments are referred to by the same numerals, and a description thereof will be omitted.

In this embodiment, page buffers 5050a and 5050b are provided in place of the data registers 5046a and 5046b of the third embodiment described above. The page buffers 50a and 50b operate in association with at least one of the input/output port PORT-A and PORT-B. Other configurations are almost the same as those of the third embodiment.

The page buffers 5050a and 5050b each include a latch, which stores therein data of all memory cells in the memory core 5040. At the start of a read operation and a write operation, data stored in the memory cells of a selected memory core 5040 are read to the page buffer 50a (or 50b). In read operation, the data latched in the page buffer 5050a are output as data signals in response to column address signals CA. In write operation, data signals are written in the page buffer 5050a first according to column address signals CA. Thereafter, the data of the page buffer 5050a are written in memory cells at the time of completion of write operation.

In the following, operations of the multi-port memory M of the fourth embodiment will be described.

FIG. 134 shows the way a read operation is performed when the input/output ports PORT-A and PORT-B receive active commands ACT and the same row address signals RA. The phase of the clock signal CLKA is slightly ahead of the phase of the clock signal CLKB. Namely, an active command ACT input to the input/output port PORT-A is slightly earlier than the active command ACT input to the input/output port PORT-B.

In the input/output port PORT-A, a read operation READA is performed in response to the active command ACT (FIG. 134-(a)). Data are read from all the memory cells of a memory core 5040 selected by the read operation READA, and the retrieved data are stored in one of the page buffers 5050a (or 5050b) (FIG. 134-(b)). In the input/output port PORT-B, on the other hand, the row address signals RA are the same as those supplied to the input/output port PORT-A, so that a read operation responding to the active command ACT is not performed.

In the input/output port PORT-A, a read command RD is supplied in synchronization with the 1st and 5th clock signals CLKA shown in the figure (FIG. 134-(c) and (d)). The data stored in the page buffer 5050a are successively output as output data Q0-Q7 in synchronization with the 5th through 12th clock signals CLKA after receiving the respective read commands RD (FIG. 134-(e)). That is, a page read operation is performed.

By the same token, in the input/output port PORT-B, read commands RD are supplied in synchronization with the 1st and 5th clock signals CLKB shown in the figure (FIG. 134-(f) and (g)). The data stored in the page buffer 5050a are successively output as output data Q0-Q7 in synchronization with the 5th through 12th clock signals CLKB after receiving the respective read commands RD (FIG. 134-(h)). In this manner, if the row address signals RA are the same, one page buffer 5050a (or 5050b) is shared by the input/output ports PORT-A and PORT-B.

Both the input/output ports PORT-A and PORT-B receive a next active command ACT 8 clock cycles after the first active command ACT (FIG. 134-(i) and (j)). Since the row address signals RA are the same, only a read operation READA is performed (FIG. 134-(k)). A read operation READB with respect to the input/output port PORT-B is not performed. Read data can be output continuously without any gap by supplying read commands RD once in every four clock cycles (i.e., gapless read).

FIG. 135 shows the way a read operation is performed when active commands ACT and different row address signals RA are supplied to the input/output ports PORT-A and PORT-B. The timing of read operations responsive to the input/output port PORT-A is the same as that of FIG. 134.

In the input/output port PORT-A that receives an active command ACT and row address signals RA first, a read operation READA is performed in response to the active command ACT (FIG. 135-(a)). Data read from all the memory cells of the memory core 5040 are stored in the page buffer 5050a (FIG. 134-(b)).

In the input/output port PORT-B, a read operation READB is performed in response to an active command ACT with respect to a memory core 5040 different from that of the read operation READA (FIG. 135-(c)). Data read from all the memory cells of the memory core 5040 by the read operation READB are stored in the page buffer 5050*b* (FIG. 135-(*d*)). After this, a read operation is performed in the same manner as was described in connection with FIG. 134. In this manner, when the row address signals RA are different from each other, the read operation READA and the read operation READB are independently performed, and the retrieved data are stored in the separate page buffers 5050*a* and 5050*b*, respectively.

FIG. 136 shows a case in which active commands ACT and the same row address signals RA are supplied to the input/output ports PORT-A and PORT-B, and write operations are performed, followed by active commands ACT and different row address signals RA being supplied, resulting in write operations being performed.

In the input/output ports PORT-A and PORT-B, active commands ACT and the same row address signals RA are supplied in synchronization with respective rising edges of the clock signals CLKA and CLKB. The arbitration circuit 5034 shown in FIG. 133 ascertains that the input/output port PORT-A receives the active command ACT first, and performs a read operation READA (FIG. 136-(*a*)) in order to transfer data to the page buffer 5050*a* (or 5050*b*) from memory cells.

Data are read from all the memory cells of the memory core 5040 selected by the read operation READA, and are stored in the page buffer 5050*a* (or 5050*b*) (FIG. 136-(*b*)). In the input/output port PORT-B, on the other hand, a read operation is not performed in response to the active command ACT since the row address signals RA are the same as those supplied to the input/output port PORT-A.

Thereafter, in the input/output port PORT-A, write commands WR and column address signals CA are supplied in synchronization with the 1st and 5th clock signals CLKA shown in the figure (FIG. 136-(*c*) and (*d*)). Write data Q0-Q7 successively supplied in synchronization with the clock signal CLKA are written in the page buffer 5050*a* (FIG. 136-(*e*)). That is, a page write operation is performed.

In the input/output port PORT-B, write commands WR and column address signals CA are supplied in synchronization with the 1st and 5th clock signals CLKB shown in the figure (FIG. 136-(*f*) and (*g*)). Write data Q0-Q7 supplied one after another in synchronization with the clock signal CLKB are written in the common page buffer 5050*a* (FIG. 136-(*h*)). In this manner, if the row address signals RA are the same, the same page buffer 5050*a* (or 50*b*) is shared by the input/output ports PORT-A and PORT-B in the write operation.

In the input/output port PORT-A which received the active command ACT first, a write operation WRITEA is performed in synchronization with a particular timing of the clock signal CLKA at which the write data Q7 is acquired (FIG. 136-(*i*)). A write operation WRITEB corresponding to the input/output port PORT-B is performed after the completion of the write operation WRITEA (FIG. 136-(*j*)).

After this, in the input/output ports PORT-A and PORT-B, active commands ACT and mutually different row address signals RA are supplied in synchronization with the respective rising edges of the clock signals CLKA and CLKB. The arbitration circuit 5034 shown in FIG. 133 ascertains that the active command ACT is supplied to the input/output port PORT-A first, and performs read operations READA and READB one after another (FIG. 136-(*k*) and (*l*)). Data are read from all the memory cells of the memory core 5040 selected by the read operation READA, and are stored in the page buffer 5050*a* (or 5050*b*) (FIG. 136-(*m*)). Further, data are read from all the memory cells of the memory core 5040 selected by the read operation READB, and are stored in another page buffer 5050*b* (or 5050*a*) (FIG. 136-(*n*)).

In the input/output port PORT-A, read commands RD and column address signals CA are supplied in synchronization with the 13th and 17th clock signals CLKA shown in the figure (FIG. 136-(*o*) and (*p*)). Write data Q0-Q7 supplied one after another in synchronization with the clock signal CLKA are stored in the page buffer 5050*a* (FIG. 136-(*q*)).

Similarly, in the input/output port PORT-B, write commands WR and column address signals CA are supplied in synchronization with the 13th and 17th clock signals CLKB illustrated in the figure (FIG. 136-(*r*) and (*s*)). Write data Q0-Q7 supplied one after another in synchronization with the clock signal CLKB are written in the page buffer 5048*b* (FIG. 136-(*t*)). In this manner, the page buffers 5050*a* and 5050*b* are used when the row address signals RA are different.

In the input/output port PORT-A which received the active command ACT and the row address signals RA first, a write operation WRITEA is performed in synchronization with a particular timing of the clock signal CLKA at which the write data Q7 is acquired (FIG. 136-(*u*)). A write operation WRITEB corresponding to the input/output port PORT-B is performed after the completion of the write operation WRITEA (FIG. 136-(*v*)). Through the write operations WRITEA and WRITEB, the write data Q0-Q7 stored in the page buffers 5050*a* and 5050*b*, respectively, are written in the memory cells corresponding to the column address signals CA, thereby completing the write operation.

FIG. 137 shows a case in which active commands ACT and the same row address signals RA are supplied to the input/output ports PORT-A and PORT-B, and write operations are performed, followed by active commands ACT and the same row address signals RA being supplied, resulting in a read operation being performed in the input/output port PORT-A and a write operation being performed in the input/output port PORT-B. The timing of the first write operation is the same as that of FIG. 137, and a description thereof will be omitted.

In the input/output ports PORT-A and PORT-B, active commands ACT and the same row address signals RA are supplied in synchronization with the respective rising edges of the 12th clock signals CLKA and CLKB shown in the figure (FIG. 137-(*a*) and (*b*)). The arbitration circuit 5034 shown in FIG. 133 ascertains that the active command ACT is supplied to the input/output port PORT-A first, and performs a read operation READA (FIG. 137-(*c*)). Data are read from all the memory cells of the memory core 5040 selected by the read operation READA, and are stored in the page buffer 5050*a* (or 5050*b*) (FIG. 137-(*d*)). In the input/output port PORT-B, a write operation responding to the active command ACT is not performed since the row address signals RA are the same as the signals supplied to the input/output port PORT-A.

After this, in the input/output port PORT-A, read commands RD are supplied in synchronization with the 13th and 17th clock signals CLKA shown in the figure (FIG. 137-(*e*) and (*f*)). The data stored in the page buffer 5050*a* are successively output as output data Q0-Q7 in synchronization with the 17th through 24th clock signals CLKA as shown in the figure after receiving respective read commands RD (FIG. 137-(*g*)).

In the input/output port PORT-B, write commands WR are supplied in synchronization with the 13th and 17th clock signals CLKB as shown in the figure (FIG. 137-(*h*) and (*i*)). Write data Q0-Q7 successively supplied in synchronization with the clock signal CLKB are stored in the page buffer 5050*a* of shared use (FIG. 137-(*j*)).

In the input/output port PORT-B, thereafter, a write operation WRITEB is performed in synchronization with a particular timing of the clock signal CLKB at which the write data Q7 is acquired (FIG. 137-(k)).

FIG. 138 shows a case in which active commands ACT and the same row address signals RA are supplied to the input/output ports PORT-A and PORT-B, and a write operation and a read operation are performed, followed by active commands ACT and different row address signals RA being supplied, resulting in a write operation and a read operation being performed.

In the input/output ports PORT-A and PORT-B, active commands ACT and the same row address signals RA are supplied in synchronization with the rising edges of clock signals CLKA and CLKB (FIG. 138-(a) and (b)). The arbitration circuit 5034 determines that an active command ACT is supplied to the input/output port PORT-A first, and performs a read operation READA (FIG. 138-(c)). Data are read from all the memory cells of the memory core 5040 chosen by the read operation READA, and the read data are stored in the page buffer 5050a (or 5050b) (FIG. 138-(d)). In the input/output port PORT-B, on the other hand, the row address signals RA are the same as those supplied to the input/output port PORT-A, so that a read operation responding to the active command ACT is not performed.

After this, in the input/output port PORT-A, write commands WR are supplied in synchronization with the 1st and 5th clock signals CLKA (FIG. 138-(e) and (f)). Write data Q0-Q7 successively supplied in synchronization with the clock signal CLKA are stored in the page buffer 5050a (FIG. 138-(g)).

In the input/output port PORT-B, read commands RD are supplied in synchronization with the 1st and 5th clock signals CLKB (FIG. 138-(h) and (i)). The data stored in the page buffer 5050a are output as output-data Q0-Q7 one after another in synchronization with the 5th through 12th timings of the clock signal CLKB after receiving the respective read commands RD (FIG. 138-(j)). In the input/output port PORT-A, a write operation WRITEA is performed in synchronization with a particular timing of the clock signal CLKA at which the write data Q7 is acquired (FIG. 138-(k)).

Then, in the input/output ports PORT-A and PORT-B, active commands ACT and mutually different row address signals RA are supplied in synchronization with the rising edges of the clock signals CLKA and CLKB (FIG. 138-(l) and (m)). The arbitration circuit 5034 ascertains that the active command ACT is supplied to the input/output port PORT-A first, and successively performs read operations READA and READB (FIG. 138-(n) and (o)). Data are read from all the memory cells of the memory core 5040 selected by the read operation READA, and the read data are stored in one of the page buffers 5050a (or 5050b) (FIG. 138-(p)). Further, data are read from all the memory cells of the memory core 5040 selected by the read operation READB, and the read data are stored in the other one of the page buffers 5050b (or 5050a) (FIG. 138-(q)).

In the input/output port PORT-A, write commands WR are supplied in synchronization with 13th and 17th timings of the clock signal CLKA (FIG. 136-(r) and (s)). Write data Q0-Q7 supplied one after another in synchronization with the clock signal CLKA are written in the page buffer 5050a (FIG. 138-(t)).

Similarly, in the input/output port PORT-B, write commands WR are supplied in synchronization with the 13th and 17th timings of the clock signal CLKB (FIG. 136-(u) and (v)). Write data Q0-Q7 supplied one after another in synchronization with the clock signal CLMB are written in the page buffer 5050b (FIG. 136-(w)).

This embodiment can provide the same advantages as the third embodiment previously described. In this embodiment, further, the page buffers 5050a and 5050b serving as a temporary data storage for all the memory cells of a memory core 5040 are situated between the data latch 28 and the memory core 5040. This makes it possible for the multi-port memory M to perform a page read operation and a page write operation.

When the same row address signals RA are supplied to the input/output ports PORT-A and PORT-B, one and the same page buffer 5050a is shared. This prevents data to be written in the memory cells from being destroyed through overwriting operations.

When the same row address signals RA are supplied to the input/output ports PORT-A and PORT-B, a read operation is performed only in response to one of the ports. Because of this, power consumption during the operation can be reduced compared with a case in which respective read operations are performed with respect to both ports. Use of the page buffers 5050a and 5050b eliminates a need for the controller controlling the multi-port memory M to detect a busy state of the multi-port memory M even when a page operation is performed. Consequently, the control (in terms of hardware and software) of the controller or the like becomes easier.

FIG. 139 shows operations of the multi-port memory M according to a fifth embodiment of the multi-port memory and the method of controlling the multi-port memory of the present invention. The same elements as those of the fourth embodiment are referred to by the same numerals, and a detailed description thereof will be omitted.

This embodiment is provided with a read command RD and a write command WR both for ordinary burst operations and a read command PRD and a write command PWR both for page operations. The circuit configuration of the multi-port memory M is substantially the same as that of the fourth embodiment.

In FIG. 139, active commands ACT and the same row address signals RA are supplied to the input/output ports PORT-A and PORT-B (FIG. 139-(a) and (b)). In synchronization with the next cycle of the clock signals CLKA and CLKB, read commands PRD are supplied (FIG. 139-(c) and (d)), and a page read operation is performed (FIG. 139-(e)). Timings of page read operation are the same as those of FIG. 134, and a detailed description thereof will be omitted.

Thereafter, active commands ACT and the same row address signals RA are supplied to the input/output ports PORT-A and PORT-B (FIG. 139-(f) and (g)). In synchronization with the next cycle of the clock signals CLKA and CLKB, read commands RD are supplied (FIG. 139-(h) and (i)). Read operations READA and READB are successively performed with respect to the respective input/output ports PORT-A and PORT-B (FIG. 139-(j) and (k)). That is, ordinary read operations (i.e., burst read operations) are performed.

This embodiment can provide the same advantages as the fourth embodiment previously described. Since this embodiment prepares commands PRD and PWR for page operations as well as commands RD and WR for ordinary operations, the multi-port memory M can perform not only page operations but also normal operations in response to the supplied command signals.

The embodiments described above have been directed to an example in which the present invention is applied to a multi-port memory of an address multiplexing type that multiplexes address signals. This invention is not limited to these particular embodiments. For example, the present invention may be applied to a multi-port memory of an address non-multiplexing type that receives address signals at once.

The embodiments described above have been directed to an example in which the present invention is applied to the multi-port memory M having two input/output ports PORT-A and PORT-B. This invention is not limited to these embodiments. For example, the present invention may be applied to a multi-port memory having four input/output ports. In this case, intervals of supplied active commands ACT (according to timing specifications) is set equal to or more than 4 times as long as the operation period of a memory core.

In the embodiments described above, a description has been given with regard to an example in which the present invention is applied to a multi-port memory that has a synchronous DRAM memory core. This invention is not limited to this form of embodiment. For example, the present invention may be applied to a multi-port memory that has a synchronous SRAM memory core.

In the multi-port memory described above, further, a request for a memory core operation may be input as a command signal. Such a command signal is supplied to the command terminal of an input/output port in synchronization with the clock signal. The command signal may be divided into an active command for activating a specific memory area of the memory block and an action command indicative of either a read operation or a write operation to be performed in this memory area, and these commands may be successively supplied. By the same token, address signals may also be supplied one after another on a time-sharing basis. A read operation cycle and a write operation cycle are fixed to constant cycles by supplying the action command predetermined clock cycles after the supply of an active command.

Refresh operations are needed if the memory cells of memory blocks are made of DRAM cells. Refresh operations are performed with respect to refresh addresses that are indicated by address signals supplied any one of the input/output ports. This configuration can minimize the size of the control circuit provided in the multi-port memory, thereby reducing the chip size.

A precharge operation that resets bit lines connected to the memory cells to a predetermined voltage is automatically performed after a read operation and a write operation. This makes it possible to complete the read operation and the write operation within a predetermined time period from the start of the respective operations. That is, a read cycle time and a write cycle time can be fixed to be constant.

Moreover, a busy terminal may be provided for each input/output port to output a busy signal. Such a busy signal is output when address signals supplied to one of the input/output ports are the same as those supplied to another one of the input/output ports and when a memory operation is carried out with respect to the latter input/output port. With this configuration, a controller connected to the multi-port memory readily knows that the requested operation has not been performed.

Further, the present invention is not limited to these embodiments, but various variations and modifications may be made without departing from the scope of the present invention.

For example, the first through fifth aspects of the present invention have been described with reference to a configuration in which only one of a rising edge and a falling edge is used for the synchronization purpose. It is apparent to those skilled in the art, however, that any one of the configurations described above can be easily and readily modified to match DDR (double data rate) operations in which both the rising edge and the falling edge are used for the synchronization purpose. Such an apparent modification is intended to fall within the scope of the present invention.

[Sixth Aspect of the Invention]

In the following a sixth aspect of the present invention will be described.

FIG. 140 is a drawing showing an example of the configuration of a dual-port semiconductor memory device according to the present invention.

The dual-port semiconductor memory 6010 of FIG. 140 includes a command buffer 6011, an address buffer 6012, a data input output buffer 6013, a data hold buffer 6014, an address decoder 6015, a command buffer 6021, an address buffer 6022, a data input output buffer 6023, a data hold buffer 6024, an address decoder 6025, an arbitration logic 6031, a timing generator 6032, a column decoder 6033, a cell array 6034, a word decoder 6035, a data-bus-amplifier-&-write-amplifier unit 6036, a switch 6037, a switch 6038, an internal address-generation circuit 6039, and a refresh timing generation circuit 6040.

The command buffer 6011, the address buffer 6012, and the data input output buffer 6013 together make up a left-hand-side port L-port, and the data hold buffer 6014 and the address decoder 6015 are provided for the port L-port. The command buffer 6021, the address buffer 6022, and the data input output buffer 6023 together make up a right-hand-side port R-port, and the data hold buffer 6024 and the address decoder 6025 are provided for the port R-port. Further, the cell array 6034 includes DRAM-type memory cells (volatile memory cells), which consist of memory capacitors.

In the port L-port, the command buffer 6011 receives control signals and a clock signal from the exterior of the device, and supplies them to the timing generator 6032 through the arbitration logic 6031. The address buffer 6012 receives address signals from the exterior of the device, and supplies the address signals to the address decoder 6015 at proper timing. The address decoder 6015 decodes the received address and supplies the decoded address to the timing generator 6032.

In the port R-port, the command buffer 6021 receives control signals and a clock signal from the exterior of the device, and supplies them to the timing generator 6032 through the arbitration logic 6031. The address buffer 6022 receives address signals from the exterior of the device, and supplies the address signals to the address decoder 6025 at proper timing. The address decoder 6025 decodes the received address and supplies the decoded address to the timing generator 6032.

The arbitration logic 6031 determines the priority of access requests between the port L-port and the port R-port according to the control signals received through the port L-port and the port R-port. For example, access requests are selected and given priority in the order of arrivals to the ports.

The timing generator 6032 receives the control signals and clock signals from the ports L-port and R-port through the arbitration logic 6031, and generates timing signals for controlling various operations. These timing signals are supplied to the core circuit and surrounding circuitries such as the column decoder 6033, the cell array 6034, the word decoder 6035, the data-bus-amplifier-&-write-amplifier unit 6036, the switch 6037, and the switch 6038. Further, the timing generator 6032 holds the supplied decoded address, and supplies it to the column decoder 6033 and the word decoder 6035 at proper timing.

The word decoder 6035 activates a word line corresponding to the word specified by the decoded address, and supplies data to sense amplifiers through bit lines where the data is chosen by a column line from data of memory cells connected to the activated word line. The word lines, the bit line, the sense amplifiers, and so on are formed in the cell array 6034. The column decoder 6033 activates a column selection line corresponding to the column specified by the decoded address, and couples to a data bus the sense amplifiers connected to the activated column selection line. Through this data bus, data transfer is conducted between the sense amplifiers and the data-bus-amplifier-&-write-amplifier unit 6036.

The data bus amplifier of the data-bus-amplifier-&-write-amplifier unit 6036 supplies the retrieved data to either the data input output buffer 6013 or the data input output buffer 6023 through the switch 6038. Choice of either one of the data input output buffers as a data destination is made by taking into account which one of the ports has received the access for the retrieved data. The data input output buffer 6013 or 6023 supplies the retrieved data to the exterior of the dual-port semiconductor-memory device 6010.

The data input output buffer 6013 or 6023 also receives data to be written from the exterior of the device. The data are written in the memory cells selected by a column line among memory cells corresponding to the selected word after traveling through the write amplifier of the data-bus-amplifier-&-write-amplifier unit 6036, the data bus, sense amplifiers, and bit lines. Selection of one of the port L-port and the port R-port at the time of write operation is made by the switch 6037. Further, the data hold buffers 6014 and 6024 are provided for the port L-port and the port R-port, respectively, for the purpose of performing a late-write operation.

In the late-write operation, data and an address provided from the exterior of the device are temporarily stored in buffers, and the data stored in the buffers are written in the memory cells at the next write operation. Namely, the data and address supplied from the exterior of the device at a given write operation are temporarily stored in buffers, and the data stored in the buffers are written during the next write operation in the memory cells specified by the address stored in the buffers. Data and an address newly provided at the second write operation are temporarily stored in the buffers in the like manner, thereby preparing for the following write operation. In this manner, the actual writing of data in memory cells is delayed from a given write operation to the next write operation, thereby making it possible to access the memory core at the start of the next write operation cycle. This provides an interface that is compatible to the SRAM interface.

The refresh timing generation circuit 6040 includes an oscillator 6041 and a divider 6042. The oscillator 6041 generates pulses by oscillation. The generated pulses are subjected to frequency division by the divider 6042, thereby generating a refresh activation signal at constant refresh intervals.

The internal address-generation circuit 6039 responds to a refresh activation signal by generating addresses at which refresh operations are to be performed, and supplies these addresses to the address decoder 6015. The refresh activation signal is also supplied to the timing generator 6032. The timing generator 6032 responds to the refresh activation signal by generating timing pulses for performing refresh operations at proper timing, and supplies the timing pulses to the column decoder 6033, the word decoder 6035, etc.

In this manner, a refresh command is automatically generated inside the dual-port semiconductor-memory device 6010, thereby making it possible to perform refresh operations at constant intervals with respect to the cell array 6034.

Moreover, the dual-port semiconductor memory device 6010 according to the present invention is configured to supply a Busy signal to the exterior of the device if accesses to the same bank are simultaneously made through the port L-port and the port R-port.

FIG. 141 is a block diagram showing the configuration of the timing generator 6032 in relation to the generation of Busy signals.

As shown in FIG. 141, the timing generator 6032 includes a plurality of timing generator units 6051 provided separately for respective banks #0 through #n. A bank activation signal generated based on an address input into the port L-port or the port R-port is supplied from the address decoder 6015 or 6025 to one of the timing generator unit 6051 corresponding to the specified bank. If the core circuit is already in the activated state by the timing generator unit 6051 when a bank activation signal arrives, the timing generator unit 51 will generate a Busy_int$_L$ signal or a Busy_int$_R$ signal. The generated Busy_int$_L$ signal or Busy_int$_R$ signal is supplied to the arbitration logic 6031, and is then output to the exterior of the device through the arbitration logic 6031. The timing generator unit 6051 retains the input address, and activates the core circuit immediately after the current operation of the core circuit comes to an end. If a bank activation signal is also supplied from the other port, the input address corresponding to this signal is also retained. In order to first select an address that was retained earlier than the other, the provision of FIFO 6052 or the like is made. When a bank activation signal is supplied to the timing generator unit 6051, the corresponding bank may not be in an activated state. In such a case, the core operation will be started immediately.

FIG. 142 is a block diagram showing the detailed configuration of the timing generator unit 6051.

The timing generator unit 6051 of FIG. 142 includes a FIFO circuit 6052, a R/W holding circuit 6053, a latch 6054, and a timing generation circuit 6055.

The FIFO circuit 6052 functions as an address holding circuit, and responds to a row activation signal supplied from the command buffer 6011 or 6021 through the arbitration logic 6031, thereby storing therein decoded address signals in the order in which they are supplied from the address decoder 6015 or 6025. The row activation signal requests the activation of a row (i.e., word), thereby requesting an access operation. The decoded address signals stored in the FIFO circuit 6052 are supplied to the column decoder 6033 and the word decoder 6035. Moreover, the FIFO circuit 6052 generates a Busy_int$_L$ signal or a Busy_int$_R$ signal if the core circuit is already in the activated state when access is requested.

The R/W holding circuit 6053 responds to a row activation signal by storing therein a Read/Write activation signal supplied through the arbitration logic 6031 from the command buffer 6011 or 6021. The Read/Write activation signal is activated when a Read operation or a Write operation is requested by command signals entered from the exterior of the device. The R/W holding circuit 6053 stores therein an access state (i.e., indicative of a write state or a read state) in response to the Read/Write activation signal. The access state stored in the R/W holding circuit 6053 is supplied to the timing generation circuit 6055 as a signal R/W indicative of an access state.

The switches 6061 and 6062 are provided on the input side of the FIFO circuit 6052 and the R/W holding circuit 6053. The switches 6061 and 6062 are controlled by a right/left selection signal supplied from the arbitration logic 6031. The switches 6061 and 6062 select signals corresponding to L-port if the left side is chosen, and select signals corresponding to R-port if the right-hand side is chosen.

The latch 6054 stores therein a refresh activation signal supplied from the refresh timing generation circuit 6040. The refresh activation signal stored in the latch 6054 is supplied to the timing generation circuit 6055.

The timing generation circuit 6055 responds to a row activation signal by generating predetermined timing signals required for the core activation according to the refresh instruction indicated by the latch 6054 and the access state indicated by the R/W holding circuit 6053. These timing signals include csaz, wdz, twlz, wdrz, sbez, and wbez. The timing-signal csaz is supplied to the column decoder 6033, and determines the activation and reset timing of a column line. The timing-signals twlz and wdrz determine the activation and reset timing of the cell array 6034 such as sense amplifiers, and control the cell array 6034 through the word decoder 6035. The timing signal wdz determines the activation and reset timing of a word line, and is supplied to the word decoder 6035. The timing-signal sbez activates the data bus amplifier of the data-bus-amplifier-&-write-amplifier unit 6036, and the timing-signal wbez activates the write amplifier of the data-bus-amplifier-&-write-amplifier unit 6036.

The timing generation circuit 55 supplies a signal indicative of the completion of a core operation to the FIFO circuit 6052, the R/W holding circuit 6053, and the latch 6054 after the core operation comes to an end. In response to the signal indicative of the completion of a core operation, the FIFO circuit 6052 and the R/W holding circuit 6053 output the next items in storage, and the latch 6054 latches the state of a refresh activation signal that is next in order. Namely, control is made such as to perform a next core operation immediately after the current core operation comes to an end.

FIG. 143 is a block diagram showing the configuration of the arbitration logic 6031 in relation to the Busy signal generation.

The arbitration logic 6031 of FIG. 143 includes a Busy logic circuit 6071, a Busy logic circuit 6072, an interrupt generation circuit 6073, and a port selection circuitry 6074.

The interrupt generation circuit 6073 receives address signals Address, a write-enable signal /WE, an output-enable signal /OE, and a chip-enable signal /CE from both ports, and generates an interrupt signal $/INT_L$ or an interrupt signal $/INT_R$, which is then output to the exterior of the device. In detail, a write operation through one of the ports is performed with respect to a predetermined address, thereby activating an interrupt signal in the other port. If a read operation is performed with respect to the same predetermined address from the port in which the interrupt signal has been activated, the activated interrupt signal will be reset. When there is a need to interrupt R_port from L_port, a write access is made from the L_port to the largest address, for example, so as to generate an interrupt signal $/INT_R$ on the R_port side. If there is a need to interrupt L_port from R_port, a write access is made from the R_port to the next largest address, for example, so as to generate an interrupt signal $/INT_L$ on the L_port side.

The port selection circuitry 6074 receives chip-enable signals /CE from both ports, and generates a right/left selecting signal according to the order of arrival of the chip-enable signals /CE. The right/left selecting signal is supplied to the switches 6061 and 6062 of FIG. 142 and to the switches 6037 and 6038 of FIG. 140.

The Busy logic circuit 6071 includes a NAND circuit 6081, an inverter 6082, and an OR circuit 6083. The Busy logic circuit 6072 includes a NAND circuit 84, an inverter 6085, and an OR circuit 6086.

In the Busy logic circuit 6071 corresponding to the left-hand-side port L-port, the OR circuit 6083 put together a plurality of Busy_int signals supplied from the timing generator units 6051 corresponding to the respective banks, thereby generating a single Busy signal. When the chip-enable signal $/CE_L$ input into the left-hand-side port L-port is asserted (LOW), the Busy signal is output from the NAND circuit 6081 as a negative-logic signal $/Busy_L$. The same is applied in the case of the Busy logic circuit 6072 corresponding to the right-hand-side port R-port.

FIG. 5 is a timing chart showing the operation when accesses are made to the same bank from the left port and the right port.

An address that has first arrived at either one of the ports (R-port in this example) is #1, and an address that has later arrived at the other port is denoted as #2. Core operations are performed without intervals between the address #1 and the address #2 as shown in FIG. 144 at the label "Core Operation". The label "Relvant BL Pair" indicates the state of relevant bit lines as to activation thereof. Data retrieved by the core operation for the address #1 is output as $Dout_R$ to the port (R-port) that has received its address input ahead of the other. The data retrieved by the core operation for the address #2 is output as $Dout_L$ to the port (L-port) that has received its address input after the other.

Since the core is already operating with respect to the address #1 when the address #2 is input into L-port, a busy signal ($/Busy_L$=LOW) is output to the port that was the second to receive its address input. After the core operation for the first port is completed, the busy signal at the second port is disengaged ($/Busy_L$=HIGH).

FIG. 145 is a timing chart showing the operation when accesses are made to the same bank from the left port and the right port, and a refresh operation is also to be performed concurrently on the same bank.

In this example, a refresh operation directed to the address #1 is carried out ahead of the accesses made by the ports on the left and right. When the address #1 is input into the first port (R-port), the core circuit is already operating with respect to a refresh address #0, thereby resulting in a busy signal being output to the first port ($/Busy_R$=LOW). When the address #2 is input into the second port (L-port), a busy signal ($/Busy_L$=LOW) is output to the second port in response to the detection of the core operation directed to the refresh address #0 or in response to the detection of an existing access in the standby state. After the completion of the refresh operation, the core circuit immediately starts performing the access from the first port (address #1) while disengaging the busy signal at the first port (R-port). After the completion of the core operation at the address #1, the access operation for the second port (address #2) is immediately started. The busy signal at the second port (L-port) is disengaged a predetermined time after the disengagement of the busy signal at the first port. Alternatively, the busy signal at the second port (L-port) is disengaged at the time when the core operation associated with the first port comes to an end.

FIG. 146 is a timing chart showing the operation when a refresh operation is requested during a core operation.

As previously described, the refresh timing generation circuit 6040 generates a refresh activation signal Ref-Act at constant intervals, and the internal address-generation circuit 6039 generates refresh addresses to be refreshed. If a request for a refresh operation is not directed to the same bank that is being subjected to a core operation, the refresh operation is immediately started. In the example of FIG. 146, when the refresh activation signal Ref-Act is generated with respect to an address #0, a core operation is already underway in the same bank at an address #1. In this case, the refresh operation is carried out immediately after the ongoing core operation comes to an end.

At this time, the refresh address is supplied from the address decoder 6015 situated on the L-port side as shown in FIG. 140. Accordingly, the timing generator 6032 generates the Busy_int$_L$ signal on the L-port side. Since the chip-enable signal /CE is not asserted on the L-port side, the busy signal /Busy$_L$ is not output to the exterior of the device.

In the present invention as described above, a busy signal is output to a port when this port requests access to the same bank that is undergoing a core operation. Through this notice function by the busy signal, a standby state can be detected from outside the semiconductor memory device.

In this invention, the term "bank" refers to a memory array portion corresponding to a set of word lines that are associated with simultaneously activated sense amplifiers.

FIGS. 147A through 147D are illustrative drawings showing various bank configurations. In FIGS. 147A through 147D, sense amplifiers are shown as S/A, and straight lines that extend horizontally from the sense amplifiers S/A are bit lines. Further, the straight lines that cross the bit lines by extending in a vertical direction are word lines. Memory cells are situated at intersections of the word lines and the bit lines. The word lines are generally implemented by repeating a four-line arrangement, thereby providing 128 lines, 256 lines, 512 lines, and so on. In FIGS. 147A through 147D, only a four-line arrangement is shown as a typical illustration of word-line arrangement. In a real device, however, a numerous number of word lines are provided between sense amplifiers.

Figure 147A:
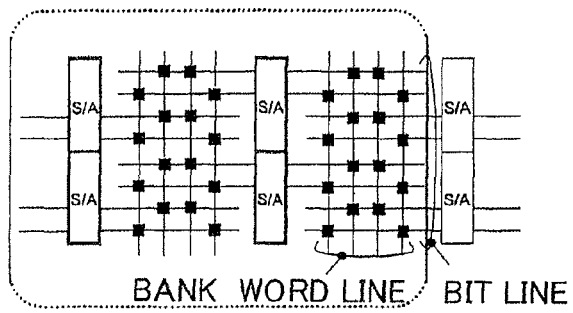

In FIG. 147A, sense amplifier columns enclosed in the dotted line are simultaneously activated. The word lines associated with these sense amplifier columns belong to the cell array placed between the two enclosed sense amplifier columns, and also belong to cell arrays situated on either side of these two enclosed sense amplifier columns. The area that is enclosed by the dotted line is referred to as a bank in this case.

Figure 147B:
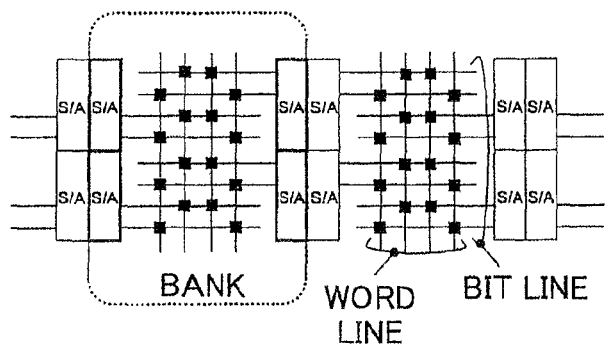

In FIG. 147B, sense amplifiers are not shared by adjacent cell arrays, so that only the sense amplifier columns enclosed in the dotted line are simultaneously activated. The word lines associated with these sense amplifier columns belong to the cell array placed between the two enclosed sense amplifier columns. The area that is enclosed by the dotted line is referred to as a bank in this case.

Figure 147C:
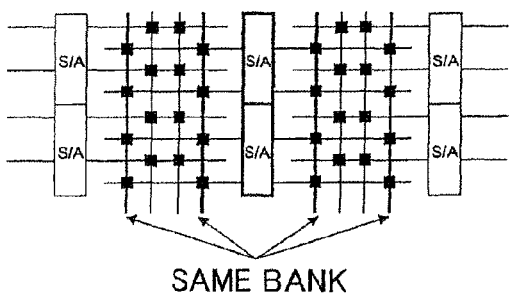

In FIG. 147C, sense amplifiers are shared by adjacent cell arrays. Since connections between the bit lines and the word lines are different from FIG. 147A, the word lines associated with the sense amplifiers shown in thick lines are situated at both ends of word line arrangement within each cell array where the two cell arrays flanking the sense amplifier column are relevant. The area that is enclosed by the dotted line is referred to as a bank in this case.

Figure 147D:
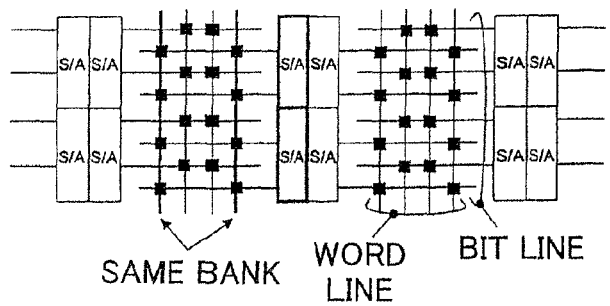

In FIG. 147D, connections between the bit lines and the sense amplifiers are the same as those of FIG. 147C, but adjacent cell arrays do not share a sense amplifier column. In this case, two word lines shown in thick lines constitute a bank with respect to the sense amplifier column simultaneously activated as shown in thick lines.

In the present invention as described above, the term "bank" is not merely defined as a partitioned section of the cell array or a single contiguous chunk thereof, but is rather defined as a set of word lines relating to sense amplifiers that are simultaneously activated.

The above embodiments have been described with reference to a case in which the two ports L-port and R-port are provided. The present invention is not limited to the case of Only two ports. The embodiments described above can easily be applied to a configuration having three or more ports, and such application can be made through slight alteration and/or modification. Such configurations are also regarded as part of the subject matter of the present invention.

In the present invention as described above, a busy signal is output to a port when this port requests access to the same bank that is undergoing a core operation. Through this notice function by the busy signal, a standby state can be detected from outside the semiconductor memory device, and it can be known that it will take longer than usual to process the access request.

Further, the semiconductor memory device according to the present invention includes a refresh timing generation circuit that internally specifies the timing of refresh operations performed on the cell array. Such automatic generation of refresh commands inside the device makes it possible to refresh the cell array at constant intervals.

Further, the present invention is not limited to these embodiments, but various variations and modifications may be made without departing from the scope of the present invention.

The present application is based on Japanese priority applications No. 2000-387891 filed on Dec. 20, 2000, No. 2001-034361 filed on Feb. 9, 2001, No. 2001-037547 filed on Feb. 14, 2001, No. 2000-398893 filed on Dec. 27, 2000, No. 2000-399052 filed on Dec. 27, 2000, and No. 2002-070514 filed on Mar. 14, 2002, with the Japanese Patent Office, the entire contents of which are hereby incorporated by reference.

What is claimed is:

1. A multi-port memory, comprising:
   a plurality of memory cores having memory cells;
   a plurality of input/output ports, each of which includes a clock terminal configured to receive a clock signal, address terminals configured to receive address signals that are supplied in synchronization with the clock signal for selecting the memory cells, and data input/output terminals configured to input and output data signals; and
   a plurality of control circuits, each of which is provided for a corresponding one of the plurality of memory cores, and selects the address signals supplied from the address terminals of one of the input/output ports to access the memory cells indicated by the selected address signals,
   wherein when address signals indicating a same memory core of the plurality of memory cores are input into two or more of the input/output ports, a control circuit corresponding to the same memory core makes the same memory core operate in an order in which the address signals are received.

2. The multi-port memory, as claimed in claim 1, wherein each of the input/output ports includes a command terminal configured to receive a command signal in synchronization with the clock signal for controlling operations of the plurality of memory cores, and wherein each said command signal input into one of the input/output ports for activating the plurality of memory cores is supplied at intervals twice or more times longer than a operation period of the plurality of memory cores required for a read operation and a write operation.

3. The multi-port memory as claimed in claim 2, wherein the command signal is invalidated if when each said command signal is input into one of the input/output ports without securing the intervals.

4. The multi-port memory as claimed in claim 2, wherein each said command signal that is input at intervals shorter than twice the operation period is accepted when said each said command is input to different ones the input/output ports.

5. The multi-port memory as claimed in claim 1, further comprising a buffer configured to store therein data the memory cells, wherein the data read from or written in the memory cells are transferred via the buffer between the memory cells and the data input/output terminals.

6. The multi-port memory as claimed in claim 1, wherein each of the input/output ports includes a command terminal configured to receive a command signal in synchronization with the clock signal for controlling operations of the plurality of memory cores.

7. The multi-port memory as claimed in claim 6, wherein, for a read operation and a write operation, the command terminal receives an active command for activating a specific memory area of the plurality of memory cores and an action command indicative of either the read operation or the write operation with respect to the specific memory area.

8. The multi-port memory as claimed in claim 7, wherein the address terminals receive the address signals for selecting the specific memory area in the plurality of memory cores and the address signals for selecting the memory cells in the specific memory area in conjunction with the active command and the action command, respectively.

9. The multi-port memory as claimed in claim 1, wherein the memory cells include capacitors configured to store therein electric charge responding to values of the data signals.

10. The multi-port memory as claimed in claim 9, wherein the memory cells are connected to bit lines for inputting and outputting the data signals, and a precharge operation for resetting the bit lines to a precharge voltage is automatically performed after a read operation and a write operation.

11. A method of controlling a multi-port memory that includes:

a plurality of memory cores having memory cells;

a plurality of input/output ports, each of which includes a clock terminal configured to receive a clock signal, address terminals configured to receive address signals that are supplied in synchronization with the clock signal for selecting the memory cells, and data input/output terminals for configured to input and output data signals; and a plurality of control circuits, each of which is provided for a corresponding one of the plurality of memory cores, and selects the address signals supplied from the address terminals of one of the input/output ports to access the memory cells indicated by the selected address signals, said the method comprising a step of, when the address signals indicating a same memory core of the plurality of memory cores are input into two or more of the input/output ports, making the same memory core operate under control of the control circuit corresponding to the same memory core in an order in which the address signals are received.

12. The method as claimed in claim 11, further comprising a step of receiving command signals for activating the plurality of memory cores by each of the input/output ports at intervals twice or more times longer than a operation period of the plurality of memory cores required for a read operation and a write operation.

13. The method as claimed in claim 12, further comprising a step of invalidating the command signals when the command signals are input into one of the input/output ports without securing the intervals.

\* \* \* \* \*